USOO5625580A

United States Patent [19]
Read et al.

[11] Patent Number: 5,625,580
[45] Date of Patent: Apr. 29, 1997

[54] HARDWARE MODELING SYSTEM AND METHOD OF USE

[75] Inventors: Andrew J. Read, Sunnyvale; Mark S. Papamarcos; Wayne P. Heideman, both of San Jose; Robert K. Mardjuki, Peasanton; Robert K. Couch, Santa Cruz; Peter R. Jaeger; William F. Kappauf, both of San Jose; Lawrence C. Widdoes, Jr.; Louis K. Scheffer, both of Los Altos Hills, all of Calif.

[73] Assignee: Synopsys, Inc., Mountain View, Calif.

[21] Appl. No.: 313,529

[22] Filed: Sep. 26, 1994

Related U.S. Application Data

[63] Continuation of Ser. No. 939,393, Aug. 31, 1992, Pat. No. 5,353,243, and a continuation of Ser. No. 359,711, May 31, 1989, abandoned.

[51] Int. Cl.[6] .................................................. G06F 17/00
[52] U.S. Cl. ......................................................... 364/578
[58] Field of Search ................................. 364/578, 579, 364/488, 490; 371/27, 29.1; 324/73.1, 158 R; 395/183.07, 183.08

[56] References Cited

U.S. PATENT DOCUMENTS

| 3,016,698 | 1/1962 | Sobey ............................... 60/35.6 |
| 3,287,702 | 11/1966 | Borck, Jr. et al. ................. 340/172.5 |
| 3,287,703 | 11/1966 | Slotnick ............................. 340/172.5 |
| 3,473,160 | 10/1969 | Wahlstrom ........................ 340/172.5 |
| 3,720,131 | 3/1973 | Frohock, Jr. et al. ............... 89/41 ME |
| 3,728,534 | 4/1973 | Bertram et al. .................... 235/184 |
| 3,764,995 | 10/1973 | Helf, Jr. et al. ................... 340/172.5 |
| 3,832,535 | 8/1974 | De Vito ............................. 235/153 AC |
| 3,854,125 | 12/1974 | Ehling et al. ...................... 340/172.5 |

(List continued on next page.)

FOREIGN PATENT DOCUMENTS

| 150260A2 | 7/1985 | European Pat. Off. ......... G06F 11/26 |
| 58-205870 | 11/1983 | Japan ............................. H03K 19/00 |
| 59-161839 | 9/1984 | Japan ............................. H01L 21/82 |
| 1-154251 | 6/1989 | Japan ............................. G06F 11/26 |
| 1444084 | 7/1976 | United Kingdom ........... H03K 19/00 |
| 2123156A | 1/1984 | United Kingdom ........... G01R 19/165 |
| 2164768A | 3/1984 | United Kingdom ........... G06F 15/60 |

OTHER PUBLICATIONS

Koike, N., Ohmori, K., and Sasaki, T. "HALL: A High-Speed Logic Simulation Machine," IEEE, Oct., 1985.

Blank, T. "A Survey of Hardware Accelerators Used in Computer–Aided Design," IEEE, Aug., 1984.

(List continued on next page.)

*Primary Examiner*—Ellis B. Ramirez
*Attorney, Agent, or Firm*—Haverstock & Associates

[57] ABSTRACT

An improved hardware modeling system that is preferably embodied as a stand-alone system for networked connection to one or a variety of host computers that are used to design digital electronics systems, the hardware modeling system having a network interface for communicating between the hardware modeling system and the host computer, a central processing unit for controlling operation of the hardware modeling system, a central timing unit for generating timing signals for use in the operation of the hardware modeling system including the generation of precision clocks, data formatting strobes and sample strobes, an internal pattern bus for transmission of read/write requests from the central processing unit in one operational mode and pattern sequences for stimulation of the hardware modeling element in a second operational mode, a pattern controller for controlling presentation and delivery of the pattern sequences to the pattern bus, a pattern memory connected to the pattern controller for storing stimulus pattern sequences, pin electronics circuitry which is used for driving the pattern sequences on the pattern bus to the hardware modeling element and then sensing the five state values of the hardware modeling element pins, and an adapter that is used for fixturing the hardware modeling element to the pin electronics circuitry with the adapter supporting live insertion into a powered hardware modeling system.

20 Claims, 48 Drawing Sheets

U.S. PATENT DOCUMENTS

| | | | |
|---|---|---|---|
| 3,902,050 | 8/1975 | Schmidt et al. | 235/152 |
| 3,913,070 | 10/1975 | Malcolm et al. | 340/172.5 |
| 3,922,537 | 11/1975 | Jackson | 235/153 AC |
| 3,928,730 | 12/1975 | Aagaard et al. | 179/18 GF |
| 3,976,940 | 8/1976 | Chau et al. | 324/73 R |
| 4,020,469 | 4/1977 | Manning | 340/172.5 |
| 4,032,893 | 6/1977 | Moran | 340/166 R |
| 4,032,899 | 6/1977 | Jenny et al. | 364/200 |
| 4,055,801 | 10/1977 | Pike et al. | 324/73 R |
| 4,092,589 | 5/1978 | Chau et al. | 324/73 R |
| 4,102,491 | 7/1978 | DeVito et al. | 235/302 |
| 4,168,796 | 9/1979 | Fulks et al. | 235/302 |
| 4,216,533 | 8/1980 | Ichimiya et al. | 365/230 |
| 4,236,246 | 11/1980 | Skilling | 371/27 |
| 4,306,286 | 12/1981 | Cocke et al. | 364/200 |
| 4,357,678 | 11/1982 | Davis | 364/900 |
| 4,365,295 | 12/1982 | Stokken | 364/200 |
| 4,386,403 | 5/1983 | Hsieh et al. | 364/300 |
| 4,404,635 | 9/1983 | Flaker | 364/481 |
| 4,450,560 | 5/1984 | Conner | 371/25 |
| 4,456,880 | 6/1984 | Warner et al. | 324/158 D |
| 4,459,694 | 7/1984 | Ueno et al. | 371/21 |
| 4,488,354 | 12/1984 | Chan et al. | 29/830 |
| 4,503,386 | 3/1985 | DasGupta et al. | 324/73 R |
| 4,510,602 | 4/1985 | Engdahl et al. | 371/21 |
| 4,517,661 | 5/1985 | Graf et al. | 364/900 |
| 4,525,789 | 7/1985 | Kemper et al. | 364/481 |
| 4,527,115 | 7/1985 | Mehrotra et al. | 324/73 R |
| 4,527,249 | 7/1985 | Van Brunt | 364/578 |
| 4,539,564 | 9/1985 | Smithson | 340/825.79 |
| 4,541,071 | 9/1985 | Ohmori | 364/900 |
| 4,544,882 | 10/1985 | Flora | 324/73 R |
| 4,577,276 | 3/1986 | Dunlop et al. | 364/491 |
| 4,578,761 | 3/1986 | Gray | 364/481 |
| 4,587,625 | 5/1986 | Marino, Jr. et al. | 364/200 |
| 4,590,581 | 5/1986 | Widdoes, Jr. | 364/578 |
| 4,593,363 | 6/1986 | Burstein et al. | 364/491 |
| 4,594,544 | 6/1986 | Necoechea | 324/73 AT |
| 4,600,846 | 7/1986 | Burrows | 307/465 |
| 4,612,618 | 9/1986 | Proyr et al. | 364/490 |
| 4,613,940 | 9/1986 | Shenton et al. | 364/490 |
| 4,621,339 | 11/1986 | Wagner et al. | 364/900 |
| 4,628,471 | 12/1986 | Schuler et al. | 364/578 |
| 4,633,417 | 12/1986 | Wilburn et al. | 364/550 |
| 4,635,218 | 1/1987 | Widdoes, Jr. | 364/578 |
| 4,635,259 | 1/1987 | Schinabeck et al. | 371/20 |
| 4,639,664 | 1/1987 | Chiu et al. | 324/73 |
| 4,642,487 | 2/1987 | Carter | 307/465 |
| 4,644,487 | 2/1987 | Smith | 364/578 |
| 4,646,299 | 2/1987 | Schinabeck et al. | 371/20 |
| 4,656,580 | 4/1987 | Hitchcock et al. | 364/200 |
| 4,656,592 | 4/1987 | Spaanenburg et al. | 364/490 |
| 4,656,632 | 4/1987 | Jackson | 371/20 |
| 4,674,089 | 6/1987 | Poret et al. | 371/25 |
| 4,675,673 | 6/1987 | Oliver | 340/825.87 |
| 4,675,832 | 6/1987 | Robinson et al. | 364/521 |
| 4,682,440 | 7/1987 | Hunter | 43/61 |
| 4,686,627 | 8/1987 | Donovan et al. | 364/481 |
| 4,695,740 | 9/1987 | Carter | 307/242 |
| 4,695,968 | 9/1987 | Sullivan, II et al. | 364/578 |
| 4,695,999 | 9/1987 | Lebizay | 370/58 |
| 4,697,241 | 9/1987 | Lavi | 364/488 |
| 4,700,187 | 10/1987 | Furtek | 340/825.83 |
| 4,713,557 | 12/1987 | Carter | 307/242 |
| 4,714,875 | 12/1987 | Bailey et al. | 324/73 |
| 4,722,084 | 1/1988 | Morton | 371/9 |
| 4,724,378 | 2/1988 | Murray et al. | 324/73 R |
| 4,725,835 | 2/1988 | Schreiner et al. | 340/825.83 |
| 4,725,970 | 2/1988 | Burrows et al. | 364/578 |
| 4,740,919 | 4/1988 | Elmer | 365/104 |
| 4,744,084 | 5/1988 | Beck et al. | 371/23 |
| 4,747,102 | 5/1988 | Funatsu | 371/23 |
| 4,752,887 | 6/1988 | Kuwahara | 364/491 |
| 4,758,745 | 7/1988 | Elgamal et al. | 307/465 |
| 4,761,768 | 8/1988 | Turner et al. | 365/201 |
| 4,763,288 | 8/1988 | Deering et al. | 364/578 |
| 4,763,289 | 8/1988 | Barzilai et al. | 364/578 |
| 4,764,925 | 8/1988 | Grimes et al. | 371/20 |
| 4,766,569 | 8/1988 | Turner et al. | 365/185 |
| 4,768,196 | 8/1988 | Jou et al. | 371/25 |
| 4,769,817 | 9/1988 | Krohn et al. | 371/23 |
| 4,771,428 | 9/1988 | Acuft et al. | 371/25 |
| 4,777,606 | 10/1988 | Fournier | 364/491 |
| 4,782,440 | 11/1988 | Nomizu et al. | 364/200 |
| 4,787,061 | 11/1988 | Nei et al. | 364/900 |
| 4,791,602 | 12/1988 | Resnick | 364/900 |
| 4,803,636 | 2/1989 | Nishiyama et al. | 364/491 |
| 4,806,852 | 2/1989 | Swan et al. | 324/73 |
| 4,811,214 | 3/1989 | Nosenchuck et al. | 364/200 |
| 4,815,003 | 3/1989 | Putatunda et al. | 364/491 |
| 4,816,750 | 3/1989 | Van der Kloot et al. | 324/73 R |
| 4,823,276 | 4/1989 | Hiwatashi | 364/491 |
| 4,827,427 | 5/1989 | Hyduke | 364/489 |
| 4,835,705 | 5/1989 | Fujino et al. | 364/491 |
| 4,845,633 | 7/1989 | Furtek | 364/490 |
| 4,849,904 | 7/1989 | Aipperspach et al. | 364/489 |
| 4,849,928 | 7/1989 | Hauck | 364/900 |
| 4,855,669 | 8/1989 | Mahoney | 324/73 R |
| 4,862,347 | 8/1989 | Rudy | 364/200 |
| 4,864,165 | 9/1989 | Hoberman et al. | 307/467 |
| 4,870,302 | 9/1989 | Freeman | 307/465 |
| 4,873,459 | 10/1989 | EL Gamal et al. | 307/465 |
| 4,876,466 | 10/1989 | Kondou et al. | 307/465 |
| 4,882,690 | 11/1989 | Shinsha et al. | 364/490 |
| 4,901,259 | 2/1990 | Watkins | 364/578 |
| 4,901,260 | 2/1990 | Lubachevsky | 364/578 |
| 4,908,772 | 3/1990 | Chi | 364/491 |
| 4,914,612 | 4/1990 | Beece et al. | 364/578 |
| 4,918,440 | 4/1990 | Furtek | 340/825.83 |
| 4,918,594 | 4/1990 | Onizuka | 364/200 |
| 4,922,432 | 5/1990 | Kobayashi et al. | 364/490 |
| 4,924,429 | 5/1990 | Kurashita et al. | 364/578 |
| 4,931,723 | 6/1990 | Jeffrey et al. | 371/22.3 |
| 4,931,946 | 6/1990 | Ravindra et al. | 364/490 |
| 4,935,734 | 6/1990 | Austin | 340/825.83 |
| 4,942,536 | 7/1990 | Watanabe | 364/490 |
| 4,942,615 | 7/1990 | Hirose | 364/578 |
| 4,945,503 | 7/1990 | Takasaki | 364/578 |
| 4,949,275 | 8/1990 | Nonaka | 364/490 |
| 4,951,220 | 8/1990 | Ramacher et al. | 364/488 |
| 4,958,324 | 9/1990 | Devin | 365/201 |
| 4,965,739 | 10/1990 | Ng | 364/491 |
| 4,972,372 | 11/1990 | Ueno | 365/201 |
| 5,003,487 | 3/1991 | Drumm et al. | 364/489 |
| 5,023,775 | 6/1991 | Poret | 364/200 |
| 5,036,473 | 7/1991 | Butts et al. | 364/489 |
| 5,041,986 | 8/1991 | Tanishita | 364/489 |
| 5,046,017 | 9/1991 | Yuyama et al. | 364/491 |
| 5,051,938 | 9/1991 | Hyduke | 364/578 |
| 5,083,083 | 1/1992 | El-Ayat et al. | 324/158 R |
| 5,093,920 | 3/1992 | Agrawal et al. | 395/800 |
| 5,109,353 | 4/1992 | Sample et al. | 364/578 |
| 5,114,353 | 5/1992 | Sample | 439/65 |
| 5,126,966 | 6/1992 | Hafeman et al. | 364/500 |
| 5,146,460 | 9/1992 | Ackerman | 371/23 |
| 5,202,593 | 4/1993 | Huang et al. | 307/475 |
| 5,253,363 | 10/1993 | Hyman | 395/800 |
| 5,259,006 | 11/1993 | Price et al. | 375/107 |
| 5,329,470 | 7/1994 | Sample et al. | 364/578 |
| 5,352,123 | 10/1994 | Sample et al. | 439/61 |
| 5,369,593 | 11/1994 | Papamarcos et al. | 364/488 |
| 5,425,036 | 6/1995 | Liu et al. | 371/23 |

OTHER PUBLICATIONS

Beece, D., Papp, G., and Villante, F. "The IBM Engineering Verification Engine," Information Processing Society of Japan, Jun. 10, 1987.

Arkos, "Hydra Logic Processor Chip Description, Version C," Feb. 15, 1995.

XILINX, *The Programmable Gate Array Data Book*, 1/279–477, 1988.

Widdoes, L.C., Jr., and Harding, W., "CAE Station Uses Real Chips to Simulate VLSI–Based Systems," *Electronic Design*, Mar. 22, 1984, pp. 167–176.

Stoll, P., "PMX: A Hardware Solution to the VLSI Model Availability Problem," IEEE Proceedings of the International Conference on Computer Design, Oct., 1985.

Johnson, "Considerations in Selecting a Physical Modeling System," ADEE Technical Session Proceedings, Sep., 1986, pp. 225–231.

Johnson, "Software vs. Hardware Models for Simulation," Design Automation Guide, 1988.

Bisset, S., "LSI Tester Gets Microprocessors to Generate Their Own Test Patterns," *Electronics*, May 25, 1978, pp. 141–145.

Albrow, R., "2–head Auto–test System Takes on Complex VLSI," *Electronic Design*, Mar. 5, 1981, pp. 79–84.

Giles, D., and Bowden, K., "Maintaining Simulation Accuracy Through Physical Device Models," IEEE Proceedings of the International Test Conference, 1985.

Parker, *Integrating Design and Test: Using CAE Tools for ATE Programming*, Computer Society Press of the IEEE, 1987, ISBN No. 0–8186–8788–5.

Widdoes, L.C., Jr. and Stump, H., "Hardware Modeling," *VLSI Systems Design*, Jul., 1988.

Gillette, G., "Tester Takes on VLSI With 264–K Vectors Behind Its Pins," *Electronics*, Nov. 3, 1981, pp. 122–127.

"Testing a TV Character Generator with the Sentry II Sequence Processor," *Fairchild Systems Technology*, Fairchild Technical Bulletin 4, Nov. 1974, pp. 1–12.

Huston, R., "Description of the Intel 8085 Microprocessor Test Programs for the Sentry II/VII with Sequence Processor Module," *Fairchild Systems Technology*, Nov., 1977, pp. 1–12.

| | | |
|---|---|---|
| 202 | BEGIN/END | INITIALIZES AND TERMINATES AN HMS MODELING SESSION. |
| 204 | CREATE | CREATES VARIOUS HMS ENTITIES. |
| 206 | RELEASE | RELEASES (FREES) VARIOUS HMS ENTITIES (COMPLEMENT OF CREATE). |
| 208 | SET | SETS PARAMETERS AND DEVICE PIN VALUES. |
| 210 | GET | RETRIEVES PARAMETERS AND DEVICE PIN VALUES (COMPLEMENT OF SET). |
| 212 | SAVE/RESTORE | SAVES/RESTORES THE FULL HMS STATE OF A SIMULATION. |
| 214 | INQUIRE | QUERIES THE STATE OF VARIOUS HMS PARAMETERS AND USAGE INFORMATION. |
| 216 | MISCELLANEOUS | PROVIDES VARIOUS UTILITIES. |

FIG. 3

| D15 | BACKPLANE SPARE <1> | 1048 |
| D14 | BACKPLANE SPARE <0> | |
| D13 | PAC SPARE <2> | |
| D12 | PAC SPARE <1> | 1046 |
| D11 | PAC SPARE <0> | |
| D10 | BRANCH <1> | 1044 |
| D9 | BRANCH <0> | |
| D8 | STOP | 1042 |
| D7 | USER | 1040 |
| D6 | PEL_CONTROL <2> | |
| D5 | PEL_CONTROL <1> | 1038 |
| D4 | PEL_CONTROL <0> | |
| D3 | PEL_ADDRESS <3> | |
| D2 | PEL_ADDRESS <2> | 1036 |
| D1 | PEL_ADDRESS <1> | |
| D0 | PEL_ADDRESS <0> | |

13x13

12x12

11x11

10x10

9x9

8x8

HARDWARE MODELING SYSTEM AND METHOD OF USE

This application is a continuation of application Ser. No. 07/939,393, filed Aug. 31, 1992 (U.S. Pat. No. 5,353,743); and Ser. No. 07/359,711, filed May 31, 1989 (abandoned).

FIELD OF THE INVENTION

The present invention relates to systems used by electronics designers to simulate the operation of electronic circuits during development and testing of electronic systems. More specifically, the invention relates to hardware modeling systems that use examples of actual physical electronic circuits and components to model their behavior within a simulated electronic system design.

BACKGROUND OF THE INVENTION

A logic-simulation model of an electronic circuit is a diagnostic tool used by a logical-simulator to accurately mimic the logic and timing behavior of the circuit. The purpose of using such a model is to verify both logic and timing behavior of an operational electronic system containing the circuit. The internal operation and internal structure of a simulation model need not be similar to that of the actual circuit being simulated. However, the logical and timing behavior of the simulation model, as externally observed during simulation, must be identical to that of the actual circuit in its real environment.

Simulation models can be divided into three major classes: behavioral models, structural models, and hardware models. Behavioral models represent device behavior by using code written in an algorithmic language such as "C." They are compiled and linked with a simulator and run on a general-purpose computer. Structural models mimic the actual internal structure of a device; they generally run on either general-purpose or special-purpose computers. Behavioral models and structural models are both represented with software and are therefore also called "software models."

A hardware modeling system ("HMS") couples an actual "known-good" physical device (called a "hardware modeling element" or "HME") with a simulator; the physical device is used to model its own behavior during simulation. When the simulator requests a device evaluation, the HMS formats the inputs received from the simulator, applies the inputs to the physical device, measures device behavior, and returns the resulting outputs plus timing information to the simulator. The timing information is generally obtained from a table in a text file called a "software shell," which contains a representation of the data-book delays.

Before hardware modeling systems became available, logic simulation models were generally software models. Software models are practical for low-complexity circuits, but software models of complex very large scale integration ("VLSI") circuits have numerous disadvantages. For example, they may be costly and time consuming to develop, they may be inaccurate, they may be difficult to check, they may execute quite slowly, and they may not be portable between simulators.

In an attempt to address these problems, Valid Logic Systems in 1984 introduced the Realchip™ hardware modeling system which provided an alternative to software simulation models for complex circuits. Realchip is a trademark of Valid Logic Systems. Valid Logic Systems' Realchip™ system was the basis of two U.S. Pat. Nos. 4,590,581, and 4,635,218, which issued in 1987.

Similar hardware modeling systems were subsequently introduced by Mentor Graphics ("HML"), Daisy Systems ("PMX"), GenRad ("HiChip"), Teradyne ("DataSource"), Cadnetix ("CDX-7000"), HHB Systems ("CATS"), and Tektronix ("TurboChip"). The Mentor Graphics HML hardware modeling system formed the basis for U.S. Pat. No. 4,744,084, which issued in 1988 and claimed improvements over the Realchip™ system.

Users have attempted to apply these prior-art hardware modeling systems in several different ways in the design and test of electronic systems. The primary attempted application of prior-art hardware modeling systems is modeling standard devices and existing ASICs during simulation of electronic systems. In this mode, the designer may run real diagnostic software on the simulated system, verifying the operation of the entire system working together as if it had been prototyped.

Another attempted application of prior-art hardware modeling systems is to use an entire existing subsystem, such as a PC board, as an HME, verifying the operation of the entire system containing the PC board as if it had been prototyped.

Another attempted application of prior-art hardware modeling systems is to debug embedded system software and microcode before fabrication of the prototype system.

Another attempted application of prior-art hardware modeling systems is to examine the behavior of existing standard devices and ASICs for which specifications may be inadequate or inaccurate. In this mode, the design engineer uses the device in question as an HME, stimulating and observing it with the simulator's normal user interface. This enables him to directly and easily answer questions about its behavior while the system design progresses.

Another attempted application of prior-art hardware modeling systems is in ASIC design. Many ASICs which are designed and verified in isolation do not operate properly within the target system. A hardware modeling system can help to solve this problem because it gives the designer access to full-function models of all the complex devices in the embedding system and enables him to simulate the entire system together before ASIC fabrication.

Another attempted application of prior-art hardware modeling systems is for functional verification of prototype ASICs. In this mode, the engineer fixtures the prototype ASIC as an HME, uses the resulting hardware model in place of the earlier gate-level model, and runs the same simulation test cases that were run during the design phase.

Although the prior-art hardware modeling systems enjoyed some commercial success, they suffer from a number of serious limitations with respect to these applications. One limitation of prior-art hardware modeling systems is that they lack the capability to be easily integrated with simulators from multiple different vendors. Therefore, in general, each one works with only one or at most a small set of simulators and cannot be accessed concurrently by multiple simulators running on multiple host platforms. Thus, designers using simulators from multiple vendors may need to buy multiple hardware modeling systems.

Also, prior-art hardware modeling systems are limited in their support for ASICs. For example, state-of-art ASICs have very high pin counts, and prior-art hardware modeling systems do not directly support very-high-pin-count devices. Also, prior-art hardware modeling systems do not directly support the capture and replay of test vectors for ASIC prototype verification.

Also, prior-art hardware modeling systems do not support direct timing measurement of HME output delays. Direct timing measurement is important for the comprehensive verification of prototype ASICs. Direct timing measurement is also important to simplify creation of the shell software for new ASIC hardware models.

Also, prior-art hardware modeling systems have proven difficult to use due to requirements for custom pin wiring on device adapters, specialized initialization circuitry, and complex software shells.

Also, prior-art hardware modeling systems are generally not fully and easily configurable. Hardware modeling systems can be used in several distinct modes which require configuration of the modeler in different dimensions. For example, system-level simulation requires that the HMS be configured for a large number of devices simultaneously mounted; ASICs tend to have high pin counts, so modeling and verifying them requires support for high-pin-count devices; and simulating the execution of software on processor models requires deep pattern memory. Prior-art hardware modeling systems limited simultaneous configurability in these dimensions.

Also, prior-art modeling systems suffer from poor performance, particularly in round-trip access time from the simulator, and in pattern-presentation rate. Better performance in both areas is necessary to keep pace with faster simulators and workstations, and to properly refresh state-of-the-art high-speed dynamic devices so that correct results are obtained.

Also, prior-art hardware modeling systems suffer from limitations of the "pin electronics," which is the electronic circuitry used by the hardware modeling system to stimulate and sample the inputs, outputs, and bi-directional ("I/O") pins of the HME. For example, because of the primitive nature of the pin electronics in the prior-art hardware modeling systems, when certain types of integrated circuits, particularly those having feed-through paths connecting I/O pins, such as the 74ALS645 bi-directional bus buffer manufactured by Texas Instruments, are used as HMEs in such systems, the very process of electronically sampling some I/O pins of the integrated circuit may inadvertently stimulate the device and cause incorrect signal values to be sampled on other I/O or output pins. As a result, the hardware modeling system may return incorrect results to the workstation which is performing the simulation. Some users of prior-art hardware modeling systems refer to this problem as the "coupled-I/Os problem."

Also, in prior-art hardware modeling systems, generally at least two bits are stored in each stimulus pattern for each pin of the HME, e.g., one bit for the data value and one bit which can inhibit the HMS pin driver. Since memory for pattern storage is generally expensive, a system and associated method of use is needed for reducing the amount and, therefore, the cost of required pattern storage.

Also, prior-art hardware modeling systems suffer from other deficiencies due to inadequate pin electronics, such unreliability and a lack of capability to support multiple integrated circuit technologies (such as TTL and low-voltage CMOS). Because of the inability to support multiple integrated circuit technologies, some types of integrated circuits cannot be used as HMEs in prior-art hardware modeling systems.

Therefore, a need exists for an improved hardware modeling system, and a method which is directed toward solving and minimizing these and other problems of prior-art devices.

SUMMARY OF THE INVENTION

The present invention is an improved hardware modeling system and method of use.

The hardware modeling system ("HMS") of the present invention is adaptable for connection to a host computer, which includes a simulator, and is supported by software appropriate for communicating with the HMS. In fact, the HMS is capable of connecting to, and communicating with, a variety of host computers including a variety of simulators, in particular including conventional digital logic and fault simulators. The host computers are conventional electronic design workstations; the software that supports their use with the HMS is novel.

The host computer and the HMS are preferably connected by a local-area network over which information is transmitted bi-directionally between the two systems. Multiple HMSs can be networked with, and concurrently shared by, multiple host computers running multiple different simulators.

The HMS of the present invention provides hardware models of standard ICs, ASICs, and electronic subsystems. The HMS has a number of applications. Some of the major ones are as follows:

1) modeling standard off-the-shelf ICs, including static and dynamic ICs and VLSI ICs, in simulation of an electronic system design;

2) modeling custom static and dynamic ICs (ASICs) in simulation of an electronic system design;

3) modeling electronic subsystems and PC boards in simulation;

4) debugging embedded system software and microcode using a simulated prototype;

5) examining the behavior of existing physical standard devices and ASICs;

6) verifying the functional behavior and timing of ASIC prototypes; and 7) generating and capturing standard-device, ASIC, and PC-board test vectors during simulation.

In order to better understand the present invention, it is useful to briefly describe the general overall operation of the HMS as it is used by a typical simulator.

When an electronic circuit is being simulated by a digital simulator including software simulation models of some circuit components, the simulator repeatedly "evaluates" the software simulation models of the components within the circuit. In order to evaluate a single software simulation model of a component, the simulator prepares a stimulus pattern representing the values of the input signals of the component and then executes a software routine which computes the output signal values of the component on the basis of both the stimulus pattern and the current internal state of the component. This output pattern is used by the simulator, along with other information, to prepare stimulus patterns for subsequent evaluations of the same and other components within the circuit. Methods of simulating electronic circuits using software simulation models of components are well known in the prior art.

The simulator may also access the HMS to evaluate the logical and timing behavior of an HME in response to simulated events on the inputs of a device instance modeled by the HME. Each access proceeds generally as follows:

The simulator first generates a stimulus pattern for the HME in generally the same manner as such a pattern is generated for a software simulation model. This stimulus pattern is encoded and transmitted to the HMS over a network. The HMS receives and decodes the stimulus pattern, stores the decoded pattern at the end of a "history sequence" of patterns in pattern memory, generally, as a single bit per pin of the HME, and presents the history sequence to the HME via the HMS pin electronics. The history sequence is appropriate to cause the HMS pin electronics to drive the input and I/O pins of the HME in such a way as to mimic the electrical behavior of the circuitry connected to the corresponding component in the circuit being simulated. Therefore, the physical HME behaves as if it were operating within the electronic circuit being simulated. After presentation of the history sequence, the pin electronics electronically samples the output and I/O signals from the HME. The HMS converts the sampled output and I/O signal values into a corresponding output pattern, which is encoded and returned via the network to the simulator. This output pattern is used by the simulator for further simulation in generally the same manner as an output pattern produced by a software simulation model.

The HMS hardware has two sections: control and modeler. The control section includes a central processing unit ("CPU") which runs the supporting software programs that perform all modeler functions and communicates with the simulators of the host computers. The CPU has local main memory. The modeler section contains special-purpose hardware to store pattern sequences, to present patterns to the HME, to sense its outputs, and to provide the outputs to the CPU. The modeler section includes a Pattern Bus, Timing Generator ("TG"), Pattern Controllers ("PACs"), Fast Pattern Memories ("PAMs"), Pin Electronics Modules ("PELs"), and Device Adapter Boards ("DABs") to which the HMEs connect.

The HMS can be independently configured in three dimensions: HME pin count, depth of pattern memory, and number of HMEs. The Pattern Bus (also referred to as the HMS "backplane") preferably includes four lanes. In the preferred embodiment, each lane supports HMEs with up to 80 pins. The TG, PACs, and PELs connect directly to the lanes. The CPU connects to the lanes through the TG. Each lane has its own pattern-presentation hardware that includes a PAC, preferably having from one to four PAMs connected to it. Each lane also has one to eight PELs connected to it. Each PEL can drive and sense up to 80 HME pins. Novel circuitry of the PAC, PAM, and PEL, and an associated method of use, allow the pattern memory in the PAMs connected to the PAC to be dynamically shared between pattern sequences for all HMEs in a lane of the PAC.

DABs of various sizes, but generally similar design and construction, connect to from one to four PELs in adjacent lanes. Ms having from 241 to 320 pins can be mounted on a DAB connecting to four adjacent PELs, HMEs having from 161 to 240 pins can be mounted on a DAB connecting to three adjacent PELs, HMEs having from 81 to 160 pins can be mounted on a DAB connecting to two adjacent PELs, and HMEs of 80 pins or less can be mounted on a DAB connecting to a single PEL. DABs of various sizes can be freely mixed in the HMS by connecting PELs at the appropriate sites at the backplane. For example, four 320-pin DABs can be mounted simultaneously with four 160-pin DABs and eight 80-pin DABs.

The TG, which connects to, and is controlled by, the CPU, is the main timing source for the HMS. The TG generates adjustable precision high-speed clocks and adjustable precision reference timing signals for timing the presentation of stimulus on individual HME pin drivers on a pin-by-pin basis and for timing the simultaneous sampling of HME outputs. The TG also synchronizes the Pattern Bus, checks for errors on the Pattern Bus, and provides a means for the CPU to access the Pattern Bus.

The Pattern Bus preferably is a high-speed controlled-impedance terminated bus supporting presentation of patterns for a 320-pin HME at up to 25 million ("25M") patterns per second. The pattern bus operates in two modes: "access" and "presentation." In the access mode, the Pattern Bus provides the CPU with read/write access to all PACs, PAMs, PELs, and DABs in the HMS. In the presentation mode, the PACs drive pre-stored patterns from the Pattern Bus and present corresponding stimulus to the pins of an HME being used as a simulation model. PELs in adjacent lanes which are connected to a single DAB can simultaneously receive patterns in each lane. These patterns are presented by separate PACs in the separate lanes, which are synchronized by the TG. The HMS is thus able to present patterns to an HME having up to 320 pins and connected to up to four PELs at the same high pattern-presentation rate as for an HME having only 80 pins and connected to only one PEL.

The PAC and connected PAM are initialized by the CPU in access mode. The PAC contains the logic for accessing patterns in the PAMs mounted on it, error-checking the patterns, and delivering the patterns to PELs within its lane via the pattern bus. The PAMs connected to a single PAC can be used for storing a single pattern sequence to be presented to a single HME or for storing multiple pattern sequences to be presented to multiple HMEs. Pattern sequences consist of lists of pattern blocks linked by addresses stored in a link table memory on the PAC. The links can span multiple PAMs connected to a single PAC. Pattern blocks are dynamically allocated, released, and managed by the CPU, using linked-list management methods.

The PAM is organized as 102-bit words, each containing 80 pattern bits, eleven control bits, five spare bits, and six parity bits. Among other functions, the control bits select a target PEL within the lane, specify the function to be performed by the PEL, mark the last pattern in the pattern sequence, and specify a condition for branching to the link address for the pattern block. The PAM memory consists of two interleaved sets of video dynamic RAMs ("VRAMs"). To allow high-speed pattern presentation, alternate patterns are fetched from alternate sets. An entire sequence of linked pattern blocks filling all the PAMs on a PAC can be presented to the Pattern Bus at 25M patterns per second without pauses. Novel PAC and PAM circuitry and an associated method of use, allows the internal VRAM shift registers to be used to continuously repeat a pattern subsequence to an HME while the HMS waits for a feedback condition to occur.

The PEL preferably includes control circuitry and five identical custom integrated circuits ("CICs"). A single PEL can support an HME having up to 80 pins. The PEL has programmable reference voltage generators and an electrical interface to the HME which allows it to support HMEs of any of a variety of logic families. Using precision timing signals from the TG, the PEL formats clocks and data, on a per-pin basis, to be presented to the HME. The PEL samples all of the HME pins and retain the sampled values for access by the CPU.

Novel circuitry and an associated method of use allow the HMS to accurately determine HME output delays. To determine HME output delays, the HMS repeatedly presents a fixed pattern sequence to the HME, each time sampling all HME outputs at a variable sampling time relative to the presentation time of the final pattern in the sequence. The HMS thus searches for the transition time of each HME output. A novel parallel binary search method reduces the number of repetitions required to determine all output transition times.

The five CICs on the PEL provide a means for driving and sensing the HME pins, and for checking for errors in the patterns received from the PAM via the PAC, Pattern Bus, and PEL. Each CIC preferably supports up to sixteen bi-directional HME pins. Functions of the CIC circuitry for driving and sensing HME pins (CIC "channels") are software programmable on a per-pin basis. Programming of each channel occurs serially using the Pattern Bus.

Novel analog and digital circuitry within the CIC and an associated method of use allow all pins of the HME, including I/O and control pins, to be accurately sampled while being simultaneously stimulated. This circuitry and method of use avoids any interference between the stimulus and the measurement by driving each I/O pin of the HME toward the target logic level of the simulated external circuitry using a current-limited soft driver in the CIC which can be overdriven to either logic level by the HME pin. At the same time that the CIC soft-drives the HME pin, the CIC compares the resulting voltage of the HME pin with four programmable reference voltages to determine whether the HME pin is driving toward the same logic level, the other logic level, is not driving, or is at an intermediate voltage level. Each channel of the CIC has the capability of distinguishing and retaining, for later CPU access, five states of each connected HME pin: driving low ("H0"), driving high ("H1"), non-driving low ("Z0"), non-driving high ("Z1") and unknown ("U"). In particular, the CIC channel has the capability to distinguish H0 from Z0 and E1 from Z1. Software-programmable reference voltages and software-programmable soft-drive current limits allow the CIC to properly stimulate and accurately sample HME devices of multiple logic families, including TTL, NMOS, CMOS, and low-voltage CMOS.

The DAB is the fixture for connecting the HME to be modeled to the PEL. The DAB has circuitry that allows the DAB, with the attached HME, to be connected to, and disconnected from, the HMS while the HMS is powered. Novel circuitry and an associated method of operation allow the HMS to automatically detect the presence and type of each DAB, and to track the DAB configuration as it changes. Novel connection means included on the DAB allows a single DAB type to support devices with multiple different package styles, sizes, and types.

The HMS software consists of the core modeler code ("CMC") and the host resident code ("HRC"). Because of the novel structure of the CMC and HRC, the HMS can be quickly and easily integrated with multiple different simulators which run on multiple different workstation types.

The software that executes on the host computer includes the Simulator Function Interface ("SFI") and utilities. The SFI consists of a library of routines which are linked with a target simulator and provide access to the HMS. All communications between the simulator and the HMS is through the SFI. The utilities consist of a library of routines which provide HMS administration, remote hardware diagnostics, and test-vector support. The SFI and utilities are simulator independent and are written in a standard programming language ("C"). The SFI and utilities can be integrated with various simulators running on various workstation types without detailed knowledge of the CMC.

The CMC includes the complex HMS control software, including a real-time operating system, a network support module, a Simulator Function Interface command processor, a shell-software compiler, and a modeler handler. The CMC is simulator, and platform, independent.

In operation, the HMS provides a means for presenting stimulus events originating within the simulator to an HME serving as a simulation model, and for returning the correct results to the stimulator.

Evaluation of a HME in response to a simulated event on an HME input proceeds as follows:

1. The HMS resets the HME to a known initial state using an "initialization sequence" specified in the shell software;

2. the HMS forces the HME to the internal state that the simulated device instance had prior to the current event;

3. the HMS presents the new event(s) on the appropriate HME pin(s);

4. after the HME outputs and I/Os have settled, the HMS samples all outputs and I/Os of the HME; and 5. the HMS returns any output changes to the simulator, with appropriate scheduling delays attached.

The scheduling delay for each output change is either inferred from a table of input-to-output delays in the shell software, or is directly measured by the HMS.

In general, forcing the state of the HME involves presenting a "history sequence" of patterns to the HME. The history sequence represents all events which have been presented by the simulator to the HME since the beginning of the simulation sequence. The HMS of the present invention uses novel pattern storage and presentation circuitry and method of use to represent the history sequence, generally using a single bit per pin in each pattern. The HMS of the present invention thus reduces the cost of required pattern memory and the cost of supporting pattern-transmission circuitry.

In general, for patterns in which a given HME I/O pin is not driving (as determined by previous measurement), the single pattern bit for the HME pin causes the CIC to drive the HME pin in the same direction that the simulated external circuitry is driving, and for patterns in which the HME pin itself is driving, the single bit causes the CIC to drive the HME pin in the same direction as the HME pin is driving. Patterns in which HME I/O pins switch direction are represented and stored as two sequential patterns: the first enables or disables the CIC pin driver, as appropriate, and the second contains the logic level for the CIC to drive toward. The HMS drives HME I/O pins using the current-limited "medium driver" of the CIC. The current limit of the medium driver avoids excessive current levels when the CIC and HME drivers temporarily fight during switching. The HMS drives HME input pins using hard drivers, and drives HME output pins using soft drivers.

An object of the present invention is to provide an HMS and methods of use that will allow modeling and verification of standard off-the-shelf ICs, ASICs, and PC boards, including both functionality and timing for those devices.

Another object of the present invention is to provide an HMS and method of use that incorporates simulator-independent architecture with a standard, high-level interface.

Another object of the present invention is to provide an HMS and method of use that can be networked and concurrently accessed by multiple simulators of different types, running on multiple workstations or host computers of different types.

Another object of the present invention is to provide an HMS and method of use which provides shorter round-trip access times and provides higher pattern-presentation rates for very long pattern sequences.

Another object of the present invention is to provide an HMS that is more reliable than prior-art systems and that can be manufactured at lower cost for equivalent functionality.

Another object of the present invention is to provide an HMS and method of use that correctly determines the states of HME I/O pins independent of the manner in which the I/O pins are connected inside the HME.

Another object of the present invention is to provide an HMS and method of use which requires a smaller number of physical pattern memory bits to store the history sequences for HMEs.

Another object of the present invention is to provide an HMS which is independently and easily configurable in the dimensions of HME pins count, pattern-memory depth, and number of HME devices simultaneously mounted.

Another object of the present invention is to provide an HMS and method of use that supports HMEs of multiple logic families.

Another object of the present invention is to provide an HMS which is capable of more conveniently and economically supporting HMEs with very high pin counts.

Another object of the present invention is to provide an PINS and method of use that supports direct measurement of output delays for use in simulation and verification of prototype ASICs.

Another object of the present invention is to provide an HMS and method of use that will allow any member of a family of different HME package sizes and types to be fixtured using a single standard fixture.

Another object of the present invention is to provide an HMS and method of use that will allow HMEs to be fixtured without extensive custom wiring, special initialization circuitry, or complex software shells.

Another object of the present invention is to provide an HMS and method of use that permits an HME to be connected to, or disconnected from the HMS while the HMS is powered.

Another object of the present invention is to provide an HMS and method of use that will allow the collection, in a simulator-independent manner, of test vectors for an HME being used in a simulation.

Another object of the present invention is to provide an HMS and method of use that will allow the functional verification of HME operation relative to a set of test vectors in a simulator-independent manner.

These and other objects of the present invention will be described more fully in the remainder of the specification.

BRIEF DESCRIPTION OF THE DRAWINGS

FIG. 3 shows the categories of functions supported by the Simulator Function Interface of the present invention.

DETAILED DESCRIPTION OF A PREFERRED EMBODIMENT

The present invention is an improved HMS and method of use which may be embodied as a stand-alone system for connection to one or a variety of host computers, called workstations, that are used to design digital electronic systems.

Figure 1:
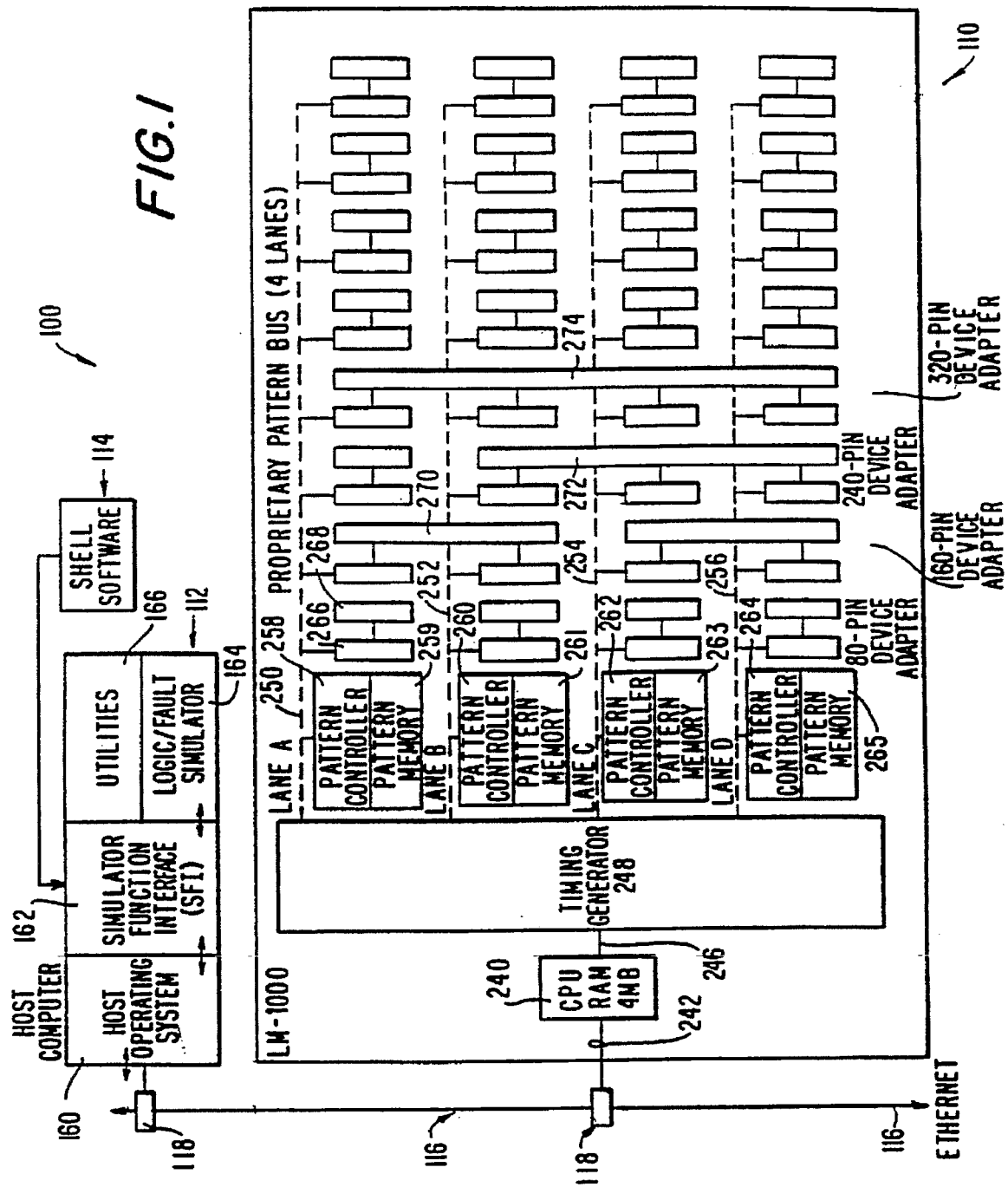
FIG. 1 is a schematic drawing of the preferred embodiment of the HMS of the present invention.

FIG. 1 shows the HMS of the present invention generally at 100. The HMS includes the section associated with the host computer, shown generally at 112, and the stand-alone section, shown generally at 110. The host computer and the stand-alone section of the HMS are preferably connected by an Ethernet® (IEEE 802.3), which is shown at 116. Ethernet® is a registered trademark of Xerox Corporation. Preferably, the Ethernet® hardware and software systems manufactured by Sun Microsystems are used. The Ethernet® protocols that are preferably used are the TCP/IP and UDP/IP protocols. The use of Ethernet® allows networking of a number of HMSs and host computers.

After a brief overview of the HMS of the present invention, the section associated with the host computer will be discussed in detail, then the stand-alone section will be discussed in detail.

Figure 2:
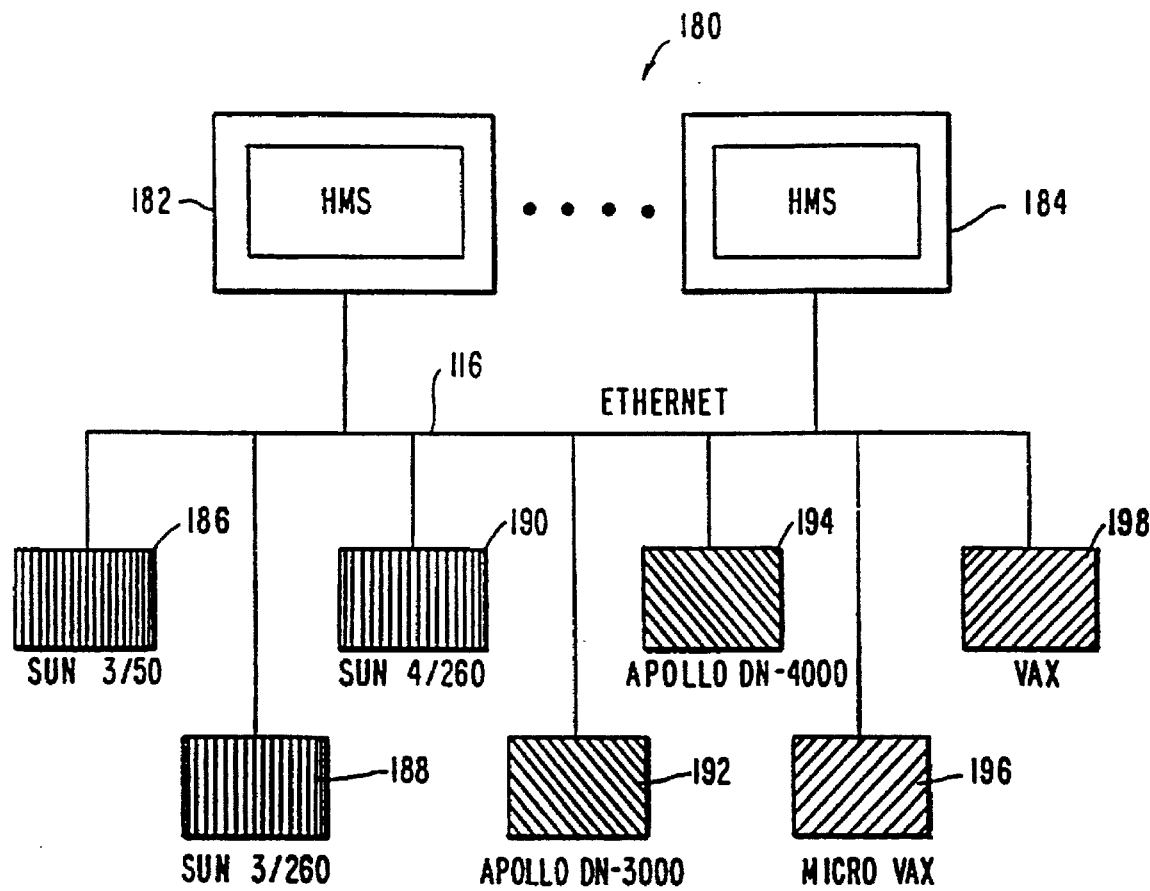
FIG. 2 is a block diagram of a network of workstations and the HMSs of the present invention.
Figure 4:
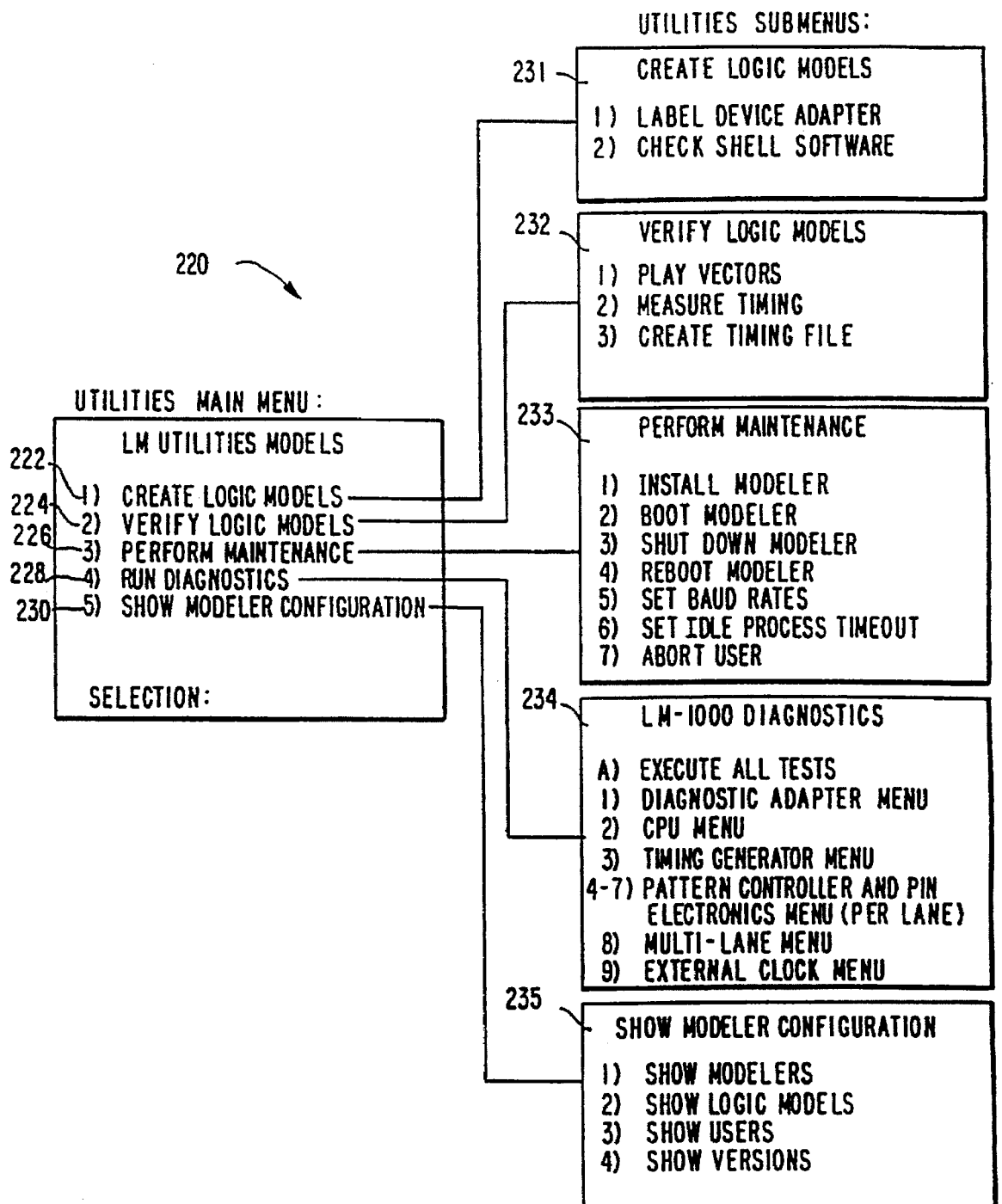
FIG. 4 is a block diagram of the Utilities.

The HMS 100 can be dedicated to a particular host computer, or it can be part of a network as shown in FIG. 2. The network generally shown at 180 includes HMSs, HMS1 to HMSN, and representative network workstations 186, 188, 190, 192, 194, 196, and 198. In network 180, the HMS support multiple simulations on the several different workstations. Different simulator programs can run on the different workstations and can all concurrently access any HME on any of the HMSs.

The host computers shown in FIG. 2 are conventional workstations. They are representative host computers to which the HMS of the present invention may be connected. These host computers are the Sun-3™ and Sun-4™ manufactured by Sun Microsystems; Apollo® DN-3000, Apollo® DN-4000, and Apollo® DN-10000 manufactured by Apollo Computer; 80286-based and 80386-based personal computers manufactured by Compaq and IBM; and DEC VAX™ computers manufactured by Digital Equipment Corporation. Sun-3™ and Sun-4™ are trademarks of Sun Microsystems, Inc.; Apollo® is a registered trademark of Apollo Computer, Inc.; and DEC VAX™ is a trademark of Digital Equipment Corporation.

Again referring to FIG. 1, the depiction at 112 represents the host computer and the novel host resident software and shell software, which are part of the HMS of the present invention. Host operating system 160 and logic/fault simulator 164 are part of the conventional host computer and are not part of the present invention.

A listing of all the HMS software, including the CMC software, is attached as Appendix III. This listing of HMS software is written in the "C" programming language, as supported by the Sun-3™ workstation manufactured by Sun Microsystems. The software listing is divided into major sections: "lm," "include," "sfi," "networkh," "networkm," "networkc," "shellswh," "shellswm," "shellswc," "diags," "bsp.diags," "tasks.diags," "lm1000," "bsp.lm1000," "tasks.lm1000," "os," and "misc." The name of the major section is shown at the top of each listing page in the box labeled "SOURCE PROGRAM." The "SOURCE PROGRAM" box also shows the name of the routine listing on the page, following the major section name. Where appropriate, the specification will refer to specific portions of supporting software.

In order to better understand the HMS software, each of the major software sections will be briefly described. The "lm" section contains the primary source code for the utilities. This code relies on the "sfi" section for low level routines. The "include" section contains the source code for all "C" language include files that are shared by more than one section of code. The "sfi" section contains the source code for communication between the simulator and the HMS. The "networkh" section contains the source code that implements the host side of the Ethernet®/UDP/IP support. The "networkm" section contains the source code that implements the upper levels of the modeler side of the Ethernet®/UDP/IP support. The lower levels of the network support are part of the VRTX® operating system. VRTX® is a registered trademark of Ready Systems. The "networkc" section contains the source code for routines that are common to both the host and HMS sides of the network support. The "shellswh" section contains the source code for the small amount of shell software processing that is performed on the host. The "shellswm" section contains the source code for the shell software processing that is performed on the HMS: all scanning, parsing, constraining, and back-end code generation of the shell software is performed by this code. The "shellswc" section contains the source code for routines that are common to both the host and HMS sides of the shell software processing. The "diags" section contains the source code implementing the HMS diagnostics. The "bsp.diags" section contains low-level source code that supports interrupts, timers, UARTS, etc., during execution of the diagnostics on the HMS. The "tasks.diags" section contains the source code that implements the VRTX® tasking model used during execution of the diagnostics; for example, there is a housekeeping task that executes as the lowest priority, performing various watchdog and clean-up activities as needed, there are receive and transmit tasks that handle modem and console port communications. The "lm1000" section contains the source code that implements pattern management, HME evaluation, and other basic HMS functionality. The "bsp.lm1000" section contains the source code that supports interrupts, timers, UARTS, etc., during the execution of the CMC. The "tasks.lm1000" section contains the source code that implements the VRTX® tasking model used during execution of the CMC. The "os" section contains the source code that implements the VRTX® support, including low-level network control and control of all CPU on-board resources. The "misc" section contains the source code implementing miscellaneous functions common to both the host and HMS code.

The host resident software includes SFI 162 and utilities 166. Shell software 114 is not part of the host resident software. SFI 162 is a library of routines which are linked with logic/fault simulator 164 and provide the simulator access to the section of the HMS shown at 100. The SFI consists of the routines and definitions in the major software listing sections "sfi," "include," "networkh," "networkc," "shellswh," "shellswc," and "misc." The SFI integrates eighteen HMS functions into simulator code, giving the simulator the ability to create HME definitions, instances, and faults on the HMS. The SFI also enables the simulator to map the simulator pin names to HMS pin names and map simulator logic/strength values to and from values supported by the HMS. The SFI permits input and I/O pin values from the simulator to be presented to the HME, and permits the sensed logic/strength value of an output pin or I/O pin transition to be returned to the simulator, with the minimum/typical/maximum delay values.

Preferably, SFI 162 is written in the "C" programming language as supported by the Sun-3™ workstation manufactured by Sun Microsystems. If the simulator is written in a language other than "C," the simulator and HMS may be linked by routines that bridge the simulator language to "C." This feature, coupled with other features, renders the SFI independent of the simulator and host computer.

The SFI routines are divided into several categories on the basis of their use. These categories are shown in FIG. 3 generally at 200. The functions of Begin/End category 202 are used to begin an HMS modeling session and to end the session. The lm_begin_modeling_session function is used at the beginning of a simulation to allocate all host data structures, to initialize the communications link, and to allocate and initialize all HMS resources. The lm_end_modeling_session procedure is used to terminate the session and release all host and HMS resources. Each of these functions is called once per simulation.

The functions in Create category 204 are used to create device definitions (lm_create_definition), instances of these defined devices (lm_create_instance), and instances of the defined devices in faulty circuits (lm_create_fault). These three create functions generate a tree structure with the device definition as the root, device instances at the next level, and faulty circuit device instances (faults) at the leaf level. The fault creation functions are normally only used for fault simulators.

The functions in Release category 206 include the functions lm_release_definition, lm_release_instance, and lm_release_fault. These three functions are the complements of the three create functions, and are used to release (free) the resources associated with their respective entities.

The functions in Set category 208 establish settable parameters, mappings, and values. The function lm_set_simulation_tick defines the simulator's minimum time unit, and the function lm_set_simulation_time establishes the current simulation duration (in simulation ticks). Following a call to the function, lm_set_simulation_time establishes the current simulation duration (in simulation ticks). Following a call to the function lm_set_simulation_tick, all time information communicated to or from the simulator is in the defined time units. The function lm_set_pin_map creates a 1-to-1 mapping from simulator pin identifiers to HMS pin names defined in the shell software. The function lm_set_logic_level_map creates a mapping from simulator logic/strength values to those supported by the HMS. This mapping allows the simulator to use any desired internal representation to communicate with the HMS. The function lm_set_pin_value then allows the simulator to establish the logic/strength values for both input and I/O pins using the predefined logic level map. Only signal transitions need be communicated to the HMS, increasing performance and reducing network traffic.

Get category 210 contains only the function lm_get_pin_value. This function is used to retrieve the logic/strength value of an output (or I/O) pin, and the minimum, maximum, and typical delay values for the transition. Only outputs that transition are returned from the HMS.

Save/Restore category 212 contains two functions. The function lm_save_modeler_state saves the current state of the modeling session to a file, and the function lm_restore_modeler_state restores that state. This pair of functions may be used to allow suspension of a simulation for later resumption. The simulation state is stored as a file which is host and HMS-independent; any HMS which contains the necessary resources may be used for restoring. Thus, a save can be done on one HMS and the state can be restored on a different HMS.

The functions in Inquire category 214 provide a general mechanism for checking the status of the HMS parameters. These parameters include the total pattern memory, total system memory, available pattern memory, number of users, number of lanes and slots, number of HMEs, number of PELs, number of active instances, number of active faults, type and version number of each system component, available devices and their locations in the system, types of HMEs in the system and their DAB IDs, memory usage in each lane, memory usage of each instance, and memory usage of each user.

The functions in Miscellaneous category 216 perform the following operations: selecting a particular HMS for inquires, turning timing measurement on and off, extracting shell software created by the Create category, setting the HMS to repeat a specific pattern history in an infinite loop to allow observation of the HME using external test equipment, and conducting maintenance and diagnostics.

Utilities 166 is a library of routines which are installed on the host workstation and provide menu-driven simulator-independent utility programs designed to help create and verify models, perform maintenance on the HMS, and perform diagnostics. Utilities 166 consists of the routines and definitions in the major software listing sections "lm," "sfi," "include," "networkh," "networkc," "shellswh," "shellswc," and "misc." The Utilities have five main categories, each of which has a submenu. The five main categories are Create Logic Models category 222, Verify Logic Models category 224, Perform Maintenance category 226, Run Diagnostics category 228, and Show Modeler Configuration category 230.

Create Logic Models category 222 has the submenu shown at 231. The submenu includes Label Device Adapter and Check Shell Software. The Label Device Adapter labels the DAB. The label must match the label given in the shell software. The check shell software utility performs a syntactic and semantic check on the specified shell software by sending the shell software to the HMS, where it is parsed and error checked.

Verify Logic Models category 224 has the submenu shown at 232. The submenu includes Play Vectors, Measure Timing, and Create Timing File. The Play Vectors utility presents test patterns in TSSI format, as supported by Test System Strategies, to the HME and compares the results with the expected results to verify the correct operation of the HME. Specifically, this utility creates an instance of the HME, plays patterns from a Test Vector file to the HME, and measures the states of the output and I/O pins of the HME after each pattern. It also stores the results in an output file. If there is a discrepancy, the instance number, pattern number within the file, and the pattern time are provided to the user.

The Measure Timing utility measures the actual physical output delays of the HME. This utility repeatedly presents inputs from the Test Vector input file to the HME, measures the resulting delays, and stores them in the Timing Measurement file.

The Create Timing File utility creates a single Timing file from one or more Timing Measurement files that were previously created with the Measure Timing utility. The Create Timing File utility reads all specified files, and for each delay, records the minimum and maximum values, and calculates the typical delay by averaging the minimum and maximum values. The resulting file lists each delay only once, and is appropriate for use as a shell software Timing file for the HMS.

Perform Maintenance category 226 has the submenu shown at 233. The submenu includes Install Modeler, Boot Modeler, Shut Down Modeler, Reboot Modeler, Set Baud Rates, Set Idle Process Timeout, and Abort User. The Install Modeler utility configures the HMS for booting. It collects and sends the boot information to the HMS, including down loading the CMC.

The Boot Modeler utility manually boots the HMS. In order to boot the HMS, the HMS must be shut down, and must wait for the CMC to be down loaded.

The Shut Down Modeler utility performs an orderly shutdown of the HMS. The HMS will remain shut down until it is booted with the Boot Modeler utility.

The Reboot Modeler utility performs an orderly shutdown of the HMS and immediately restarts the HMS.

The Set Baud Rates utility allows the user to set the baud rates of the two RS-232 HMS communication ports. The new baud rates are effective immediately after executing the utility.

The Set Idle Process Timeout utility establishes a timeout period on the HMS. When the timeout period is set, any process that has remained idle for the specified time period on the HMS will be checked by the host computer, and if the connected process no longer exists on the host computer, the modeling session is terminated and resources that had been allocated to the user on the HMS are made available to other users.

The Abort User utility allows the user to manually remove the HMS processes which are no longer active. Inactive processes are left on the HMS when the simulation session or utilities session terminates abnormally. Inactive processes may be holding resources on the HMS which are needed for other simulation sessions. The Abort User utility releases all HMS resources associated with a particular user.

Run Diagnostics category 228 has the submenu shown at 234. It includes Execute All Tests, Diagnostic Adapter Menu, CPU Menu, Timing Generator Menu, Pattern Controller and Pin Electronics Menu (per lane), Multi-Lane Menu, and External Clock Menu. The Run Diagnostics category allows the user to run HMS diagnostic programs from the host computer.

The Execute All Tests utility runs all of the diagnostic tests. As each test is completed, a status message is generated which is representative of the test that was performed and the outcome of the test.

The Diagnostic Adapter Tests utility performs tests on the PEL using a special diagnostic adapter which connects to the PEL in place of an HME. The diagnostic adapter plugs into a single PEL and allows all of the pin drivers and sensors of the PEL to be exercised using a signature analysis algorithm. The design of the diagnostic adapter is well within the capability of one skilled in the art. To fully verify the PELs, this utility should be run for each PEL. When this utility is used, the diagnostics search every configured lane in the HMS and perform the tests on every PEL that has a diagnostic adapter installed.

The CPU Menu, Timing Generator Menu, Pattern Controller Menu and Pin Electronics Menu (per lane), and Multi-Lane Menu contain the detailed diagnostic testing utilities for the specified component or circuitry.

The External Clock Menu utilities measure and verify the frequency of external clocks connected to the two external clock connections of the HMS. These tests are not run as part of the Execute All Tests utility because this utility requires additional hardware that may not always be connected to the HMS.

Show Modeler Configuration category 230 has the submenu shown at 235. This submenu includes the utilities Show Modelers, Show Logic Models, Show Users, and Show Versions. The Show Modelers utility lists the available HMSs on the network and describes their configuration. The configuration information may include a list of major hardware components, the amount of CPU memory being used, the number and location of PACs, PAMs, or PELs, the amount of pattern memory used or available per lane, the number of instances and faults being modeled per lane, a list of active users and their host machines, and the software version being used.

The Show Logic Models utility lists the HMEs currently available on a specified HMS, and provides information about each HME. This information may include its lane/slot location, the HME status, whether it is used as a public or private device, the number of active instances of the HME, the number of active faults, the type of DAB, and the DAB revision number and manufacturer.

The Show Users utility provides a brief summary of the status information about each current user. Such information may include the host name, the total number of public or private HMEs used, the total amount of pattern memory used and the total number of active instances and active faults created by the user.

The Show Versions utility provides the current revision levels of all installed HMS hardware and software.

Figure 5:
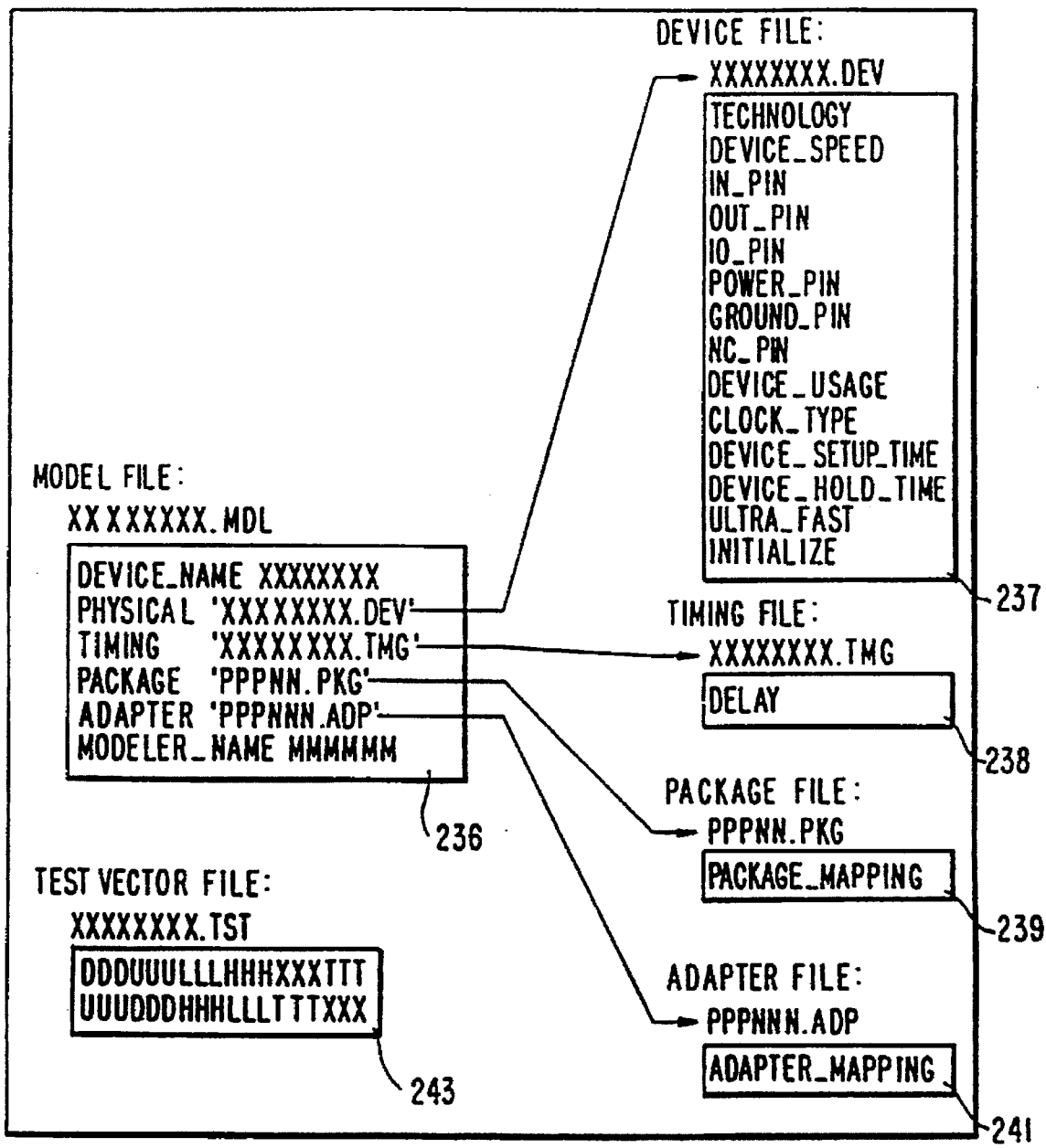
FIG. 5 is a block diagram of the Shell Software.

FIG. 5 shows the structure of shell software 114. By way of example, a listing of preferred shell software for an HME containing the MC68020 microprocessor manufactured by Motorola Semiconducter and a listing of preferred shell software for an HME containing the AM7990 Ethernet® controller IC manufactured by Advanced Micro Devices are provided in Appendices I and II, respectively. The shell software describes the HME to the HMS. The exact contents of the shell software varies depending upon the characteristics of the HME device. The following describes the features and capabilities of shell software in general.

All processing of the shell software is done on the HMS. The shell software consists of statements arranged in files that define the specific characteristics of the HME to be modeled, and the DAB to which it is attached. Table 1 lists representative statements, the file type, and a brief description of the shell software.

TABLE 1

| Statement | File | Description |
| --- | --- | --- |
| device_name | Model | Associates the shell software with a particular HME. |
| technology | Device | Specifies the device technology process. |
| device_speed | Device | Specifies the device clock frequency range. |
| in_pin | Device | Defines the input pins and attributes. |
| out_pin | Device | Defines the output pins and attributes. |
| io_pin | Device | Defines the I/O pins and attributes. |
| power_pin | Device | Defines the power pin numbers. |
| ground_pin | Device | Defines the ground pin numbers. |
| nc_pin | Device | Defines the no-connect pin numbers. |
| package_mapping | Package | Defines the device package mapping. |
| adapter_mapping | Adapter | Defines the DAB mapping. |
| modeler_name | Model | Selects a specific HMS. |
| device_usage | Device | Enables and disables pattern history replay. |
| clock_type | Device | Selects the source of the pattern clock. |
| device_setup_time | Device | Specifies the worst case setup time of any HME pin. |
| device_hold_time | Device | Specifies the worst case hold time of any HME pin |
| initialize | Device | Defines the initialization pattern sequence. |
| delay | Timing | Lists the data sheet propagation delays. |

The shell software for an HME and DAB may be stored in a single file, except for the test vectors, which are stored in a separate file. However, the preferred file structure of shell software 114 is shown in FIG. 5. In FIG. 5, main Model file 36 serves as the header file for the shell software of the HME. The Model file contains the "device_name" statement, the "modeler_name" statement, and a list of shell software file directives which will be explained. The required "device_name" statement is used to associate the shell software with the physical DAB and HME. The character string "name" specified in the statement must exactly match the character string used to label the DAB as per the Label Device Adapter utility. If the two do not match, the MS will not be able to locate the proper hardware for the shell software. The optional "modeler_name" statement is used to specify the name of the HMS to be used in case there are multiple HMSs on the network.

The four directives "physical," "timing," "package," and "adapter," provide a preferred method of structuring the shell software. The "physical" directive is used to include the information in the Device file 237 that describes the HME being modeled. The "timing" directive is used to include the information in Timing file 238 regarding model timing. The "package" directive is used to include the information in Package file 239 that describes the HME package. The "adapter" directive is used to include the information in Adapter File 241 that describes the DAB being used.

The statements of Device file 237 will now be described. The required "technology" statement describes the power supply and current levels appropriate for the fabrication technology of the HME, which could be, for example, NMOS, CMOS, LCMOS, or TTL. The current values defined with the "technology" statement apply to all pins of the HME, but may be overridden on a per-pin basis using the "out_pin" and "in_pin" statements.

The required "device_speed" statement specifies the allowable frequency or period of the pattern clock of the HME. The frequency that is specified is either a single maximum or a range. The specified period may also be either a single maximum or a range.

The six HME pin description statements are "in_pin," "out_pin," "io_pin," "power_pin," "ground_pin," and "nc_pin." All HME pins should be listed in the shell software as one of these pin types. Input and I/O pins have simulator data presented to them, while output and I/O pins are sampled to detect changes, which are then passed back to the simulator. Power, ground, and no-connect pins are not driven during simulation.

The "in_pin" statement maps the user-defined input pin name to the actual HME package pin number. The input pin attributes, which are part of the statement, specify which inputs can affect the state and the outputs of the HME. The attributes for "in_pin" are "eval," "store," "edge_rise," "edge_fall," and "keepalive." Changes on an "eval" pin may cause changes at the outputs of the HME, but do not cause changes in the internal state of the HME. Any rising or falling changes on a "store" pin may cause changes at the outputs of the HME and changes in the internal state of the HME. An "edge_rise" pin is a pin with respect to which only a rising edge on the pin may cause changes to the outputs and internal state of the HME. An "edge_fall" pin is a pin with respect to which only a falling edge on the pin may cause changes to the outputs and internal state of the HME. The "keepalive" attribute should be included to document which pin has the keepalive signal connected to it on the DAB. The "keepalive" attribute is used in addition to any of the other attributes.

The "out_pin" statement maps the user-defined output pin name to the actual HME package pin number. One output pin attribute is "feedback." If the HME pin is being used for feedback in an initialization sequence, then the "feedback" attribute must be specified. In this case, the HME pin must be connected to the feedback pad on the DAB, and the feedback sequence must be described in the "initialize" statement.

The "io_pin" statement maps the user defined I/O pin name to the actual HME package pin number. I/O pins share all of the attributes of input and output pins.

The "power_pin," "ground_pin," and "nc_pin" statements define the HME package pin numbers for the power, ground, and no-connect pins, respectively. These pins are not driven during simulation.

The optional "device_usage" statement is used to indicate whether the HME is public or private. A public HME is one to which a history sequence is presented in order to restore its internal state. A private HME retains its state internally between evaluations. A public HME can be shared between multiple simulations and between multiple device instances in a simulated design, whereas, a private HME can represent only a single device instance in a single simulation. Only static devices (devices with no minimum clock-rate specification) can be used in private HMEs. Either static or dynamic devices can be used in public HMEs.

The optional "clock-type" statement specifies the clock source for the HME. The clock may be the internal clock signal generated by the TG, or it may be an external clock.

The optional "device_setup_time" statement is for overriding the default setup time. The HMS will always present input and I/O transitions at least as much in advance of HME store, edge_rise, and edge_fall pin transitions as this parameter specifies, thus guaranteeing at least this amount of setup time.

The optional "device_hold_time" statement is for overriding the default hold time.

The optional "initialize" statement is used whenever a public device is evaluated, to put the device in the same fixed internal state prior to presenting the history sequence. This statement defines an initialization sequence that is applied to the HME for this purpose. This may be accomplished by an initialization sequence consisting of fixed patterns, or by feedback initialization, which consists of a pattern sequence that is repeatedly presented to the HME until a desired internal state is attained. The two types of sequences will be discussed in detail, subsequently.

Timing file 238 includes one statement, the "delay" statement. The HMS supports minimum/typical/maximum HME output delays by means of the shell software "delay" statement. When delay information about an output or I/O pin is provided in the Timing file, the value specified for the delay is returned to the simulator whenever that pin changes state during simulation.

Package file 239 and Adapter file 241 specify the mapping between the HME package pin numbers and the DAB net numbers which connect to the PEL. The "package_mapping" statement reflects the design of the HME device package; it translates HME device package pin numbers into DAB pin names. The "adapter_mapping" statement reflects the design of the DAB itself; it translates DAB pin names into DAB net numbers. Every DAB pin name in the master footprint area of the DAB maps to one DAB net number. Multiple DAB pin names may map to a single DAB net number.

Test Vector file 243 contains input stimuli and expected outputs for the HME in TSSI format, as supported by Test System Strategies. This file constitutes a functional test program for the HME.

Having discussed the section of the HMS associated with the host computer, stand-alone section 110 and its elements will now be discussed. Before describing the hardware elements of stand alone section 110, the software that executes on the CPU of the HMS will be described. This software is the CMC.

Figure 6:
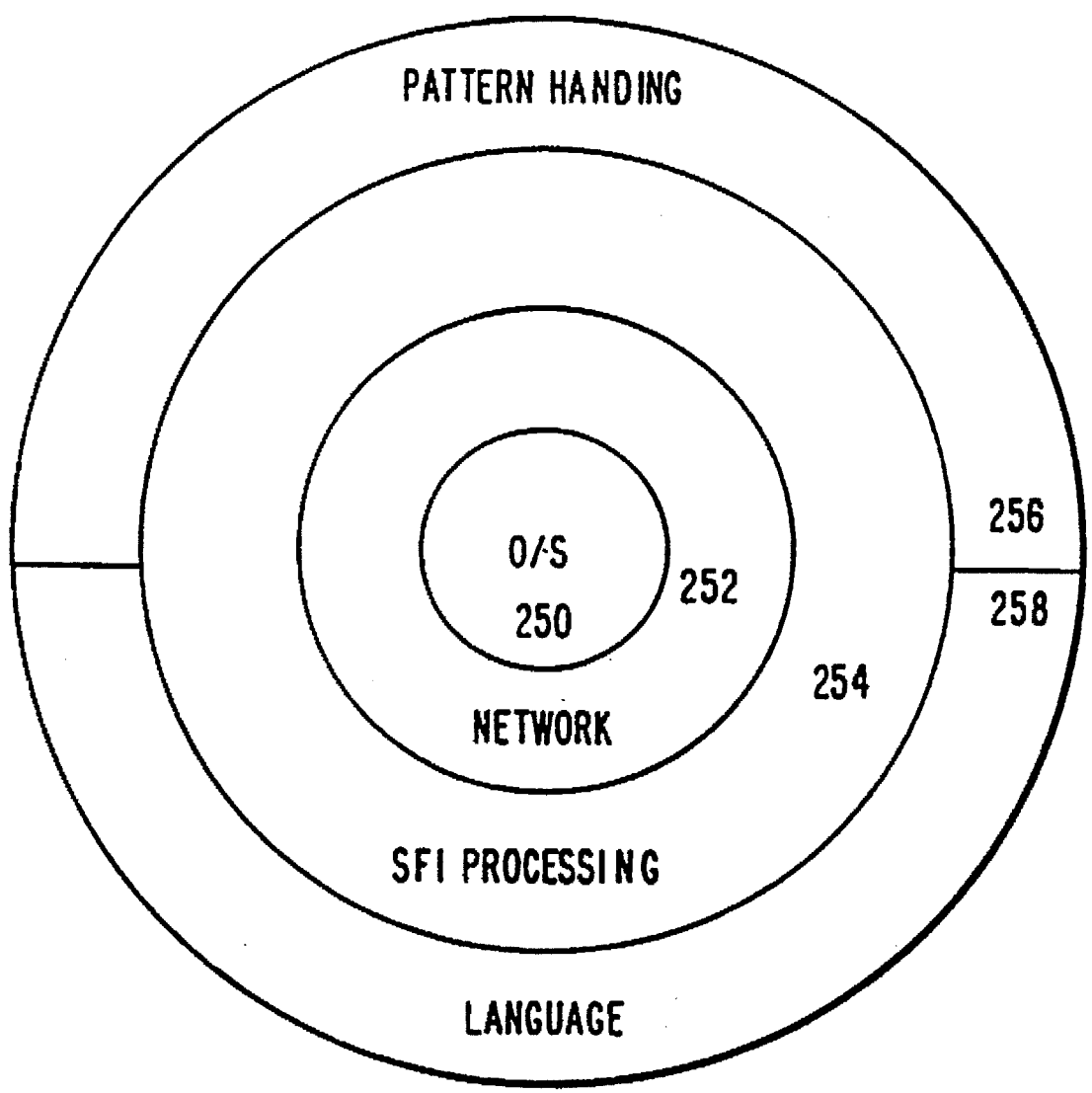
FIG. 6 is a block diagram of the Core Modeler Code.

Referring to FIG. 6, the CMC will be disclosed. The CMC includes diagnostics and run-time code that execute on CPU 240 of the HMS. The CMC diagnostics are used to verify the correct operation of the HMS hardware. They are downloaded to stand alone section 110 when the user runs diagnostics. The CMC diagnostics includes the routines and definitions in the major software listing sections "diags," "networkm," "networkc," "shellswm," "shellswc," "misc," "bsp.diags," and "tasks.diags." The CMC run-time code controls the normal operation of stand alone section 110. It manages pattern sequences in pattern memory, controls HME evaluations, manages the network, compiles shell software, and interfaces to the real-time operating system. The CMC run-time code includes the routines and definitions in the major software listing sections "lm1000," "networkm," "networkc," "shellswm," "shellswc," "misc," "bsp.lm1000," and "tasks.lm1000."

The CMC files preferably are ASCII files. These files are downloaded from the host computer over the Ethernet network to the HMS when the HMS is booted. The CMC includes the Ethernet® support software for the modeler, as well as the modeler control software. Most of the operations required to service simulator requests are performed by the CMC on the CPU.

The CMC software is stored on the host's mass storage system. After power-up or reset, the CMC diagnostics are downloaded to the CPU and executed. If the CMS diagnostics are executed successfully, the CMC run-time code is downloaded and executed. The CMC automatically determines the configuration of the PAMs, PELs, and the DABs. If a valid configuration is found, the CMC waits for requests from the host computer.

Referring now to FIG. 6, the execution of the CMC is supported by a real-time operating system 250. In the preferred embodiment it is the VRTX® system that is commercially available from Ready Systems. The VRTX® system manages the hardware resources of the CPU. Layered on top of the operating system is network support 252 for the Ethernet® connection protocols that are needed to communicate with the host system. The network layer creates a packetized byte stream between the host and the HMS. All communications between the host and the HMS are by this byte stream. The SFI command processing layer 254 on the HMS receives requests from the host computer and a byte stream provided by network layer 252. The SFI command processing layer processes host requests and generates replies which are passed back via the network to the requesting host.

SFI command processing calls upon two major subsections of the CMC to answer host requests. These are language processing and pattern handling subsections. Language processing module 258 parses and error checks the shell software and compiles a binary representation which is used by the HMS for the duration of the simulation. Pattern handling module 256 processes simulator requests for HME evaluation, and returns sampled HME pin changes and output delays to SFI layer 254 for delivery to the host via the network.

Multiple host and multiple user support preferably is provided by queuing multiple requests and then scheduling the CMC to handle each request on a first-come, first-serve basis.

Stand-alone section 110 forms the majority of the HMS of the present invention. For convenience, unless specified differently, a reference to 110 is a reference to the HMS generally.

Referring again to FIG. 1, the HMS at 110 will be described. The elements that are part of the stand-alone section 110 of HMS 100 and their interconnection will be first described in general, then each will be described in greater detail, and the supporting software will be described.

The HMS has two sections: control and modeler. The control section includes CPU 240. The modeler section includes TG 248, the Pattern Bus at 250, 252, 254, and 256, the PACs at 258, 260, 262, and 264, the PAMs at 259, 261, 263 and 265, the representative PEL 266, and the DABs 268, 270, 272, and 274.

CPU 240 is connected to Ethernet® 116 at node 118 by line 242. The CPU preferably has 4 Mbytes of memory. The CPU runs the CMC software and provides Ethernet® network support. TG 248 is connected to CPU 240. TG 248 generates precision timing edges and synchronizes the playing of patterns. CPU 240 accesses the remainder of the HMS through the TG. TG 248 is connected to the four lanes of the Pattern Bus at 250, 252, 254, and 256. The Pattern Bus is used to distribute data in both access and pattern-presentation modes of the HMS. In access mode, the lanes of the Pattern Bus are used to provide the CPU with access to the HMS components.

The HMS preferably has one to four PACs, which are shown at 258, 260, 262, and 264. Each PAC is connected to one of the Pattern Bus lanes. The PAC contains the logic for pattern sequencing. It delivers patterns from the PAMs onto the Pattern Bus for delivery to the PELs. Each PAC has at least one PAM connected to it. Up to four PAMs may be connected to each PAC. The maximum number of patterns stored in the PAMs attached to a single PAC is 2M (512K in each PAM).

PEL 266 is one of up to 32 PELs of the HMS. Each lane may have PELs connected to it. The PELs provide inputs and sense outputs of the HME. The PELs include custom ICs ("CICs") that are novel. The HME interfaces with the PEL via the DAB. DABs 268, 270, 272, and 274 connect to different PELs. The number of HME pins determines the number of PELs to which to the DAB must connect and, thereby, the DAB type. DAB 268 supports HMEs with up to 80 pins, DAB 270 supports up to 160 pins, DAB 272 supports up to 240 pins, and DAB 274 supports up to 320 pins.

Before describing the elements of the stand-alone section in detail, the following general statements regarding the HMS are provided to assist in understanding the operation of the elements of the stand-alone section, their interrelated operation, and the operation of the HMS generally.

The Pattern Bus, and therefore, the HMS, may be operated in one of two modes: "access" mode and "presentation" mode. The HMS operates in the access mode whenever the HME is not being evaluated. The evaluations take place during the presentation mode. During the access mode, the CPU may access the PAM, the pattern-block link table of the PAC, the PELs, and various control and status registers of the HMS. The CPU is capable of programming the various components of the HMS, performing error analysis, and reading and writing addresses. During the presentation mode, patterns are sent to the HME being modeled via the Pattern Bus.

During the presentation mode, an HME is evaluated as either a private or a public device. Private devices retain their internal state between evaluations and, therefore, do not have to have their state restored between such evaluations. Private devices can not be shared between device instances or users, because their internal state must be preserved for the next evaluation. Public devices can be shared between device instances or users because their states are restored before each evaluation.

Static devices may be modeled as either private or public devices. Dynamic devices, however, must be modeled as public devices.

CPU

CPU 240 preferably is a conventional microprocessor-based single-board computer based on the MC68020 microprocessor manufactured by Motorola Semiconductor. The detailed design of an equivalent CPU is well within the capability of one skilled in the art. CPU 240 executes all operational code, including boot, diagnostic, and HMS control functions. An on-board 128 KByte erasable programmable read only memory ("EPROM") contains the boot and diagnostic code. An on-board Ethernet® controller (preferably the AM7990 manufactured by Advanced Micro Devices) interfaces with the Ethernet®. The controller runs the lowest levels of network protocols, while the higher levels are run by the CPU. CPU 240 preferably accesses 4 Bytes of dynamic random access memory ("DRAM"). Approximately 1 MByte is used for programs, and approximately 3 MBytes are used for data. The CPU accesses the rest of the stand-alone section of the HMS through TG 248, during the access mode. The CPU control of the PACs, PAMs, and PELs during the access mode will be described in conjunction with the detailed description of each of those elements. CPU 240 directs the PACs to drive programmed pattern sequences over each of the Pattern Bus lanes to the PELs. The HMS supports 80 bits of pin data per lane at up to 25 MHz, therefore, the Pattern Bus throughput can reach a maximum of 8 billion pin-patterns/second during presentation mode.

Pattern Bus

The Pattern Bus at 250, 252, 254, and 256 is operated in the access and presentation modes. The PACs with their attached PAMs and the PELs with their attached DABs connect to the Pattern Bus. The CPU can cause the Pattern Bus to enter the presentation mode. When it does, the PACs drive pre-stored pattern sequences down each lane to the PELs. CPU 240, however, cannot access any of the elements connected to the Pattern Bus, except TG 248, during the presentation mode. TG 248 distributes a number of precision clocks and timing signals on the Pattern Bus. These are identically driven on all four lanes.

Timing Generator

An overall description of the TG and its operation will first be presented. The TG performs two main functions within the HMS. First, it provides a gateway for CPU communication to the PACs, PAMs, and PELs. Second, it controls the presentation of pattern sequences. The TG generates all system clocks and timing strobes as well as supervising the transition between backplane access and presentation modes. During presentation, the TG monitors the lanes involved for synchronization. If the lanes are out of synchronization, the presentation is aborted and an error is reported to the CPU.

The CPU communicates with the TG using a dedicated interface. The TG decodes each access from the CPU into TG, PAC, PAM, or PEL accesses. Accesses to the TG may occur at any time. Since accesses to the PACs, PAMs, and PELs are via the backplane, they can only take place when the backplane is in access mode.

The two modes of the backplane are referred to as access mode and presentation mode. In access mode, the TG repeats the CPU bus signals on the backplane, and vice-versa, allowing communication from the CPU through the TG to the PACs, PAMs and PELs. Access mode is the default mode and is entered upon power-up or after a system reset.

During presentation mode, PAM contents are clocked out of the PAMs, through the PACs, onto the backplane, and into the PELs and CICs. Using timing strobes generated by the TG, the PEL formats the patterns, as required, and presents them to the HME. During an evaluation of an HME, the backplane always starts in access mode, then transitions to presentation mode, then transitions back to access mode. A state machine on the TG controls these mode transitions. Any attempt by the CPU to access a PAC, PAM, or PEL while the backplane is in presentation mode results in a CPU "bus error."

The TG generates all of the system clocks used during pattern presentation. The system clocks preferably are derived from a phase-locked frequency synthesizer. The reference for this synthesizer is a precision quartz crystal oscillator of preferably 30 MHz.

The TG generates two types of timing strobes for use by the PEL. The first type, referred to as EDGES, is used by the PEL to format the pattern data before presenting to the HME. The EDGES are actually pulses preferably 8 ns wide. A total of six EDGES are generated by the TG. The second type of strobe, referred to as SAMPLE, is used by the PEL to measure the response of the HME to the last pattern in a pattern sequence (the "measurement pattern"). Each stimulus pattern presented to the HME has an associated group of EDGES. Each edge can be programmed to occur at a different time relative to the start of the pattern clock. A single SAMPLE strobe is generated at the end of each pattern sequence.

The TG contains two separate, but similar, ramp generators, one from which the EDGES are derived, and the other from which the SAMPLE strobe is derived. The ramp generators are created by charging a capacitor using a constant-current source and rapidly dumping the capacitor charge at appropriate intervals. The two constant current sources each have four selectable current levels, creating four slopes for each ramp. The ramp voltage thus increases at a software selectable but constant rate. By comparing the ramp waveform to a programmable reference voltage level, time delays can be generated that are proportional to the programmed voltage.

The EDGE ramp is synchronized to the system clock. The duration of the EDGE ramp can be selected to be from one to eight pattern clock cycles. This is the interval in which the six EDGES can be positioned under control of the CMC software running on the CPU. Ramp generation preferably is enabled by control bits from the PACs and PAMs which are driven on the backplane during presentation mode. When the proper code is present on these control bits, a ramp cycle is triggered. At the end of the programmed ramp duration, the ramp is automatically dumped.

Six separate comparators are connected to the EDGE ramp signal. Each comparator connects to an individually programmable reference voltage. Each comparator triggers a pulse generator when the EDGE ramp voltage crosses the reference voltage. In this way, six separate EDGES are generated from the same ramp waveform. The EDGE times are all relative to the trigger point of the EDGE ramp.

A separate comparator with a separate programmable reference voltage is connected to the SAMPLE ramp signal. When the SAMPLE ramp voltage crosses this reference voltage, it triggers the SAMPLE strobe rising edge. The falling-edge time of the SAMPLE strobe is programmable in units of pattern clock cycles. In this way, the rising edge of SAMPLE strobe is precisely adjustable. The rising edge preferably is used for two-state sampling of the HME pins by the CIC. The falling edge preferably is used for five-state sampling, and does not require precise positioning. It is important that the five-state measurement not be corrupted by noise. Therefore, during the SAMPLE strobe, the TG disables all system clocks, disables the feedback out signal, and instructs the PACs and PAMs to inhibit their memory refresh.

In normal five-state sampling, the HME pins are sampled at the end of a pattern sequence presentation. In this case, the two-state SAMPLE edge is simply ignored. In timing measurement, a pattern sequence is repeated many times, each time moving the two-state SAMPLE edge and determining whether or not the HME output pin has transitioned by that time. By noting the time at which the HME output pins transition and subtracting from it the time at which the causative HME input pin transitions, the actual HME output delays are determined. The same SAMPLE ramp slope is used to detect both the causative input pin transition and the output transition, in order to minimize error.

The reference voltages used for all of the ramp comparators are supplied by a programmable, precision DAC (digitial to analog converter). The placement resolution for the EDGES or SAMPLE is dependent upon the resolution available from the DAC and upon the slope of the ramp. Timing measurements are computed from knowledge of two threshold settings of the SAMPLE DAC: one corresponding to the causative input transition, and one corresponding to the resulting output transition.

The accuracy of the EDGE placements and the resulting timing measurements depend on the accuracy to which the ramp slopes are known. The TG contains dedicated hardware that, along with calibration routines in the CMC software, allows measurement of the exact ramp slopes and offsets for each EDGE and SAMPLE. The hardware is a single toggle flip-flop for each EDGE and SAMPLE. The "T" input of this flip-flop is driven from the pattern clock and the clock input is driven from the EDGE or SAMPLE. If the EDGE/SAMPLE rising edge occurs while the system clock is high, the flip-flop toggles, and if it occurs while the system clock is low, the flip-flop does not toggle. After positioning a reference voltage at a particular setting, the time delay corresponding to that setting can be determined by changing the pattern clock period via the programmable phase-locked loop, and then determining whether or not the corresponding flip-flop toggles at that pattern clock period. By adjusting the pattern clock period and repeating the test, a pattern clock period can be found that corresponds to the unknown delay. Since the period of the pattern clock is known precisely, the ramp slope can be calibrated precisely by making two or more measurements.

During pattern presentation, the PAC outputs in the lanes participating in the presentation are compared for agreement of the control bits. If there is any disagreement, the TG latches the offending bits, stops the presentation, and interrupts the CPU.

Now that an overall description of the TG and its operation has been presented, the TG will be described in detail.

Figure 7:
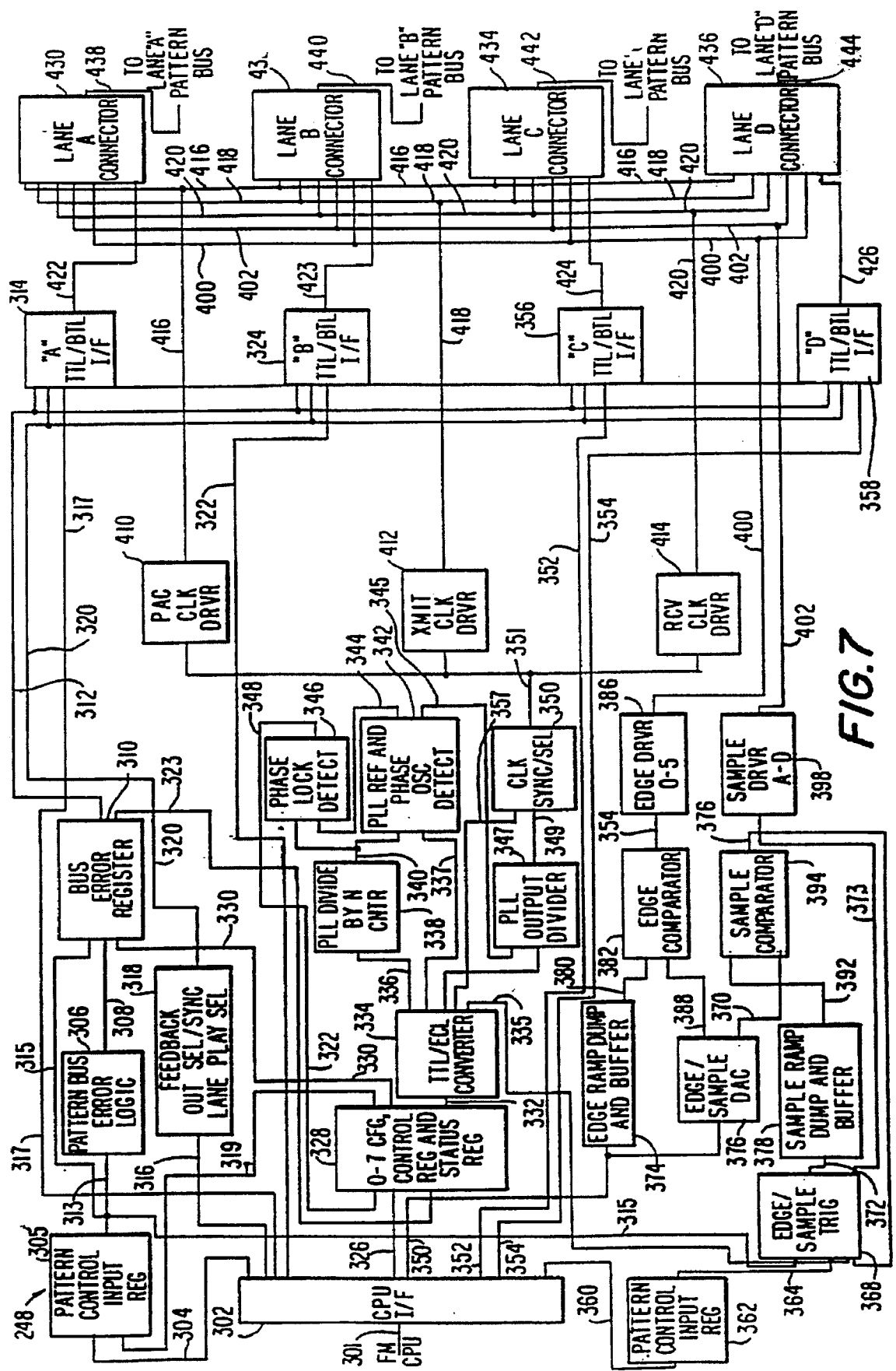
FIG. 7 is a block diagram of the TG of the HMS of FIG. 1.

Referring to FIG. 7, a block diagram of the TG 248 is shown. CPU interface ("CPU I/F") 302 communicates with CPU 240 on line 301. The signals on line 301 include the control signals from the CPU to the CPU I/F, and the address/data signals that are bi-directionally communicated between the CPU and CPU I/F. The CPU I/F buffers and decodes the signals for use by the remainder of the TG.

The decoded signals are used for Pattern Bus lane and PEL selection, and are used as control signals by the PACs and PELs. Line 317 from the CPU I/F connects the signals for Lane "A" to Lane "A" bus transceiver logic interface ("BTL I/F") 314. In a like manner, line 322 connects the signals for Lane "B" to Lane "B" BTL I/F 324, line 352 connects the signals for Lane "C" to Lane "C" BTL I/F 356, and line 354 connects the signals for Lane "D" to Lane "D" BTL I/F 358.

Pattern control input register 305 receives inputs from CPU I/F 302 on line 304 and from 0–7/control/status register 328 on line 309. 0–7/control/status register 328 is connected to CPU I/F 302 via line 326. The information communicated from CPU I/F 302 to register 328 includes buffered control, status, and data signals. The signals received from the CPU I/F in this case, however, are the valid data signals for each lane. The signals received from the 0–7/control/status register are PEL control signals for each lane.

The output of pattern control input register 305 is input to Pattern Bus error logic 306 via line 313. Pattern Bus error logic 306 includes a programmable array logic ("PAL") which determines whether there are errors in the PEL control data and in the data being placed on any of the lanes.

The output of Pattern Bus error logic 306 on line 308 is input to bus error registers 310, along with the output of pattern control input register 305 on line 313 and the output of 0–7/control/status register 328 on line 330. The signal output from logic 306 is an error signal for the lanes; the signal output from register 305 clears error conditions. If there is an error, the bus error register provides error data to 0–7/control/status register 328 on line 323, and an error signal on line 312 to Lane "A" BTL I/F 314, Lane "B" BTL I/F 324, Lane "C" BTL I/F 356, and Lane "D" BTL I/F 358. The error signal will be processed by the PELs and PACs, and their respective associated circuitry, according to the type of error it is. A detected error will also cause the generation of a CPU interrupt signal that is transmitted back to the CPU by appropriate means.

The output of CPU I/F 302 on line 316 is input to the feedback out select synchronizer/lane play select 318. The outputs from CPU I/F 302 are the buffered lane signals from the CPU. Via bi-directional line 320, feedback out select synchronizer/lane play select 318 receives the feedback signal as an input from the HME, to indicate that a desired HME internal state has been achieved. Feedback out select synchronizer/lane play select 318 processes these signals such that the feedback and the lane select signals are clocked from a register at the same time. The signals are used for conducting pattern play, as will be described. The output of feedback out select synchronizer/lane play select 318 on bi-directional line 320 is input to Lane "A" BTL I/F 314, Lane "B" BTL I/F 324, Lane "C" BTL I/F 356, and Lane "D" BTL I/F 358.

All of the input signals to Lane "A" BTL I/F 314, Lane "B" BTL I/F 324, Lane "C" BTL I/F 356, and Lane "D" BTL I/F 358 have now been described. The outputs of these I/Fs are bi-directionally connected to their respective Pattern Bus lane connectors. That is, the output of Lane "A" BTL I/F 314 is connected to Lane "A" connector 430 by bi-directional line 422, the output of Lane "B" BTL I/F 324 is connected to Lane "B" connector 432 by bi-directional line 423, the output of Lane "C" BTL I/F 356 is connected to Lane "C" connector 434 by bi-directional line 424, and the output of Lane "D" BTL I/F 358 is connected to Lane "D" connector 436 by bi-directional line 426.

The signals output from TTL/ECL (transistor-transistor logic/emitter-coupled logic) converter 334 are used for generating delays for the sample strobes and edge times, and for generating the pattern clock signal. The circuitry for generating the clock signals will be discussed first, then the circuitry relating to the sample strobes and precision edges will be discussed.

The output of TTL/ECL converter 334 on line 336 are the programmed clock rate signals from CPU 240. These signals are input to PLL (phase-locked loop) divide-by-N counter 338. Based on the programmed rate, the signals representative of the clock rate are output on line 340 and input to PLL reference oscillator/phase detector 342. PLL reference oscillator/phase detector 342 compares the frequency of the oscillator-generated signal and the signal output from the PLL divide-by-N counter. The difference in the signals drives a voltage controlled oscillator ("VCO").

The output of PLL reference oscillator/phase detector 342 on line 344 is the reference oscillator signal, which is input to phase-lock detector 346. The second input to phase lock detector 346 is the output of PLL divide-by-N counter 338 on line 340. The two inputs are compared, and when matched, the output of the phase-lock detector on line 348 changes state to indicate to that this has been achieved. The output of phase lock detector 346 is input to 0–7/control/status register 328. This register will place this status information on the bus that communicates with CPU 240.

A second output of PLL reference oscillator/phase detector 342 on line 345 is input to a PLL output divider 347. This output is the output of the VCO, and is used as a clocking signal for PLL output divider 347. The other inputs to the PLL output divider on line 339 from TTL/ECL converter 334 are the signals for determining how to divide the PLL output to obtain the desired clock rate. The input signals are processed, and the output of PLL output divider 347 on line 349 is input to clock synchronizer/selector 350.

Clock synchronizer/selector 350 receives an input from divider 347, and is capable of having two external clocks connected to it. The clock select signals from TTL/ECL converter 334 are also input to clock synchronizer/selector 350, via line 357. After the clock signal is selected, it is synchronized. This clock signal will be used to generate pattern clock signals.

The output of clock synchronizer/selector 350 on line 351 is input to PAC clock driver 410, transmit clock driver 412, and receive clock driver 414. The outputs of the PAC clock driver on line 416, the transmit clock driver on line 418, and the receive clock driver on line 420 are input to each of Lanes "A," "B," "C" and "D" via lane connectors 430, 432, 434, and 436. The PAC clock signal is used for generating the clock signal for the PAC. The receive clock signal is used to direct the PAC to receive data. The transmit clock signal is used to direct the PAC to transmit data.

Generation of the sample strobes and the edge times will now be discussed. The signals output from CPU I/F 302 on line 360 are input to pattern control input register 362. These signals are the data valid signals for each lane, and the PEL control signals. The output of register 362 is one of the inputs to edge/sample trigger circuitry 368. The other inputs to this circuitry are the control and select signals for the six timing edges from TTL/ECL converter 334 on line 335, and the output of Pattern Bus error logic 306 on line 313.

The outputs of the edge/sample trigger circuitry 368 on line 378 are charging signals for generating the six timing edges, which are input to edge ramp dump buffer 374. The charging signals are input to circuitry that provides analog outputs for the six edges. These analog outputs are input to edge comparators 382 via line 380. The other input to the edge comparators is the output of the edge/sample DAC 376.

The signals input to the DAC are from CPU I/F 302 on line 350. These signals originate at CPU 240, and are converted to analog signals and compared with respective analog signals from edge ramp dump buffer 374. The comparison of the signals at each of the comparators will cause an output on line 384 to 0–5 edge driver 386. The output of the 0–5 edge driver on line 400 is input to each of Lanes "A," "B," "C," and "D," over its respective connector.

With regard to the sample strobes, the inputs to edge/sample trigger circuitry 368 are the sample mode selection signal and clocking signals from TTL/ECL converter 334. The output of edge/sample trigger circuitry 368 on line 373 is input to the ADC (analog to digital counter) sample driver 398. The output signal has a programmed width. The output of driver 398 on line 402 is input to each of Lanes "A," "B," "C," and "D," via its respective connector.

The other output of the edge/sample trigger circuitry, relating to the sample strobe, is on line 372, and it is input to sample ramp dump buffer 378. This output includes charging signals which are processed by sample ramp dump buffer 378 to generate an analog signal. The analog signal is output on line 392 and is input to sample comparator 394, where it is compared with an analog output from the edge/sample DAC. The output of sample ramp dump buffer 378 preferably is also provided as a test point.

The output of sample comparator 394 on line 396 is input to edge/sample trigger circuitry 368. This signal is used to set the register that provides the output signal to ADC sample driver 398 via line 373.

Having described the circuitry of TG 248, aspects of its operation and interrelationship with other elements of the HMS will now be discussed.

As stated, one of the primary functions of TG 248 is to provide a single source of timing signals for use by the HMS. However, TG 248 also performs other important functions. During the access mode, TG 248 provides a path between CPU 240 and the four lanes of the Pattern Bus, permitting the CPU to access the PACs, PAMs, and PELs to perform read and write operations. This is done in the form of read and write requests. The specific requests that can be made through TG 248 will be discussed in conjunction with the elements to which the requests are made.

The pattern clock that is output from TG 248 clocks the patterns from the pattern memory onto the Pattern Bus. The pattern clock rate is programmable by the CPU and is set according to the "device-speed" parameter specified in the shell software.

The six edge strobes generated by TG 248 are used for formatting HME data and clock input signals. The CMC automatically computes the edge times based on the "device_speed," "device_setup_time," and "device_hold_time" specified in the shell software. TG 248 uses the programmable-slope ramp generator and the six comparators to place the edges with a resolution of approximately 0.5 ns.

The sample strobe is used by the PELs to sample HME outputs. The rising edge of the signal can be swept by the CMC in four ranges, with resolution as fine as 0.5 ns, in order to precisely determine the time of output and I/O pin transitions. The falling edge, which is automatically placed by the CMC, samples the five-state output and I/O pin values.

As briefly discussed above, TG 248 performs error handling functions. The primary function is to detect errors on the four lanes of the Pattern Bus. If an error is detected, an interrupt signal is sent to the CPU. Depending on the type of error, the HMS may discontinue the current evaluation.

Errors detected by TG 248 include parity error, shorted pin error, and DAB error. Parity error detection ensures that proper transmission of patterns takes place and ensures that the patterns are properly received by the CICs on the PELs. A parity error is a fatal error.

The shorted pin error indicates that the CICs of the PEL have detected that a pin driver is shorted. This is not a fatal error.

The DAB error indicates that a DAB has either been inserted or removed, or that the DAB is not active. This is not a fatal error.

TG 248 generates other error signals, in addition to the main signals discussed above. These signals will be discussed in the course of describing the operation of the HMS and the elements that generate the various signals.

The six timing edges that are generated are used for HME data and clock formatting during pattern play. The slope of the analog voltage ramp used to generate the edges is selected to allow all six timing edges to occur within one pattern clock period. The ramp used preferably has a software-selectable slope of 0.5, 2, 10, or 50 ns/threshold.

The time delays of the six timing edges are programmable via an 8 bit address. The 8 bit address selects one of 256 points along the slope. For example, if the 0.5 ns/threshold slope is selected, the minimum timing delay available is: (0.5 ns/threshold)×(1 threshold)=0.5 ns. The maximum delay is: (0.5 ns/threshold)×(256 thresholds)=128 ns.

The TG performs timing checks on patterns transmitted by the PACs. It determines whether the pattern sequences transmitted by adjacent PACs stop at the same time, and verifies that patterns are sent to the same PEL in each lane.

TG 248 may also include an on-board clock for diagnostic purposes.

Pattern Controller

Figure 8:
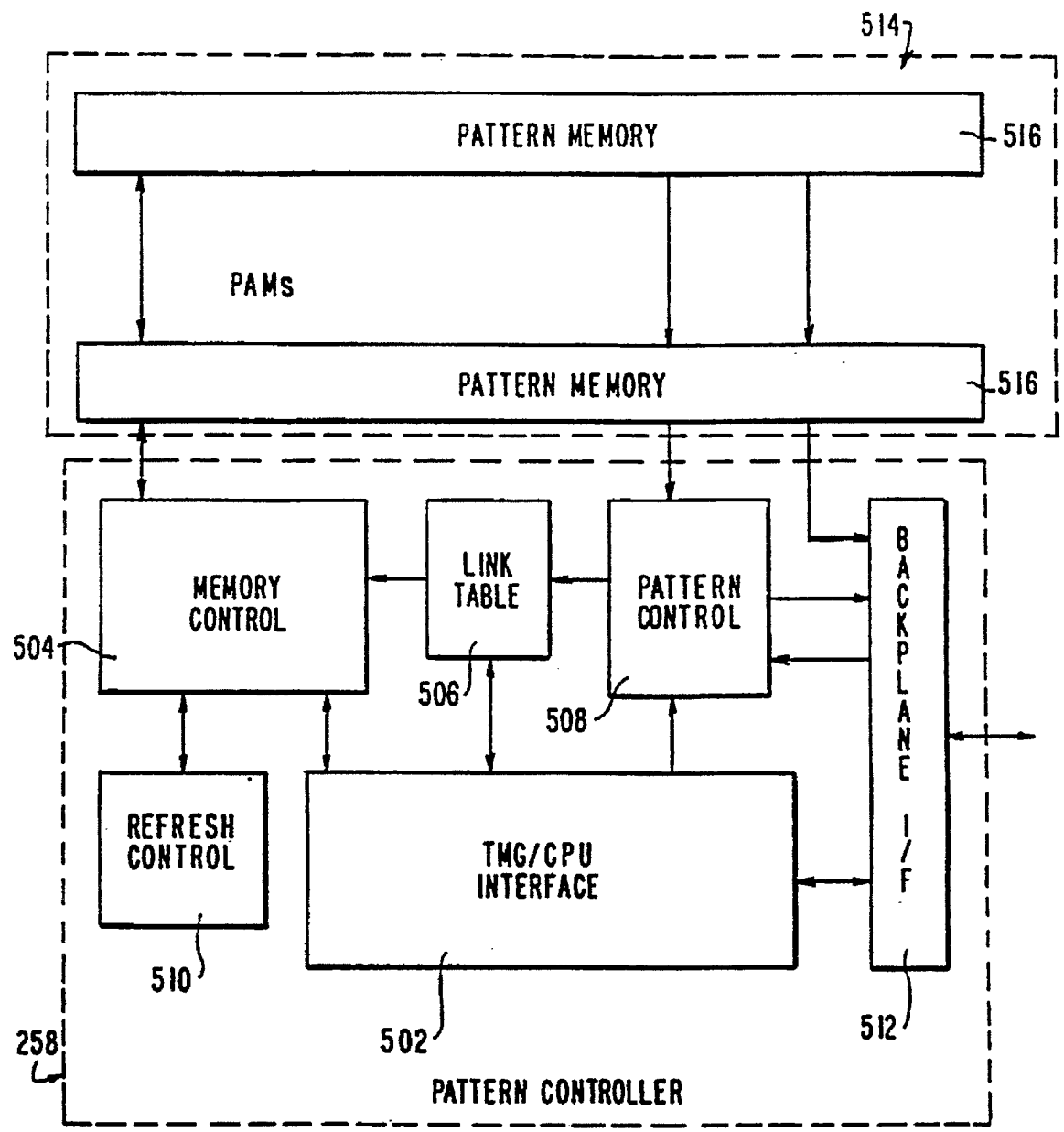
FIG. 8 is a block diagram of a PAC and attached PAMs of the HMS of FIG. 1.

Referring to FIG. 8, a block diagram of representative PAC 258 and PAM 259 is shown. The following description of PAC 258 and PAM 514 is representative of the other PACs and PAMs of the HMS. PAC 258 includes timing/CPU interface ("TMG/CPU I/F") 502, memory control 504, link table 506, pattern control 508, refresh control 510, and backplane I/F 512. The pattern memories of the PAC/PAM combination are shown at 514. PAM 514 includes from one to four PAM boards 516, which are connected to a PAC.

An overall description of the PAC and PAM operation will first be presented. The PAC, together with one or more PAMs, allows for the storage and presentation of pattern sequences in the HMS. The HMS preferably can support up to four PACs, one per lane. A minimum of one PAC is required for basic system operation. An edge connector on the PAC allows the PAC to be connected directly to a single lane of the backplane. Because the PAC itself has no memory for pattern storage, stacking connectors on the PAC allow from one to four PAMs to be connected to the PAC. This allows the user to configure and upgrade pattern memory within the system.

Pattern memory is allocated in blocks of 256 patterns by CMC software running on the CPU. A pattern sequence is initially allocated as a single block. Additional blocks of memory are allocated as the pattern sequence length increases beyond 256 during simulation or test-vector play. It is not necessary for the pattern blocks that make up a pattern sequence to be contiguous within the pattern memory, because pattern blocks are linked together by a 32K-by-15-bit "link table." The link table, located on the PAC, contains the information necessary to generate a continuous pattern sequence from the blocks which may be scattered throughout the pattern memory.

The CMC software running on the CPU allocates and deallocates pattern memory in 256-pattern blocks, and maintains pattern sequences as lists linked via the link table. The HMS hardware follows the links in the link table when presenting pattern sequences to the HME. Because of these linked-list pattern-memory allocation and presentation methods, multiple pattern sequences can share pattern memory and can grow and shrink without requiring the CPU to copy patterns from one location in pattern memory to another.

Linked pattern memory blocks are also used to support concurrent fault simulation. In concurrent fault simulation, multiple history sequences are retained in pattern memory. These history sequences represent multiple instances of a single device for different faults of the system being simulated. These multiple history sequences may have initial portions which are common. The HMS stores the common initial subsequence of these differing history sequences only once. It links the common initial subsequence to any of several different ending subsequences by storing the appropriate link in the link table immediately prior to presentation.

The backplane can be placed in either of two operational modes: access mode or presentation mode. The behavior of the PAC is dependent on the mode of the backplane. Between device evaluations, the entire backplane is in access mode. This mode of operation allows the CPU board to access the contents of the status and control registers on the PAC, the link table, and the memories residing on all PAMs connected to the PAC.

During evaluation of an HME, the backplane is in presentation mode. In presentation mode, all PACs operate synchronously, simultaneously presenting patterns to the PELs in each of the enabled lanes. Preferably, each PAC presents 80 data bits, 5 parity bits, and 11 control bits to the backplane during each pattern cycle. Additional bits from the pattern word are used internally in the PAC.

The patterns presented to the backplane by the PAC during presentation mode are stored within memories on the PAM or PAMs connected to the PAC. Preferably, the pattern words stored within a PAM are 102 bits wide, and consist of 80 data bits, 16 control bits, and 6 parity bits.

Lengthy simulations may require that long pattern sequences be stored in the PAM. The memories used on the PAMs are, therefore, preferably able to output a long, continuous sequence of patterns at a high pattern rate (25 MHz). For this reason, the PAM uses Video RAMs ("VRAMs") for pattern storage.

PAMs preferably are of several different capacities. A 128K PAM preferably uses 256K-bit VRAMs such as the M5M4C264L-12 manufactured by Mitsubishi, and a 512K PAM preferably uses 1M-bit VRAMs, such as the TC524256AZ-12 manufactured by Toshiba. The 256K-bit VRAMs consist of a 64K-by-4-bit dynamic RAM port and a 256-by-4-bit serial read/write port. The serial port allows the data stored within the memory to be clocked out with a high speed clock. The 1M-bit VRAMs are similar, with the dynamic RAM port organized as 256K-by-4 bits and the serial port organized as 512-by-4 bits. During access mode the patterns are stored in the VRAMs using standard DRAM RAS/CAS protocol. During presentation mode, the serial port is used to clock the data out of the memory and onto the backplane via the PAC.

Due to the high pattern rates encountered during presentation, the pattern memories preferably are interleaved. The pattern clock received by the PAC is divided by two, and half of the VRAMs use one phase of the divided clock to shift data out of their serial ports, while the remaining VRAMs use the other phase of the divided clock. Since the VRAMS have a 4-bit-wide serial output, a total of 24 VRAMs are required to store 96 bits of pattern and control data. The six additional parity bits require two more memory devices, for a total of 26 VRAMs per pattern word. Because the memories are interleaved, twice this number (52 VRAMs) preferably reside on the PAM.

During access mode, pattern memory is divided into three banks in order to make efficient use of the memory address space allocated to the PAC and connected PAMs. The 96-bit pattern/control word is split into three 32-bit words, each accessed in a different memory bank. Each 32-bit bank is further divided into a 16-bit low data word and a 16-bit high data word, allowing for 16-bit accesses from the CPU. The parity VRAMs are duplicated because of interleaving, that is, there are a total of four parity VRAMs on the PAM, two for each interleaved half of pattern memory. Only three of the four bits are used on each VRAM, one for each of the three memory banks.

During CPU write accesses to the PAC/PAM, two parity circuits on the PAC generate separate parity bits for the two 16-bit words. These parity bits are sent to the PAMs where they are written into the appropriate parity VRAMs. One parity bit is individually written into each affected parity VRAM by making use of the "write-per-bit" feature of the VRAMs. During a 32-bit write access, two parity bits are generated and written simultaneously. During a 16-bit write access, only one of the two parity bits is valid, and only that bit is written into the VRAM. Each parity generator preferably can be configured to output either even or odd parity.

When the CPU performs a read access to pattern memory, the parity bit or bits associated with the accessed location are read from the appropriate parity VRAM and routed to the parity circuitry on the PAC. The remainder of the pattern word is also sent to the parity circuitry, which computes the parity and compares the result with the parity bits. If the result indicates a parity error, then the CLK_READ signal latches the pattern word and the address at which it occurred. During a 16-bit access, only the 16 bits being accessed can generate a parity error.

In addition to the two parity generator/checkers which operate during access mode, there is another 16-bit parity checker which operates during presentation mode. This parity checker computes parity on the 16-bit pattern control word. The generated parity bit is compared with the appropriate parity bit stored in pattern memory. If a parity error is detected, the PAC halts pattern presentation.

The five parity bits associated with the 80 bits of pattern data are driven onto the backplane during presentation mode. The PEL receives these five parity bits, and the CICs on the PEL use them to check the parity of each 16-bit section of the 80-bit pattern data. If a parity error is detected by any CIC on the PEL, the PEL asserts the backplane ERROR* signal. The PAC receives the ERROR* signal and immediately halts pattern presentation.

During a CPU access, the low 32 pattern bits on the backplane are used by the PAC as address bits. When the backplane address strobe is asserted, the lane select and address bits are latched by the PAC. Decode logic on the PAC uses the backplane address strobe, the latched lane select, and address bits 20 through 27 to determine if the CPU is addressing the PAC/PAM. If it is, the PAC generates an internal signal indicating that a CPU request is in progress. A request code is sent to the memory control circuitry to determine what type of transaction the control circuitry should perform.

All memory and register requests are processed by the "request machine" circuitry of the PAC. This state machine is composed of two PROMs with registered outputs, and uses a 16 MHz crystal oscillator as its clock. All requests except pattern memory refresh requests are asynchronous to the 16 MHz clock and are first synchronized with a two stage flip-flop synchronizer.

Because stacking connectors preferably are used to connect multiple PAMs to a single PAC, each PAM is strapped with a two bit address. This is accomplished using a DIP switch on each PAM. Each DIP switch is set to a unique address, starting with zero. If both 512K and 128K PAMs are installed on the same PAC, the 512K PAMs are assigned the lowest switch settings. In order to verify that the switches have been set properly, the PAC and PAM contain memory detection circuitry. An analog comparator circuit on the PAC automatically determines the number of PAMs plugged into the PAC. This number can be read by the CPU.

When the CMC, running on the CPU, writes data patterns in the PAM, it also stores a 16-bit control word with each of the patterns. Bits D0 through D3 of the control word are PEL address bits. These bits are driven onto the HMS backplane during pattern presentation and are used to select the appropriate PEL within the lane. Bits D4 through D6 are PEL control bits. These bits are driven onto the HMS backplane during pattern presentation and are used by both the TG and the PELs. Bit D7 is the USER bit. It is driven onto the HMS backplane during pattern presentation and is received by the PEL. The PEL then drives the USER bit onto a test point on the DAB. Bits D11 through D13 are spare control bits which are unused by the PAC. Bits D14 and D15 are spare bits driven onto the backplane during presentation.

Bits D9 and D10 of the control word are branch command bits. These bits, in conjunction with the link table, instruct the PAC to stop fetching patterns from the current block and to begin fetching in the next block. The branch command code tells the PAC when to jump to the next block, and the link table contains the address of the next block. The transfer from one block to the next is accomplished by performing a "serial read transfer cycle" operation within the VRAM, transferring a new row of data from the dynamic RAM port to the serial shift register port.

Having presented an overall description of the PAC and PAM operation, a detailed description of the PAC will now be presented.

In order to understand operation of the PAC in both operational modes, it is necessary to understand the signals at backplane I/F 512. The Pattern Bus preferably carries signals of two logic families: BTL (as supported by BTL transceivers manufactured by National Semiconductor) and ECL. This was described in discussing the signals placed on the Pattern Bus by TG 248. BTL transceivers are used for the majority of the Pattern Bus signals. The ECL drivers and receivers are used for the more critical timing signals such as clocks, timing edges, and strobes. Table 2 shows the signals at the backplane I/F and their descriptions. Many of these signals have different functions for the access and presentation modes; this is reflected in the descriptions.

TABLE 2

| Signal | Description |
| --- | --- |
| RESET | The RESET signal is an active high BTL input signal driven by the TG. This signal is asserted upon power-on, or when the HME is initialized. While the RESET signal is asserted, refresh cycles cannot take place, and the contents of the pattern memory may be lost. |
| PLAY* | The PLAY* signal is an active low input signal driven by the TG. The state of the PLAY* signal determines the state of the Pattern Bus lane. PLAY* is inactive (high) during access mode, and is asserted during presentation mode. |
| ERROR* | The ERROR* signal is an active low BTL "party-line" signal driven by the TG, the PEL, and the PAC itself. During access mode, the PAC ignores ERROR*. During presentation mode, the PAC halts pattern play whenever ERROR* is asserted. The PAC asserts the ERROR* signal when an internal error condition is detected, independent of the Pattern Bus mode. The ERROR* signal is asserted until the error condition is cleared by the software or until the RESET signal is asserted. |
| PARITY<0..4>* | The five Pattern Bus parity signals, PARITY<0..4>*, are BTL signals which serve different purposes during each operational mode. During the pattern presentation mode, the signals are the parity signals for the 80 pattern bits, one parity bit per sixteen pattern bits. The parity bits are stored in pattern memory and are driven onto the Pattern Bus by the PAC. During CPU access mode, the parity signals serve as control signals driven by the TG and received by the PAC.<br>In the access mode:<br>  PARITY<0>* is the AS (address strobe) signal. This AS signal is an active high signal. This signal indicates when the address line signals are valid.<br>  PARITY<1>* is the READ (read data) signal. The READ signal determines the direction of CPU transfers. The READ signal is high when the CPU is reading data from the PAC or PAM. The READ signal is low when the CPU writes to the Pattern Bus.<br>  PARITY<2>* is the DS (data strobe) signal. The DS signal is an active high signal and indicates the data portion of a CPU transfer cycle. During CPU write cycles, the assertion of the DS signal indicates that valid data exists |

TABLE 2-continued

| Signal | Description |
|---|---|
| | on the shared address/data bus. During CPU read cycles, the assertion of the signal indicates to the device being accessed that it may place data on the Pattern Bus. PARITY<3>* is the LW (long word) signal. This active high signal determines the width of data transfers. When LW is low, the CPU cycle is a 16-bit transfer. When LW is high, a 32-bit transfer is performed. PARITY<4>* is the LANE (lane select) signal. The active high LANE signal is generated by the TG from CPU address bits. The PAC and PEL have no way of sensing which backplane lane they are in. Hence, the LAKE signal acts as a lane select. |
| FB_IN* | The FB_IN* signal is an active low BTL "party-line" signal driven by the PAC and PEL. FB_IN* serves as an acknowledge signal asserted by the PAC at the end of the CPU access mode. During pattern presentation mode, the FB_IN* signal is used to transmit the feedback signal from the PEL to the TG. The PAC simply drives FB_IN* with a logic "1" value during this time. |
| FB_OUT* | The FB_OUT* signal is a BTL signal driven by the TG. It is received by the PAC and is used as the HME feedback signal during pattern presentation mode. During CPU access mode, FB_OUT* signal is ignored by the PAC. |
| PAC_CLK | PAC_CLK signal is a differential ECL signal that is used by the PAC and the PAM for clocking the majority of the control and data signals. |
| XMT_CLK | XMT_CLK signal is a differential ECL signal that is used to register the pattern bits output onto the Pattern Bus during pattern presentation. |
| RCV_CLK | RCV_CLK signal is a differential ECL signal that is used to clock the PAC inputs during presentation mode. |
| SAMPLE | The SAMPLE signal, is a differential ECL signal driven by the TG. Whenever the received SAMPLE signal goes high, the PAC completes any refresh cycle it is in and withholds refresh cycles until the SAMPLE signal returns to the low state. |
| PEL_CTL<0..2>* | The three PEL control bits, PEL_CTL<0..2>*, are stored in the PAM as part of the pattern control word and are driven onto the Pattern Bus by the PAC during the pattern presentation mode. During CPU access mode, the PAC receives, but ignores, the PEL control signal, in order for the TG to drive them onto the Pattern Bus. |
| DATA_VALID* | The DATA_VALID* signal is a BTL signal that is driven by the PAC. This signal indicates when the Pattern Bus control and pattern bits are valid. Several clock cycles after presentation mode is initiated by the TG, the DATA_VALID* signal is asserted, indicating that the next clock cycle contains valid data and control signals. When the DATA_VALID* signal goes high, data and control signals are valid for only one more clock cycle. |
| PEL_ADDR<0..3>* | PEL_ADDR<0..3>* are the PEL address signals. These signals are BTL signals which are driven by the PAC. These signals, stored in the PAM as part of the pattern control word, are only valid during the pattern presentation mode. |
| SPARE CONTROL | Spare control signals may be provided. These signals are similar to the PEL address bits in that they are driven by the PAC, but are only valid when the DATA_VALID* signal is active. The spare bits are stored in the PAM. In the preferred embodiment, the spare signals are not used by the TG or PEL. |
| USER* | The USER* signal is a BTL signal. The USER* signal is stored in the PAM as part of the pattern control word. It is only valid during the pattern presentation mode. |
| PAT<0..79>* | These signals are BTL signals. During pattern presentation mode, the 80 signals contain pattern data and are driven by the PAC onto the Pattern Bus. During CPU access mode, 48 of the signals, PAT<32..79>*, are not driven. The remaining 32 pattern signals, PAT<0..31>*, are used as multiplexed address/data signals. They are driven by the TG during the address portion of the cycle and during the data portion of CPU write cycles. The PAC drives them during the data portion of CPU read cycles. |

Figure 9:
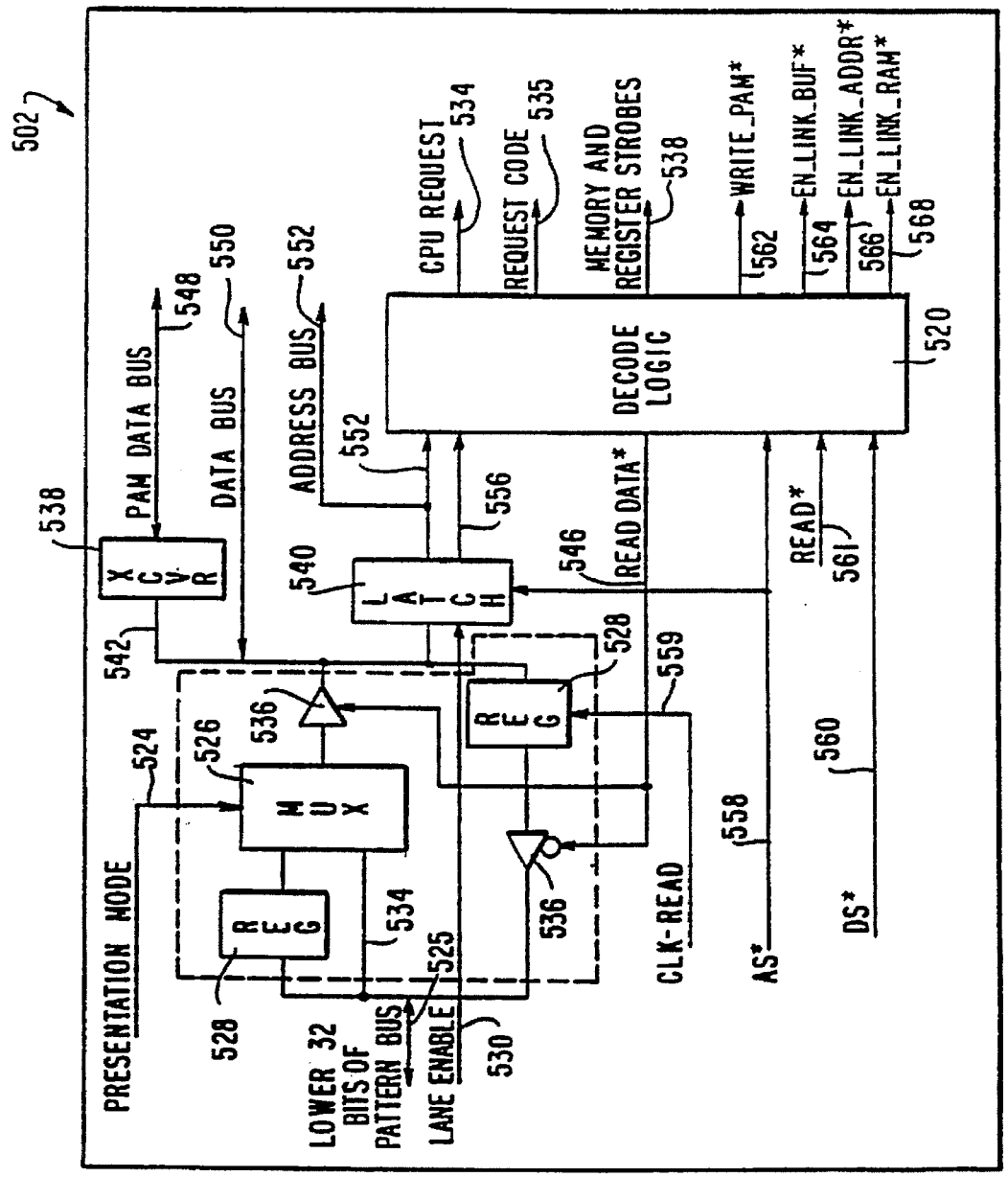
FIG. 9 is a schematic drawing of the TMG/CPU Interface of the PAC of FIG. 8.

FIG. 9 is a schematic diagram of TMG/CPU I/F 502. The TMG/CPU I/F uses the control strobes, the PLAY* signal (which is inverted to become the PRESENT signal), and the lower 32 bits of the Pattern Bus to generate separate address and data buses, as well as various control signals for use by the PAC and the PAM, as will be described.

Line 525 represents the lower 32 bits of the Pattern Bus, which may be within any one of the four lanes of the Pattern Bus. The lower 32 bits on line 525 are input to register 528. The READ_DATA* signal on line 546 is input to tri-state buffers 532 and 536. The READ_DATA* signal determines the direction of data flow through the Pattern Bus. When the READ_DATA* signal is a logic high value, the direction of data flow is from line 525 to line 542; when it is a logic low value, data flow is in the opposite direction. In the opposite direction, data on the PAC address/data bus is input to register 526 and then placed on Pattern Bus 525. The CLK_READ signal on the 559 clocks shift register 526.

The output of buffer 536 on line 542, which is the PAC address/data bus, is input to transceiver 538 and latch 540. Transceiver 538 provides bi-directional communications between PAM data bus 548 and the PAC address/data bus 542.

The second input to latch 540 is the lane enable signal on line 530. The outputs are the signals on address buses 552 and 556. The address bus signals are input to the decode logic 520 and sent to other portions of the PAC. The decode logic comprises two PALs. The other inputs to the decode logic are the AS* signal on line 558, the DS* signal on line 560, and the READ* signal on line 561. Decode logic 520 processes the input signals, and provides at its outputs the READ_DATA, signal on line 546, the CPU_REQ signal on line 534, the REQ_CODE on line 535, and various memory and register strobes at line 538. The READ_DATA* signal was explained above. The CPU_REQ signal, the REQ_CODE signal, and various memory and register strobes will be described in discussing the PAM and the remainder of the PAC.

During the access mode, the PLAY* signal, driven by TG 248, is deasserted on all four lanes of the Pattern Bus. TG 248 drives the address strobes in the deasserted state until a CPU read or write cycle takes place. While the address strobe is in its deasserted state, the lane enable signals and the lower 32 bits of the Pattern Bus are received by the PAC through latch 540.

At the beginning of a CPU access, the lower 32 bits of the Pattern Bus become address bits and, if the access is directed at the lane, the lane enable signal becomes active. When the address strobe becomes active, the lane enable and address bits are latched. Decode logic 520 uses the address strobe, the latched lane enable, and address bits 20–27 to determine whether the CPU is addressing the PAC/PAM. If it is, a CPU request signal is generated. Decode logic 520 also uses other control signals such as the RD* and DS* signals to generate various control strobes and memory selects.

The three bit REQ_CODE signal 535 is sent to the PAMs and determines the type of transaction the control circuitry must perform. The REQ_CODE signal is encoded as shown in Table 3. The first two entries in the table are for transfer cycles which occur only during the presentation mode. The remaining codes are for PAM reads and writes, and link table or register reads and writes.

TABLE 3

| Bits | | | |
|---|---|---|---|
| R1 | R2 | R3 | Transaction |
| 0 | 0 | 0 | ASYNC XFER |
| 0 | 0 | 1 | SYNC XFER |
| 0 | 1 | 0 | ILLEGAL |
| 0 | 1 | 1 | ILLEGAL |
| 1 | 0 | 0 | DRAM WRITE |
| 1 | 0 | 1 | DRAM READ |
| 1 | 1 | 0 | LINK/REG WRITE |
| 1 | 1 | 1 | LINK/REG READ |

The use of each transaction will be described in conjunction with the description of link table 506 and the PAM.

Figure 10:
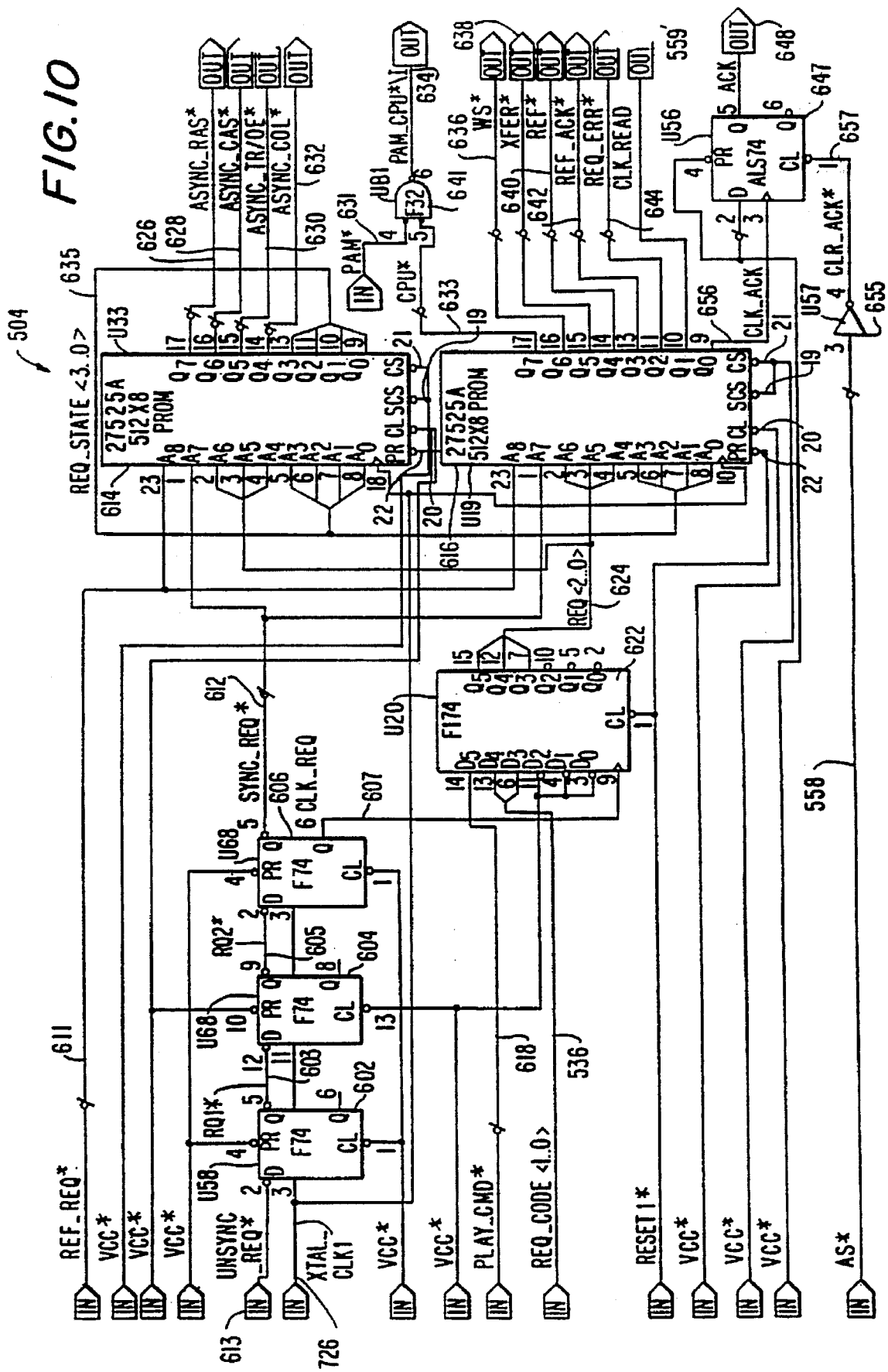
FIG. 10 is a schematic drawing of the memory control circuitry of the PAC of FIG. 8.

FIG. 10 is a schematic drawing of memory control circuitry 504. Memory control circuitry 504 processes all PAM, link table, and register requests. All of these requests, except the REF_REQ* signal on line 611, are multiplexed on line 613 as the UNSYNC_REQ* signal. The specific requests that are input to the memory control circuitry will be discussed after the disclosure regarding the circuit and its operation.

Memory control circuitry 504 includes programmable read only memories ("PROMs") 614 and 616, and flip-flops 602, 604, 606, 622, and 647. Flip flops 602, 604, and 606 are D-type flip-flops that are used to synchronize the UNSYNC_REQ* signal. The UNSYNC_REQ* signal, as stated, includes all of the request signals except the REF_REQ* signal on line 611. The three flip-flops are clocked by the 16 XTAL_CLK signal on line 720 that is output from the crystal clock on the PAC. Following conventional clocking of the three flip-flops, the SYNC_REQ* signal is output from the "Q" output of flip-flop 606 on line 612. This signal is input to PROMs 614 and 616. The CLK_REQ signal is output on line 607 from the "Q*" output of flip-flop 606 to clock flip-flop 622.

The remaining inputs to PROMs 614 and 616 will now be described. The REF_REQ, signal on line 738, which is output from refresh PAL 714 (FIG. 11), is input directly to PROMs 614 and 616. The next input to the PROMs is the output of flip-flop 622. The inputs to the flip-flop are the PLAY_CMD* signal on line 618 and the three bit REQ_CODE signal on line 536.

The last input to PROMs 614 and 616 is the 4-bit REQ_STATE signal on line 635. This signal is output from PROM 614 and then input to both PROMs. The REQ_STATE signal inputs to the PROMs the current request type being processed by the PROMs. Outputs of PROM 614 include the synchronous control signals that are sent to the PAM after being gated with other signals. These signals are the ASYNC_RAS* signal on line 626, ASYNC_CAS* signal on line 628, ASYNC_TR/OE* signal on line 630, and ASYNC_COL* signal on line 632.

Figure 19:
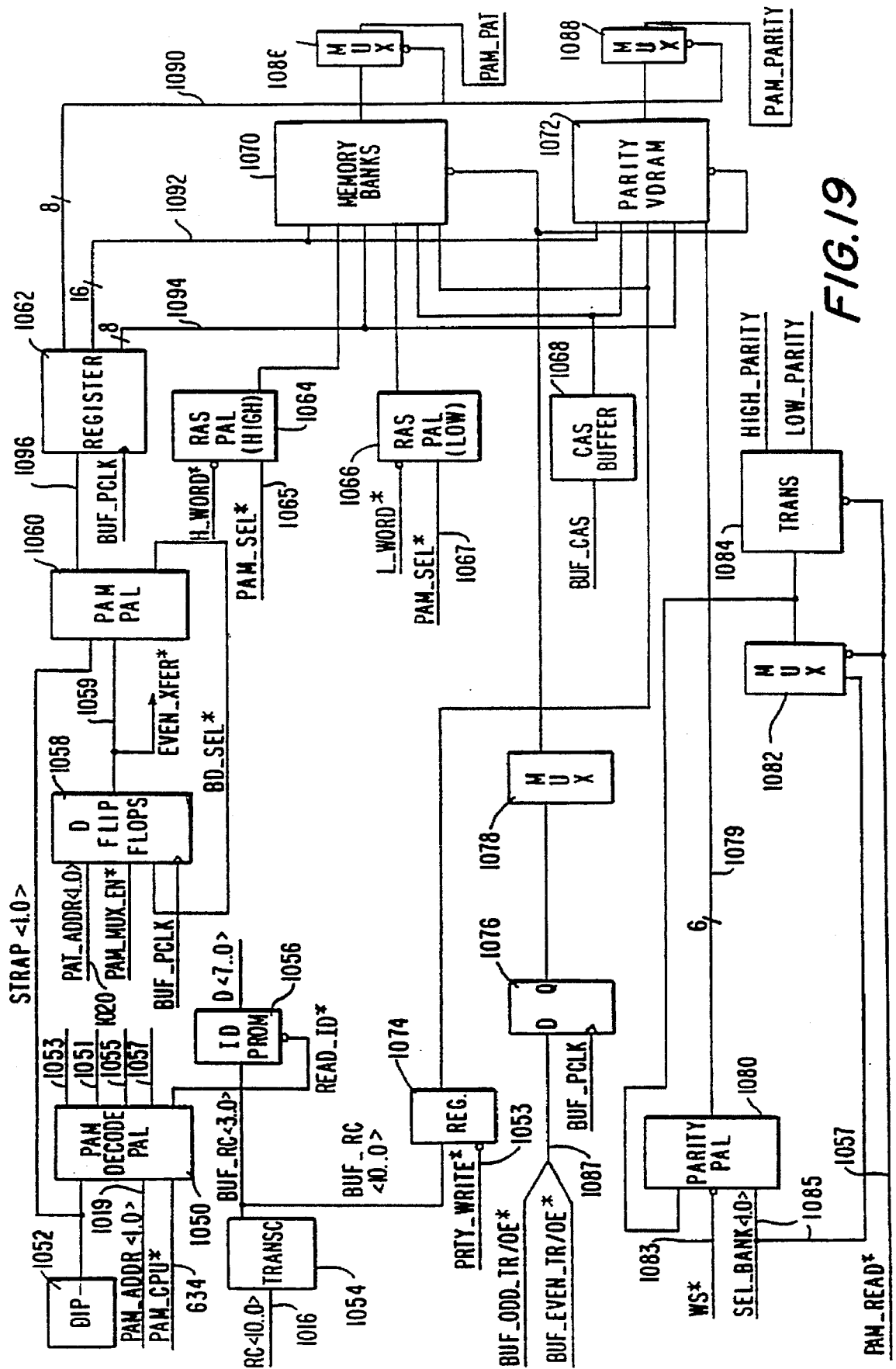
FIG. 19 is a schematic drawing of the preferred embodiment of the control circuitry for the PAM of the present invention.

The first output of PROM 616 is the CPU* signal on line 633. This signal and the PAM* signal on line 631 are input to OR gate 641. The PAM* signal is an output of decode logic 520 of the TMG/CPU I/F 502. The output of gate 641 is the PAM_CPU* signal on line 634 which is sent to the PAM Decode PAL 1050 (FIG. 19).

The next three outputs of PROM 616 are control signals that are sent to the PAM. These signals are the WS* signal on line 636, the XFER* signal on line 638, and the REF* signal on line 640. The WS* signal controls PAM write operations, and the XFER* and REF* signals are input to PAM RAS generation PALs 1064 and 1066 (FIG. 19) for generating various RAS signals. The XFER* signal is for effecting transfers from memory to a shift register. The REF* signal is the refresh enable signal.

The REF_ACK* signal on line 642 is the next output of PROM 616. This signal is input to the Refresh PAL 714. The REQ_ERR* signal on line 644 is output from PROM 616. The REQ_ERR* signal, when asserted, is used to generate the ERROR* signal which is placed on the Pattern Bus. The CLK_READ signal on line 559 clocks shift register 526 as described, and clocks the flip-flops for use in determining parity error.

The last output of PROM 616 is the CLK_ACK signal on line 656. This signal is input to the clock input of flip-flop 647. The input to the clear input is the CLR_ACK* signal on line 657. This signal is the AS* signal on line 558 after being inverted by inverter 655.

Memory control circuitry 504 processes link table and register read requests in exactly the same way since they are multiplexed as the UNSYNC_REQ* signal on line 613. A request is processed in two clock cycles. During both cycles, the COL* strobe and the signal on line 632 are asserted. Although these signals are asserted during all register and link table read operations, they are only used during reading of the PROM of the PAM. The CAS signal enables the lower address bits onto the row-column address bus. This bus connects to the output of the PAM ID PROM. The CPU signal, when gated with the PAM signal, turns the PAM data bus drivers on, allowing PAM ID PROM data to be read. Also, during the first of the two cycles, the CLK_ACK signal on line 656 is asserted. The rising edge of this active high signal clocks flip-flop 647, which asserts the ACK signal on the Pattern Bus. Even though valid data does not yet exist on the Pattern Bus, the negative setup time from data to acknowledge required by the TMG/CPU combination allows the PAC to assert the ACK signal two clock cycles before data is available.

During the second cycle, the CLK_ACK signal is deasserted and the CLK READ is asserted. The rising edge of this active low signal clocks the desired data into the shift register of the TMG/CPU I/F section.

Memory control circuitry 504 then returns to its default state, deasserting the CAS signal, the CPU signal, and the CLK_READ signal. The backplane Pattern Bus ACK signal is automatically deasserted when the AS* is deasserted by the CPU, clearing flip-flop 647.

Link table and register write requests, like read requests, are processed in two clock cycles. During both cycles, the WS* signal is asserted. This active low signal is gated by various decoded memory/register select signals to generate the appropriate address select.

PAM read requests are processed in five clock cycles. During cycle 1, the CPU* signal on line 633 and the RAS signal sent to the PAM are asserted. These signals remain asserted during all five cycles. During cycle 2, the EVEN_TR/OR or ODD_TR/OR signal, and the COL* signal are asserted. In cycle 3, the CAS signal is asserted. In cycle 4, the CLK_ACK signal (and therefore the Pattern Bus ACK signal) is asserted. During cycle 5, the CLK_ACK signal on line 656 is deasserted and the CLK_READ clock is asserted. After cycle 5, all signals which remain asserted are deasserted. The Pattern Bus ACK signal is deasserted when the AS* signal is deasserted by the CPU, clearing flip-flop 647.

PAM write requests are also processed in five clock cycles. During cycle 1, the CPU signal is asserted. During cycle 2, the RAS and the CLK_ACK signals are asserted. In cycle 3, the COL* signal and the WS* are asserted and the CLK_ACK is deasserted. In cycle 4, the CAS signal is asserted. In cycle 5, all signals remain as they are. After cycle 5, all signals which remained asserted are deasserted. The Pattern Bus ACK signal acknowledge is deasserted when the AS* is deasserted by the CPU, clearing flip-flop 647.

Shift register transfer requests occur during pattern presentation. Each of the video memories ("VRAMs") of the PAM contains a serial shift register. This register is as long as one of the rows within the DRAM array (256 cells for VRAMs on a 128K PAM). Any row within the VRAM may be transferred to the shift register by performing a shift register transfer cycle. The contents of the shift register may be clocked out of the memory serially. The PCLK signal, divided by two, is used as the serial clock.

The row address selects the row to be transferred to the register. When the transfer takes place, the column address selects one of the registers as the first to be clocked out; this is the start address. If the register contents have been clocked out and another transfer does not take place, the same data from the start address is output again. That is, the shift register is cyclic.

At high PCLK rates, the placement of control signal transitions (RAS, CAS, etc.) relative to the serial clock is critical. These signals; therefore, must be generated by the PCLK signal itself. Pattern control 508, which uses the PCLK clock, generates the transfer control signals. This type of shift register transfer is a synchronous transfer, because the control signals are synchronous with PCLK.

Synchronous transfers are used at PCLK frequencies greater than 1 MHz, while asynchronous transfers are used below this frequency. A PCLK signal flip-flop on the PAC is set or cleared by software, depending on the frequency of the next pattern play. The output of this flip-flop is used by decode logic 520 when forming the three bit REQ_CODE signal. The state of this bit determines whether the request is a synchronous or an asynchronous transfer request.

When pattern control 508 sends a synchronous transfer request, memory control circuitry 504 finishes any refresh cycle which may be in progress, and then asserts the XFER* signal on line 638. This active low signal is buffered and sent to the PAMs where it is used as a RAS enable signal. The memory control circuitry asserts the XFER* signal until pattern control has completed the transfer operation and has removed the transfer request.

When pattern control 508 sends a synchronous transfer request, the request state machine finishes any refresh cycle which may be in progress, and then begins the six cycle transfer sequence. During cycle 1, the XFER* signal and the EVEN_TR/OE or ODD_TR/OE enable signals are asserted. In cycle 2, the RAS signal is asserted. In cycle 3, the COL* signal is asserted. During cycle 4, the CAS signal is asserted. In cycle 5, all signals remain asserted. After cycle 6, all signals are deasserted and the transfer is complete.

Refresh requests are not sent through the synchronizer because they are generated by the refresh control circuitry 510, which uses the same 16 MHz clock as memory control circuitry 504. Refresh requests, therefore, are sent directly to the memory control circuitry. They are processed only when the memory control circuitry is idle. Each CAS-before-RAS refresh sequence is four cycles long. During cycle 1, the REF* and the CAS signals are asserted. During cycle 2, the RAS signal is asserted. In cycle 3, the CAS signal is deasserted and the REF_ACK* signal is sent back to refresh control circuitry 510, to indicate that the REF_REQ* signal is being processed. During cycle 4, the REF_ACK* and the RAS signal are deasserted. After this cycle, the REF* signal is deasserted.

To minimize the size of the current pulse during refresh, only one PAM board is refreshed at a time.

Figure 11:
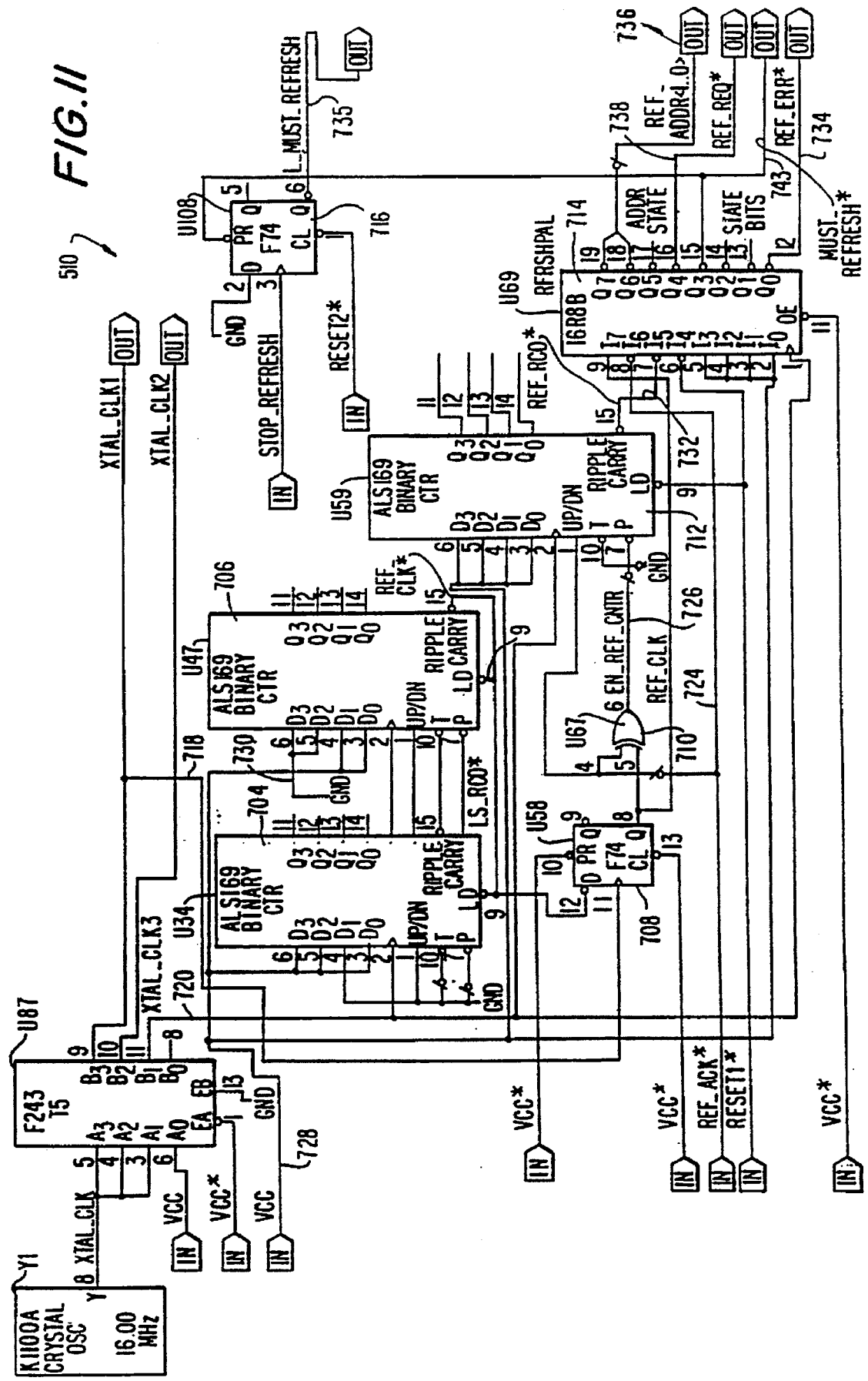
FIG. 11 is a schematic drawing of the refresh control circuitry of the PAC of FIG. 8.

Referring now to FIG. 11, to achieve a REF_CLK* signal with the right period for the refresh sequences, the 16 MHz clock is divided by 62 using 4-bit counters 704 and 706. This provides a REF_CLK* signal with a period of about 3.87 ms, which is within and approximates the maximum refresh request period of 3.9 ms.

The REF_CLK* signal resets counters 704 and 706, and is asserted at the input of flip-flop 708. Flip-flop 708 is clocked by the XTAL_CLK signal on line 718. Exclusive-OR gate 710 processes the REF_ACK* and REF_CLK signals and outputs the EN_REF_CNTR signal on line 726 to the parallel enables of counter 712. The output of counter 712 is the REF_RCO* signal on line 732, which is input to refresh PAL 714. Since transfer cycles cannot be interrupted, the refresh circuitry preferably can accumulate REF_CLK signals. Accordingly, a burst of refresh cycles are performed immediately after the transfer cycle is complete.

Refresh cycles are accumulated during the HME sampling time and during normal CPU accesses. Refresh PAL 714 provides at its output a 2-bit address for input to the PAM for performing refresh cycles. The second output is the REF_REQ* signal on line 738. The other output is the MUST_REFRESH* signal on line 740 and the REF_ERR* signal on line 734.

During synchronous transfer cycles, refresh control circuitry 510 may accumulate up to seven REF_CLK signals. This occurs at the minimum pattern clock rate used for synchronous transfers of 1 MHz. During CPU accesses and asynchronous transfer cycles, only one or two refresh clocks usually need to be accumulated. Holding refresh cycles while the sample strobe is active also causes REF_CLKs to accumulate. The width of the sample strobe determines the number of refresh requests accumulated.

The MUST_REFRESH* signal is also input to flip-flop 716. This flip-flop is clocked by the STOP_REFRESH 3 signal. The output of the flip-flop (from the "Q*" output terminal) is the L_MUST_REFRESH signal on line 735. The STOP_REFRESH will be used to clock the flip-flop when a pattern presentation starts or when the MUST_REFRESH* signal is asserted.

Figure 12:
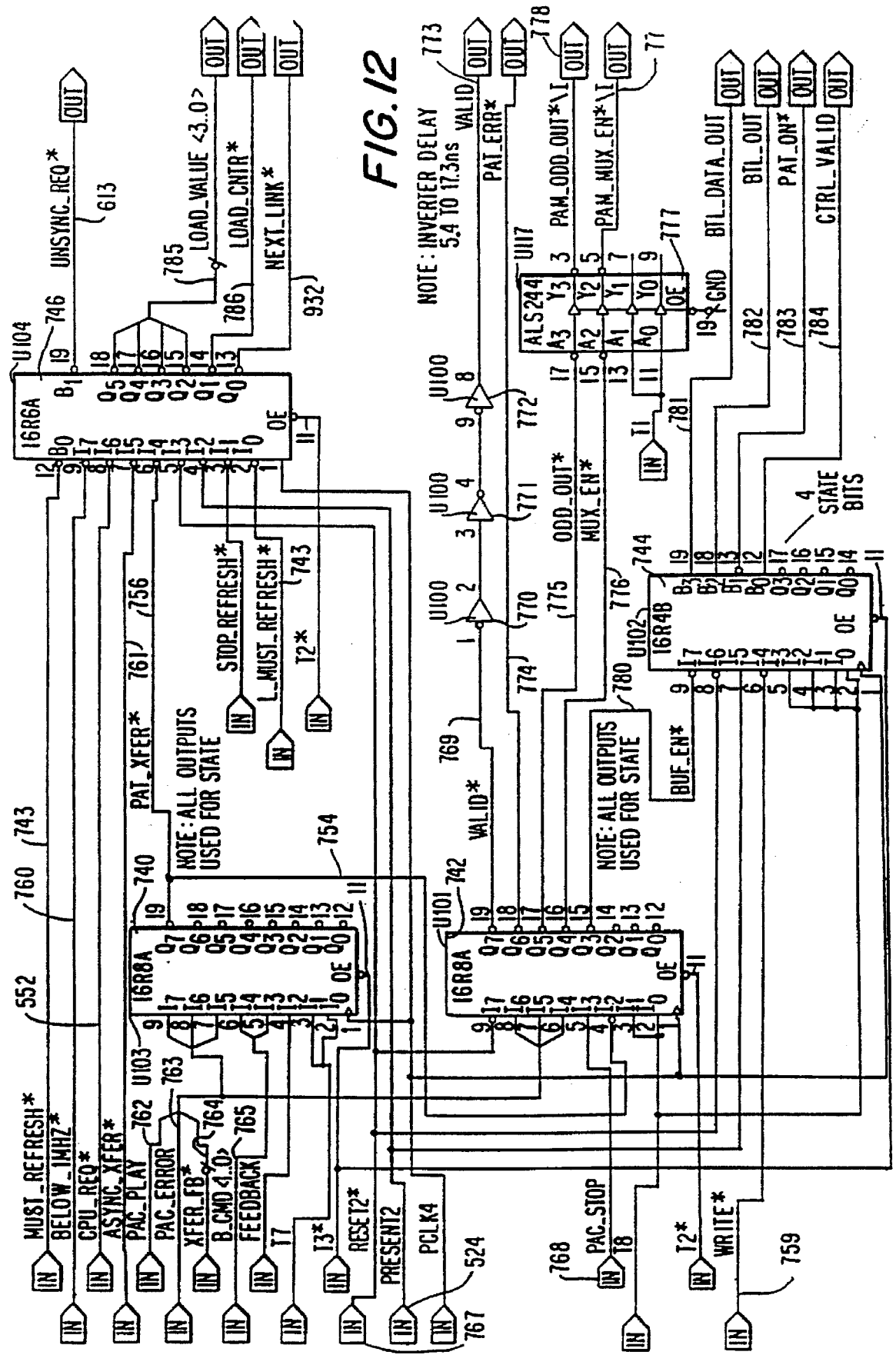
FIGS. 12 and 13 are schematic drawings of the pattern control circuitry of the PAC of FIG. 8.
Figure 13:
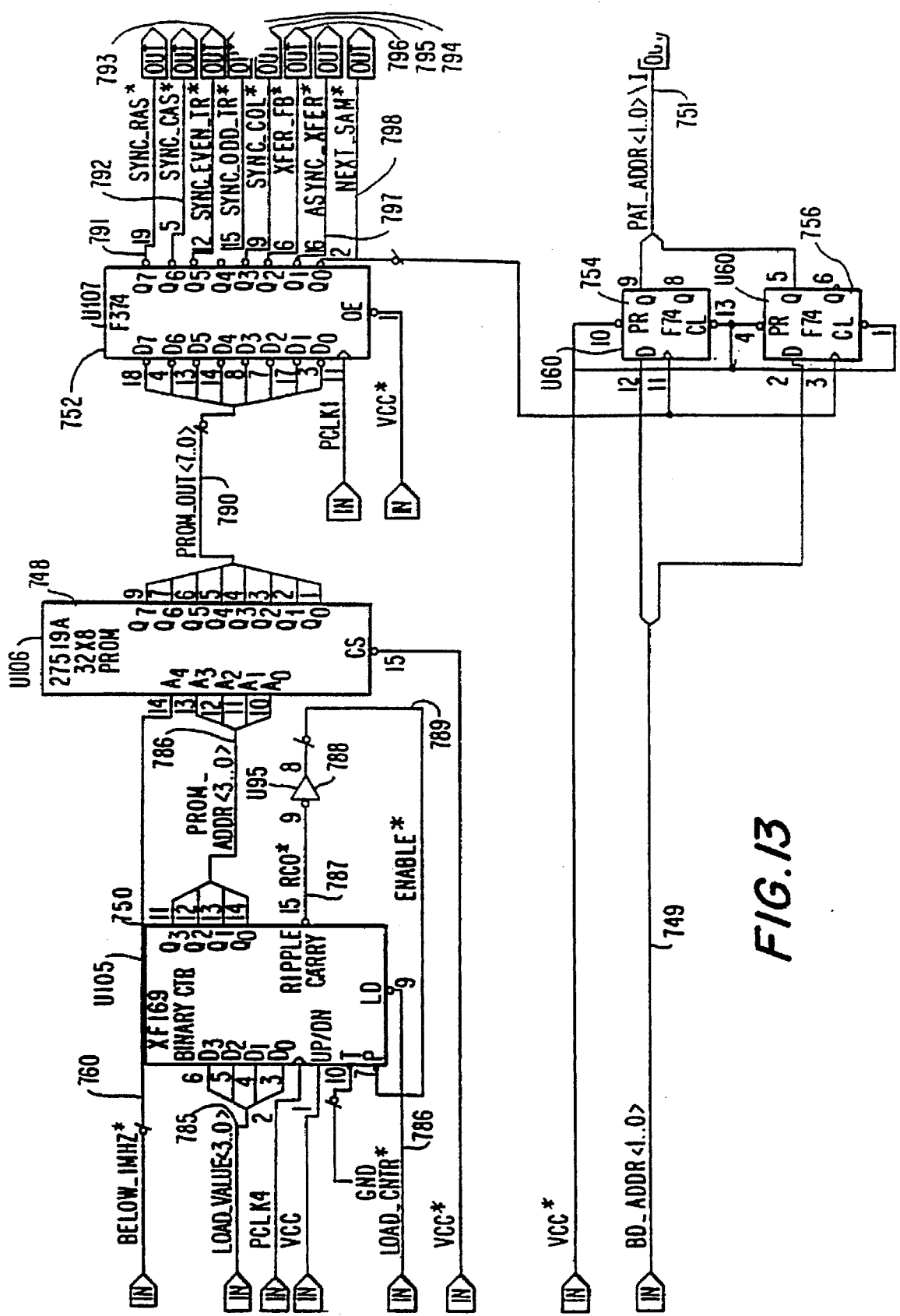

FIGS. 12 and 13 show pattern control circuitry 508. This circuitry includes, for the most part, a series of interconnected PALs and a PROM. Pattern control circuitry 508 uses the PCLK signal and, therefore, is only active during pattern presentation mode. Pattern control 508 performs several functions. It determines when the Pattern Bus changes from CPU access mode to pattern presentation mode, detects error conditions which occur during pattern presentation, indicates that a pattern-block branch must take place, indicates that a transfer operation is in progress, and indicates when a transfer cycle is complete.

Pattern Control 508 includes transfer PAL 40, Pattern control PAL 742, buffer control PAL 44, request PAL 746, transfer PROM 748, 4-bit counter 50, and register 752. Transfer PAL 740 includes pattern transfer circuitry and the branch circuitry.

The pattern transfer circuitry has one internal and three external inputs and a single output. The external inputs are the PAC_PLAY signal on line 762, PAC_ERROR signal on line 763, and XFER_FB* signal on line 764. The PAC_PLAY signal is the PLAY signal that has been buffered, inverted, and registered. A change in state of this signal informs the pattern transfer circuitry when the operating mode changes between the access mode and presentation mode. The PAC_ERROR signal is the ERROR signal on line 763 after it has been buffered, inverted, and registered. A change in state of this signal informs the pattern transfer circuitry that an error has been detected during pattern presentation.

The BRANCH signal is an output of the branch circuitry and is internally connected to the pattern transfer circuitry. This signal indicates that a pattern-block branch must take place. The XFER_FB* signal is an output of transfer PROM 748 and registered by register 752. It indicates that a transfer cycle is complete. The output of the pattern transfer circuitry is the PAT_XFER* signal on line 756. This signal is input to pattern control PAL 742 and request PAL 746 via lines 754 and 756, respectively. When asserted, this output indicates that a transfer operation is in progress.

The branch circuitry of transfer PAL 740 has three inputs. These are the 2-bit B_CMD signal on line 765 and the FEEDBACK signal on line 766. The output of the circuitry is the previously discussed BRANCH signal. The B_CMD bits reside in the PAM and are clocked into the PAC during pattern play. Prior to the 2-bit B_CMD signal being input to the transfer PAL, it is gated with the CNTL_VALID signal on line 784, which output from buffer control PAL 44. Therefore, when the pattern data is not valid, the signal will not be asserted. The FEEDBACK signal is the registered FB_OUT* signal. The output of the branch circuitry is the BRANCH signal, which is sent to the pattern transfer circuitry via an internal connection.

As stated, the PAT_XFER* signal on line 54 is input to pattern control PAL 742. The other inputs to the PAL are the RESET* signal on line 767, the PAC_PLAY signal on line 762, the PAC_ERROR signal on the 763, the XFER_FB* signal on line 764, and the PAC_STOP signal on line 768. The PAC_PLAY, PAC_ERROR, and XFER_FB* signals have been previously described, and those descriptions apply here. The RESET* signal is the Pattern Bus RESET* signal that has been buffered. The PAC_STOP signal is similar to the 2-bit B_CMD signal sent to transfer PAL 740. The PAC_STOP signal is asserted in case the PAC_ERR* signal is asserted while a transfer is taking place. This will allow the transfer to be completed.

The pattern control PAL has five outputs. These are the VALID signal on line 769, the ODD_OUT* signal on line 775, the MUX_EN* signal on line 776, and the BUF_EN* signal on line 780. The MUX_EN* signal is a PAM enable signal that is input to buffer 777. The ODD_OUT* signal is also input to buffer 777. The output of buffer 777 is the PAM_ODD_OUT* signal on line 778 and the PAM_MUX_EN* signal on line 779. When the PAM_MUX_EN* is asserted, it enables the pattern data multiplexers on the selected PAM board. The PAM_ODD_OUT* signal is the pattern clock divided by two, which turns on and off at the beginning and end of pattern play, respectively. It is sent to the PAM boards, where it is registered on the rising edge of the PCLK signal.

The VALID* signal is the Pattern Bus DATA_VALID* signal, before it is registered, level shifted, and placed on the Pattern Bus.

The BUF_EN* signal on line 780 is input to buffer control PAL 744. This signal, after further registering, is the signal that will be used for enabling the outputs.

Buffer control PAL 744 generates control signals which direct and gate pattern data during the presentation mode. The inputs to the PAL are the BUF_EN* signals on line 780, the RESET* signal on line 767, the PRESENT signal on line 524, and the WRITE* signal on line 759. The BUF_EN* signal is used to synchronously generate four state bits. These bits are routed internally to combinational logic, which then uses the remaining inputs to generate the four output signals.

PAL 744 outputs the BTL_DATA_OUT signal on line 781, the BTL_OUT signal on line 782, the PAT_ON* signal on line 783, and the CTRL_VALID signal on line 784. The BTL_DATA_OUT signal controls the direction of the four BTL transceivers used for the lower 32 pattern bits of backplane I/F 512. These bits differ from the remaining 48 pattern bits in that the lower bits are used as the shared address/data bus during access mode.

The BTL_OUT signal controls the direction of the bus transceiver of the backplane I/F. The transceiver receives the 5-bit PARITY signal and a 3-bit PEL_CTL signal. The BTL_OUT signal is asserted when the RESET* signal is asserted.

The PAT_ON* signal enables the registers of the backplane I/F used for the lower 32 pattern bits, the 5-bit PAM PARITY signal, and the 3-bit PAM_PEL_CTL signal, and enables the BTL transceivers of the backplane I/F used for the upper 48 pattern bits. The PAT_ON* signal is asserted when the pattern-on state bit and the PRESENT signal are asserted and the RESET* signal is deasserted. As discussed, the CTRL_VALID signal is gated with the branch command bits and the stop bit PAM_STOP signal when pattern data is not valid. The PARITY_VALID signal is the registered CTRL_VALID signal. When the PARTY_VALID signal is asserted and the P_CHECK signal is asserted, the PRTY_ERROR signal is asserted. The error signal will disable the control word parity checker until the pattern data is valid. The CTRL_VALID signal is deasserted when the control-valid state bit is deasserted, the PRESENT signal is deasserted during the access mode, or the RESET signal line is asserted.

Request PAL 746 has asynchronous and synchronous sections. The asynchronous section combines CPU requests, synchronous transfer requests, and asynchronous transfer requests for generating the UNSYNC_REQ* signal on line 613. This signal is sent to the request state machine. Request PAL 746 also has a synchronous section which is used only during pattern play. During this time, the request PAL generates six outputs which are the LOAD_CNTR* signal on line 786, NEXT_LINK* signal on line 932, and a 4-bit LOAD_VALUE signal on line 785.

Request PAL 746 has nine inputs; some of these signals have been previously described. The inputs to the request PAL were the RESET* signal on line 767, PRESENT signal on line 524, CPU_REQ* signal on line 552, BELOW_1 MHZ* signal on line 760, ASYNC_XFER* signal on line 761, PAT_XFER* signal on line 756, STOP_REFRESH* signal on line 741, L_MUST_REFRESH* signal on line 743, and MUST_REFRESH signal on line 743. The RESET* signal places the synchronous section of the PAL in a state in which the 4-bit LOAD_VALUE signal is asserted and each of the bits has a logic high value. This will allow the counter used by transfer PROM 748 to be loaded with a hexadecimal "F." The assertion of the RESET* signal also deasserts the UNSYNC_REQ* signal output from the PAL. Once RESET* is deasserted, the synchronous state machine goes to a wait state.

The PRESENT bit informs the asynchronous section of the request circuitry which mode the Pattern Bus is in.

The CPU_REQ* signal is asserted whenever the PAC/PAM is selected during access mode. When asserted, it will cause the UNSYNC_REQ* signal to be asserted.

During presentation mode, the BELOW_1 MHZ* signal determines whether the ASYNC_XFER* or the PAT_XFER* signal is used to generate the UNSYNC_REQ* signal. When the BELOW_1 MHZ* signal is asserted, the ASYNC_XFER* signal is used. Conversely, the PAT_XFER* signal generates the UNSYNC_REQ* signal when the BELOW_1 MHZ* signal is deasserted.

The synchronous section of the PAL always uses the PAT_XFER* signal. When the PAT_XFER* signal is first asserted, the synchronous section begins to count. In doing this, the LOAD_VALUE bits are used as a non-sequential counter. On the thirteenth count, the LOAD_CNTR* signal on line 786 is deasserted for one pattern clock cycle. This loads a seven into binary counter 750 that connects to transfer PROM 748. The request PAL then waits until the PAT_XFER* signal is deasserted before returning to a wait state which looks for the PAT_XFER* signal to be asserted. The remaining output of request PAL 746 is the NEXT_LINK* signal on line 932. This signal is the PAT_XFER* signal delayed one clock cycle.

The STOP_REFRESH* signal is the TTL version of the ECL_SAMPLE signal. During HME sample periods, the STOP_REFRESH* signal is asserted and the BELOW_1 MHZ* signal is deasserted. The UNSYNC_REQ* signal output from the request PAL is asserted and clocked into the request circuitry synchronizer. The 2-bit REQ_CODE signal indicates a synchronous transfer request. This prevents the request circuitry from performing refresh cycles during the sample period.

The MUST_REFRESH* signal on line 743 is an output of refresh circuitry 510. If refresh cycles are being withheld, and more than 48 cycles are counted, the MUST_REFRESH* signal is asserted. This causes request PAL 746 to ignore the STOP_REFRESH signal on line 741 and to deassert the UNSYNC_REQ* signal. The L_MUST_REFRESH* signal serves an identical function. It is necessary only when the MUST_REFRESH* signal is removed once refresh cycles begin to take place, even though refresh circuitry 510 has not processed all of the accumulated refresh clocks.

The transfer PROM 748 and its associated circuitry are used during presentation mode to provide various branch/transfer control signals. This circuitry includes PROM 748, 4-bit binary counter 750, and octal register 752. Binary counter 750 is normally disabled until it is loaded by request PAL 746 during a transfer operation. Once loaded with a seven, the binary counter is enabled and begins to count until it reaches a terminal count of hexadecimal "F." The output of the binary counter is the 4-bit PROM_ADDR signal that forms the lower four address bits for PROM 748. The highest order address bit is the BELOW_1 MHZ* signal. This bit determines whether the PROM generates signals appropriate for synchronous transfer or asynchronous transfer. Waveforms are stored within PROM 748 and are output as the counter sequences through the PROM.

During synchronous transfers, when memory control signals are generated using the P_CLK signal, transfer PROM 748 outputs the SYNC_RAS* and SYNC_CAS* signals output for the register 752 on line 791 and 792, respectively, SYNC_COL* signal on line 795, and the SYNC_EVEN_TR* signal and SYNC_ODD_TR* signals on lines 793 and 794, respectively. During asynchronous transfers, the ASYNC_XFER* signal is asserted during the appropriate clock cycle. The ASYNC_XFER* signal is sent to request PAL 746.

During both types of transfer cycles, the transfer PROM circuitry generates the XFER_FB* signal on line 796 and the NEXT_SAM* signal on line 798. The XFER_FB* signal is a timing signal used by both transfer PAL 740 and pattern control PAL 742. The rising edge of the NEXT_SAM* signal registers the 2-bit BD_ADDR signal on line 749. This signal is from the link table circuitry. The BD_ADDR signal is registered and becomes the address for the next transfer operation. The NEXT_SAM* signal also loads the block offset counter with an FC, so that the count will be zero coincident with the first pattern resulting from the transfer.

Figure 14:
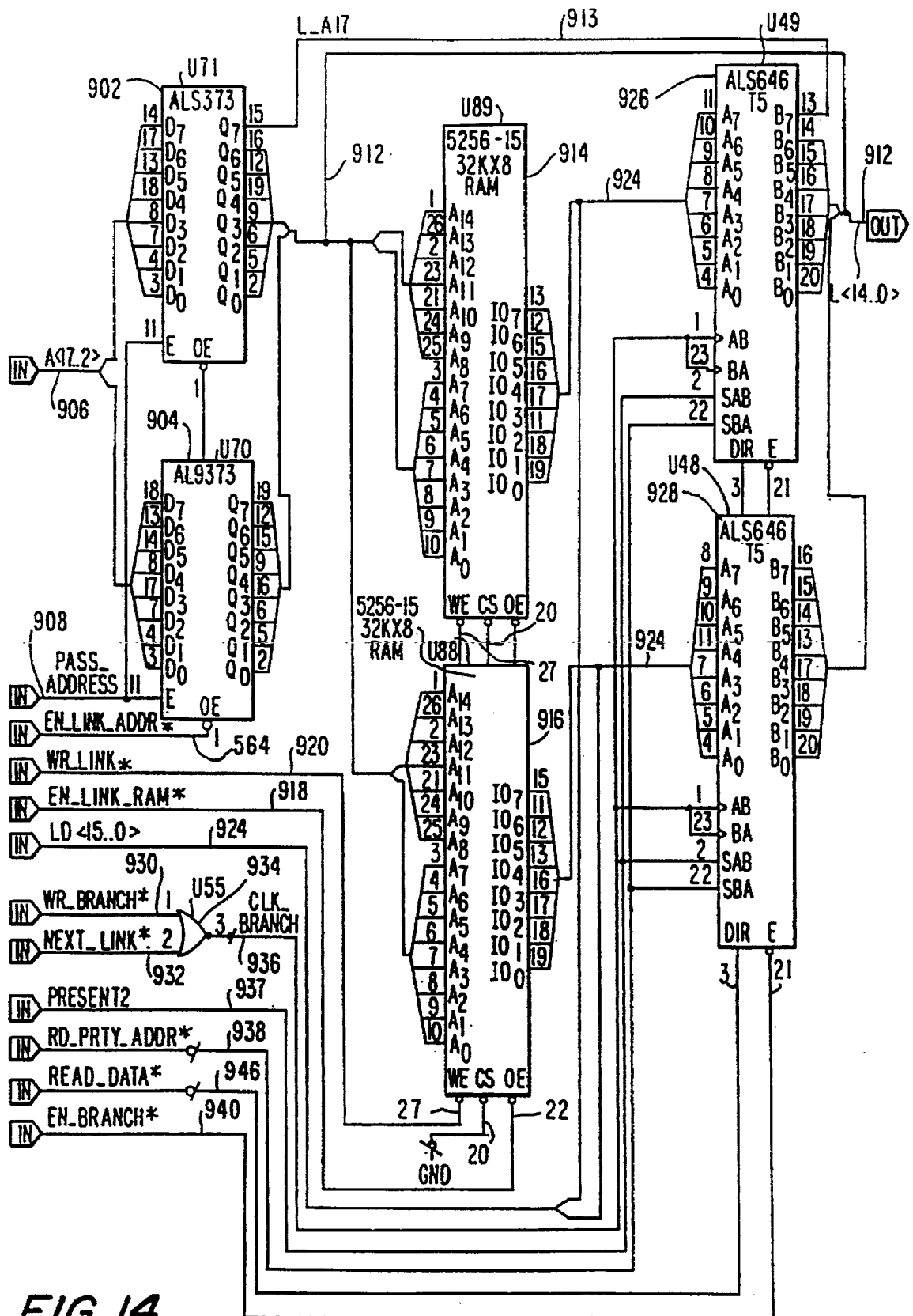
FIG. 14 is a schematic drawing of the link table circuitry of the PAC of FIG. 8.

FIG. 14 shows the elements of link table 506. The link table includes latches 902 and 904, RAMs 914 and 916, and bi-directional shift registers 926 and 928. The 16 bits from PAC address bus 906 are input to latches 902 and 908, with latch 902 receiving the upper order bits and latch 904 receiving the lower order bits. The PASS_ADDRESS signal on line 908 is input to the latch control inputs of latches 902 and 904. This active high signal indicates that no parity errors have been detected in the pattern control word. The EN_LINK_ADDR* signal on line 564 is input to the output enable inputs of the latches. This signal is one of the link table control signals output from decode logic 520 of the TMG/CPU I/F 502.

The output of the latches, except for the highest order bit, are placed on the link address bus 912. This consists of 15 of the 16 bits. The highest order bit on line 913 is input to bi-directional shift register 926 for placement on link data bus 924. The 15-bit address bus connects to the address inputs to RAMs 914 and 916. The signals input to the control inputs of the RAMs are the WR_LINK* signal on line 920, which is input to the write enable inputs, and the EN_LINK_RAM* signal on line 918.

The data inputs of RAMs 914 and 916 are connected to link data bus 924. The data bus also connects to bi-directional shift registers 926 and 928, such that the high order bits connect to register 926 and the low order bits connect to register 928. The inputs to the shift registers, in addition to the highest order address bit previously discussed, are the remaining 15 bits of link address bus 912.

The CLK_BRANCH signal on line 936 clocks the shift registers. The CLK_BRANCH signal is the output of AND gate 934. The signals input to AND gate 934 are the WR_BRANCH* signal on line 930 and the NEXT_LINK* signal on line 932. The WR_BRANCH* signal is one of the outputs of the PAC write control decoder and the NEXT_LINK* signal is one of the outputs from the request PAL 746.

The PRESENT signal on line 937 and the RD_PRTY_ADDR* signal on line 938 are input to the control inputs of the shift registers. The PRESENT signal has been discussed. The RD_PRTY_ADDR* signal is one of the outputs from the PAC read control decoder.

The other control inputs to the shift registers are the READ_DATA* signal on line 546 and the EN_BRANCH signal on line 940. The previously discussed READ_DATA* signal is input to the direction input. The EN_BRANCH* signal is one of the outputs from decoder logic 520 of TMG/CPU I/F 502, and is input to the output enable of the shift registers.

Now considering the circuit and its operation, isolated blocks of PAM memory are linked together by the link table. During the presentation mode, the 15-bit address bus that connects to shift registers 926 and 928, which are the branch registers, is routed to both the address generator which creates the PAM address for the next branch operation and to the 15-bit address of the link table memory.

Each time a branch occurs, the shift registers are clocked. In this manner, the link table data bits on line 924 become link table address bits on line 912, which look up the next branch address. This process is continued until pattern presentation is complete.

During the access mode, latches 902 and 904 allow the CPU to read from, and write to, RAMs 914 and 916, and branch shift registers 926 and 928.

Pattern Memory

Figure 15:
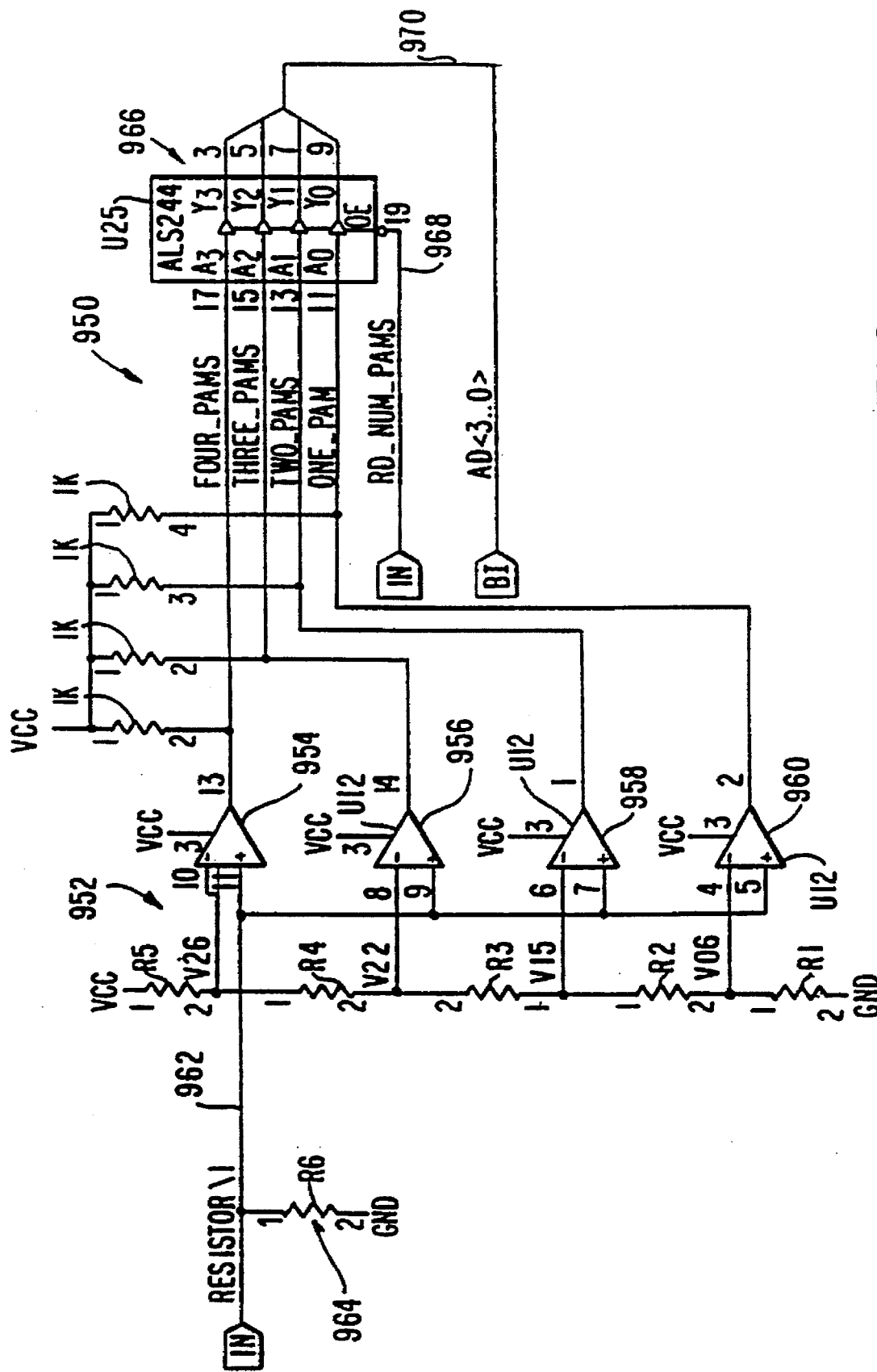
FIG. 15 is a schematic drawing of the PAM detection circuitry of the PAC of FIG. 8.
Figure 16:
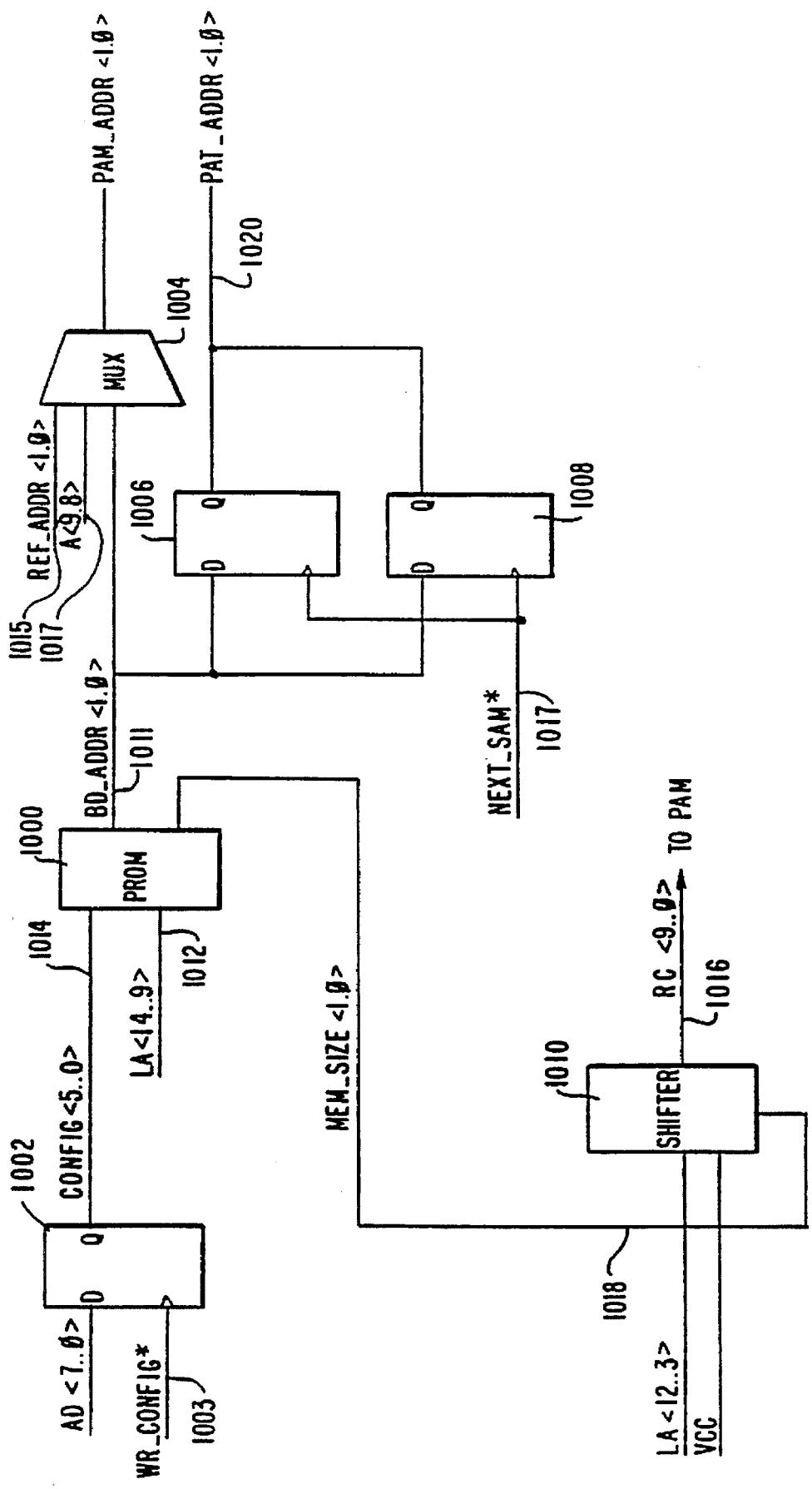
FIG. 16 is a schematic drawing of the Configuration PROM and associated circuitry of the PAC of FIG. 8.

FIGS. 15, 16, and 19 refer to the PAM circuitry and circuitry used for selecting specific PAM memory during the access and presentation modes.

Pattern memory 514, shown in FIG. 8, includes one or more individual PAM boards 516. Each PAM board is capable of storing 102-bit wide words, which are referred to as "patterns." Each of the individual PAM boards can store 128K, 512K, 2M, or 8M patterns (by 102 bits wide). The maximum memory depth of each PAM board depends upon the capacity of the VRAMs on it.

Referring to FIG. 15, analog comparator circuit 950 is shown. This circuit preferably is disposed on PAC 258. Its purpose is to determine the number of PAM boards that are connected to PAC 258. A resistor divider network 952 provides comparators 954, 956, 958, and 960 with a separate reference voltages. Nominally, these voltages are 2.50 v, 2.07 v, 1.48 v, and 0.55 v, respectively. The other input of each comparator is tied to a common signal, which in this case is the RESISTOR signal on line 962, and is a wire-tied composite of the RESISTOR signal from each PAM. Line 962 is connected to ground through 162 ohm resistor 964. Each PAM RESISTOR signal is based on PAM VCC after passing through a 562 Ohm resistor. As PAMs are added to the PAC, the 562 Ohm resistors are added in parallel and, therefore, the voltage seen at the input to each of the comparators increases. Each incremental change of voltage, caused by the addition of a PAM board, crosses one of the voltage thresholds. The nominal voltage of the comparator circuit input is 0 V for no PAMs, 1.12 V for one PAM, 1.83 V for two PAMs, 2.31 V for three PAMs, and 2.67 V for four PAMs. The comparator outputs are routed to a 4-bit buffer 966 which may be read during CPU access mode by asserting the RD_NUM_PAMS* signal on line 968. When read, the output of buffer 966 is placed on the 4-bit PAM AD bus on line 970. The number of logic high values in buffer 966 indicates the number of PAMs on PAC 258.

FIG. 16 shows configuration PROM 1000 and its supporting circuitry. Configuration PROM 1000 serves as a look-up table. It has a 12-bit input and a 4-bit output. The input comprises two signals: the 6-bit CONFIG signal on line 1014, and the 6-bit LA (link address) signal on line 1012. The 6-bit LA signal is from the PAC row/column generation circuitry. The CONFIG signal is based on the number and size of the PAMs connected to PAC 258.

The output of PROM 1000 consists of a 2-bit BD_ADDR signal on line 1011 and a 2-bit MEM_SIZE signal on line 1018. BD_ADDR is input to two D flip-flops 1006 and 1008. These flip-flop are clocked by the NEXT_SAM* signal on line 1017. The output of the flip-flops is the 2-bit PAT_ADDR signal on line 1020.

BD_ADDR signal on line 1011 is multiplexed with the 2-bit REF_ADDR signal on line 1015 and 2 bits of the PAL address bus on line 1017. The output of multiplexer 1054 is the 2-bit PAM_ADDR signal.

The MEM_SIZE signal on line 1018 is input to the control input of shift register 1010. The signals determine the row/column selection for memory. An access to a 128K PAM requires a 2-bit shift. A 2M PAM would require a three bit shift.

On the basis of the 6-bit LA signal and 6-bit CONFIG signal, Configuration PROM 1000 determines which PAM board is being addressed and outputs the signal which corresponds to the appropriate board.

Each time pattern memory 514 is accessed, the 32-bit Pattern Bus address must be converted into a 2-bit board address and a multiplexed row/column address. Such a conversion must also be made to the link table address during branching operations. Both the link table address and 22 bits of the CPU address bus are sent to a multiplexer circuit. During CPU access mode, the CPU address bus is selected. During pattern presentation mode, the 15-bit link table address (appended with seven zeros as the least significant bits) is selected. The 6 most significant bits of this 22-bit multiplexed address bus are sent to configuration PROM 1000 (the LA signal). The 20 least significant bits are multiplexed onto a ten bit row/column address bus before being sent to the PAMs.

Figures 17, 18:
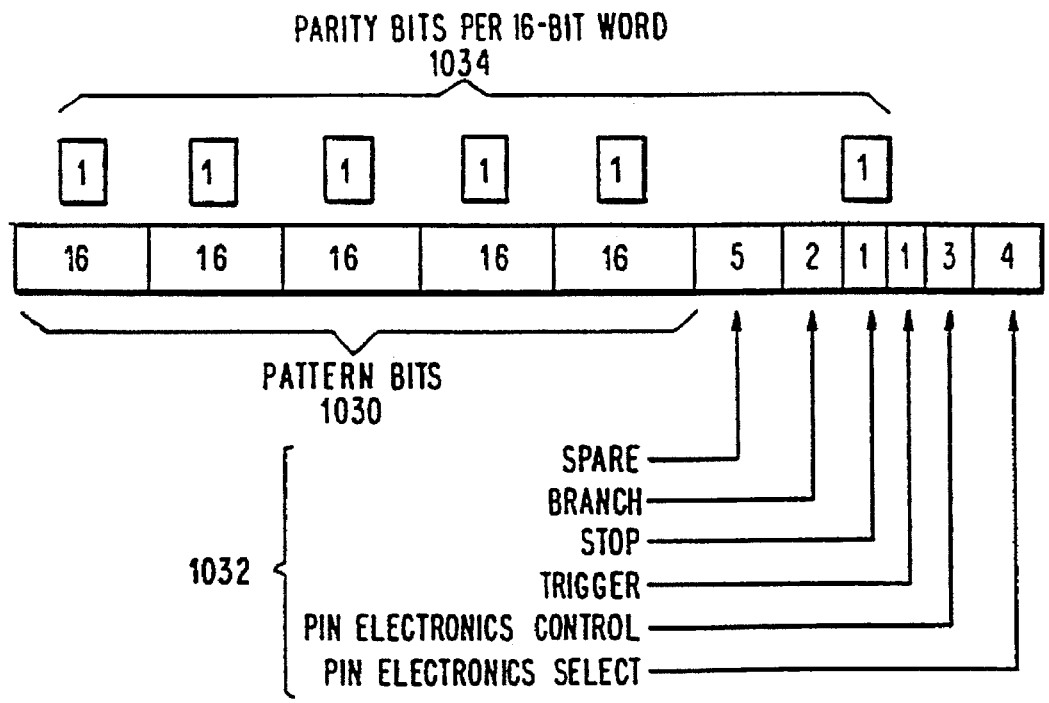
FIG. 17 is a block diagram of the 102-bit pattern word according to the present invention.
FIG. 18 shows bit assignments of the pattern control word according to the present invention.

FIG. 17 shows an example of a pattern control word. Pattern words preferably are 102 bits wide including 6 parity bits, 80 data bits and 16 control bits which are shown at 1030 and 1032, respectively. There is one parity bit for every 16 data bits, and one parity bit for the 16 control bits. For HME devices wider than 80 pins, PACs in the multiple lanes are programmed with the same pattern control words and run synchronously.

Referring now to FIG. 18, control word 1032, which is part of each pattern in the sequence, includes 16 bits, illustratively labelled D0 through D15. Control word 1032 preferably includes the four PEL_ADDR bits at 1036 for addressing PEL 266 during pattern presentation. The three PEL_CONTROL bits 1038 are driven on the Pattern Bus during pattern presentation and are used by TG 248 and PELs 266. These bits control the function of the CICs on the PEL.

Control word 1032 preferably includes the USER bit at 1040. The bit may be driven to a test point on DAB 268. For this purpose, it is also driven onto the Pattern Bus for receipt by the PEL during pattern presentation. This bit preferably is asserted throughout pattern presentation.

The STOP bit at 1042 preferably is provided to inform a PAC that a pattern sequence is complete. After the STOP bit is recognized, the PAC outputs three more patterns onto the Pattern Bus before halting. Therefore, the STOP bit must be stored three patterns ahead of the last pattern.

Control word 1032 preferably includes the 2 BRANCH bits at 1044. These bits are for controlling pattern-block branching during pattern presentation. The two bits may be set to one of four states, as shown in Table 4.

TABLE 4

| D10 | D9 | BRANCH COMMAND |
| --- | --- | --- |
| 0 | 0 | BRANCH NEVER |
| 0 | 1 | BRANCH ALWAYS |
| 1 | 0 | BRANCH ON FALLING FEEDBACK |
| 1 | 1 | BRANCH ON RISING FEEDBACK |

"Branch never" causes the pattern sequence to continue sequentially without branching. "Branch always" causes unconditional branching to the link address. The remaining two commands cause conditional branching, conditioned by either the falling or rising edge of the FEEDBACK signals. Branching on the FEEDBACK signal is used to initialize non-resettable HMEs, as will be described.

The branch commands of "branch always" or "branch on feedback" must be specified 26 patterns before the last pattern to be presented in the current pattern block. Also, branch commands must be placed in "odd" numbered patterns in a pattern sequence because pattern memory is interleaved.

The remaining 5 bits of the control word at 1046 and 1048 preferably are spare bits, which are driven to the PAC or onto the Pattern Bus during pattern presentation.

PAMs are addressed by the CPU in three banks, each 32 bits wide. This memory organization requires that each pattern which is stored in a sequence must be stored across all three banks.

Division of the PAM is treated differently during access and presentation mode. During CPU access mode, pattern memory 514 is divided into the three banks, and each bank is further divided into a low data word and a high data word. During pattern presentation mode, however, the memory is divided into two banks, even and odd. Each "even" memory bank is paired with an "odd" memory bank. The serial output ports of each pair are connected to a multiplexer. The outputs of the various multiplexers are routed to data connectors. The connectors route the data to registers of PAC 258. This multiplexing allows the memories to be operated at one half the pattern presentation rate. The even and odd banks are clocked with complementary versions of the pattern clock.

FIG. 19 shows the PAM control circuitry located on the PAM. The PAM control circuitry includes a PAM decode PAL 1050, a PAM PAL 1060, two row address strobe ("RAS") PALs 1064 and 1066, column address strobe ("CAS") buffers 1068, a parity PAL 1080, and the data and parity memory banks 1070 and 1072.

The 2-bit PAM_ADDR signal on line 1019 is input to PAM decode PAL 1050. The second input to PAL 1050 is the 2-bit STRAP signal from DIP switch 1052. The outputs of PAL 1050 include the PRTY_WRITE* signal on line 1053, the PAM_SEC* signal on line 1055, PAM_ACCESS* signal on line 1051, and the PAM_READ* signal on line 1057. The PRTY_WRITE* signal is input to register 1074. The PAM_SEL* signal is input to RAS PALs 1064 and 1066 via lines 1065 and 1067, respectively. The PAM_ACCESS* signal enables registers that store data from banks 1070. The PAM_READ* signal, is a control input to transceiver 1084. The READ_ID* signal is a control input to ID PROM 1056. Transceiver 1054 and registers 1074 control the transfer of the RC signal on line 1016 to the data and parity memory banks. The PRTY_WRITE* signal on line 1053 enables register 1074.

PAM PAL 1060 receives the STRAP signal from DIP switches 1052 and input signals from registers 1058 via line 1059. Line 1059 carries the registered PAT_ADDR and PAM_MUX_EN* signals, and the EVEN_XFER* signal.

The BD_SEL* output is looped back to registers 1058. The other outputs of PAM PAL 1060 are registered in register 1062 which is clocked by the BUF_PCLK signal. The outputs of register 1062 are input to memory banks 1070 and parity memory 1072 on lines 1092 and 1094, and to the control inputs to multiplexers 1086 and 1088 on line 1090.

RAS PALs 1064 and 1066 control the high and low data words, respectively, for each of the three data memory banks 1070 and parity memory bank 1072. RAS PALs 1064 and 1066 receive the same input signals, except that PAL 1064 receives the H_WORD* signal, and PAL 1066 receives the L_WORD* signal. The other inputs to PALs 1064 and 1066 via lines 1065 and 1067 include: the EVEN_XFER* signal from register 1058, the PAM_SEL* signal from PAM decode PAL 1050, the RAS* signal, and various bank select signals. High and low CAS buffers 1068 receive buffered CAS* signals, and transmit them to the data and parity memory banks 1070 and 1072.

The inputs to parity PAL 1080 are the WS* signal on line 1083, the 2-bit SEL_BANK signal on line 1085, and the H_PARITY and L_PARITY signals on line 1081, which are outputs of H_PARITY multiplexer 1082. The outputs of parity PAL 1080 are the 3-bit H_PRTY signal and the 3-bit L_PRTY signal on line 1079. These outputs are input to parity memory 1072 and multiplexer 1082.

Multiplexer 1082 is controlled by the 2-bit SEL_BANK signal on line 1085. Multiplexer 1082 and transceiver 1084 are enabled by the PAM_READ* signal on line 1057 that is output from PAM decode PAL 1050.

Register 1076 and multiplexer 1078 transmit the buffered ODD_TR/OE* and EVEN_TR/OE* signals on line 1087. These signals enable the inputs of memory banks 1070 and 1072.

Figure 20:
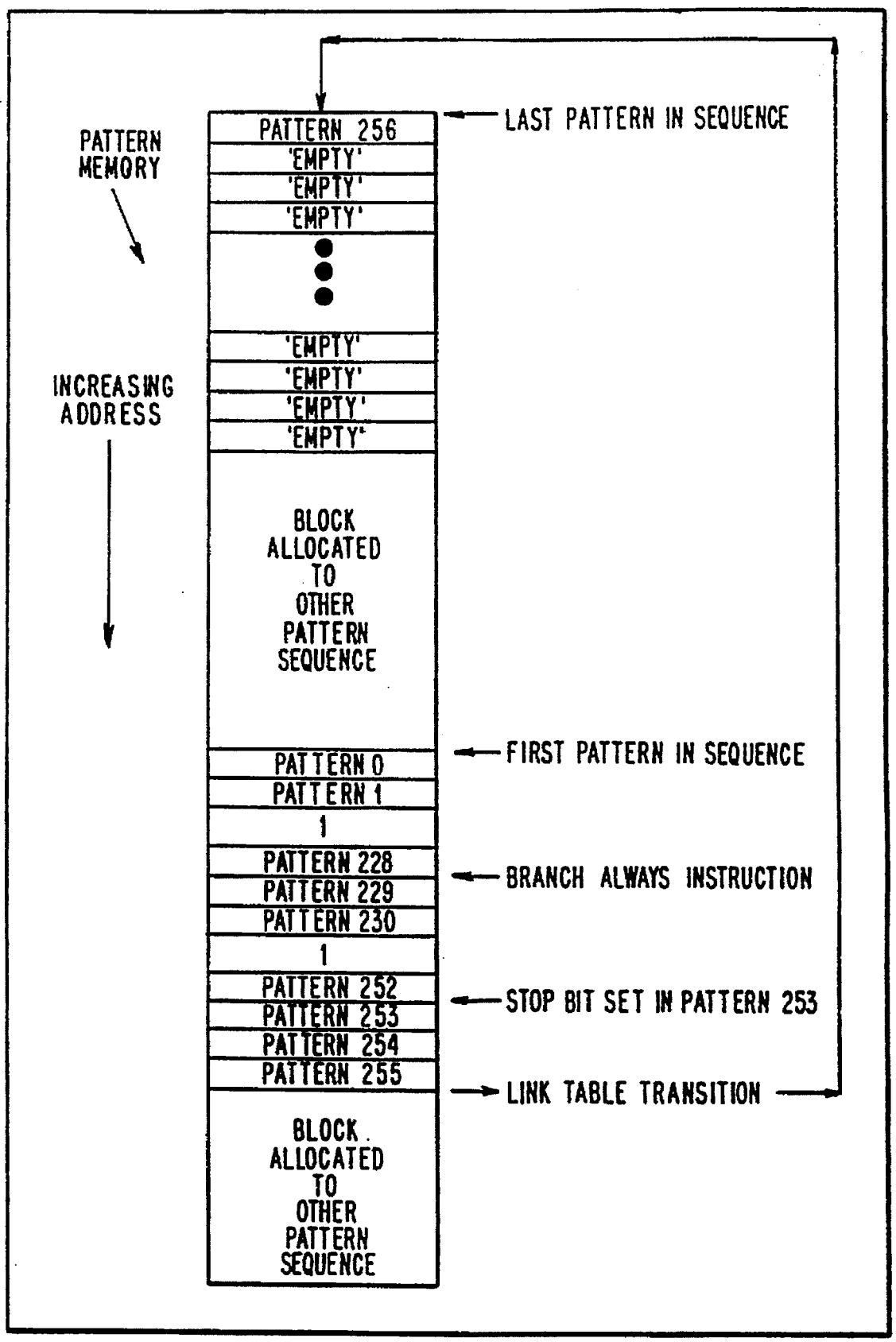
FIG. 20 is a block diagram of a pattern sequence according to the present invention.

Referring to FIG. 20, as pattern sequences are created, pattern memory is allocated in 256-pattern blocks. The blocks need not be contiguous within the memory because link table 506 causes PAC 258 to branch from one block to the next, creating a continuous output. The first pattern in any sequence must be stored on a block boundary.

The following is a description of accessing pattern memory and its presentation. The patterns to be presented preferably are stored in VRAMs. Each of the VRAMs of the PAM contains a serial shift register. This register is as long as a row within the VRAM array (256 bits for the VRAM used on the 128K PAM). The pattern data, when requested, is transferred to the VRAM shift register. Bits may then be shifted from this register at the preferred clock speed of 25 MHz. The 16-bit address specified in link table 506 defines the VRAM address of the next block to be transferred to the VRAM shift register. At the initiation of pattern presentation, a starting address in link table 506 must be specified for retrieving data from the VRAM.

Shift register transfer requests occur during pattern presentation. Any row within the VRAM may be transferred to the shift register by performing a shift register transfer cycle.

The row address selects the memory row that is transferred to the shift register. When the shift register transfer takes place, the column address selects one of the bits of the register as the first to be clocked out. If the shift register contents have all been clocked out and another shift register transfer cycle does not take place, the same data is output again. In other words, the shift register is cyclic.

PAC 258 performs a "feedback initialization" function in which non-resettable HME devices are placed in a known state. To do this, a stimulus pattern sequence is presented to the HME device until the desired state is attained. PAC 258 uses the shift registers inside the VRAM of the PAM to repeatedly present a given sequence of patterns to the device. A row of the VRAM is transferred into the shift register, where it is then continually clocked. Because the shift register is cyclic, the feedback pattern sequence is repeated indefinitely, as long as no branching takes place.

In the preferred embodiment of the invention, PAC 258 will stop presenting the feedback sequence once the device has achieved the desired state. To end feedback initialization and begin presenting normal patterns to the HME, a single-bit FEEDBACK* signal is sent from the HME through the TG to PAC 258. Either the rising or the falling edge of this FEEDBACK* signal is used to determine the state of the HME.

PAM AND PAC REGISTERS

As set forth previously, the PAC has been allocated 194 MBytes of CPU address space. The allocation is 192 MBytes to PAMs 514, 1 MByte for link table 506, and 1 MByte for the various control and status registers. The PAC has multiple control and status registers. One such status register is ID PROM 1056. Each PAM that is connected to the PAC also has an ID PROM, of which, ID PROM 1056 of FIG. 19 is representative. In addition, there are four PAM present status registers which are shared between the PAC and PAMs.

Various registers have been discussed in conjunction with the circuitry of which each is part. Here each will be discussed briefly to provide a reference section regarding these registers.

The PAC ID PROM 1056 (FIG. 19) is a 32-by-8 PROM which contains information pertaining to the PAC.

The number of PAMs register 966 is a 4-bit register which indicates the number of PAMs stacked onto the PAC. Table 5 shows the relationship between the number of PAMs connected to the PAC and the bit patterns found in the register. If the bit pattern is other than one of the five shown in Table 5, the PAC/PAM hardware is not functioning properly.

TABLE 5

| D3 | D2 | D1 | D0 | No. of PAMs |
|----|----|----|----|-------------|
| 0  | 0  | 0  | 0  | 0           |
| 0  | 0  | 0  | 1  | 1           |
| 0  | 0  | 1  | 1  | 2           |
| 0  | 1  | 1  | 1  | 3           |
| 1  | 1  | 1  | 1  | 4           |

Even though the all "0s" condition is legitimate, it is treated as an error condition since the PAC in not fully functional without at least one PAM.

The PAC configuration register 1102 (FIG. 16) is an 8-bit read/write register used to configure the PAC. Six of the bits are set according to the number and types of PAMs connected to the PAC. The 6-bit code is determined as shown in Table 6.

TABLE 6

A. If only one PAM is connected to the PAC:
  CONFIG_CODE = 60 for a 128K PAM
  CONFIG_CODE = 61 for a 512K PAM
  CONFIG_CODE = 62 for a 2M PAM
B. If more than one PAM is connected to the PAC:
  CONFIG_CODE = [(MEM_SIZE)/128 − 1,
  where MEM_SIZE is the sum of the soize of all PAMs The two remaining bits configure the two parity generator/checker circuits. One bit configures the high word circuitry to compute either even or odd parity. The other bit configures the low word parity generator/checker in the same manner. Odd parity preferably is selected during normal operation.

The branch address registers 926 and 928 (FIG. 14) are 15-bit read/write registers used to specify the initial pattern address in block increments. Also, if a pattern sequence terminates due to an error condition, the CPU can examine the branch address register to determine which block was being played when the error occurred.

The error register is a 4-bit read/write error register which, together with a parity error address register indicates the source of an error condition. The CPU clears the error bit by performing a write operation. When the most significant bit is a logic high value, it indicates a refresh error has occurred. This is a fatal error. When the second most significant bit is a logic high value, it indicates a fatal hardware error. This error is generated by the state machine operating with the on-board 16 MHz clock. When the third most significant bit has a logic high value, it indicates that state machine operating the pattern clock has detected an error. This could be due to faulty hardware or an improperly loaded PAM. When the least significant bit has a logic high value, it indicates that a control word parity error occurred during a pattern presentation.

The block offset register is an 8-bit read only register which the CPU may read when an error occurs during presentation. It indicates the number of patterns offset from the block number residing in the branch register address.

The parity error address register is a 28-bit read only register containing the address of the memory location which generated a parity error. Two of the bits in the register indicate which word, low, high, or both, was in error. The CPU clears the two active-high error bits by performing a write operation on the error register. The two most significant bits are the high and low word parity error bits, respectively. The remainder of the bits correspond to the address bits 27–2. These 26 bits uniquely specify the long word address in the PAM address space.

The PAM 0 present register is a single bit read only register which allows the CPU to determine whether any of the PAMs stacked on the PAC are associated with address 00. When the bit has a logic low value, it indicates that the PAM is present, and when it is a logic high value, it indicates that the PAM is not present.

The PAM 0 ID PROM is a 32-by-8 bit read only memory which contains information pertaining to the PAM associated with address 00, viz., memory size, revision number, etc.

Each of the other three PAMs has a similar PAM present register and PAM ID PROM.

PIN ELECTRONICS CIRCUITRY

An overall description of the PEL and its operation will first be presented. PEL 266 connects to the Pattern Bus and provides the electrical interface to the HME. The HME connects to the PEL via the DAB. PEL 266 preferably supports 80 HME pins and includes five CICs.

During pattern-presentation mode, the PEL receives patterns from the Pattern Bus preferably at up to 25M patterns per second. These patterns are clocked into a register using the pattern clock from the TG. From there the patterns are clocked directly into the five CICs. Clocking into the CICs is preferably simultaneous. The HMS, for example, could alternatively clock patterns into the CICs sequentially to minimize Pattern Bus width.

When receiving patterns, the PEL compares a hard-wired 4-bit backplane slot address with the 4-bit PEL address on the Pattern Bus. The PEL accepts only those patterns addressed to its own slot. This allows patterns to be delivered sequentially to PELs in different backplane slots. Patterns can be data or control, based on the 3-bit PEL control signal on the Pattern Bus. Control patterns are used to load internal CIC control registers.

The PEL can be accessed by the CPU in access mode. The CPU uses the access mode to read from, and write to, certain PEL control registers and to read from, and write to, registers internal to the CICs on the PEL. All CPU reads and writes preferably are multiplexed on the 16-bit PEL data bus.

The PEL contains programmable reference-voltage generators which are initialized by the CPU in access mode. Four reference voltages are delivered to each of the five CICs to allow five-state sampling of the HME pins. One additional reference voltage is used as the target voltage ("VSL") for the low soft drivers of the five CICs on the PEL. One additional reference voltage is used as the target voltage ("VSH") for the high soft drivers of the five CICs on the PEL. The PEL also contains a multi-channel analog-to-digital converter ("ADC") which can be read by the CPU in access mode to check the programmed reference voltages.

In addition to soft drivers, the five CICs on the PEL also contain hard and medium drivers which are used to drive HME pins. Most circuitry within the CIC is powered from the PEL +5 V power plane. However, the pins of the CICs which are connected within the CICs to VCC of the hard and medium drivers are not connected to the PEL +5 V power plane. Instead, these pins are connected to a special power plane of the PEL. This special power plane is separated from the +5 V power plane and is connected instead to the DAB HMEVCC power plane. Thus, the hard and medium drivers of the CICs can drive between HMEVCC and signal ground, allowing HMEVCC on the DAB to be freely adjusted between +3 V and +5 V, independent of the +5 V PEL power plane.

Having presented an overall description of the PEL and its operation, the PEL will now be described in more detail.

PEL 266 in FIG. 1 is representative of all PELs of the system. Referring to FIGS. 21–24, the PELs of the system will be described. Generally, PEL 266 preferably includes one or more CICs which interface with the HME being modeled. PEL 266 preferably includes five such CICs, each of which provide 16 pins for interfacing with the HME. The five CICs are connected in parallel and, therefore, a total of 80 HME pins are supported by each PEL. Hence, HMEs having 80 pins or less may be connected to a single PEL using a DAB. In an alternative embodiment, the CICs are replaced with discrete circuits.

Figure 21:
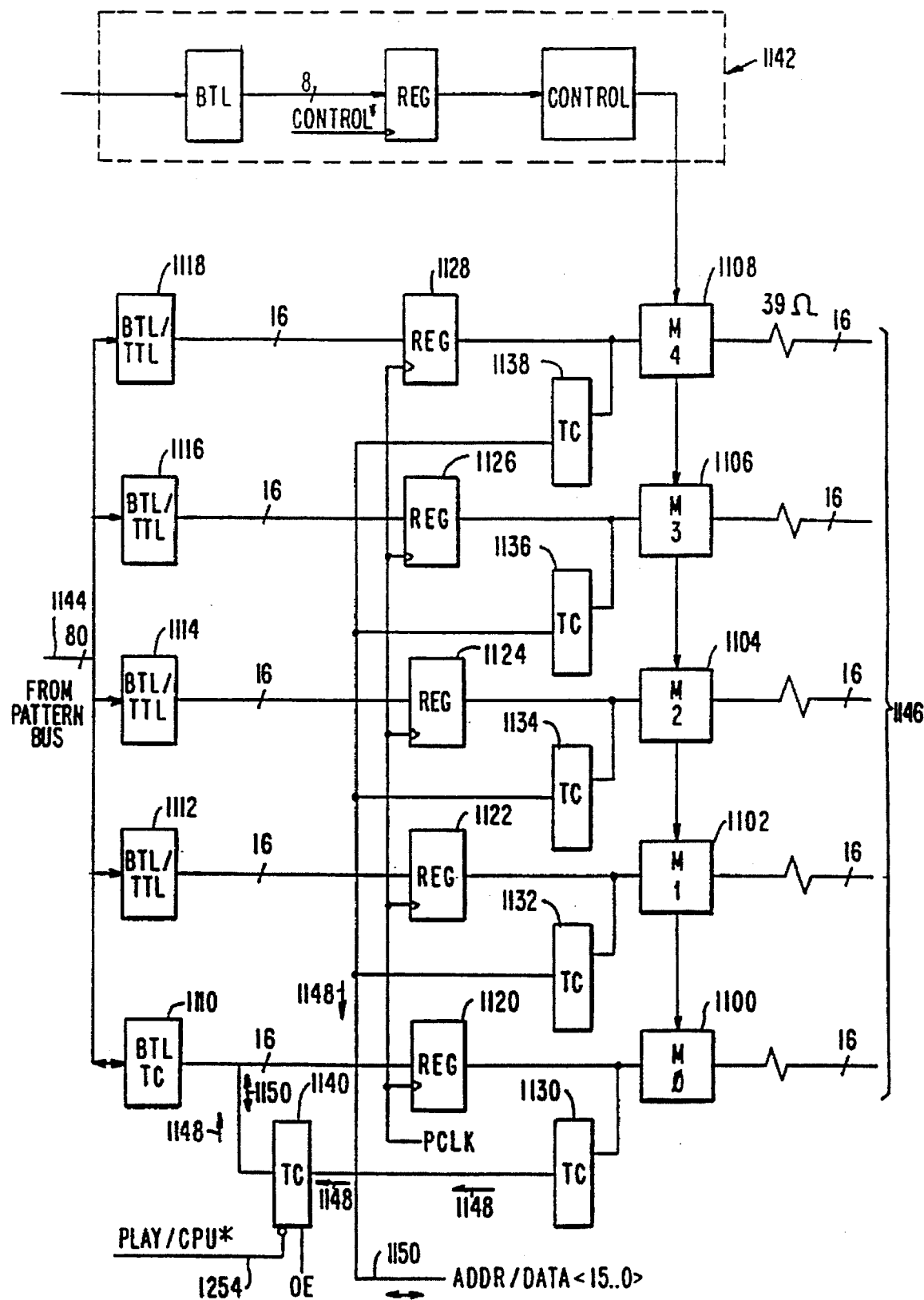
FIG. 21 is schematic drawing of the preferred embodiment of the PEL circuitry which interfaces the Pattern Bus of the HMS of FIG. 1 with an HME.

Referring now to FIG. 21, PEL 266 has circuitry for interfacing the CICs to the Pattern Bus. For descriptive purposes, the five CICs are shown at reference numbers 1100, 1102, 1104, 1106, and 1108. Each is mounted on PEL 266. Line 1144 from the Pattern Bus is input to BTL/TTL logic transceivers 1110, 1112, 1114, 1116, and 1118. A 16-bit signal is input to each of the five transceivers. An additional 16-bit control signal is transmitted from the Pattern Bus as part of the pattern data. Eight bits of the control signal are input to the PEL by the circuit shown at 1142.

In circuit 1142, the 8-bit signal is input to a BTL/TTL transceiver. The 8-bit output signal is input to an clocked octal register. When the register is clocked by the CONTROL* signal, the 8-bit signal is input to a series of PALs which will be described in detail in the discussion of FIG. 23. The outputs of each of the transceivers are input to clocked registers 1120, 1122, 1124, 1126, and 1128 and then to CICs 1100, 1102, 1104, 1106 and 1108, respectively.

During pattern presentation, data is sent from the PAM onto the Pattern Bus to the appropriate PEL. It is then processed by the BTL/TTL logic transceivers, and the clocked registers. The PCLK signal clocks registers 1120, 1122, 1124, 1126, and 1128, which output the data to the inputs of their respective CICs. The five CICs each output a 16-bit signal to the HME being modeled by five, 16-bit bi-directional lines which collectively are shown as the 80-bit bus line 1146.

The HMEs respond to stimulus signals sent over the 80-bit bus line, and the output is transmitted back to the CICs on bi-directional bus line 1146. When the CICs are read for determining the changes in the HME pin states as a result of the stimulus, the data is transmitted on the respective transceiver 1130, 1132, 1134, 1136, and 1138. The entire 80-bit signal is sent to the transceivers at the same time. The transceivers, however, are then sequentially enabled to multiplex the data onto a 16-bit address data bus and through transceiver 1140, as indicated by arrows 1148, onto line 1144 after processing by transceiver 1110.

Data is sent to the five CICs from PAC 258 and PAMs 514 on an 80-bit wide data bus. Data output from the five CICs is sent to CPU 240. It may then be sent to the host operating system to be used in simulations. The data path to the CPU is only 16 bits wide, so the data from the five CICs is multiplexed when transmitted from transceivers 1110, 1112, 1114, 1116, and 1118.

Transceiver 1140 changes operating states depending on whether the system is operating in pattern presentation mode or CPU access mode. The signal that controls this operation is the PLAY/CPU* signal on line 1154. During the CPU access mode, BTL/TTL transceivers 1112, 1114, 1116, and 1118 are not used. Instead, transceiver 1110 and transceiver 1140 are used. The transmission path between the Pattern Bus and various PEL control circuits in the access mode is via bus 1150 (shown in FIG. 22).

Figure 22:
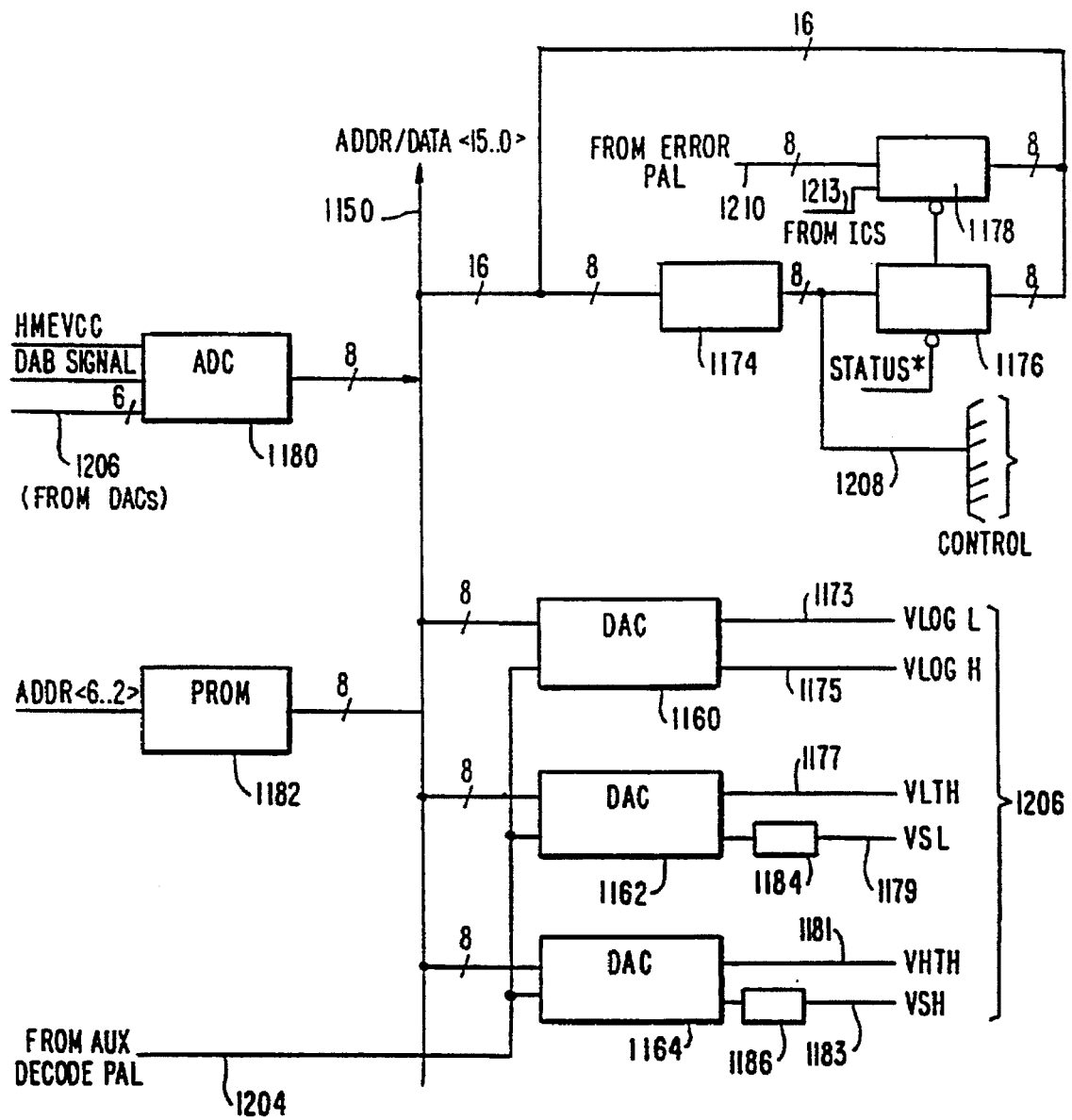
FIGS. 22–24 are schematic drawings of the control portion of the PEL circuitry of the HMS of FIG. 1.

Referring now to FIG. 22, bus 1150 forms a 16-bit address/data bus between CPU 240 and various control and status registers on PEL 266. Control register 1174 of PEL 266 controls whether the HME is a public or private device, resetting error conditions, activating light-emitting diodes, and initializing DAB 268. The 8-bit signals output from control register 1174 are input to error PAL 1202 on line 1208, as described with respect to FIG. 25. The output of control register 1174 is also input to an electrically-erasable programmable memory chip (EEPROM) on the DAB which identifies the DAB that is attached to the PEL. The bits of control register 1174 are reset to a logic low value when the HMS is reset.

The PEL includes status registers 1176 and 1168. The inputs to register 1176 are the signals output from control register 1174. The signals input to register 1178 are signals from the CICs, the output of error PAL 1202, and the output of the EEPROM.

Digital-to-analog converters ("DACs") 1160, 1162, and 1164 are disposed on the PEL. The DACs generate the six voltages used by CICs 1100, 1102, 1104, 1106, and 1108. These voltages are the VLOGL signal on line 1173, the VLOGH signal on line 1175, the VLTH signal on line 1177, the VSL signal on line 1179, the VHTH signal on line 1181, and the VSH signal on line 1183. The CICs use these signals to generate reference voltages and currents for sampling and driving the HME pins.

DACs 1160, 1162, and 1164 are controlled by the CPU and are connected to address/data bus 1150. The reference voltages of the DACs are connected to HMEVCC. The HMEVCC signal is input to the DACs to minimize the danger of the DACs generating a voltage which exceeds the specifications of the HME.

The outputs from DAC 1162 and DAC 1164, associated with the VSL and VSH signals, respectively, preferably have an analog power buffer disposed in the line. The VSL signal on line 1179 is output from DAC 1162, and becomes the output signal of power buffer 1184. Similarly, the VSH signal on the 1183 is output from DAC 1164, then output from power buffer 1186. The signal shown at line 1204 represents the control signals for the DACs. The DAC output signals 1206 are transmitted to the CICs and to an ADC 1180. These ADC inputs serve the diagnostic function of verifying the outputs of DACs 1160, 1162, and 1164.

ADC 1180 is an octal converter. The inputs to the ADC include the outputs from DACs 1160, 1162, and 1164. The remaining inputs include the HMEVCC signal and the HME analog output. There is also a 5 V reference signal input to the ADC which is used for comparison to the HMEVCC signal. The ADC also connects to bus 1150.

Each PEL 266 has a distinct STRAP signal assigned to it. The STRAP signal must match the PEL address signal which is part of the 16-bit control word used during pattern presentation. If the PEL address signal does not match the STRAP signal, the PEL is not selected for use. This will be explained in detail, referring to FIGS. 23 and 24.

Figure 23:
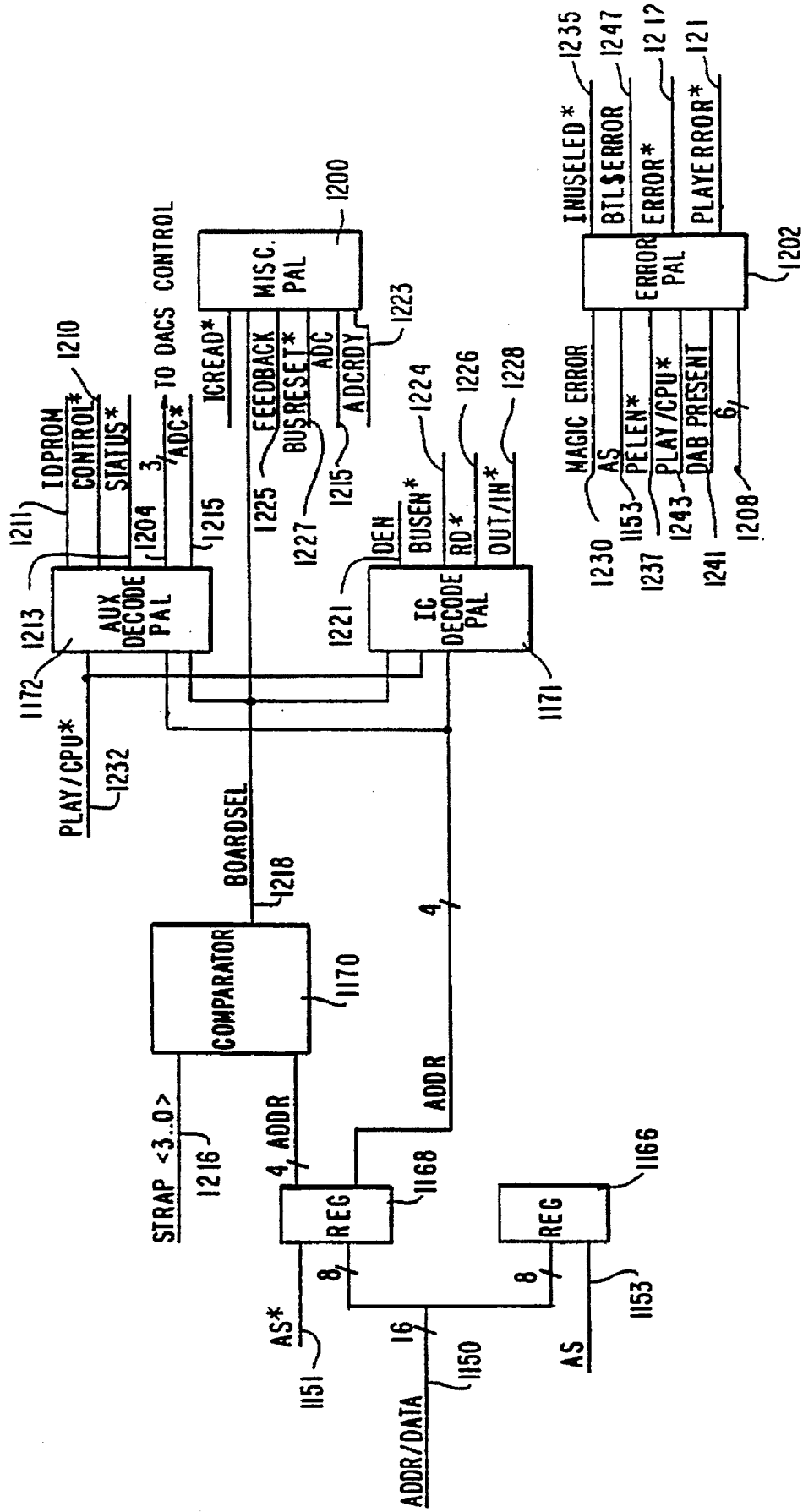

In FIG. 23, comparator 1170 is connected to ADDR/DATA bus 1150 via a clocked register 1168. This register is clocked by the AS* signal on line 1151. A 4-bit PEL address signal on bus 1150 is latched by register 1168. The other input to comparator 1170 is the 4-bit STRAP signal. The output of the comparator is the BOARDSEL signal on line 1218. This signal is asserted when the PEL address signal from register 1168 matches the STRAP signal.

The BOARDSEL signal is input to Auxiliary Decode PAL 1172, CIC Decode PAL 1171, and Miscellaneous PAL 1200. The 4-bit ADDR signal output from register 1168 on line 1220 and the PLAY/CPU* signal on line 1232 are input to PALs 1171 and 1172.

Auxiliary decode PAL 1172 outputs the IDPROM* signal on line 1211, CONTROL* signal on line 1210, and STATUS* signal on line 1213. The CONTROL* and STATUS* signals are input to status register 1178 of FIG. 22. The IDPROM* signal is input to chip select of the IDPROM. PAL 1172 also outputs the chip select signals for each of the DACs. These signals are shown on composite line 1204. Also output from PAL 1172 is the ADC* signal on line 1215, which is the chip select signal for ADC 1180.

The outputs of CIC decode PAL 1171 are the BUSEN* signal on line 1224, the CIC RD* signal on line 1226, the OUT/IN* signal on line 1228, and the 5-bit CIC DEN signal on line 1221. The BUSEN* signal enables each of transceivers 1130, 1132, 1134, 1136, and 1138. The OUT/IN* and CIC RD* signals are transmitted to each of the CICs of the PEL on lines 1228 and 1226, respectively.

In addition to the BOARDSEL signal, the inputs to Miscellaneous PAL 1200 include the CIC READ* signal, the ADCRDY signal on line 1223, the ADC signal on line 1215, the FEEDBACK signal on line 1225, and the BUSRESET* signal on line 1227. The CIC RD* and ADC signals were described previously. The ADCRDY signal is asserted once ADC 1180 has made a conversion and is ready to output the data. The FEEDBACK signal is input from the DAB connected to the PEL, and the BUSRESET* signal from the Pattern Bus.

The outputs of Miscellaneous PAL 1200 are the CIC AS* signal on line 1231, the DEVRESET* signal on line 1233, and the BTL_FBIN* signal on line 1229. The CIC AS* signal is a control input to each of the five CICs. The DEVRESET* signal controls a flip-flop, whose output is the previously discussed ACTIVE signal. The flip-flop is clocked by the previously described INITIALIZE signal. The BTL_FBIN* signal on line 1229 has been previously discussed regarding the PAC.

Error PAL 1202 receives as inputs an error signal from the CICs on line 1230 and the previously described signals output from control register 1174 on line 1208. The signals on line 1208 are the INITIALIZE signal, the ACTIVE signal, the LED signal, and the CTL RESET* signal. The remaining input signals are the DABPRESENT signal on line 1241, the PELEN* signal on line 1237, the AS signal on line 1153, and the PLAY/CPU* signal on line 1243. Error PAL 1202 is switched between pattern presentation mode and CPU access mode by the PLAY/CPU* signal. When an error condition is detected, error PAL 1202 will output an ERROR* signal to output enable PAL 1232 on line 1212, and to status register 1178 on line 1210. Error PAL 1202 also transmits the BLT$ERROR Pattern Bus error signal on line 1247 to the CPU. Another output of PAL 1202 is the INUSELED* signal on line 1235. This signal will cause a status LED to light when the PEL is being accessed or patterns are being played.

Figure 24:
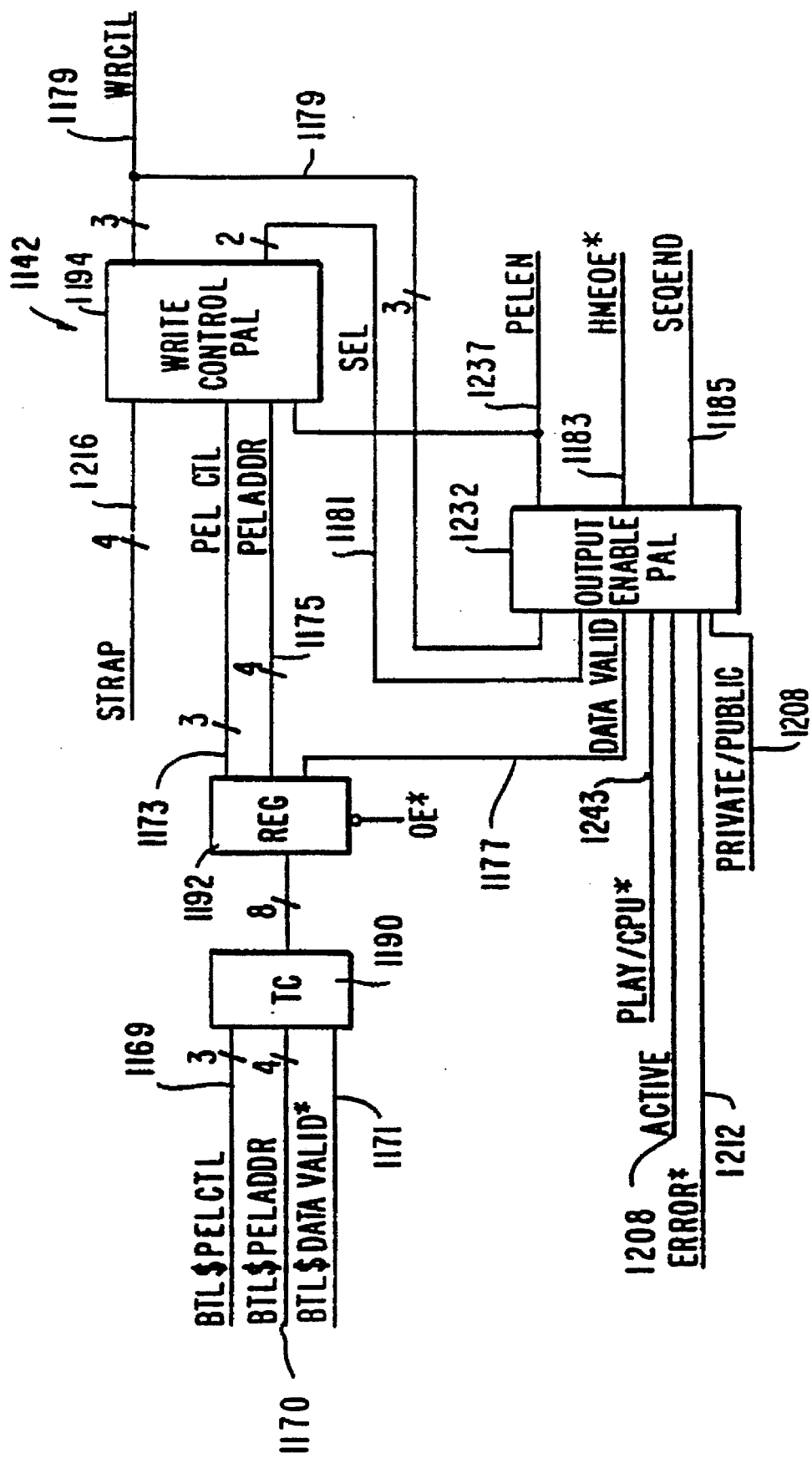

Referring now to FIG. 24, write control PAL 1194 and output enable PAL 1232 of control circuit 1142 are shown. The input signals to these PALs are registered signals from the Pattern Bus received through BTL/TTL transceiver 1190 and register 1192.

The inputs to transceivers 1190 are the 3-bit BTL-$PELCTL signal on line 1169, the BTLSPELADDR signal on line 1170, and the BTL$DATAVALID* signal on line 1171. The 8-bit output of the transceiver is input to register 1192. The output of the register are the 3-bit PELCTL signal on line 1173 and the 4-bit PELADDR signal on line 1175. These are input to write control PAL 1194. Write control PAL 1194 receives the 4-bit PELADDR signal during pattern presentation as part of the control word, compares it to the 4-bit STRAP signal 1216, and outputs a 2-bit SEL signal which is input to output enable PAL 1232. The PEL is "selected" if the PELADDR signal matches the STRAP signal. The 3-bit PELCTL signal is output from PAL 1194 as the WRCTL signal on line 1179. This signal is transmitted to the CICs and to output enable PAL 1232. If the PEL has been selected for operation, the signal will be asserted. The WRCTL signal is discussed in detail in connection with the integrated circuits.

Output enable PAL 1232 receives WRCTL and SEL signals from error PAL 1202, the ERROR* signal on line 1212, and the ACTIVE and PRIVATE/PUBLCIC* signals from control register 1174 on line 1208. PAL 1194 also receives the DATAVALID signal on line 1177 from register 1192, and the PLAY/CPU* signal on line 1243. PAL 1232 outputs the SEQEND signal on line 1185 and the HMEOE* signal on line 1183 which are input to the CICs. The SEQEND signal is active high to initiate a measurement cycle at the end of a pattern sequence. The HMEOE* signal controls the HME pin drivers. The third output is the PELEN signal on line 1237.

PEL 266 generates an error signal when certain conditions occur. For example, PEL 266 generates an error signal if patterns are presented to the PEL before a DAB has been inserted, or when the PEL is not active. PEL 266 also generates an error signal when an error occurs on the CICs, such as shorting of the pins or a parity error. If the DAB is capable of live insertion, PEL 266 preferably generates an error signal when a DAB has been inserted, when the DAB is not active, and when a DAB has been removed after it has been initialized. Error signals relating to the DAB status inform the user that something has changed and that some action may be required.

CUSTOM INTEGRATED CIRCUITS

An overall description of the CIC and its operation will first be presented. The CIC provides an electrical interface between the HMS and the HME pins. The CIC preferably is a mixed analog/digital CMOS standard-cell integrated circuit such as those manufactured by International Microelectronic Products. The CIC preferably supports 16 HME pins. The circuitry within the CIC for supporting a single HME pin is called a "channel." All 16 channels of the CIC are identical in function.

Each CIC channel also has two internal single-bit pattern data registers. A "presentation" register holds the single-bit value that is currently being presented via the pin drivers of the channel. The other register is a "staging" register which is used in supporting HMEs with more pins than the width of the Pattern Bus. To support such HMEs, the staging registers of multiple CICs are loaded at different times, while all the CICs present constant pattern data from their pattern registers. After loading the staging registers of the final set of CICs, all the CICs are commanded to simultaneously transfer the contents of their staging registers to their presentation registers. Thus, the staging register allows patterns to be accumulated within multiple CICs in preparation for simultaneous presentation to a single HME.

The CIC channels have various programmable functions. They are software programmable on a per-pin basis via the Pattern Bus. The CPU programs the CIC channels by causing special control patterns to be presented to the PEL. Ordinarily, such control patterns are prefixed to the beginning of each pattern sequence stored in PAM. When the pattern sequence is presented, these prefix patterns initialize the CICs.

Each CIC channel includes an HME pin driver which connects to an HME pin via a series damping resistor and controlled-impedance traces on the DAB. The HME pin driver consists of a hard driver, a medium driver, and a soft driver. These three types of drivers have their outputs connected in parallel within the CIC. The hard driver is capable of driving very high current levels in either the high or low state. The medium driver preferably is current limited to less than 16 mA in the low state and less than 8 mA in the high state. The hard driver is used for HME pins which are strictly inputs (so that these HME pins transition quickly when driven by the CIC channel). The medium driver is used to drive HME I/O pins during the presentation of the history sequence. The reason for using the medium driver to present the history sequence is that the HME I/O pins may at times temporarily drive in the opposite direction than the CIC pin driver is driving, and the medium driver will limit the current in such a situation.

Because of the relatively low current limits of the medium driver, the HME pin will ordinarily dominate in a conflict with the CIC pin driver, but the resulting logic level is not always predictable. However, novel HMS software discussed elsewhere herein creates one-bit-per-pin patterns which cause the CIC channel to drive in the same direction as the HME pin. To do this, the HMS measures the state of each HME pin before each new pattern is added to the pattern sequence. If an HME pin is found to be driving during measurement, the new pattern is constructed so that the CIC will drive in the same direction as the HME pin. Therefore, the steady state for each pattern in the pattern sequence is that the HME and the CIC drive in the same directions, and any medium-driver conflicts are transient.

The soft driver is used during five-state measurement of the HME pin's state after presentation of a pattern sequence. All CIC's connected to the HME measure all HME pin states simultaneously after the HME outputs have settled. As previously discussed, the measurement process can distinguish driving low, driving high, non-driving low, non-driving high, and unknown ("H0," "H1," "Z0," "Z1," and "U") HME pin states. The result of each measurement is latched in a 3-bit register in the CIC channel.

The soft driver is implemented as two drivers connected in parallel inside the CIC: a low soft driver and a high soft driver. The low soft driver is enabled only if the corresponding pattern bit is a zero; it drives toward the soft-low target voltage ("VSL") programmed on the PEL. The high soft driver is enabled only if the corresponding pattern bit is a one; it drives toward the soft-high target voltage ("VSH") programmed on the PEL. The low soft driver and high soft driver have current limits which are separately programmable using control patterns presented to the CIC.

The low soft driver in each CIC channel is preferably programmed with a current limit such that if the connected HME pin is not driving (for example, if it is an I/O pin in the input state), then the low soft driver will succeed in driving it to a valid logic low state, but if the HME pin is driving, then the HME pin will dominate and the pin will attain the same logic level as if the CIC channel were not connected to it. In this case, we say that the CIC pin driver is driving "soft-low," or is driving with "soft-drive low I/V characteristic."

Similarly, the high soft driver in each CIC channel is preferably programmed with a current limit such that if the connected HME pin is not driving (for example, if it is an I/O pin in the input state), then the high soft driver will succeed in driving it to a valid logic high state, but if the HME pin is driving, then the HME pin will dominate and the pin will attain the same logic level as if the CIC channel were not connected to it. In this case, we say that the CIC pin driver is driving "soft-high," or is driving with "soft-drive high I/V characteristic."

Thus, a CIC channel driving "soft-high" or "soft-low" can be dominated by an HME pin which is driving, but will cause a non-driving HME pin to attain a valid logic high or low state, respectively.

During the measurement process, the CIC channel drives the connected HME pin using either a soft-drive low I/V characteristic or a soft-drive high I/V characteristic, depending upon the value of the appropriate pattern bit of the measurement pattern. The target voltage for the low soft driver is programmed to be slightly above the bottom of the logic low state voltage range for the HME pin. The target voltage for the high soft driver is programmed (on the PEL) be slightly below the top of the logic high state voltage range for the HME pin.

While soft driving, the CIC channel compares the steady-state HME pin voltage simultaneously with four reference voltages generated on the PEL. The CIC channel may be soft-driving low or soft-driving high. If the CIC channel is soft-driving low, then an HME pin voltage lower than the target voltage of the low soft driver (VSL) indicates that the HME pin is in the H0 state. A voltage which is a valid logic low, but is above the target voltage, indicates that the HME pin is in the Z0 state. A voltage which is a valid logic high indicates that the HME pin is in the H1 state, and any other voltage indicates that the HME pin is in the U state. The Z1 state is impossible.

Similarly, if the CIC channel is soft-driving high, then an HME pin voltage higher than the target voltage of the high soft driver (VSH) indicates that the HME pin is in the H1 state; a voltage which is a valid logic high but is below the target voltage indicates that the HME pin is in the Z1 state; a voltage which is a valid logic low indicates that the HME pin is in the H0 state; and any other voltage indicates that the HME pin is in the U state. The Z0 state is impossible.

Various alternative embodiments of this basic five-state sampling method would be obvious to one skilled in the art. For example, in an alternative embodiment, the current into, or out of, the HME pin could be compared with reference currents to distinguish the H0, H1, Z0, Z1, and U HME pin states.

In another alternative implementation, the CIC channel could be set to drive the HME pin toward a logic low level or a logic high level without regard to whether the CIC pin driver would dominate the HME pin. For example, the CIC channel could be set to hard drive the HME pin. As in the soft-drive method, voltage comparisons or current comparisons would be used to distinguish the H0, H1, Z0, Z1, and U pin states.

Now that its general operation has been presented, the CIC will be described in detail.

When simulator 164 of host computer 112 makes a request for a device evaluation, the HMS formats the request into signals to be presented to HME pins, applies the signals to the pins, measures the HME's behavior by sensing the pins after a predetermined time period, and returns the resulting outputs, plus timing information, to the simulator. An important consideration in this process is the method used to drive and sense the HME pins. In the present invention, CICs preferably are used to drive and sense the HME pins. In an alternative embodiment, some or all of these functions may be performed by discrete circuits. The CICs for the purpose defined herein may be packaged in any conventional packaging arrangement.

Figure 25:
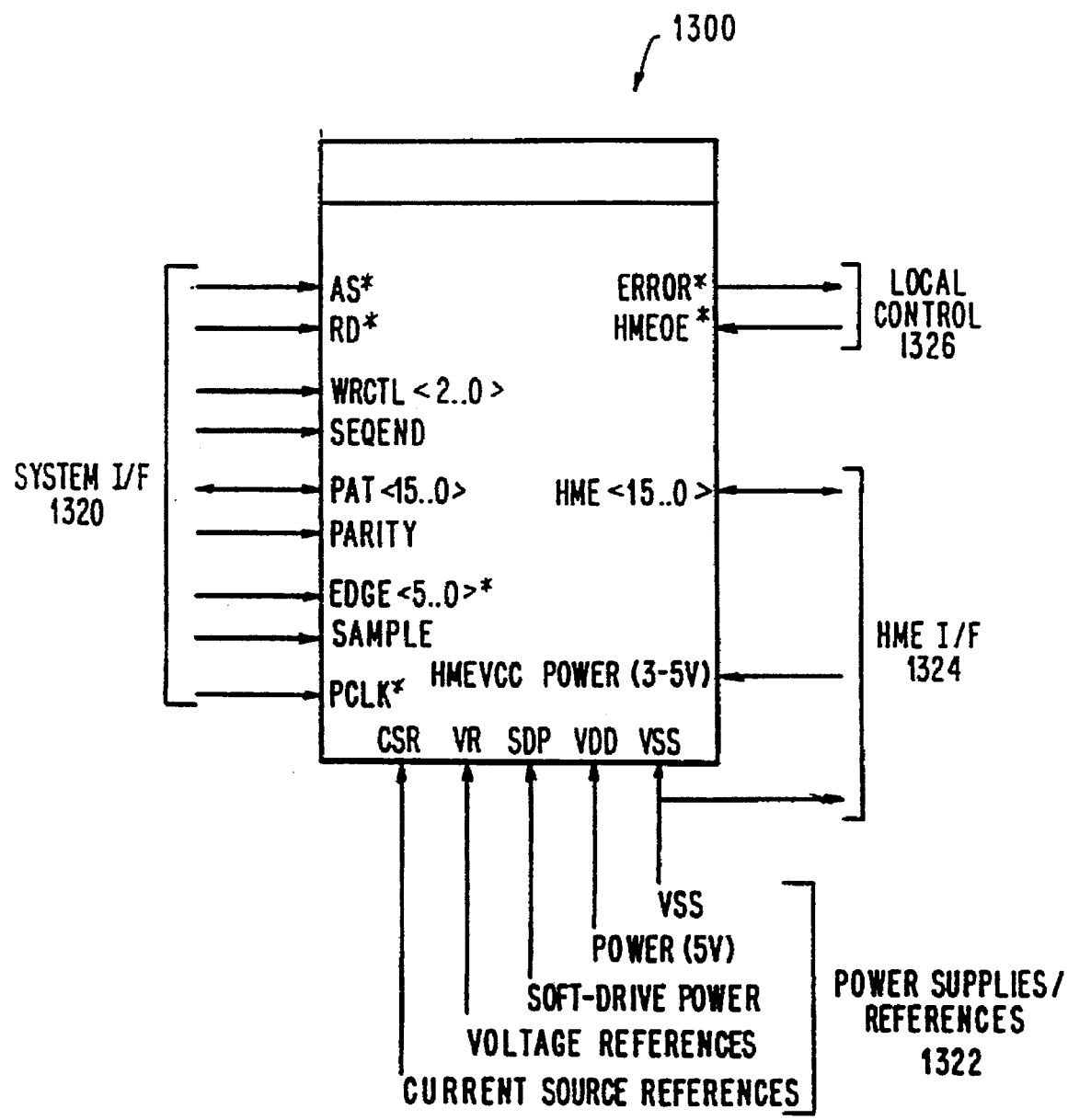
FIG. 25 is a block diagram of a CIC on the PEL circuitry of the present invention.

FIG. 25 at 1300, shows a chip-level block diagram of the CIC of the present invention. The major inputs to, and outputs from, CIC 1300 are shown. These are associated with system interface 1320, HME interface 1324, power supplies/references 1322, and local control 1326. Before disclosing the specifics of the components of CIC 1300 and their operation, the configuration of the CICs on the PEL will be disclosed.

Figure 26:
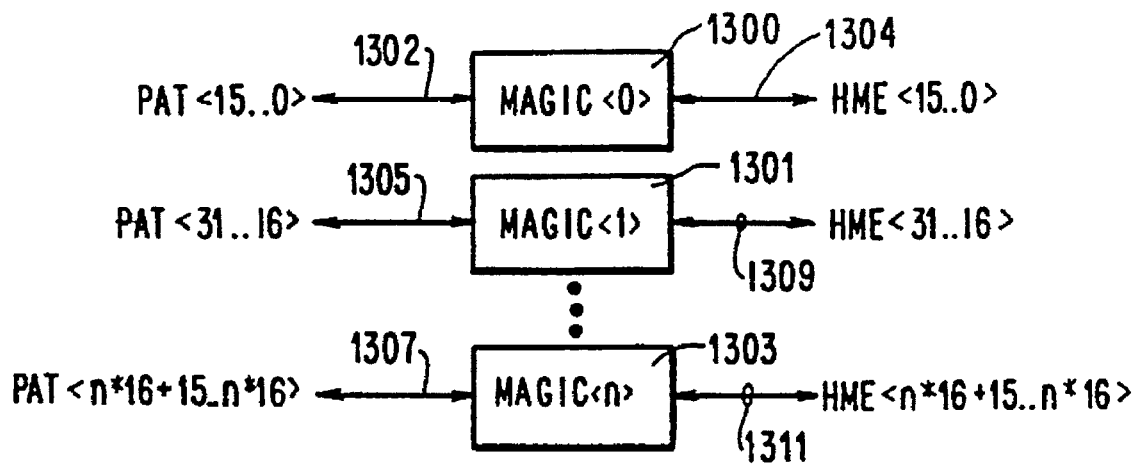
FIG. 26 is a block diagram showing the parallel connection of a number of CICs of FIG. 25.
Figure 27:
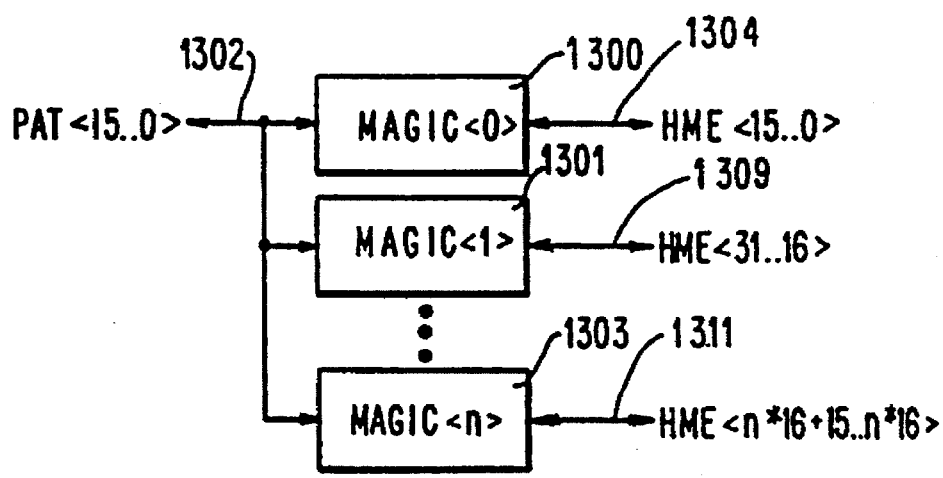
FIG. 27 is a block diagram illustrating the serial connection of a number of CICs of FIG. 25.

Referring to FIG. 26 and 27, there are preferably five CICs connected to each PEL. Each one has sixteen HME driver/sensor pin channels. However, it is understood that there may be more or less than five CICs per PEL and each CIC may have a fewer or greater number of driver/sensor pin channels.

The five CICs may be configured in series or in parallel to increase the number of HME pin driver/sensors of the system. Preferably, the CICs are connected in parallel to allow pattern presentation at maximum rates, but the CICs could also be connected in series for lower cost. The design of an HMS based on serially-connected CICs is well within the capability of one skilled in the art. Any number of CICs may be connected together to accommodate an HME having more than 16 pins. FIG. 26 shows the parallel connection of CICs 1300, 1301 and 1303. CICs 1300, 1301, and 1303 are connected to their own 16-bit Pattern Bus, 1302, 1305, and 1307, respectively. They are also connected to their own 16-bit HME bus 1304, 1309, and 1311, respectively.

FIG. 27 shows CICs 1300, 1301, and 1303 connected in series. Each CIC is connected to its own 16-bit HME bus 1304, 1309 and 1311, respectively, but they all share the same 16-bit Pattern Bus 1302. When the CICs are connected in series, each CIC is sequentially enabled to access multiplexed pattern bus 1302.

When the system is connected in parallel, the speed of data presentation during pattern play is faster than when they are connected in series. This is because all the data bits for each CIC are sent from the PAMs at the same time. However, when they are connected in series, the multiplexed pattern bus serially loads all of the data bits from the PAMs. This method is slower.

When the system is series connected, the size of Pattern Bus 1302 is reduced. Further, when the CICs are serially connected, the system may include any desired number of CICs without the need to redesign the Pattern Bus and addressing system. Even further, to operate CICs 1300, 1301, and 1303 in parallel, each HME pin driver/sensor must be accompanied by its own pattern data line.

Again referring to FIGS. 25, CIC 1300 has a number of signals associated with it. Tables 7 and 8 provide an explanation of these signals which are referred to throughout the description of CIC 1300.

There are two modes that are used to perform the system interface function. The first is pattern presentation mode. In this mode, bit patterns containing control and data signals are clocked onto the Pattern Bus using the PCLK* signal. The patterns are presented to the pins of the HME. After the patterns have been presented, a measurement cycle is performed to evaluate the HME response to the pattern sequence. The second mode is CPU access mode. In CPU access mode, the Pattern Bus is used by the system to read data from, and write data to, the CICs, among other components. The following signals, listed in Tables 7 and 8, are used in both modes of operation as will be explained.

TABLE 7

| Signal | Description |
|---|---|
| AS* | ADDRESS STROBE. This input is used during the CPU access mode. Asserting the AS* pulse causes PATTERN<5..2> to be latched into the internal address register of the CIC during the register read operation. AS* preferably is a TTL level input. |
| RD* | READ. This input is used during in CPU access mode. RD* enables reading of the CIC status registers onto the Pattern Bus. The internal address register of the CIC points to the status register being read. RD* preferably is a TTL level input. |
| WRCTL<2..0> | WRITE CONTROL. These inputs are used during pattern presentation mode to specify the operation the CIC will perform during the current pattern cycle. WRCTL<2..0> preferably are synchronous TTL level inputs. |
| PAT<15..0> | PATTERN I/O. During pattern presentation mode, the Pattern Bus is used to program the CIC control registers and to receive pattern data to be formatted onto the HME pins. During CPU access mode, the Pattern Bus is used to read the internal status registers of the CIC. PAT<15..0> preferably are synchronous TTL level I/O with weak pull-ups. |
| PARITY | PATTERN PARITY IN. PARITY is used during pattern presentation mode to check the parity on the Pattern Bus. If there is a parity error, the ERROR* signal is asserted and the data with the parity error is saved. The CIC parity is odd. PARITY preferably is a synchronous TTL level input. |
| EDCE<5..0>* | TIMING EDGES. The six timing edges are used by the data formatter as timing references during pattern presentation mode to generate the data formats DNRZ, R1, RZ and RC for the HME outputs. These signals are preferably 8 ns high-going pulses. EDGE<5..0>* preferably are CMOS level inputs. |
| SAMPLE | SAMPLE. This signal is used during pattern presentation mode. The positive edge is used to take a 2-state sample of HME<15..0> for timing measurement, while the negative edge is used to take a 5-state sample during soft-drive sampling. SAMPLE preferably is a TTL level input. |
| PLCK* | PATTERN CLOCK. The falling edge of PCLK* is used in pattern presentation to clock data onto the synchronous input pins. PCLK* preferably is a CMOS level input. |
| IM | MEDIUM-DRIVER CURRENT SOURCE. This signal is used to generate a reference current for the HME medium-drivers. The medium-driver output currents at 2.5V are $Imoh = 16 * V(IM) / R(IM)$, and $Imoh = -8 * V(IM) / R(IM)$. Preferably, the CIC will hold IM at VDD/2, and the R(IM) suggested value is 2.5K to VSS, which results in Imoh = 16mA and Imol = −8 mA. |
| ISN | LOW SOFT-DRIVER CURRENT SOURCE. This signal is used to generate a reference current for the HME low soft-drivers. The formulas for the low soft-drivers are $Isol<3> = 3 * V(ISN) / R(ISN)$, $Isol<2> = 1.2 * V(ISN) / R(ISN)$, $Isol<1> = 0.5 * V(ISN) / R(ISK)$, $isol<0> = 0.2 * V(ISN) / R(ISN)$. Preferably, the CIC will hold this pin at VDD/2, and suggested R(ISN) value is 2.5K to VSS, which results in Isol<3> = 3 mA, Isol<2> = 1.2 mA, Isol<1> = 0.5 mA and Isol<0> = 0.2 mA. |
| ISP | HIGH SOFT-DRIVER CURRENT SOURCE. This pin is used to generate a reference current for the HME high soft-drivers. The formulas for the high soft-drivers are $Isoh<3> = -V(ISP) / R(ISP)$, $Isoh<2> = -0.6 * V(ISP) / R(ISP)$, $Isoh<1> = -0.25 * V(ISP) / R(ISP)$, $Isoh<0> = -0.06 * V(ISP) / R(ISP)$. The CIC will hold this pin at VDD/2, and the suggested R(ISP) value is 1.25K to VDD, which results in Isoh<3> = −2 mA, Isoh<2> = −1.2 mA, Isoh<1> = −0.5 mA, and Isoh<0> = −0.1 mA. |
| VHTH | Z1/H1 THRESHOLD. This voltage reference is used by the HME 5-state sampling circuitry. When the CIC is soft-driving an HME pin high, and VLOGH < V(HME) < VHTH, then the Z status bit for the HME pin will be sampled TRUE. If V(HME) > VHTH, then the Z status bit would be FALSE. |
| VLOGH | U/Z1 THRESHOLD. This voltage reference is used by the HME 5-state sampling circuitry. If V(HME) > VLOGH then the HME pin will be sampled as a H1 or Z1. If VLOGH < V(HME) < VLOGL, then the HME pin will be sampled as a U. |
| VLOGL | Z0/U THRESHOLD. This voltage reference is used by the HME 5-state sampling circuitry. If V(HME) < VLOGL, then the HME pin will be sampled as a logic low. If VLOGL < V(HME) < VLOGH, then HME pin will be sampled as a logic "U". |
| VLTH | H0/Z0 THRESHOLD. This voltage reference is used by the HME 5-state sampling circuitry. When the CIC is soft-driving an HME pin low, and VLTH < V(HME) < VLOGL, then the Z status bit for the HME pin will be sampled TRUE. If V(HME) < VLTH, then the Z status bit would be FALSE. |
| VSH | HIGH SOFT-DRIVE POWER. This is the high soft-driver power supply. Its input range is from 2.5 volts to HMEVCC. |
| VSL | LOW SOFT-DRIVE POWER. This is the low soft-driver power supply. Its input range is from 0 V to 1.0 V. |
| AVDD | ANALOG POWER. This is the analog +5 V supply. |
| VDD | POWER. The VDD pins are for a +5 V power supply. There are two pins for pattern I/O, and one pin for internal logic. |
| VSS | GROUND. The VSS pins are for the ground reference. There are four pins for pattern I/O, two pins for internal logic, and two pins for analog cells. |

Local control deals primarily with error handling. A preferred method of handling errors is to use the ERROR* signal to deassert the HMEOE* signal, and send an interrupt back to the HMS. The ERROR* signal preferably is also sent to a local status register on PEL 268. HMEOE* should only be asserted while patterns are being presented to an HME. For private devices, this occurs during the entire time the device is being used; for public devices it is only during individual pattern sequences. These signals are indicated generally at 1326 in FIG. 25. The last two groups of I/O signals of CIC 1300 interface the CIC with the HME and power the CIC. These signals are designated generally by reference numerals 1322 and 1324. These signals and their descriptions are set forth in Table 8.

TABLE 8

| Signal | Description |
|---|---|
| ERROR* | ERROR. ERROR* is an open drain output that indicates there was either a parity error on the Pattern Bus during pattern presentation, or a HME pin was detected to be shorted. The current input pattern is saved when this pin goes low. To reset this signal, a read of the reset register is required. ERROR* is a CMOS level I/O. |
| HMEOE* | HME OUTPUT ENABLE. Deasserting HMEOE* disables the HME drivers, and enables a weak pull-down. HMEOE* preferably is a TTL level input. |
| HME<15..0> | HME I/O. The HME bus is used to drive and sense HME pins. HME<15..0> preferably are programmable level I/O pins. |
| HMEVCC | HME POWER. This signal is the HME I/O pin-driver power supply. The advantage to having a separate supply from the VDD pins is that HMEVCC can be from 3 V to 5 V, allowing for the direct driving of low-voltage CMOS parts. |
| VSS | GROUND. There are four ground pins allocated for HME pin drivers. These ground pins should be common to both the CIC and the HME. |

CIC 1300 includes both digital and analog electronic circuitry. The digital circuitry includes data channels, control and data registers, and formatting circuitry. The analog circuitry includes the HME driver circuitry and 5-state sampler. The following description relates to the preferred embodiment of the present invention which includes CICs that have 16 HME pin driver/sensor channels.

CIC 1300 has the capability of per-pin programmability for driving and sensing the HME pins. Hence, each of the CIC's HME pins can be programmed as an input, an output, or an I/O. In addition, each pin may be programmed as a power or ground pin so that the user can jumper power or ground to the HME without having to disconnect the HME pin. The CIC is protected against damage when HME pins are connected to power or ground.

Figure 28:
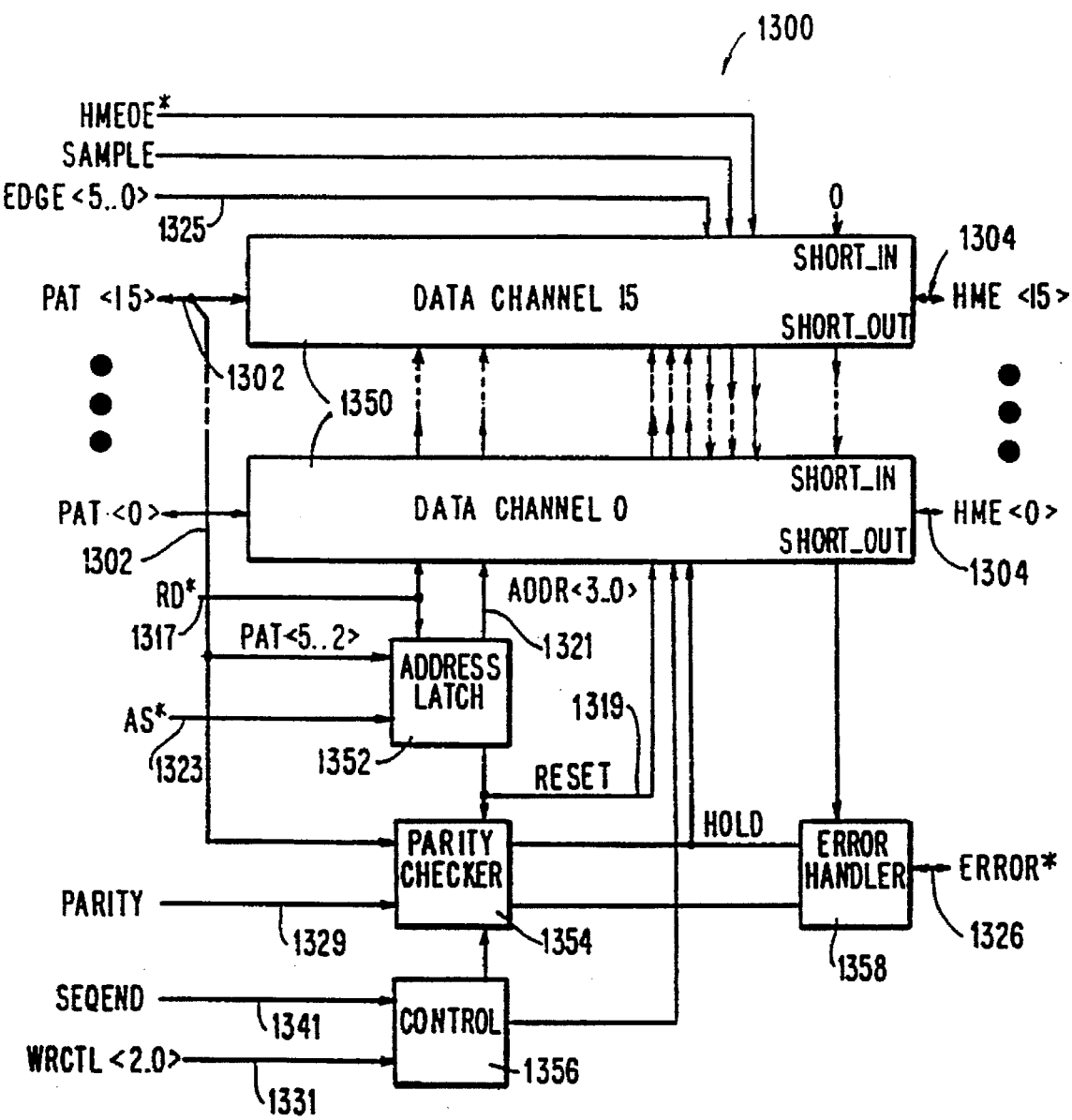
FIG. 28 is a schematic drawing of the digital circuitry of the CIC of FIG. 25.

Referring to FIG. 28, a block diagram of CIC 1300 shows the major components of the CIC. CIC 1300 preferably includes 16-bit Pattern Bus 1302 and 16-bit HME bus 1304. Data channels 1350 process the Pattern Bus signals for output therefrom to the HME bus. In processing data, data channels 1350 format data from the Pattern Bus and drive the formatted data on to the HME bus for input to the HME pins. The data channels sample the HME pins.

Circuit 1300 includes address latch 1352 which latches four pattern bits PAT<5..2> in a 4-bit register. The latched address is transmitted to each of the data channels 1350, to be used as a status/read select. When RD* on line 1317 is asserted, the internal RESET signal on line 1319 of circuit 1300 is asserted. The RESET signal is input to parity checker 1354 and data channels 1350. The latched address values are input to data channels 1350, as the 4-bit ADDR signal on line 1321 when the AS* signal on line 1323 is asserted.

CIC 1300 also includes a parity checker 1354, an error handler 1358, and control circuitry 1356. The parity checker will now be described.

Figure 29:
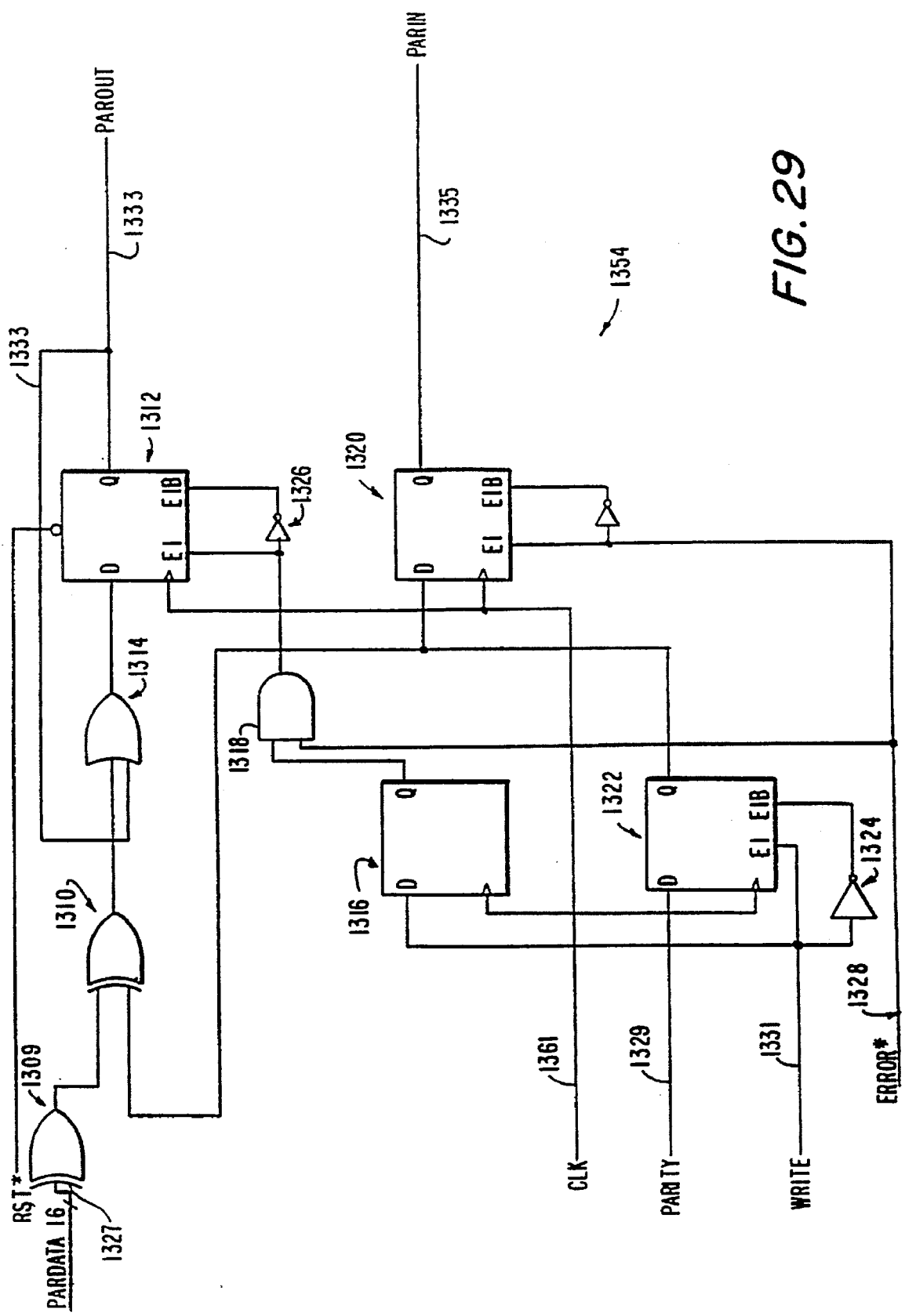
FIG. 29 is a schematic drawing of the Parity Checker circuitry of the CIC of FIG. 25.

During pattern presentation, parity checker 1354 (FIG. 29) checks Pattern Bus 1302 for parity against the PARITY signal on line 1329. The 16-bit input connects to eight exclusive-OR gates, two adjacent bit lines per gate. The output of the gates are input to four more exclusive-OR gates, two adjacent bit lines per gate. This process is continued until there is a single output signal. The four levels of exclusive-OR gates are represented by the exclusive-OR gate 1309. The signal output of gate 1309 is output to exclusive-OR gate 1310. The second input signal is the registered PARITY signal output from register 1332.

The PARITY signal on line 1329 is from the Pattern Bus and latched in register 1322. The PARITY signal is from the PAC. The register is clocked by PCLK signal on line 1361. The control inputs to the register are the WRITE* signal on line 1331 and its complement.

The output of exclusive-OR gate 1310 is input to OR gate 1314. The second input to OR gate 1314 is the signal on feedback line 1333. The output of OR gate 1314 is input to the data input of register 1312. The output of register 1312 is the PAROUT signal on line 1333 which is also fed back to the input of OR gate 1314. The control inputs to register 1312 are the output of AND gate 1318 and its complement.

The inputs to AND gate 1318 are the ERROR* signal on lines 1328 and the output of register 1316. The WRITE signal on line 1331 is in input to the data input to register 1316. PCLK signal on line 1361 in input to its clock input.

The PARITY signal output from register 1322 is input to the data input of register 1320. This register is clocked by the PCLK signal and its control inputs are the ERROR* signal on line 1326 and its complement. The output of the register is the PARIN signal on line 1335.

The PARIN signal line 1335 is the twice registered PARITY signal. This signal is clocked with the PAROUT signal so that if there is a parity error, the PARITY signal which generated the error may be retrieved. The PAROUT signal on line 1333 is a comparison of the PARITY signal on line 1329 and the PARDATA on line 1327.

If an error is detected, register 1312 and OR gate 1314 form a "hold" loop. This loop is controlled by the status ERROR* and WRITE signals, as gated by AND gate 1318. This loop will remain set by the RST* signal on line 1319.

Figure 30:
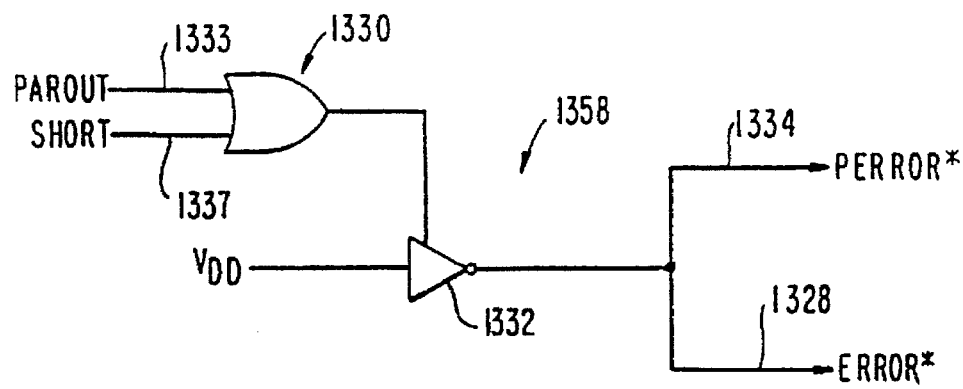
FIG. 30 is a schematic drawing of the Error Handler circuitry of the CIC of FIG. 25.

Referring to FIG. 30, error handler 1358 will be described. If an error exists on the CIC, viz., parity or short error, it is preferably sent to all data channels 1350 by error handler 1358. The PAROUT signal on line 1333 and the SHORT signal on line 1337 are input to OR gate 1330. The SHORT signal when asserted indicates that there is a short in the data channel circuitry. The output of OR gate 1330 enables a tri-state buffer 1332. This will assert the PERROR* signal on line 1334 which is input to the PEL, and assert the ERROR* signal on line 1328 which is input to parity checker 1354 and data channels 1350.

The ERROR* signal on line 1328 is sent to the data channels so that the error data can be held for future evaluation. The PARIN signal on line 1335 is saved in status register 1320. Error handler 1358 forces the data channels and parity checker 1354 into the "hold" state whenever the ERROR* signal is asserted (either internally or externally).

Figure 31:
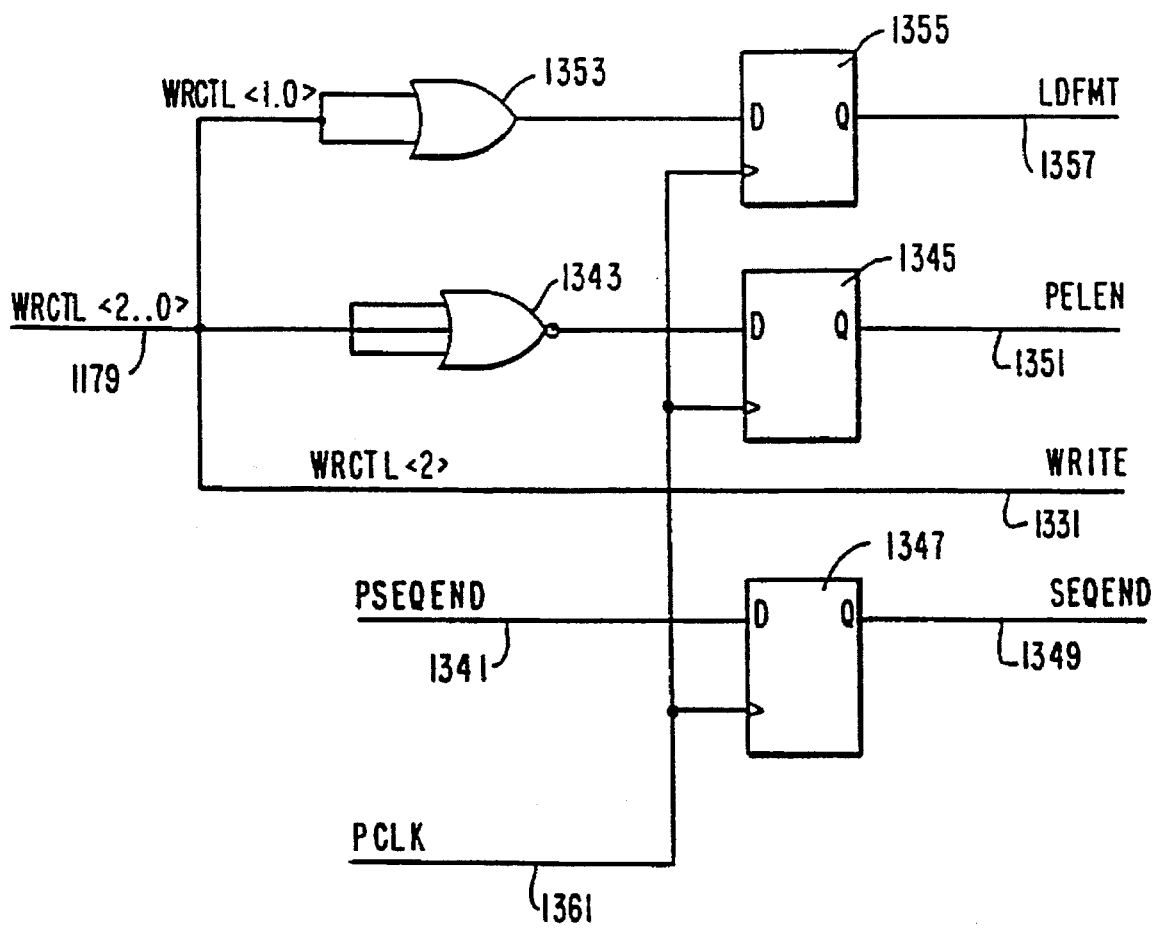
FIG. 31 is a schematic drawing of the Control Circuit of the CIC of FIG. 25.

FIG. 31 shows a block diagram of control circuitry 1356. Control circuitry 1356 generates certain control signals during pattern presentation mode. Certain of these signals control the input to the data channels. The single bit WRITE signal on line 1331 is sent to parity checker 1354 indicating when the parity checker has valid data. The circuit of FIG. 31 will now be discussed in detail.

The PSEQEND* signal on line 1341 is input to the data input of flip-flop 1347. The flip-flop is clocked by the PCLK signal. The SEQEND signal output from flip-flop 1347 on line 1349 is input to data channel 1350.

The 3-bit WRTCL signal on line 1179 is from PEL 266. The 3 bits are input to NOR gate 1343. The output of NOR gate 1343 is input to the data input of flip-flop 1345. This flip-flop is also clocked by the PCLK signal on line 1361. The output of the flip-flop 1345 is the PELEN signal on line 1351 which is input to the data channels, 1350.

The WRITE signal on line 1331 is the WRCTL<2> bit of the 3 bit WRCTL signal. This signal is input to parity checker 1354.

A 2-bit WRCTL<1..0> signal that is part of the 3-bit WRTCL signal on line 1179 is input to OR gate 1355. The output of OR gate 1355 is input to the data input of flip-flop 1355 whose output is clocked by the PCLK signal. The output of flip-flop 1355 is the load formatter ("LDFMT") signal on line 1357. The LDFMT signal is input to data channels 1350.

Figure 32:
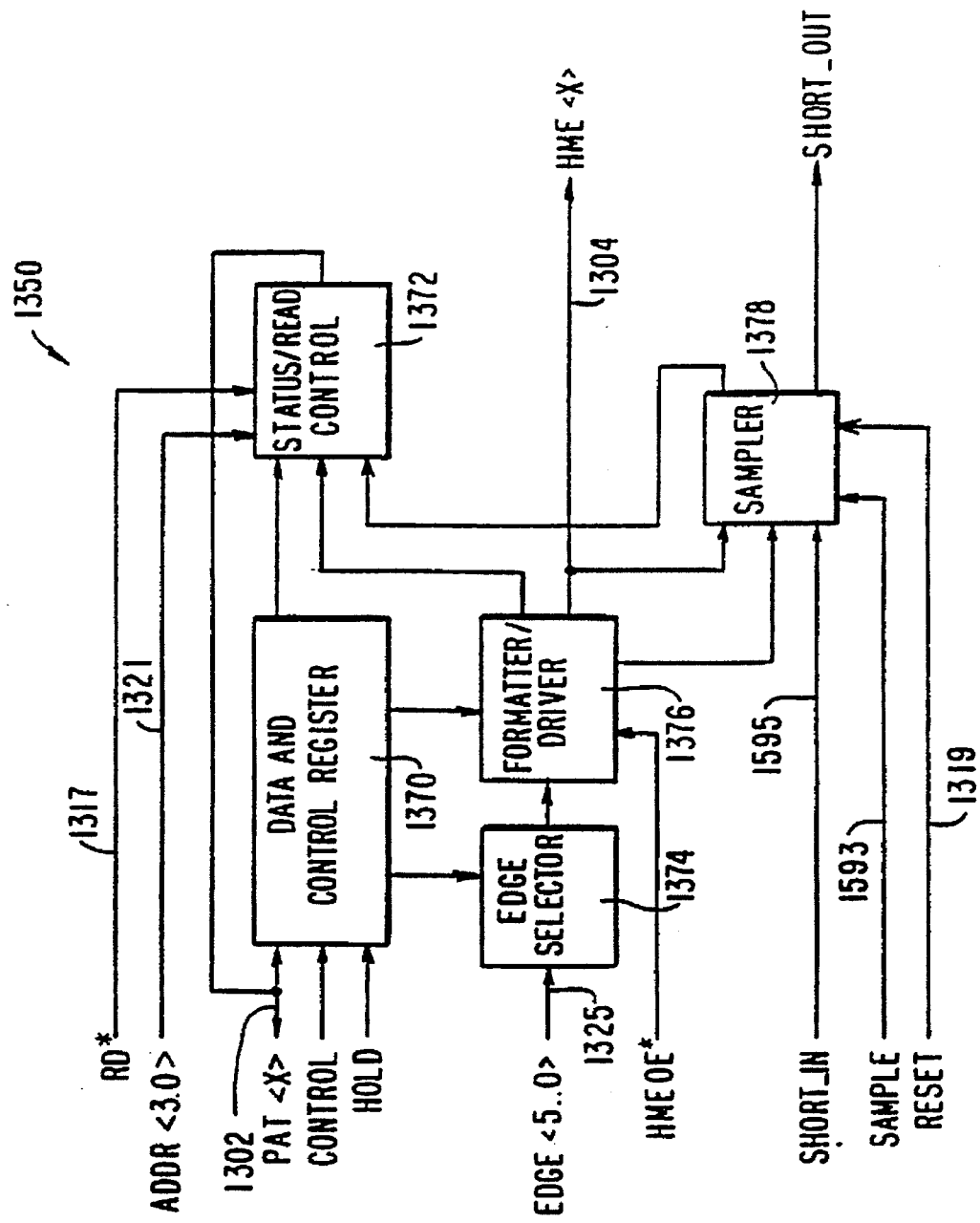
FIG. 32 is a schematic drawing of the Data Channel of the CIC of FIG. 25.

FIG. 32 is a block diagram of data channel 1350. It includes data and control registers 1370, status/read control circuitry 1372, edge selector 1374, formatter/driver circuitry 1376, and sampler 1378. Registers 1370 receive data from the Pattern Bus. This data is stored in either a configuration register (FIG. 16), a data register, or the hard/medium drive enable register.

Status/read control 1372 is a 16:1 multiplexer that receives inputs from various internal nodes, including registers 1370, formatter/driver 1376, and sampler 1378.

Edge selector 1374 selects which of six timing edges will be used as the "set" edge, the "reset" edge, and the "driver off" edge for a particular bit of pattern data.

The inputs to formatter/driver circuitry 1376 are from data and control register 1370 and edge selector 1374. These inputs cause the formatter/driver circuitry to format the pattern data and drive it to the HME pins.

Sampler 1378 preferably performs two-state sampling on the rising edge of the SAMPLE signal, and five-state sampling on the falling edge of the signal. Sampler 1378 also includes circuitry for detecting short circuits. Each of these components is described subsequently.

Figure 33:
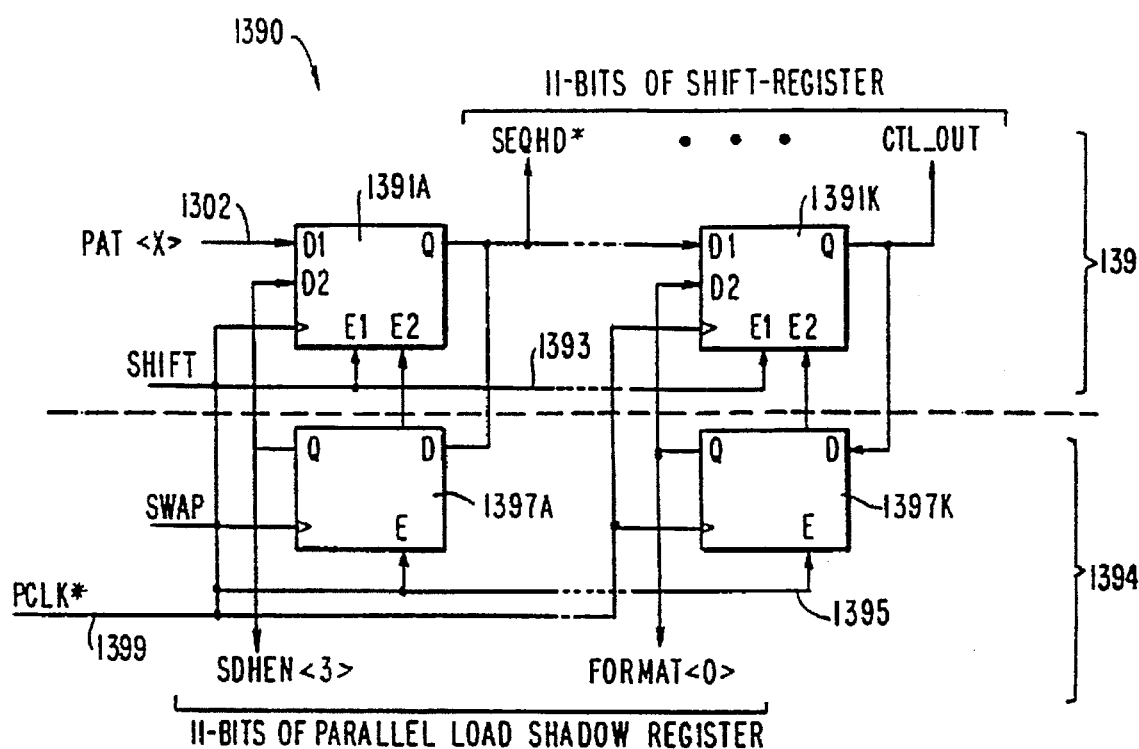
FIGS. 33 and 34 are a schematic drawings of the Data and Control Register of the Data Channel of FIG. 32.
Figure 34:
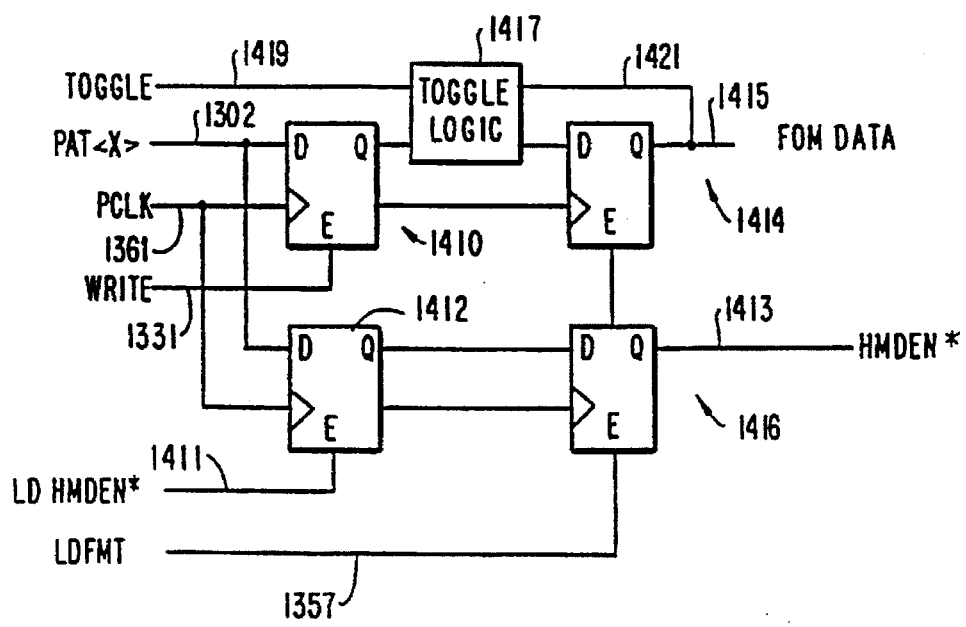

Data and Control registers 1370 include configuration register 1390, shown in FIG. 33, and data and HMDEN* (hard/medium drive enable) registers 1410 and 1412, shown in FIG. 34. Configuration register 1390 is an 11-bit shift register with a parallel-load shadow register. The configuration register must be fully updated when it is written because of the shifting operation. The data and HMDEN* registers, however, may be individually updated in each pattern.

Referring to FIG. 33, configuration register 1390 includes 11-bit shift register 1392 and 11-bit shadow register 1394. The combination of these registers provide control signals for the data channels. The signals output from the configuration register 1390 are set forth in Table 9 and Table 10. The signals in Table 9 are output from shift register 1392 and the signals in Table 10 are output from shadow register 1394.

TABLE 9

| Signal | Description |
|---|---|
| SEQHD* | IN SEQUENCE HARD-DRIVE ENABLE. Enables hard-driving during the interior of a sequence (SEQEND = FALSE) when HMDEN* is asserted low. Occurrence of a SET or RESET edge turns on the hard-drive output enable. |
| SEQMD* | IN SEQUENCE MEDIUM-DRIVE ENABLE. Enables medium-driving during the interior of a sequence (SEQEND = FALSE) when HMDEN* is asserted low. Occurrence of a SET or RESET edge turns on the medium-drive output enable. |
| LCYCHD* | LAST CYCLE HARD-DRIVE ENABLE. Enables hard-driving during the last pattern cycle (SEQEND = TRUE) when HMDEN* is asserted low. Occurrence of a SET or RESET edge turns on the hard-drive output enable. |
| LCYCMD* | LAST CYCLE MEDIUM-DRIVE ENABLE. Enables medium-driving during the last pattern cycle (SEQEND = TRUE) when HMDEN* is asserted low. Occurrence of a SET or RESET edge turns on medium-drive output enables. |
| HDDIS* | HARD-DRIVER DISABLE. When HDDIS* is asserted low, then the DOFF edge turns off the hard-driver during both the interior of a sequence and the last cycle of a sequence. |
| DOFF | DRIVER OFF EDGE SELECT. The DOFF edge turns off selected hard-drivers (using HDDIS*), and it turns off selected medium-drivers during the last cycle when LCYCMD* is asserted low. |
| SET<1..0> | SET EDGE SELECT. Selects the edge for setting HME formatted data to a logic high value. |
| RESET<1..0> | RESET EDGE SELECT. Selects the edge for setting HME formatted data to a logic low value. |
| CTL_OUT | CONTROL REGISTER OUTPUT. Performs no internal CIC control. Its purpose is to match the length of the shift register with the parallel load shadow register. It is also the bit of the configuration register that can be read (address 3). |

TABLE 10

| Signal | Description |
|---|---|
| SDHEN<3..0> | SOFT-DRIVE HIGH ENABLE. Selects the current for soft-driving a logic high value during the last cycle (SEQEND = TRUE). |
| SDLEN<3..0> | SOFT-DRIVE LOW ENABLE. Selects the current for soft-driving a logic low value during the last cycle (SEQEND = TRUE). |
| TOGGLE | TOGGLE FORMAT. When TRUE, TOGGLE selects the Input Pattern Data to be toggled when PAT<X> = 1, and unaffected when PAT<X> = 0. When FALSE, PAT<X> Input Pattern Data is unaffected. |
| FORMAT<1..0> | FORMAT: selects the data format used for a channel (RC=00, RZ=01, R1=10, DNRZ=11). |

The method by which these signals are output from configuration register 1390 will now be described.

11-bit shift register 1392 includes eleven flip-flops, 1391A–1391K. Each flip-flop has two data inputs and a single output. For example, the first data input of flip-flop 1391A is connected to patten bus 1302. The output of flip-flop 1391A is connected to the first data input of the flip-flop 1391B. This output-to-input connection method between successive flip-flops is repeated for the remainder of the flip-flops, 1391C–1391K. The first input is provided at the output when the SHIFT signal on line 1393 is asserted and the second is provided at the output when the SWAP signal on line 1395 is disasserted. Flip-flops 1391A-1391K are clocked by the PCLK* signal on line 1399.

Parallel load shadow register 1394, like shift register 1392, has eleven flip-flops, 1397A–1397K. These flip-flops, however, have one input and one output and are enabled when the SWAP signal on line 1395 is asserted. Flip-flops, 1397A–1397K are also clocked by the PCLK* signal on lines 1399.

The output of each flip-flop of shift register 1392 is connected to the data input of one of the flip-flops of shadow register 1394. The output of each shadow register flip-flop is connected to the second data input of the flip-flop of shift register 1392 to which its data input is connected to the output of that same shift register flip-flop.

In operation, data from Pattern Bus line 1302 that is properly addressed is serially input to shift register 1392. This is accomplished by asserting the SHIFT signal which enables the first data input of each of the eleven flip-flops, 1391A–1391K. Therefore, on the next eleven PCLK* clock pulses, the eleven bits on the pattern data are serially loaded into shift register 1392.

The data that is loaded is control data that is organized such that the SEQHD* signal is at first flip-flop 1391A (or first bit) and the CTL_OUT signal is at eleventh flip-flop 1391K (or eleventh bit). The remainder of the flip-flops are loaded with a control data in the order presented in Table 9.

After shift register 1392 is loaded, the SHIFT signal is deasserted and the SWAP signal is asserted. This enables flip-flops 1397A–1397K of the shadow register and enables the second data input of the flip-flops 1391A–1391K. On the next clock, the data at the output of the flip-flops 1391A–1391K is clocked through shadow registor flip-flops 1397A–1397K.

During this same clocking operation the data at the output of the flip-flops 1397A–1397K, which is presented at the second data input of shift register flip-flops 1397A–1397K, is clocked through these flip-flops. This data will be shifted out as the next 11 bits are shifted into shift register 1392.

FIG. 34 shows the data and HMDEN* registers of data channels 1350. The data register is shown at 1410 and the HMDEN* register is shown at 1412. The Pattern Bus signal on line 1302 is input to the data input of each register and both registers are clocked by the PCLK signal on line 1361. However, each register is enabled by a different signal. Data register 1410 is enabled by the WRITE signal on line 1331 and the HMDEN* register is enabled by the LDHMDEN* (Load hard/medium drive enable) signal on line 1411.

The output of data register 1410 is input to toggle logic 1417. The other inputs to toggle logic 1417 are the TOGGLE signal on line 1419 and the feedback signal on line 1421 from the output of formatter register 1414. Toggle logic 1417, based on the state of the TOGGLE signal 1419, will provide at the output, the fed-back FOMDATA (formatted data) signal on line 1415, or the output of the data register 1410.

The output of the toggle logic is input to the data input of formatter register 1414. This register is clocked by the the PCLK signal on line 1361 and is enabled by the LDFMT signal on line 1357. The output of formatter register 1414 is the FOMDATA signal on line 1415 which is used at various places in the circuitry as will be disclosed.

The output of HMDEN* register 1412 is input to the data input of formatter register 1416. This formatter register is clocked by the the PCLK signal on line 1361 and is enabled by the LDFMT signal on line 1357. The output of formatter register 1416 is the HMDEN* signal on line 1413 which is also a signal used in various places in the circuitry.

The WRITE signal and the LDHMDEN* signal are asserted at different times so that the data from each register can be loaded into its associated formatter register on different patterns and output from the formatter registers at the same time when the LDFMT signal is asserted.

With regard to serially configuring the CICs, as shown in FIG. 27, the data and HMDEN* registers of all of the CICs are serially loaded with pattern data. Once each has its data clocked to its respective formatter registers, all of the formatter registers are enabled at the same time with the LDFMT signal.

Figure 35:
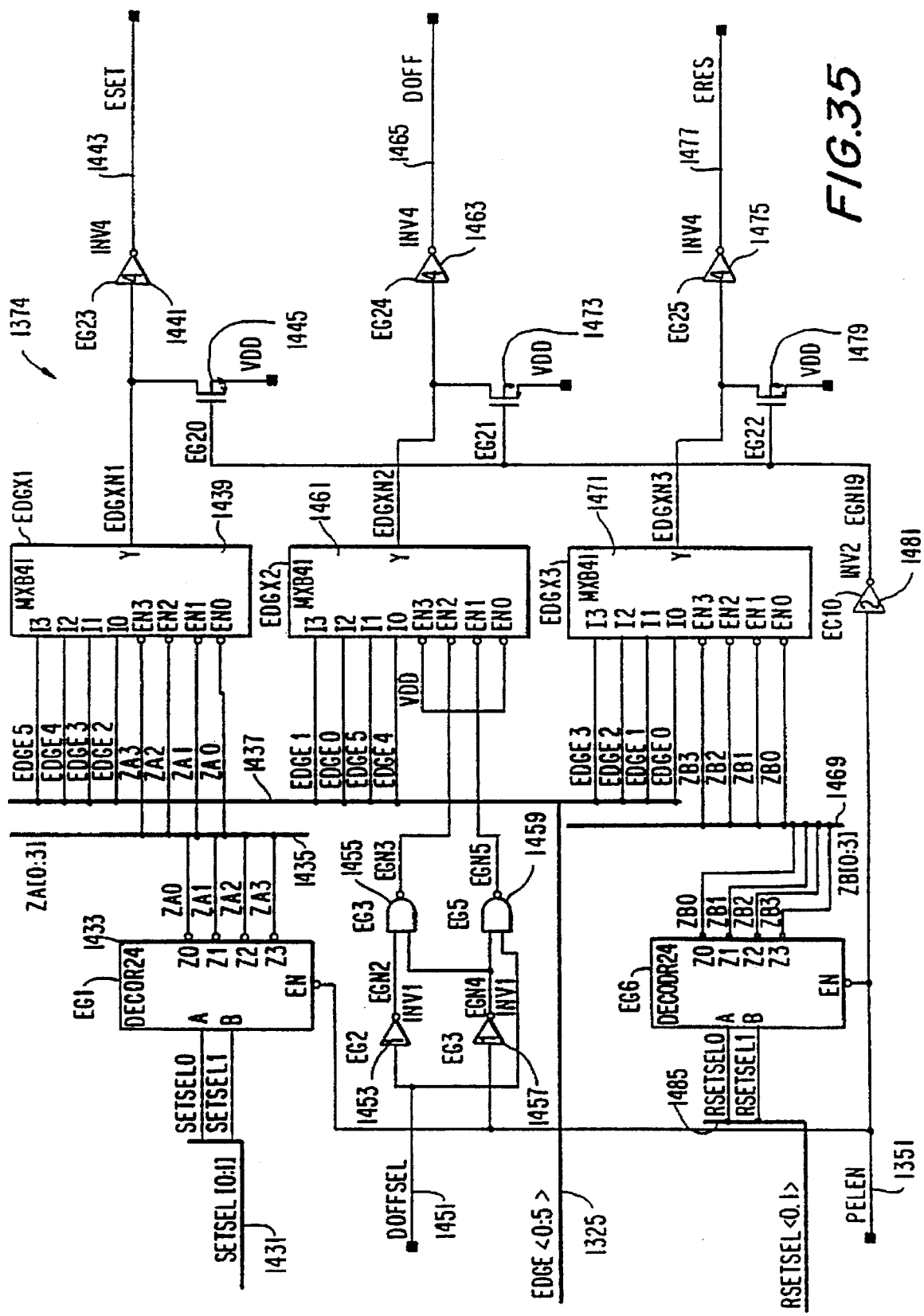
FIG. 35 is a schematic drawing of the Edge Selector circuitry of the CIC of FIG. 25.

FIG. 35 shows edge selector circuitry 1374 of data channels 1350. Each data channel 1350 includes edge selector 1374. Generally, edge selector circuitry 1374 allows the user to program which of the six timing edges will function as the set, reset, and driver off edges. The six timing edges are generated by timing generator 248 and input to edge selector 1374 via the Pattern Bus.

The four inputs to the edge selector circuitry are the 2-bit SETSEL signal on line 1431, the DOFFSEL signal on line 1451, the 6-bit EDGE signal on line 1325, and the 2-bit RESETSEL signal on line 1485. All of these signals except the 6-bit EDGE signal are output from shift register 1392 (Table 9). A control input to the circuitry is the PELEN* signal on line 1351.

The 6-bit EDGE signal on line 1325 is a 6-bit bus that connects to data selectors 1439, 1461, and 1471. From this bus, the EDGE 2, 3, 4, and 5 bits are input to data selector 1439, the EDGE 0, 1, 4, and 5 bits are input to data selector 1461, and the EDGE 0, 1, 2, and 3 signals are input to data selector 1471.

The 2-bit SETSEL signal is input to decoder 1433. The decoder provides a parallel, 4-bit output on bus 1435. Bus 1435 is connected to the four enable inputs of data selector 1439. Based on the logic values of the 4-bit signal from bus 1435, one of the EDGE signals is selected as the ESET signal on line 1443 after being processed by inverter 1441.

The DOFFSEL signal on line 1451 is input to NAND gate 1455 after being processed by inverter 1453, and is input to NAND gate 1459. The PELEN signal on line 1351 is the second input to NAND gates 1455 and 1459 after being processed by inverter 1457. The outputs of the NAND gates are tied and input to the enable inputs of data selector 1461. The selected EDGE signal is the output from the data selector and is the DOFF signal on line 1465 after it has been processed by inverter 1463.

The 2-bit RESETSEL signal is input to decoder 1467. Decoder 1467 has a parallel, 4-bit output that is put on 4-bit bus 1469. Bus 1469 is connected to the four enable inputs to data selector 1471. The logic values of the 4-bit signal input to the enable inputs cause selection of one the EDGE signals as the ERES signal on line 1477 after being processed by inverter 1475.

The PELEN* signal is also the output enable signal for decoders 1433 and 1467. It is also the gate signal for the p-channel devices used as pullups for each of the output lines of the edge selector.

Table 11 shows the preferred edge select options and the corresponding edge assignments. However, it is understood that other selection options and edge assignments are possible within the scope of the present invention.

TABLE 11

| Edge Type | Select | Output |
|---|---|---|
| Set EDGE | 00 | EDGE<2> |
| Set EDGE | 01 | EDGE<3> |
| Set EDGE | 10 | EDGE<4> |
| Set EDGE | 11 | EDGE<5> |
| Reset EDGE | 00 | EDGE<0> |
| Reset EDGE | 01 | EDGE<1> |
| Reset EDGE | 10 | EDGE<2> |
| Reset EDGE | 11 | EDGE<3> |
| DOFF EDGE | 00 | EDGE<0> |
| DOFF EDGE | 01 | EDGE<5> |

An important feature of edge selector 1374 is that it can disable any timing edge from passing through the edge selector output, thereby permitting an entire PEL 266 to be disabled.

The data selectors of edge selector circuitry 1374 may be designed to suit the needs of particular applications. In applications in which it is desirable to save die area on the CIC, two 4:1 data selectors (with a 2-bit select) and one 2:1 data selector (with a 1-bit select) may be used. Where die area is not a limiting factor, it may be preferable to use three 6:1 data selectors or even three 8:1 data selectors. However, additional pins may be required to address the larger data selectors.

Figure 36:
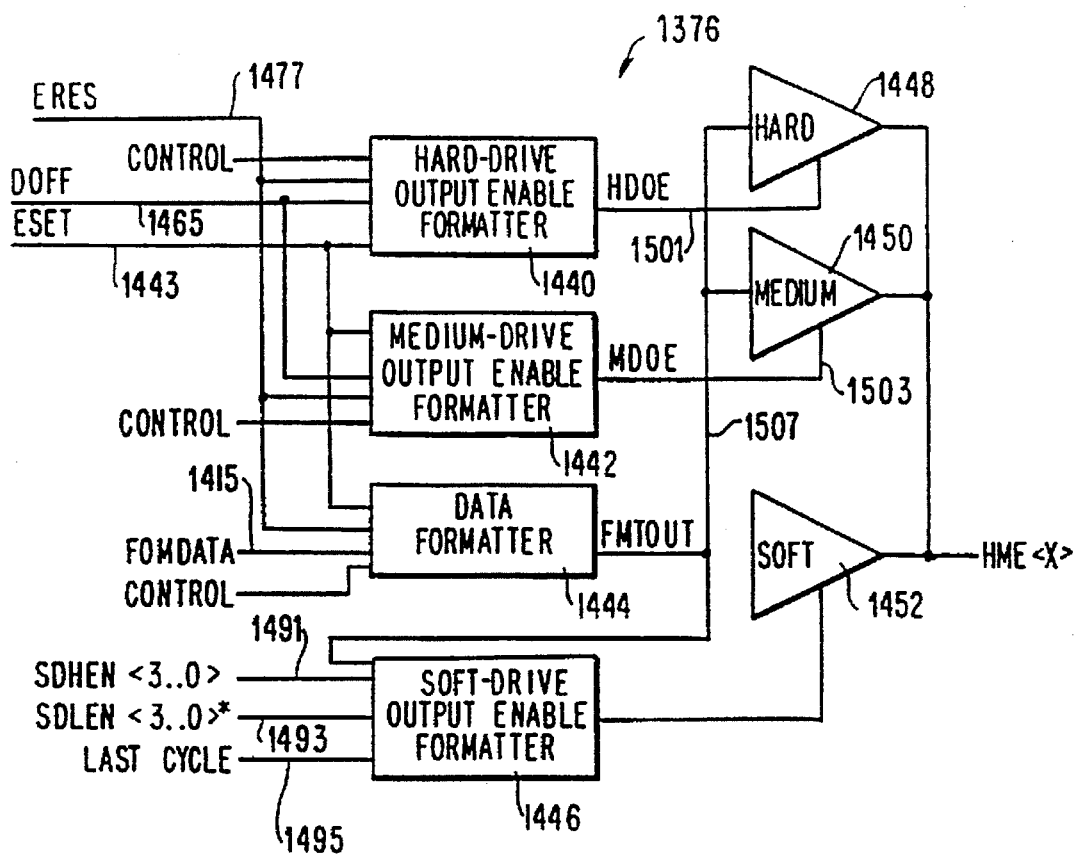
FIG. 36 is a schematic drawing of the Formatter/Driver circuitry of the Data Channel of FIG. 32.

FIG. 36 shows data formatter 1376. Formatter 1376 includes hard-drive output enable formatter 1440, medium-drive output enable formatter 1442, data formatter 1444, and soft-drive output enable formatter 1446. Formatter 1376 also includes hard driver 1448, medium driver 1450, and soft driver 1452.

Figure 37:
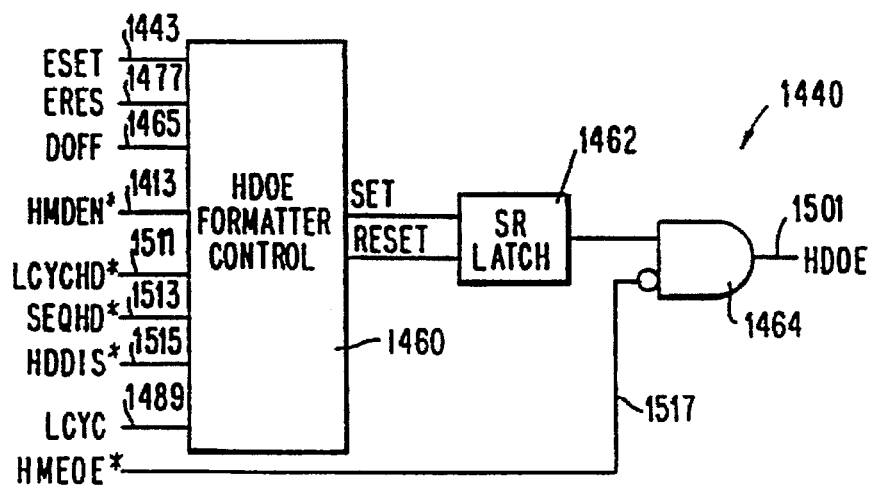
FIG. 37 is a schematic drawing of the Hard-Drive Output Enable Formatter of the Formatter/Driver circuitry of FIG. 36.

The common inputs to hard-drive output enable formatter 1440, medium-drive output enable formatter 1442, and data formatter 1444 are the ERES signal on line 1477 and the ESET signal on line 1443. A common input to just the hard-drive output enable formatter and the medium-drive output enable formatter is the DOFF signal on line 1465. The three signals, ERES, ESET, and DOFF, relate to the timing edges that were selected. The other inputs to the hard-drive output enable formatter are control signals that are representatively shown as the single input signal CONTROL. The signals on this line are the LCYC* signal on line 1495, HMDEN* signal on line 1413, HDDIS* signal on line 1515, SEQHD* signal on line 1513, LCYCHD* signal on line 1511; and the HMEOE* signal on line 1517 (FIG. 37). The output of the hard-drive output enable formatter is the HDOE signal on line 1501 which is the output enable signal for hard driver 1448.

Figure 38:
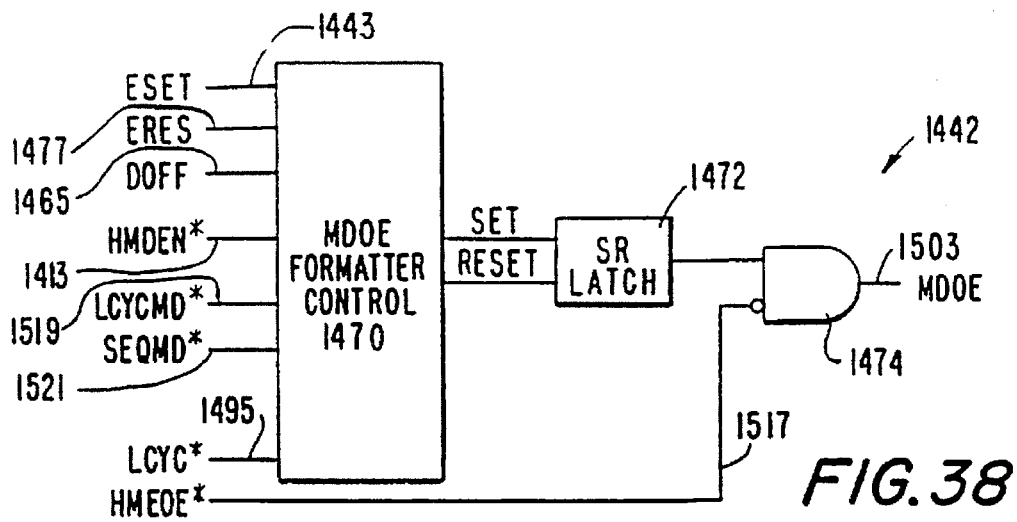
FIG. 38 is a schematic drawing of the Medium-Drive Output Enable Formatter of the Formatter/Driver circuitry of FIG. 36.

Similarly, the control inputs to medium-drive output enable formatter are the LCYC* signal on line 1495, SEQMD* signal on line 1521, HMDEN* signal on line 1413, LCYCMD* signal on line 1519; the HMEOE* signal on line 1517 (FIG. 38). The output of the medium-drive output enable formatter is the MDOE signal on line 1503 which is the enable signal for medium driver 1450.

The other inputs to data formatter 1444 are the 2-bit FORMAT signal on line 1523 and FOMDATA signal on line 1415. The output of data formatter 1444 is the FMTOUT (formatted data) signal on line 1507 which is input to the hard and medium drivers, and the soft-drive output enable formatter.

The inputs to soft-drive output enable formatter 1446 are the 4-bit SDHEN signal on line 1491, the 4-bit SDLEN* signal on line 1493, the LCYC signal on line 1489, which is the inverted LCYC* signal, and, as stated, the FMTOUT signal on line 1507.

Data formatter 1376 uses the ESET signal to set HME pins to logic high value, the ERES signal edge to reset HME pins to logic low value, and the DOFF signal to turn off the hard and medium drivers. The set and reset edges are also used to turn on the hard and medium driver. However, even though the set edge changes data from a logic low to a logic high value, it does not affect data which is already a logic high value. Conversely, even though the reset edge changes data from a logic high to a logic low value, it does not affect data which is already logic low value.

FIG. 37 is a block diagram of hard-drive output enable formatter 1440 in greater detail. The signals input to hard-driver output enable formatter were described in discussing FIG. 36. Formatter 1440 includes hard-drive control circuitry 1460, SR latch 1462, and AND gate 1464. The control circuitry operates according to the true table set forth in Table 12.

TABLE 12

| HMDEN* | LCYCHD* | SEQHD* | HDDIS* | LCYC* | EDGE(s) needed | LATCH |
|---|---|---|---|---|---|---|
| 1 | X | X | X | X | X | RESET |
| X | X | X | 0 | X | DOFF | RESET |
| 0 | X | 0 | X | 0 | Set or Reset | SET |
| 0 | 0 | X | X | 1 | Set or Reset | SET |

The input signals to HDOE formatter control 1460 will cause it to generate output signals at the set and reset outputs which are input to SR latch 1462. The output of the SR latch is input to AND gate 1464. The second input to AND gate 1464 is the HMEOE* signal on line 1464. This signal is input to the negative-true input of the AND gate. The output of AND gate 1464 is the HDOE signal on line 1501.

According to the logic in Table 12, several specialized operations are possible. Assertion of the LCYC* signal permits the HMS to hard drive an HME pin at one stage of the pattern presentation (e.g., during the "restore" operation of pattern presentation) and to soft drive the same HME pin at a second stage of the simulation (e.g., during the "measurement" cycle of pattern presentation).

HME pins known to be dedicated input pins preferably are always hard-driven to establish a fast, clean transition from a logic high to logic low value and from a logic low to logic high value. There is no need to soft-drive such pins since these pins can never become output pins.

HME I/O pins can be driven by pulsing the hard driver. Circuit 1460 also enables operating with two bits per pin (normal operation is one bit per pin). When operating in the two bits per pin mode, the first bit is control bit, and the second bit is the data bit.

FIG. 38 shows medium-drive output enable formatter 1442 in greater detail. The signals input to the medium-driver output enable formatter were described in discussing FIG. 38. The components of formatter 1442 are similar to the components of hard-drive output enable formatter 1440. The medium-driver output enable formatter includes medium-drive control circuitry 1470, SR latch 1472, and AND gate 1474. This circuitry operates according to the truth table set forth in Table 13.

TABLE 13

| HMDEN* | LCYCMD* | SEQMD* | LCYC* | EDGE(s) needed | LATCH |
|--------|---------|--------|-------|----------------|-------|
| 1      | X       | X      | X     | X              | RESET |
| X      | X       | X      | 1     | DOFF           | RESET |
| X      | 1       | X      | 1     | Set or Reset   | RESET |
| 0      | X       | 0      | 0     | Set or Reset   | SET   |
| 0      | 0       | X      | 1     | Set or Reset   | SET   |

The input signals are processed by the MDOE formatter and the set and reset outputs are input to SR latch 1472. The output of SR latch 1472 is input to AND gate 1474. The second input to AND gate 1474 is the HMEOE* signal on line 1517 which is input to the negative-true input of the gate. The output of the gate is the MDOE signal on line 1503.

In the operation of the circuits in FIGS. 37 and 38, the SR latch set and reset edges, viz., the ERES and ESRT signals, must not overlap the driver off edge, viz., the DOFF signal. Further, AND gates 1464 and 1474 provide a means for overriding the output of latches 1462 and 1472, respectively, by permitting the respective output enable (HDOE or MDOE) to be gated with the HMEOE* signal.

Figure 39:
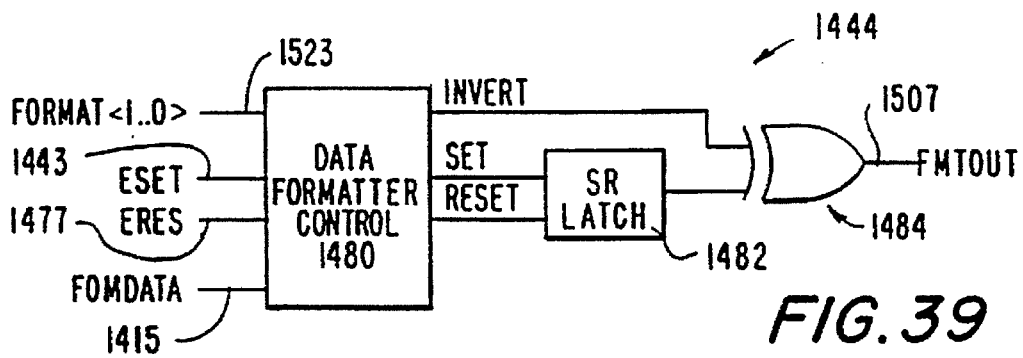
FIG. 39 is a schematic drawing of the Data Formatter of the Formatter/Driver circuitry of FIG. 36.

FIG. 39 shows data formatter 1444. The signals input to the data formatter were described in discussing FIG. 36. Formatter 1444 includes data formatter control circuitry 1480, SR latch 1482, and exclusive-OR gate 1484. This control circuitry operates according to the truth table in Table 14.

TABLE 14

| FORMAT<1..0> | FOMDATA | Set EDGE | Reset EDGE | Invert |
|--------------|---------|----------|------------|--------|
| RC=00        | 0       | PASS     | PASS       | 1      |
|              | 1       | PASS     | PASS       | 0      |
| RZ=01        | 0       | —        | PASS       | 0      |
|              | 1       | PASS     | PASS       | 0      |
| R1=10        | 0       | PASS     | PASS       | 0      |
|              | 1       | PASS     | —          | 0      |
| DNRZ=11      | 0       | —        | PASS       | 0      |
|              | 1       | PASS     | —          | 0      |

The INVERT output of data formatter control 1480 is the first input to exclusive OR gate 1484. The input signals are processed according to the logic values. The set and reset outputs are input to the SR latch 1402. The output of the SR latch is the second input to exclusive-OR gate 1484. The output of the gate is the FMTOUT signal on line 1507. Exclusive-OR gate 1484 is used to invert the data during "return to complement" formatting ("RC"), as will be explained.

Figure 40:
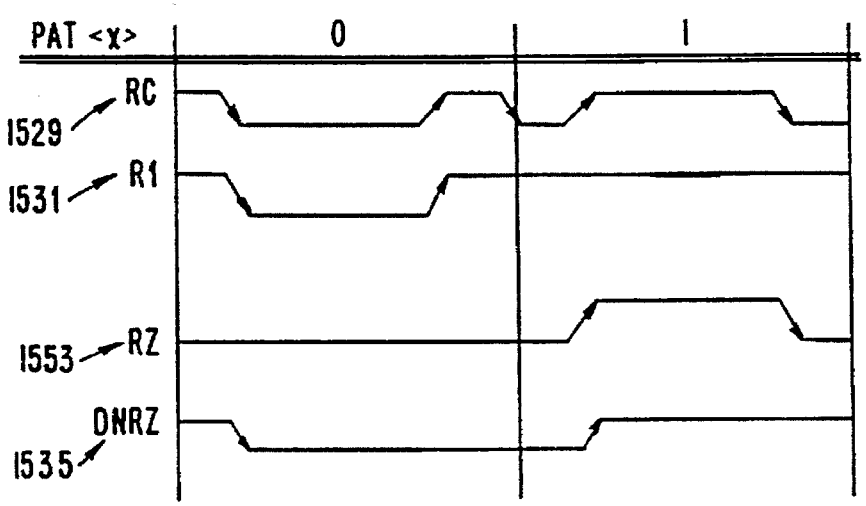
FIG. 40 shows the four signal formats for transmitting data and clocks to the HME in accordance with the present invention.

Referring now to FIG. 40, data may be transmitted using one of four formats. These formats where shown in Table 14. They are return to complement ("RC") format at 1529, return to zero ("RZ") format at 1533, return to one ("R1") format at 1531, or delay no return to zero ("DNRZ") format at 1535. In the figure, a rising edge indicates a set timing edge, and a falling edge indicates a reset timing edge. These four data formats permit the use of complex patterns while still using only one data bit per pin.

Table 14 shows the function of each format. The RC format permits all data to pass to SR latch 1482, regardless of its value, but inverts the latch output. The RZ format passes all data with a logic high value, but only the reset timing edge is passed with a logic low value. The R1 format passes all data with a logic low value, but only the set timing edge is passed with a logic high value. In the DNRZ format, the only logic low value that will be passed is the reset timing edge when it has a true logic state; and similarly, the only logic high value that will be passed is set timing edge when it has a true logic state. The SR latch set and reset timing edges cannot overlap or operation may be unpredictable.

Figure 41:
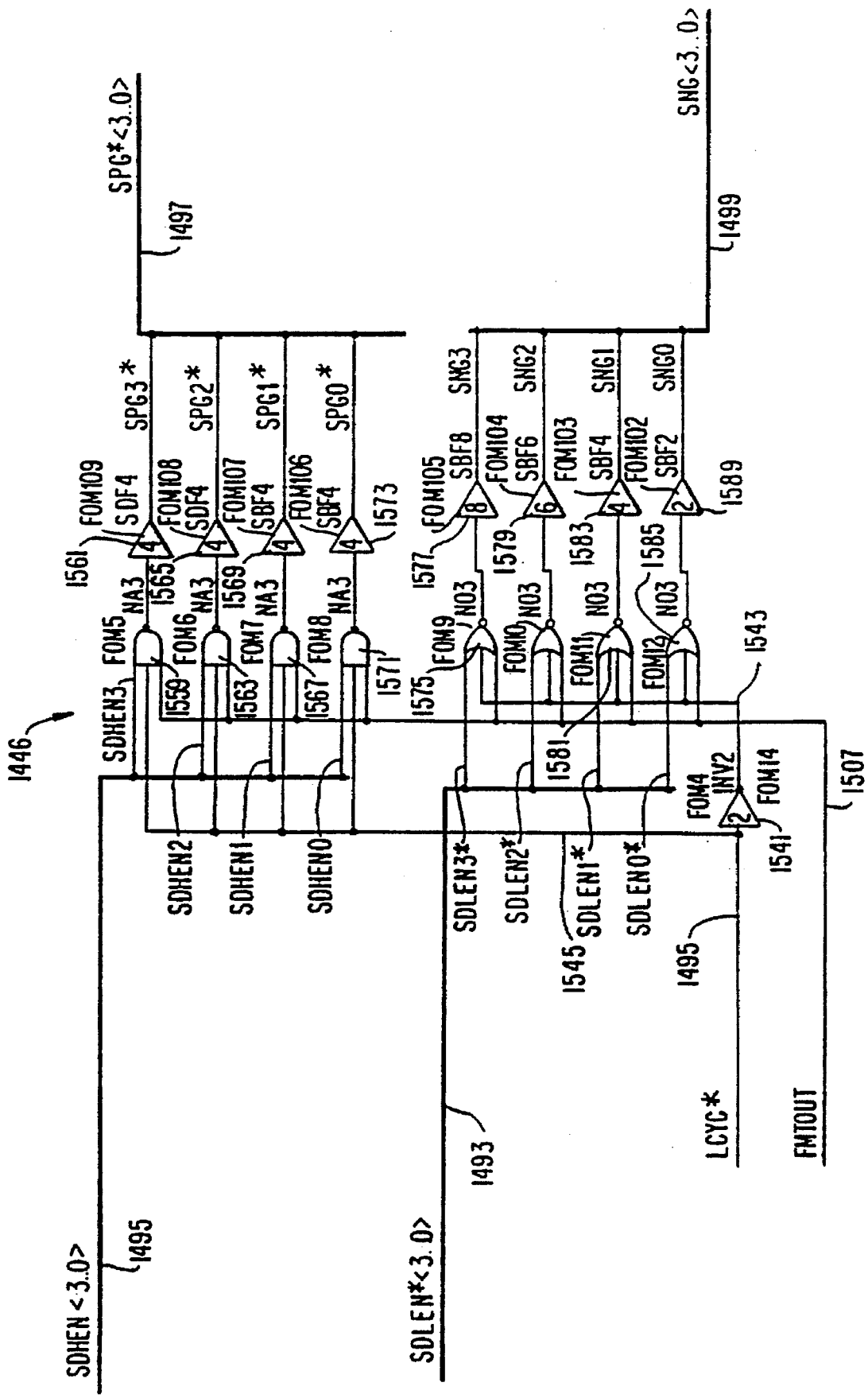
FIG. 41 is a schematic drawing of the Soft-Drive Output Enable Formatter of the Formatter/Driver circuitry of FIG. 36.

FIG. 41 shows soft-drive output enable formatter 1446. The formatter consists of two sections. The first is a series of four NAND gates with an inverter at the output of each NAND gate, and the second is a series of NOR gates with an inverter at the output of each NOR gate. The first section includes NAND gates 1559, 1563, 1567, and 1571. Each is a three input device with the LCYC* signal on line 1495 and the FMTOUT signal on line 1507 at two of the inputs. The third input to the NAND gates is one of the bits of the 4-bit SDHEN signal on line 1491. Under normal operations, the logic value of the 4-bits of the SDHEN signal determine the value of the outputs of the NAND gates, assuming the gates are enabled.

The outputs of NAND gates 1559, 1563, 1567, and 1571 are processed by inverters 1561, 1565, 1569, and 1573, respectively. The outputs of the inverters for form the 4-bit SPG* signal on line 1497.

The second section is similar to the first, except for the gates and the logic value of the LCYC* signal. The second section has four NOR gates with an inverter at the output of each. The second includes NOR gates 1575, 1579, 1581, and 1585. Each is a three input device with the LCYC signal on line 1593 and the FMTOUT signal on line 1507 at two of the inputs. The third input to the NOR gates is one of the bits of the 4-bit SDLEN signal on line 1493. Under normal circumstances, the logic value of the 4-bits of the SDLEN signal determine which output of the NOR gates will be asserted, assumming the gates are enabled.

The outputs of NOR gates 1575, 1591, 1581, and 1585 are processed by inverters 1577, 1579, 1583, and 1589, respectively. The outputs of the inverters form the 4-bit SNG signal on line 1499.

Soft driver 1452 preferably is enabled during the last cycle of a pattern sequence. Soft-drive output enable formatter 1446 uses the LCYC* signal to gate on and off the high and low soft driver enables, the 4-bit SDHEN signal, and the 4-bit SDLEN* signal. Soft driver 1452 includes separate high and low soft driver enables so that different levels of current may be programmed for driving a logic high and a logic low value. The HMEOE* signal can be used to gate the soft drive output enables off.

Figure 42:
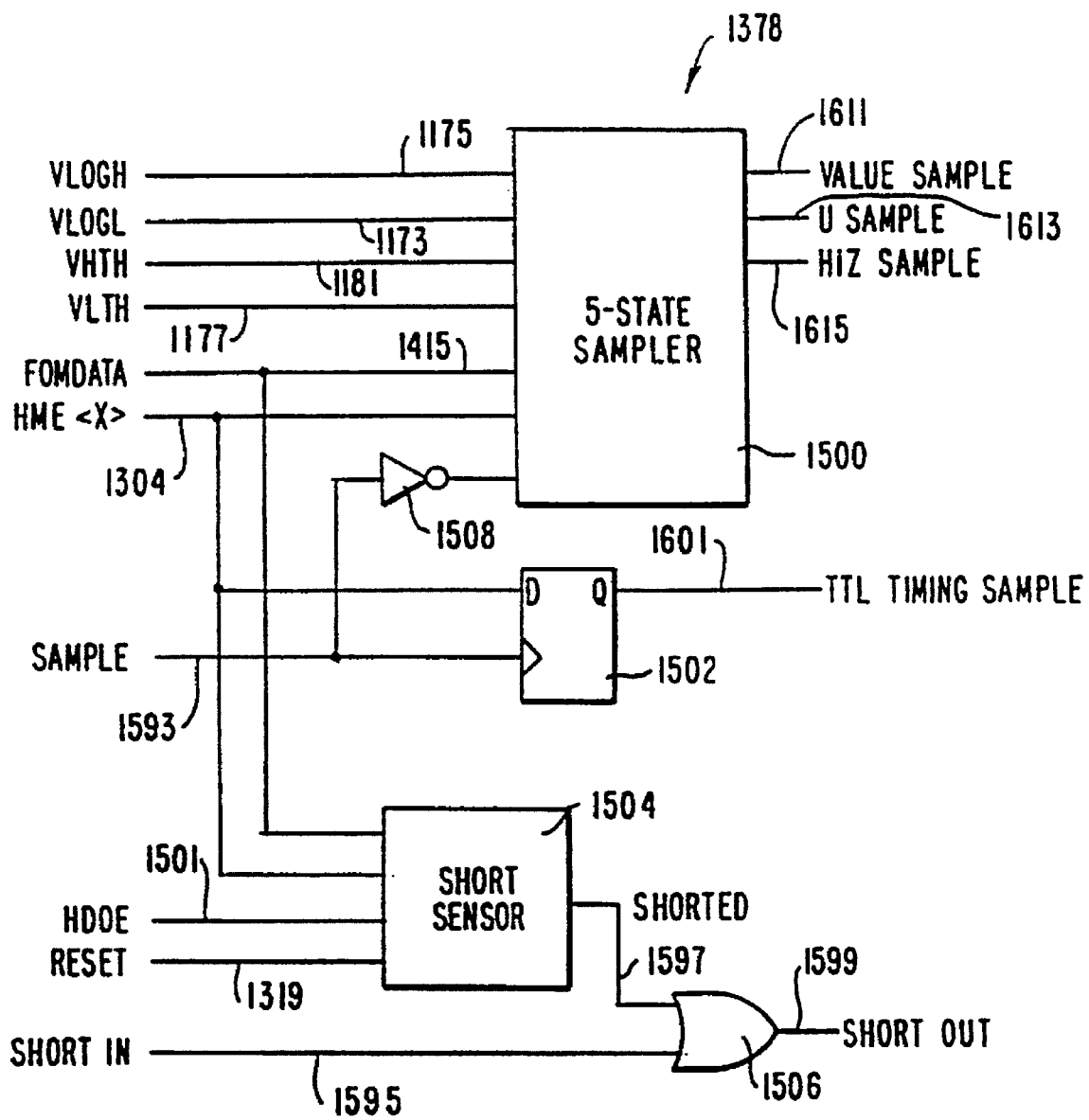
FIG. 42 is a schematic drawing of the sampling circuitry of the Data Channel of FIG. 32.

FIG. 42, is a block diagram of sampling circuitry 1378. This circuitry is used to sample the output signals from HME pins. Sampling circuitry 1378, preferably includes 5-state sampler 1500, 2-state timing sampler 1502, and short sensor 1504. 5-state sampler 1500 includes analog circuitry for determining whether an HME output signal is a driven high or low, non-driving high or non-driving low, or an unknown level. Before 5-state sampler 1500 is disclosed in detail, the 2-state sampler 1502, short sensor 1504, and the analog support circuits will be disclosed.

Again referring to FIG. 42, 2-state timing sampler 1502 preferably is a flip-flop that is clocked on the positive edge of the clock signal. The output of the flip-flop is TTL timing sample signal on line 1601. The input to flip-flop 1502 is the HME bus signal on line 1304 and the signal that clocks the flip-flop is the SAMPLE signal on line 1593. The 2-state sampler 1502 is controlled by strobing the SAMPLE signal.

Figure 43:
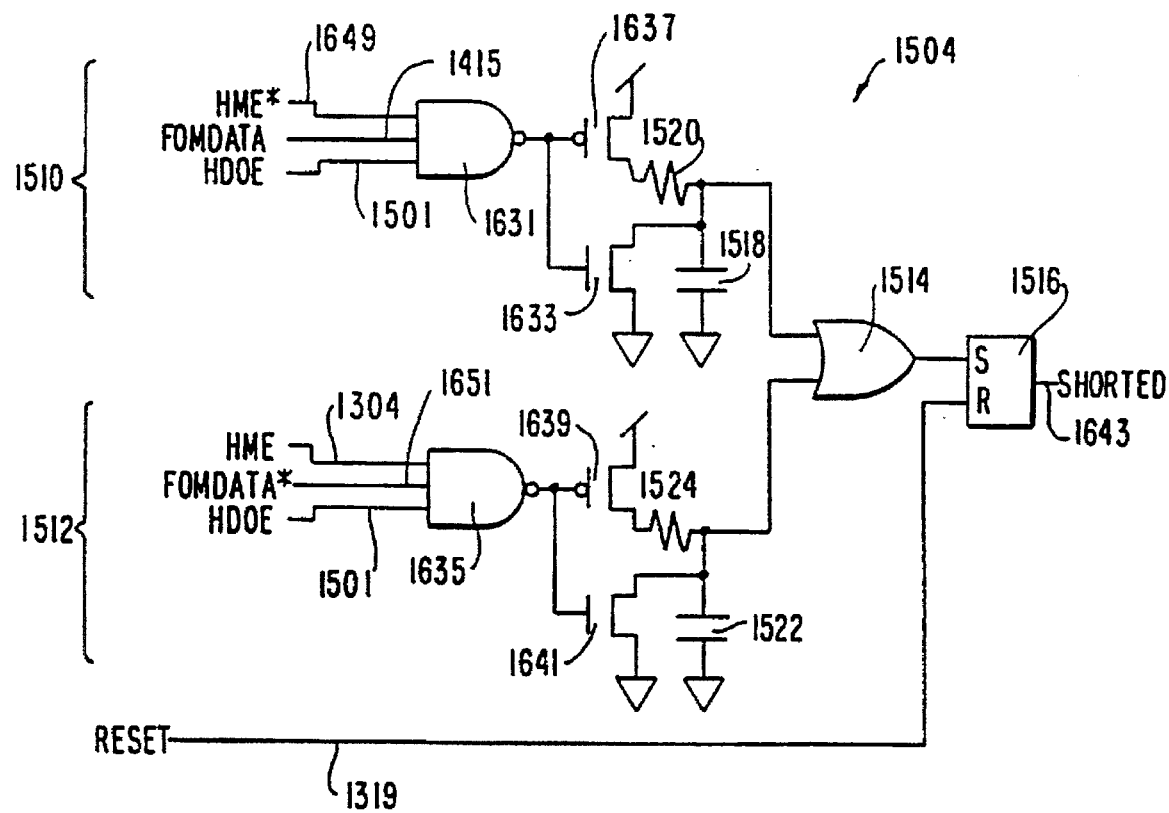
FIG. 43 is a schematic drawing of the Short Sensor circuitry of the sampling circuitry of FIG. 42.

FIG. 43 shows a detailed diagram of short sensor 1504. The short sensor circuitry at 1504 and OR gate 1506 (FIG. 42) combine to provide the SHORT_OUT signal on line 1599.

Generally, short sensor 1504 is used to detect when a hard-driver has been continuously shorted for more than about 200 ns. Sensor 1504 includes two identical resistor-capacitor circuits 1510 and 1512 that are used for detecting short circuits. Circuit 1510 detects shorts when the data channel is driving a logic high value for the FOMDATA signal and when sensing a logic low value for the HME* signal. Circuit 1512 detects shorts when the data channel is driving a logic low value for the FOMDATA* signal and when sensing a logic high value for the HME signal.

Circuits 1510 and 1512 will now be described. Taking first circuit 1510, the input signals to NAND gate 1631 are the HME* signal on line 1649, the FOMDATA signal on line 1415, and the HDOE signal on line 1501. The output of NAND gate is input to the gates of field effect transistors ("FETs") 1637 and 1633.

Circuit 1512 is the same as circuit 1510 except for the input signals. The inputs to NAND gate 1635 are FOMDATA* signal on line 1651 and the HME signal on line 1304. The HDOE signal on line 1501 is the same. The circuit that includes NAND gate 1635, FETs 1639 and 1641, resistor 1524 and capacitor 1522 is same as the corresponding elements in circuit 1510. The description of circuit 1510 applies here, and is incorporated by reference.

In operation, capacitors 1518 and 1522 charge slowly through resistor 1520 and 1524 when a conflict is being detected, and discharge quickly through FET 1635 and 1641 when there is no conflict. When the voltage on either of the capacitors charges to a logic high value, the bit is determined to be shorted, and the SHORTED error signal bit is latched in SR latch 1516 through OR gate 1514. A RESET signal is used to clear the SHORTED error signal.

Referring to FIG. 42, OR gate 1506 is used to propagate a chip-wide short-sensor status in a daisy-chain fashion. That is, the SHORT_OUT signal on line 1599 of the first data channel 1350 becomes the SHORT_IN signal to OR gate 1506 of the next data channel 1350.

In operation, the HMS drives signals to the HME pins, and then samples the HME pins to determine the HME's response. When an HME pin is known to be a dedicated input pin, the CIC can hard drive the pin without concern. When an HME pin is known to be a dedicated output pin, the CIC need only sample the pin. In these cases, the CIC need not determine the status of the pin prior to driving or sensing it.

The driving and sensing of I/O pins is not as simple. The CIC must not interfere with the sensing of an output and must not force pins to the wrong state. The CIC of the present invention uses soft drivers to drive I/O pins. The soft-drivers drive an I/O pin in such a manner that the pin is driven when in the input state, yet if the pin is itself driving, the CIC allows the HME to overdrive the CIC. The driving and sensing of all pins will now be discussed.

Figure 44:
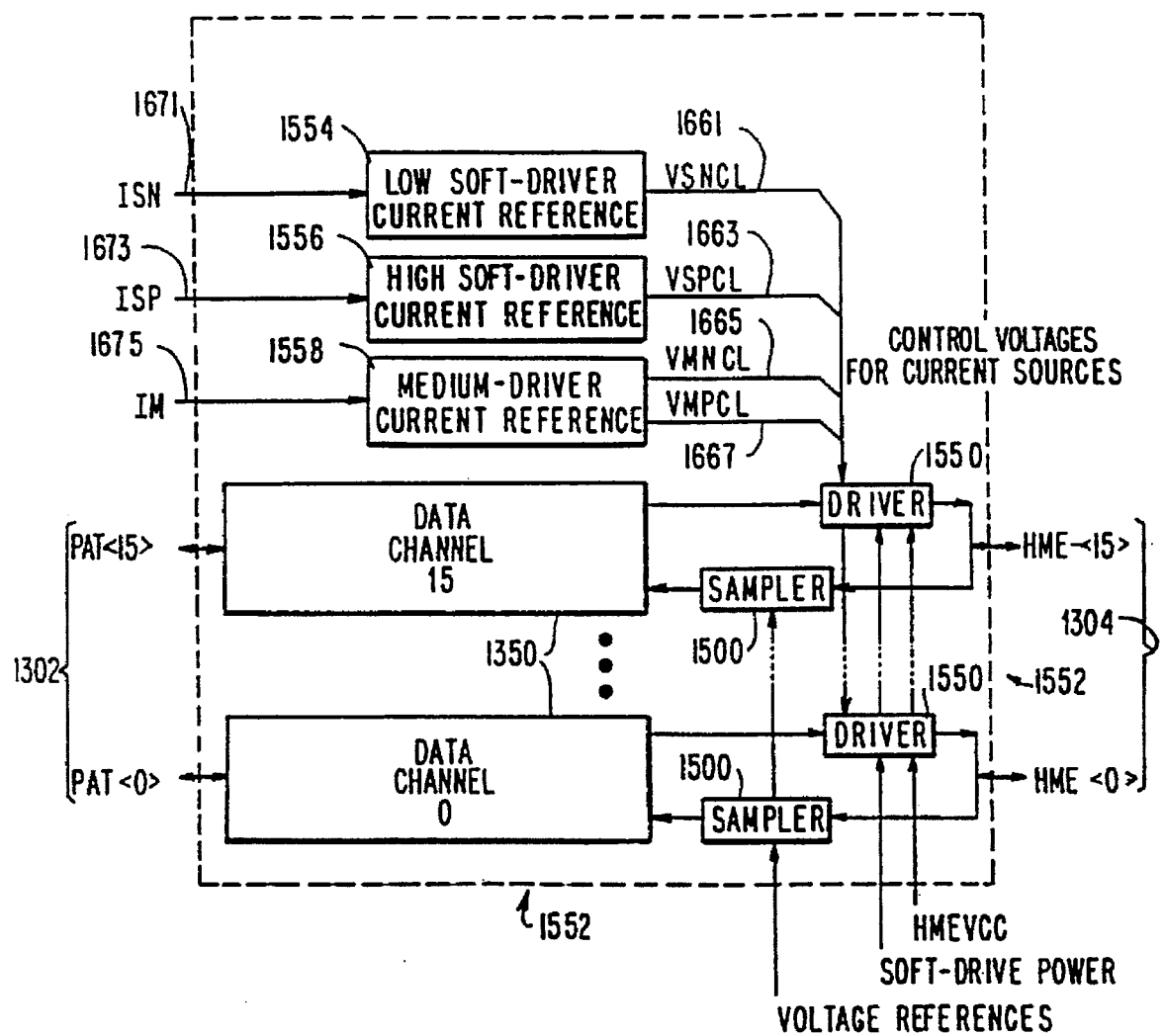
FIG. 44 is a block diagram of the analog sections of the CIC of FIG. 25.

FIG. 44 shows the three main analog sections of CIC 1300. These sections are current references 1554, 1556, and 1558, HME pin drivers 1550, and 5-state sampler 1500. Each of the data channels 1350 includes its own driver 1550 and sampler 1500.

Current references 1554, 1556, and 1558 generate control voltages for current sources in driver 1550. Driver 1550 uses the current sources as pin drivers to reduce current spikes during conflicts between the HME and CIC 1300 (using the medium-drivers), and also to perform unobtrusive 5-state sampling of the HME outputs (using the soft drivers).

The respective input to current reference 1554, 1556, and 1558 is ISN on line 1621, ISP on line 1673, and IM on line 1675. Current references 1554, 1556, and 1558 use these signals to generate control voltages for use by the soft and medium drivers. These are the low soft-driver VSNCL voltage on line 1661, the high soft-driver VSPCL voltage on line 1663, and the medium-driver VMNCL voltage on line 1665 and the medium driver VMPCL voltage on line 1667.

The ISN, ISP, and IM lines connect to ground through external resistors. Preferably, they are connected through 2.5K, 1.25K, and 2.5 k ohm resistors, respectively. It is understood that other resistor values may be used to vary the output of the respective current sources.

Figure 45:
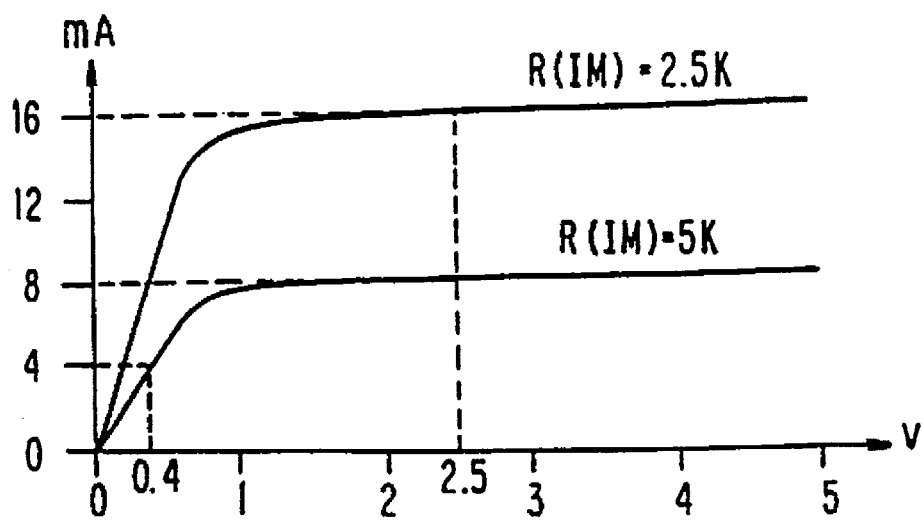
FIGS. 45 and are 46 current/voltage curves for the medium driver of FIG. 47.
Figure 46:
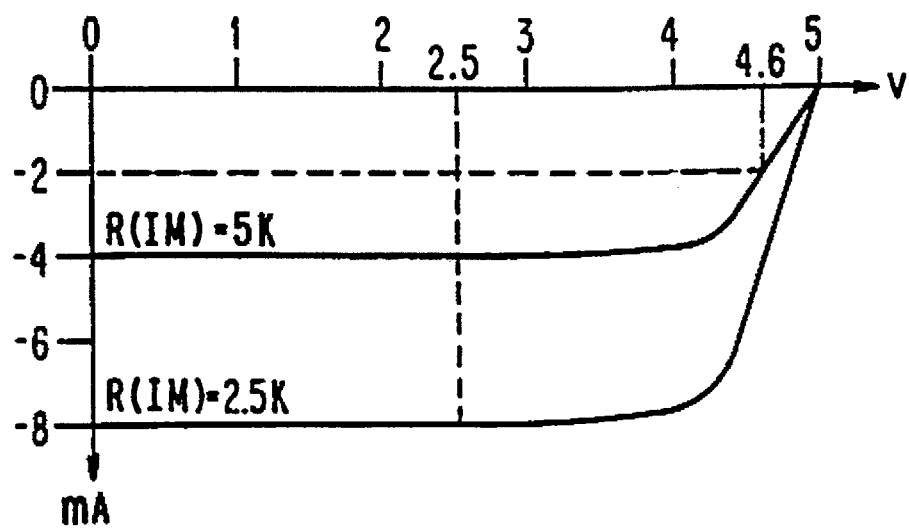

As examples, FIGS. 45 and 46 are representative I/V curves based on resistors of different sizes being connected in the IM line 1675.

Figure 47:
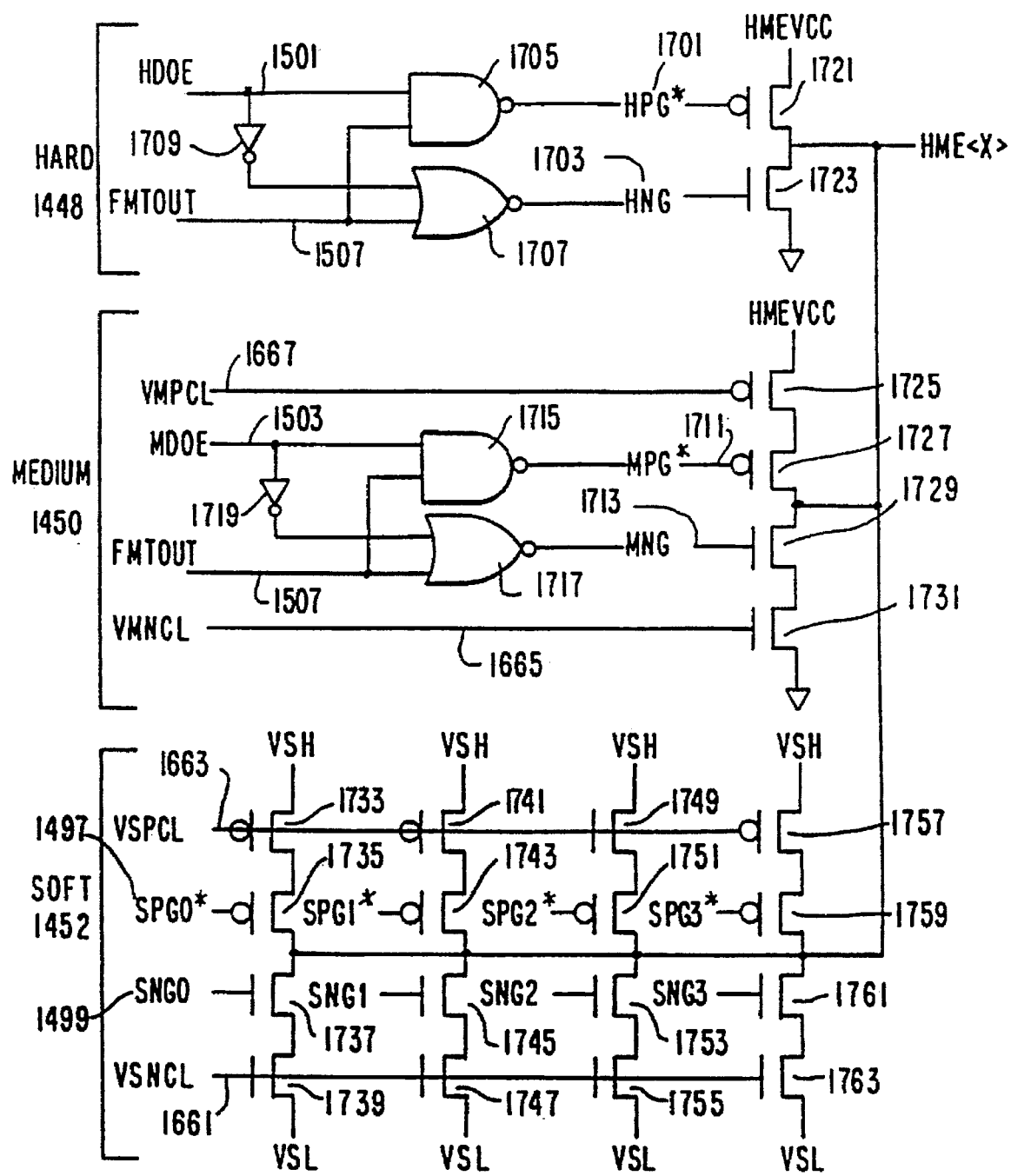
FIG. 47 is a schematic drawing of the soft, medium, and hard drivers of the CIC of FIG. 25.

FIG. 47 shows the HME pin drivers shown generally at 1550 in FIG. 44. The drivers are hard driver 1448, medium driver 1450, and soft driver 1452 (FIG. 36). Medium driver section 1450, and soft driver section 1452 are preferably current limited. The outputs of hard, medium and soft-driver sections are input to the HME pins.

Hard driver 1448 is used to drive an HME pin known to be a dedicated input pin. Hard driver 1570 is preferably not used to drive HME I/O pins except in pulsed mode.

Hard driver 1448 is powered by HMEVCC. The HNG signal on line 1783 and the HPG* signal on line 1701 are the control signals for output enabling the hard driver. These signals are generated by the connected circuit. Since the medium driver uses the same circuit to generate the MPG* signal on line 1711 and the MNG signal on line 1713, the circuit of the hard driver will be described with the corresponding reference numbers for the medium driver circuit shown in paranthesis.

The HDOE (MDOE) signal on line 1501 (1503) is input to NAND gate 1705 (1715) and its compliment is input to NOR gate 1707 (1717) after being inverted by inverter 1709 (1719). The second input to both gates is the FMTOUT signal on line 1507. When the formatted data represented by the FMTOUT signal is input to the gates, the HDOE (MDOE) signal will output enable both gates when it is asserted. Accordingly, this will assert the HPG* (MPG*) signal on line 1701 (1711) and the HNG (MNG) signal on line 1703 (1713) depending on the state of the FMTOUT signal.

Medium-driver 1572 is preferably designed to drive HME I/O pins during the presentation of the history sequence. Medium-driver 1572 has switching times on the order of 10 ns, however, because it is a current source, the driver is current limited. This minimizes current spikes which might occur if there is a conflict between the HME and the medium driver. The medium-driver preferably is current limited as shown in FIGS. 45 and 46.

In these figures, the low medium-driver current limit is programmable preferably from 8 mA to 16 mA and the high medium driver current limit is programmable preferably from −4 mA to −8 mA. This corresponds to the resistor in the IM line having a value of 2.5K.

The control signals for medium-driver 1572 are the MNG signal on line 1713, MPG* signal on line 1711, VMPCL signal on line 1667, and VMNCL signal on line 1665. The MPG* and MNG signals have been discussed. The VMPCL and VMNCL signals are control voltages generated by the low and high medium drivers current references.

Figure 48A:
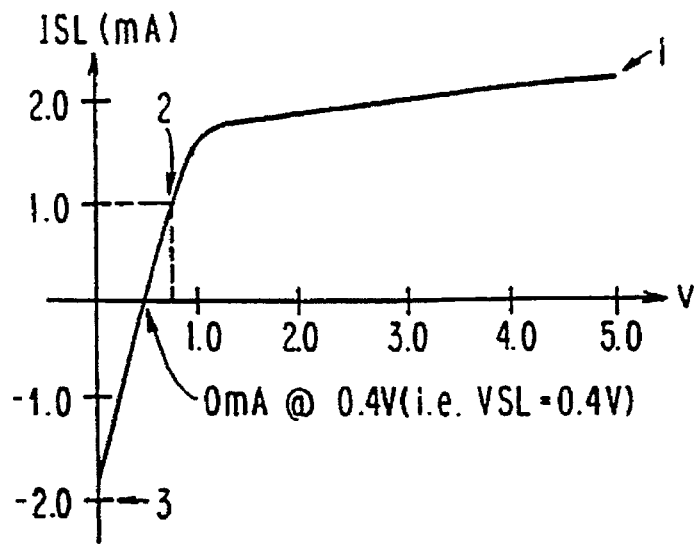
FIGS. 48A–48E show a representation of the I/V characteristic of the low and high soft drivers of FIG. 47.
Figure 48B:
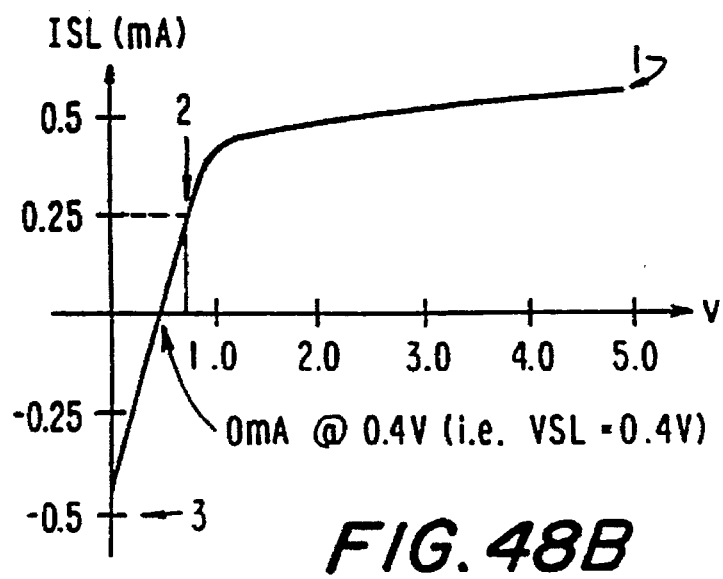

Referring to FIGS. 48A–48E, soft driver I/V characteristic curves will be described. The low soft drivers of the CIC are capable of non-intrusive driving during sampling. The low soft driver, CIC sensing circuitry, and related CMC software have several features to support this capability. Referring to FIGS. 48A and 48B, which are representative soft-drive low I/V characteristic curves for driving TTL, NMOS, CMOS and LCMOS HME pins, these features will be described.

The low soft driver drives toward the programmable drive voltage, VSL. Preferably, the CMC software running on the CPU sets VSL to an appropriate logic low voltage depending upon the HME logic family.

As shown at Point 1 in FIG. 48A, the low soft driver is current limited. This current limit, ISL, is programmable on a pin-by-pin basis. Preferably, the CMC software running on the CPU constrains the low soft driver current limit such that it is less than the source current of the HME pin in the driving high state. Thus, if the HME pin is in a driving high state, the HME pin will overdrive the enabled CIC low soft driver to a logic high.

Preferably, the CMC software running on the CPU sets the low soft driver current limit, depending upon the VSL used, such that if the HME pin is in a non-driving state, then the CIC low soft driver will drive the HME pin to a logic low. For example, for TTL HME pins, the CMC software constrains the low soft driver current limit such that it is more than twice the input leakage current for the HME pin in the non-driving low state. Referring to Point 2 of FIG. 48A, with VSL set at 0.4 V, the low soft driver will drive a TTL HME pin which is in the non-driving state to 0.6 V, which is a valid logic low.

Figure 48C:
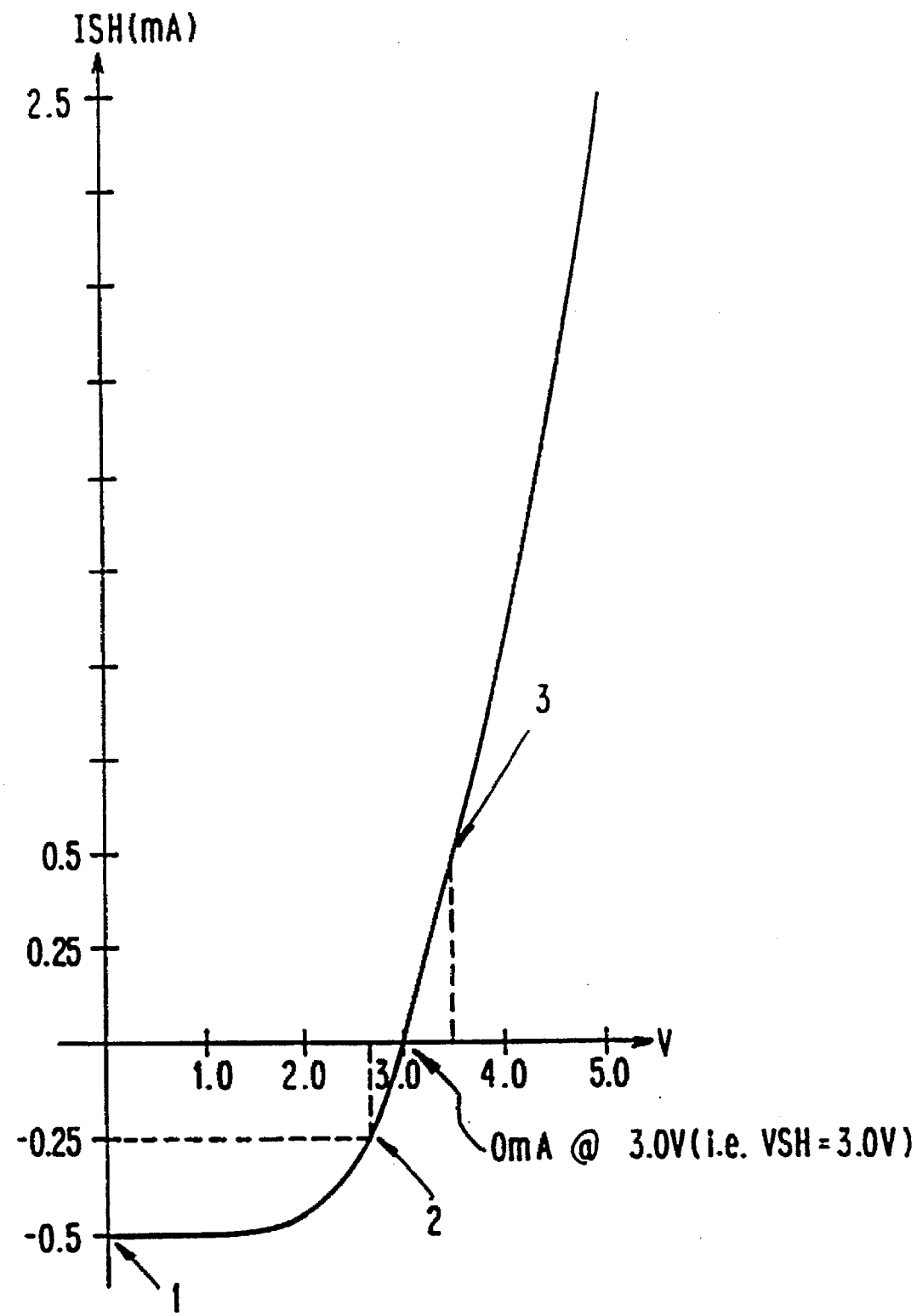
Figure 48D:
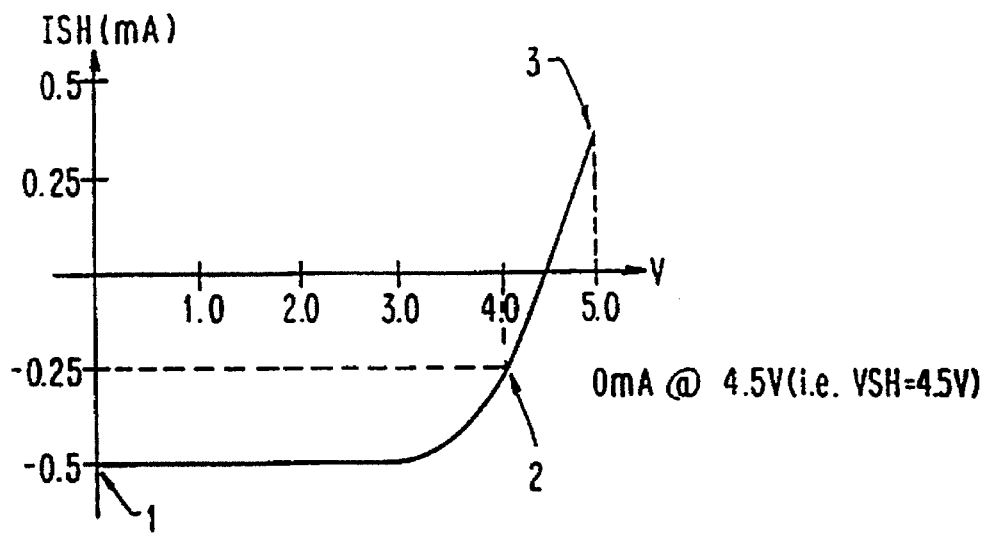
Figure 48E:
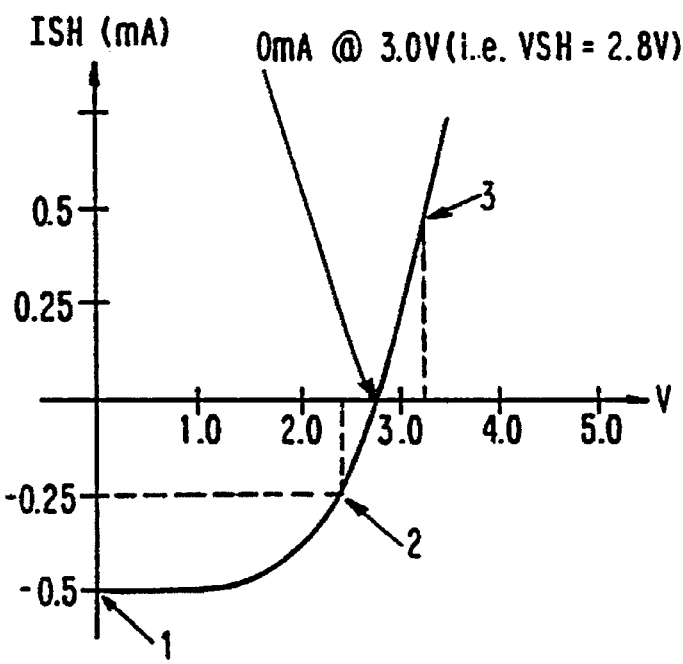

The high soft drivers of the CIC are capable of non-intrusive driving during sampling. The high soft driver, CIC sensing circuitry, and related CMC software have several features to support this capability. Referring to FIG. 48C, 48D, and 48E, which are representative soft-drive high I/V characteristic curves for driving TTL, NMOS, CMOS and LCMOS HME pins, these features will be described.

The high soft driver drives toward a programmable drive voltage, VSH. Preferably, the CMC software running on the CPU sets VSH to an appropriate logic high voltage depending upon the HME logic family.

As shown at Point 1 in FIG. 48C, the high soft driver is current limited. This current limit, ISH, is programmable on a pin-by-pin basis. Preferably, the CMC software running on the CPU constrains the high soft driver current limit such that it is less than the sink current of the HME pin in the driving low state. Thus, if the HME pin is in a driving low state, then the HME pin will overdrive the enabled CIC high soft driver to a logic low.

Preferably, the CMC software running on the CPU sets the high soft driver current limit, depending upon the VSH used, such that if the HME pin is in a non-driving state, then the CIC high soft driver will drive the HME pin to a logic high. For example, for TTL HME pins, the CMC software constrains the high soft driver current limit such that it is more than twice the input leakage current for the HME pin in the non-driving high state. Referring to Point 2 of FIG. 48C, with VSH set at 3.0 V, the high soft driver will drive a TTL HME pin which is in the non-driving state to 2.6 V, which is a valid logic high.

Preferably, the CMC software running on the CPU sets a reference voltage, VHTH, for comparison with the HME pin voltage, depending upon the VSH used and the high soft driver current limit used, so that if the HME pin is in a driving high state and the CIC high soft driver is enabled, then the HME pin voltage will be greater than VHTH. For example, for TTL HME pins, at Point 3 in FIG. 48C, the "reverse" current of the high soft driver is less than ISH, the source current of the HME pin is greater than ISH, and the I/V characteristic curve in this region is essentially linear. In this case, therefore, the CMC software sets VHTH to be closer to VSH than to the maximum HME drive voltage.

Table 15 shows the preferred settings for the programmable voltage levels used in driving and sampling HME pins of the above-indicated logic families.

TABLE 15

| FAMILY | VLTH | VSL | VLOGL | VLOGH | VSH | VHTH | HMEVCC |
| --- | --- | --- | --- | --- | --- | --- | --- |
| TTL | 0.35 V | 0.4 V | 0.8 V | 2.0 V | 2.9 V | 3.05 V | 5.0 V |
| NMOS | 0.25 | 0.4 | 0.8 | 2.0 | 2.9 | 3.2 | 5.0 |
| CMOS | 0.25 | 0.4 | 1.0 | 3.5 | 4.5 | 4.7 | 5.0 |
| LCMOS | 0.25 | 0.4 | 0.6 | 2.5 | 2.8 | 3.0 | 3.3 |

Preferably, the CMC software running on the CPU sets a reference voltage, VLTH, for comparison with the HME pin voltage, depending upon the VSL used and the low soft driver current limit used, so that if the HME pin is in a driving low state and the CIC low soft driver is enabled, then the HME pin voltage will be less than VLTH. For example, at Point 3 in FIG. 48A, the "reverse" current of the low soft driver is less than ISL, the sink current of the HME pin is greater than ISL, and the I/V characteristic curve in this region in essentially linear. In this case, therefore, the CMC software sets VLTH to be closer to VSL than to 0.0 V.

Similarly, Table 16 shows the preferred settings for programmable current levels used in driving and sampling the HME pins.

TABLE 16

| FAMILY | ISL | ISH |
| --- | --- | --- |
| TTL | 2.0 mA | −0.5 mA |
| NMOS | 0.5 | −0.5 |

TABLE 16-continued

| FAMILY | ISL | ISH |
|---|---|---|
| CMOS | 0.5 | −0.5 |
| LCMOS | 0.5 | −0.5 |

Figure 49:
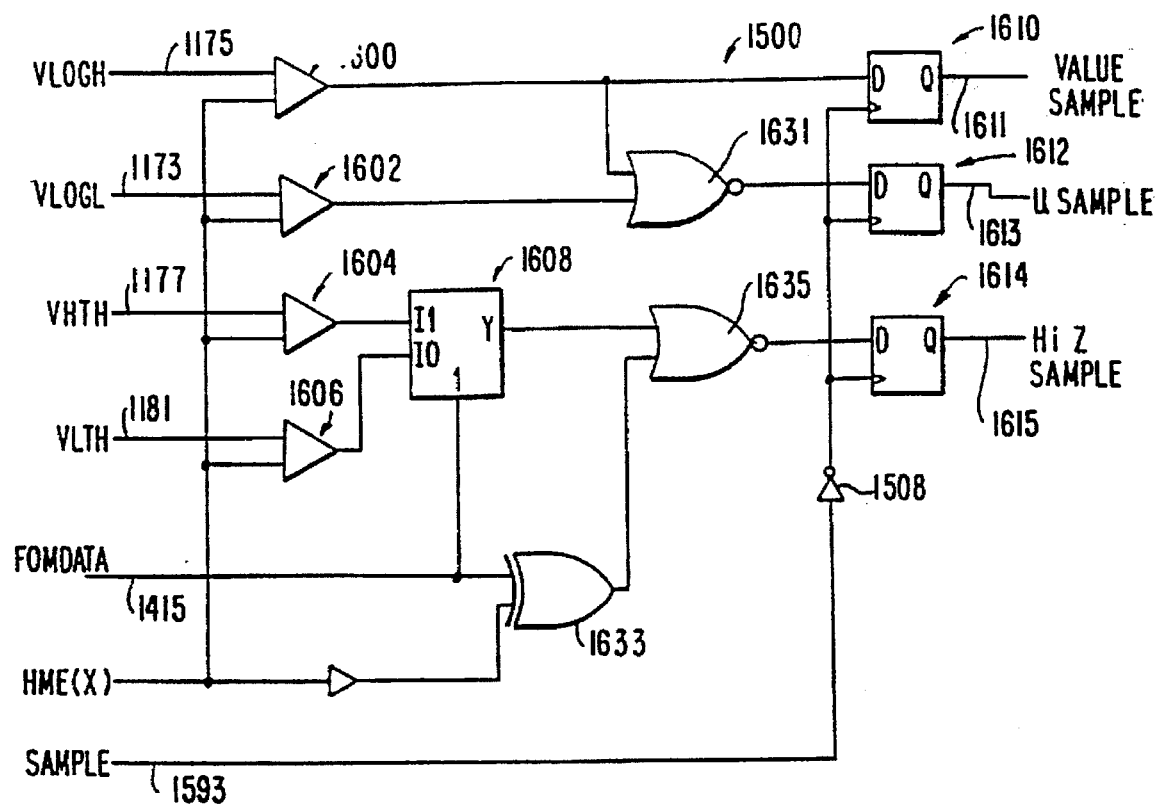
FIG. 49 is a schematic drawing of the 5-State Sampler of the sampling circuitry of FIG. 42.
Figure 50:
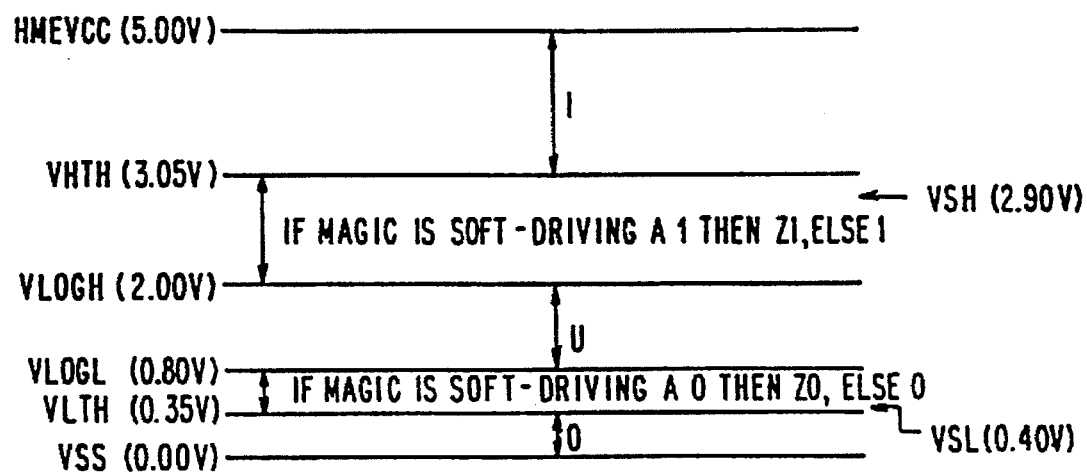
FIG. 50 shows a representation of the voltage ranges for the 5-state sampling of a TTL HME device.

The preferred embodiment of 5-state sampler 1500 is shown in FIG. 49. FIG. 50 also will be referred to in disclosing the 5-state sampler. The 5-state sampler includes analog voltage comparators 1600, 1602, 1604, and 1606. The comparators compare the voltage sensed at HME pins with the four reference voltages. These are VLOGH on line 1175, VLOGL on line 1173, VHTH on line 1177, and VLTH on line 1181. The outputs from the comparators are input to two NOR gates.

The inputs to NOR gate 1631 are the outputs of comparators 1600 and 1602. The inputs NOR gate 1635 is either the output of comparators 1604 or 1606, and the output of exclusive-OR gate 1633. The inputs to the exclusive-OR gate are the FOMDATA signal on line 1415 and the HME signal on line 1304.

Data selector 1608 selects whether the output of comparator 1604 or 1606 will be the input to NOR gate 1635. The FOMDATA signal is used to determine what is being soft driven to the HME pin.

The output of the comparators and the logic circuitry is latched by registers 1610, 1612, and 1614. The output of comparator 1600 is input to the data input of register 1610, the output of NOR gate 1631 is input to the data input of register 1613, and the output of NOR gate 1635 is input to the data input of register 1614. The three registers are clocked by the SAMPLE* signal which is the SAMPLE signal on line 1593 that has been inverted by inverter 1508. The SAMPLE signal may be asserted after a sufficient time delay to permit settling of the signal to occur. The output of registers 1610 is the VALUE SAMPLE signal on line 1611, the output of register 1612 is the U SAMPLE signal on line 1613, and the output of register 1614 in the HIZ SAMPLE signal on line 1615. This sampling operation may be performed on one or more pins while one or more different HME pins are being driven. Because each data channel includes its own sensing and driving circuitry, multiple pins of the HME are sensed simultaneously. The results of sampling are returned to the simulator.

There are three bits of sampled information output for the five state sampling circuitry. However, they provide five states of useful information: driving high ("H1"), non-driving high ("Z1"), driving low ("H0"), non-driving low ("Z0"), and unknown ("U"). An output of high or low (HIZ_SAMPLE deasserted), indicates that the HME pin is an output pin and that it is driving a logic high or logic low value. An output of Z1 or Z0, (HIZ SAMPLE asserted) indicates that the HME pin is in a non-driving state. An output of U, which is asserted as the U SAMPLE signal, indicates that the HME pin was sampled at an unknown level (between VLOGL and VLOGH).

FIG. 50 shows the relationship among the supply voltages, voltage references, and HME pin voltages shown in FIG. 49. The voltages shown on FIG. 49 are the preferred voltages for use in testing TTL logic circuits. The values of the reference voltages will differ depending upon the technology of the device being tested (e.g., TTL, ECL, CMOS, NMOS and LCMOS). These values may be selected through the software shell. The VSH and VSL voltages shown in FIG. 50 are the voltages at which the CIC soft drives a logic high and a logic low value, respectively.

Table 17 discloses how determination are made regarding the status of sampled HME pins:

Table 17

1. VHTH<HME pin voltage<HMEVCC. The HME pin voltage is above both VSL and VSH, which are the target voltages of the soft drivers, therefore, the HME must be in the H1 state. If the soft drivers are also driving a logic high value, the measured voltage is merely driven closer to HMEVCC.

2. VLOGH<HME pin voltage<VHTH. If the soft drivers are driving a logic high value, the HME pin is in the Z1 state (the HME is an input pin and the soft drivers are driving at VSH). If the soft drivers are not driving, the HME is an output pin, and it is in the H1 state. The logic circuitry of 5-state sampler 1500 determines whether or not the soft drivers are driving.

3. VLOGL<HME pin voltage<VLOGH. The HME pin voltage is between a valid logic low value and a valid logic high value, and therefore is classified as unknown. This state indicates that a problem exists.

b 4. VLTH<HME pin voltage<VLOGL. If the soft drivers are driving a logic low value, then the HME pin is in the Z0 state (the HME is an input pin and the soft drivers are driving at VSL). If the soft drivers are not driving, the HME is an output pin, and it is in the H0 state. The logic circuitry of 5-state sampler 1500 determines whether or not the soft drivers are driving.

5. HME pin voltage<VLTH. The HME pin voltage is below both VSL and VSH, so the HME is in the H0 state.

This sampling method permits the HME pin to dominate whenever both the HME pin and the soft drivers are driving (i.e., when the HMS is trying to soft drive an I/O pin which is acting as an output). It also permits the user to know which of the high impedance zones (i.e., Z1 or Z0) the HME pin is in. For example, if the HME pin was an output pin driving a logic high value and then becomes a high impedance input, the CIC will soft drive low during the next calculation.

Referring again to FIG. 32, status/read control 1372 of data channel 1350 is a 16:1 multiplexer which used primarily for diagnostic purposes and for reading sampled results. The multiplexer receives as inputs the data described in the Table 18 and outputs data to the Pattern Bus. Control 1372 is read by first strobing the 4-bit address on the four pattern lines during CPU access mode and latching the address with the AS* signal. Then the RD* signal is asserted. The signals set forth in Table 18 provide the status of the individual data channels, with the exception of the parity status and RESET signals, which give the entire status of CIC 1300.

TABLE 18

| Address | Source | Source Description |
|---|---|---|
| 0 | FMT OUT | SR Data Formatted output. |
| 1 | MDOE | SR Medium-Drive output enable. |
| 2 | HDOE | SR Hard-Drive output enable. |
| 3 | CTL_OUT | Control Register CTL_OUT bit. |
| 4 | LCYC | Delayed version of SEQEND. |
| 5 | FORMATTER HMDEN* | Formatter hard/medium drive enable output from the Control Register. |
| 6 | FOMDATA | Formatter data output from the Control Register. |
| 7 | ERROR DATA | Last input pattern data before ERROR* is asserted. |

TABLE 18-continued

| Address | Source | Source Description |
|---|---|---|
| 8 | SHORTED | Short sensor status |
| 9 | U SAMPLE | 5-state U sample |
| 10 | HIZ SAMPLE | 5-state Z sample |
| 11 | VALUE SAMPLE | 5-state 0/1 sample |
| 12 | TTL Timing Sample | 2-state timing measurement sample. |
| 13 | Unused | |
| 14 | Parity Status Register | PAT<0> contains the input PARITY bit. PAT<1> contains the output parity status. A value of 1 for this bit indicates a parity error. |
| 15 | RESET | Reading from this address causes the internal RESET to be asserted. Also, the value read is the CIC version number. |

DEVICE ADAPTER BOARD

The primary function of DAB 268 is to fixture an HME to the PEL of an HMS. FIG. 52 shows a top view of a representative DAB. It is an 80 pin DAB. It is understood that the DAB may be a 160, 240, or 320-pin DAB, or be a DAB with more than 320 pins, and still be in the scope of the present invention.

Two main components of the DAB 268 shown in FIG. 52 are system connector 1702, which connects the DAB to the PEL of the HMS and, pad array 1704, referred to as the HME "footprint," to which an HME or an HME socket connects. The footprint is designed to permit a family of HMEs that have different pin-out configurations to be fixtured on the same pad array, without requiring any custom wiring on the DAB. DAB 268 also includes an array of power and ground pads, which may be connected directly to the pads that are intended to connect to HME power and ground pins.

System connector 1702 is used for communicating between the HME and the PEL. There may be one or more system connectors on a given DAB depending on the number of signal pins the DAB is intended to support.

The HME footprint preferably supports a class of HME package types having up to a predetermined number of device pins. The footprint pads preferably are laid out in a matrix with 0.1 inch centers. For example, the footprint for supporting a family of device packages with pin grid array ("PGA") pin-out configurations is a square matrix. The footprint for a family of device packages with dual-in line package ("DIP") pin-out configurations is a rectangular matrix with multiple parallel rows on 0.1 inch centers. Another example is the footprint for a family of device packages with plastic leaded chip carrier ("PLCC") pin-out configurations or quad-flat pack ("QFP") pin out configurations is a rectangular matrix also with multiplex parallel rows 0.1 inch centers. The footprint, therefore, may be configured in any manner which supports the direct connection of HMEs to the DAB. It is to be understood that custom DABs may be constructed for any special HME requirements, such as 50-mil PGA or high-density surface-mount devices.

Support for a class of HME package types is achieved by designing the HME footprint to be a superset of a specific class of HME package types. For illustration purposes only, the footprint of the 80-pin PGA DAB shown in FIG. 51 will be described.

The DAB matrix which supports the 80-pin PGA package has a total of 169 pads arranged in a square 13-by-13 matrix, on 0.1 inch centers in both dimensions. It is to be understood that the total number of signal pads of a given DAB footprint may exceed the number of signals available from the system connector. For example, the above-mentioned DAB footprint has 169 pads to which a maximum of 80 pins are connected. In connecting the footprint pads to the system connector pins, the 80 pins from the system connector are initially routed to one pad in the HME footprint. Each pin may then have one or more additional matrix pads connected to it. The pins that connect to more than one pad preferably are routed in a manner to take advantage of the concentric ringed nature of standard PGA packages. FIGS. 52A–52F illustrate the package pin-out configuration supported by the 80 pin PGA DAB footprint. If a device has a pin-out configuration that is a subset of any of the arrays that are shown in these figures, it can be supported by the DAB.

The impedances of the traces that connect the system connector pins to the HME footprint pads are controlled. Such impedances are selected to match the combined impedance of the PEL drivers and any series dampening resistors. Impedance matching decreases ringing and undershoot of the HME signal lines. Equalizing trace lengths to each of the pads permits very precise timing measurements to be made.

In a preferred embodiment, power supply, HMEVCC, pads and ground pads are distributed throughout the HME footprint for simplifying their connection to the HME footprint pads. These pads preferably are coded by shape: square pads for ground, as shown at 1708, and diamond pads for power, as shown at 1710. These shapes are easily distinguished from the round pads which are used for all other signals.

To accommodate mounting an HME to the DAB, vias are provided for every HME footprint pad. The vias are channels for the traces and allow the connection of the footprint pad to the system connector pins. Further, the HMEVCC and ground connections are on the front side of the DAB to allow the easy connection to the footprint pads.

In the preferred embodiment, DAB 268 includes circuitry to permit the DAB to be inserted or withdrawn from a powered HMS. This is referred to as a live insertion capability. Live insertion eliminates the need to power-down the HMS to insert or remove a DAB. This is particularly useful in systems supporting multiple users. The live insertion capability can be used with or without a specially designed HME footprint.

Live insertion is preferably accomplished in three phases: dissipation of electrostatic charge, equalization of signal ground potential, and gradual powering of the DAB power supplies. Each phase will now be discussed.

The system connector is designed such that its pins mate to the PEL connector at three different times. The first pin of the DAB system connector to mate with the female connector of the PEL connects to the PEL (and HMS) chassis ground. This dissipates any stored electrostatic charge on the DAB. The DAB system connector pin that makes the first contact is 0.5 inches longer than the normal connector pins.

The second pin of the DAB system connector to mate with the female connector of the PEL is associated with signal ground. When it mates it allows the equalization of the DAB and PEL signal grounds. If the signal grounds were not equalized before the main signal pins connect, it could result in a damaging voltage being sent to the PEL (and HMS). The DAB pin that makes this second contact is approximately 0.25 inches longer than the normal connector pins. After this mating, the main body of normal connector pins mate.

An important characteristic of the live insertion circuitry is the slow ramp-on of the power supplies. This substantially eliminates the large in-rush of current which might otherwise occur as the capacitors on the DAB and the HME charge when the power supplies are connected to the DAB. Unless the current in-rush were eliminated, it could cause damage to the HMS, HME, and DAB. This instantaneous in-rush of current could also cause voltage transients on PEL 266.

To accommodate a wide variety of circuits and support circuits that require voltages other than +5 V, the DAB is provided with three additional power supplies. These are the −12 V at 1712, −5.2 V at 1714, and the +12 V at 1716.

The DAB of the present invention also provides a means to regulate the HMEVCC voltage to accommodate HMEs with different supply voltages. This is effected by the circuit shown in FIG. 53. In the circuit, the +5 V supply voltage is connected to the input of voltage regulator 1773 and the terminal 1783 of switch 1779. The output of the voltage regulator is determined by the value of the resistor 1724 and 1725. Table 19 shows the relationship of the resistors and a number of output voltages.

TABLE 19

| VREG | RA value in ohms | RB value in ohms |
| --- | --- | --- |
| 3.5 V | 100 | 180 |
| 3.3 V | 91 | 150 |
| 3.2 V | 43 | 68 |
| 3.0 V | 47 | 68 |
| 2.9 V | 91 | 120 |
| 2.8 V | 120 | 150 |
| 2.5 V | 91 | 91 |
| 2.4 V | 100 | 91 |
| 2.2 V | 120 | 91 |
| 2.0 V | 91 | 56 |
| 1.8 V | 75 | 33 |
| 1.5 V | 120 | 27 |

Figure 53:
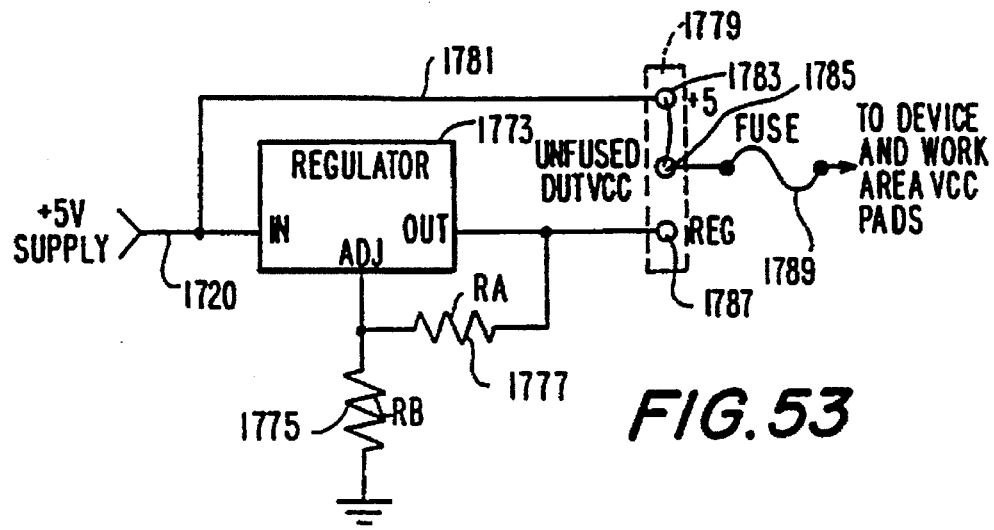
FIG. 53 is a schematic drawing of the circuit for generating variable HMEVCC voltages of the DAB of FIG. 51.

As shown in FIG. 53 either the regulated voltage at 1787 or the +5 V signal at 1783 may be selected for input to the HME after passing through fuse 1789.

It is desirable to connect all power supply pins of the system connector to the female connector of the PEL at the same time to prevent the need for power supply sequencing circuitry. However, when the DAB is being connected to the female connector of the PEL, pins near the edges can be connected and disconnected as the system connector is being rocked into position. If power supply pins are near the edges, it is possible for one power supply to be fully active and for another to be completely shut off as the connection is being made. To reduce the likelihood of this occurring, and, thereby, obviating the need for power sequencing, supply voltage pins are preferably placed near to the center of the system connector.

A public HME must be initializable to a consistent state before each evaluation. Certain HME circuits, for example, divide-by-N counters, cannot be initialized by assertion of a RESET signal. If the HME contains such a circuit, the HME may be initialized by repeatedly presenting a sequence of stimuli which causes the HME to advance to a particular internal state. One or more feedback pads such as FEEDBACK pad 1730 are provided on DAB 268 to allow the HME to transmit signals to the HMS regarding its internal state so it can be determined when the HME is initialized.

Figure 51:
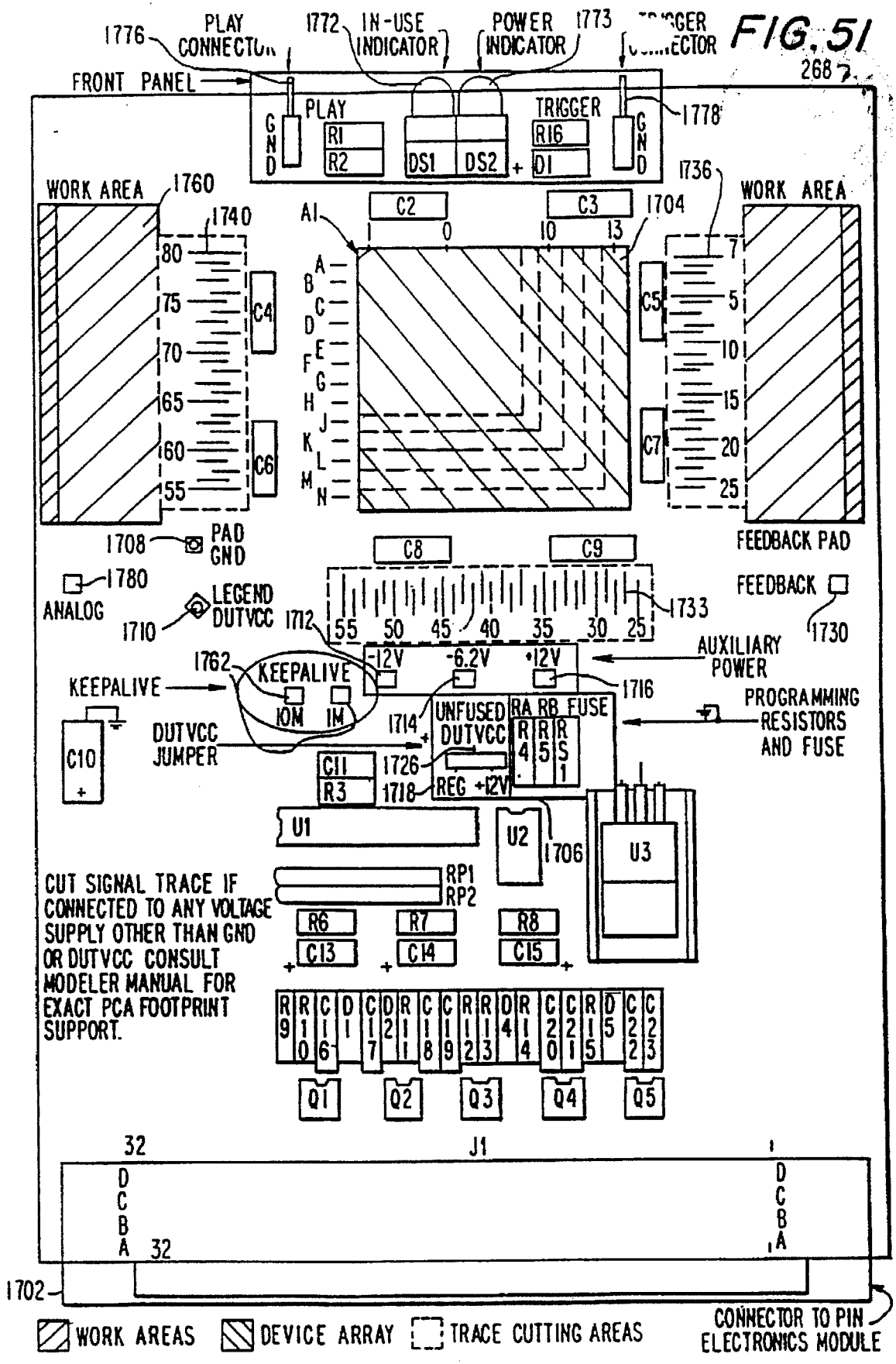
FIG. 51 is a top view of a representative DAB of the HMS of FIG. 1.
Figure 52A:
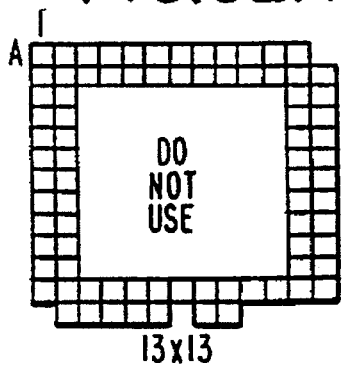
FIG. 52A–52F shows representative HME footprints to accommodate attachment of Pin Grid Array IC packages to the DAB of FIG. 51.
Figure 52B:
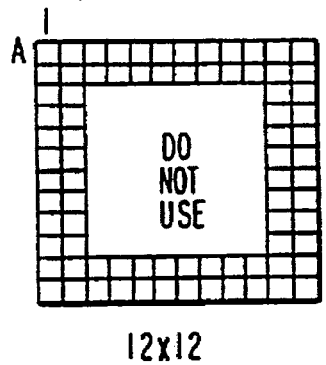
Figure 52C:
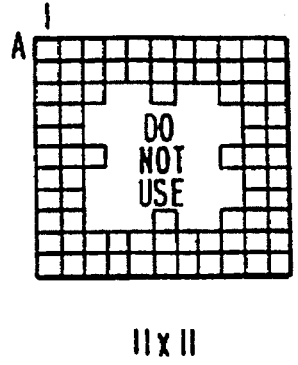
Figure 52D:
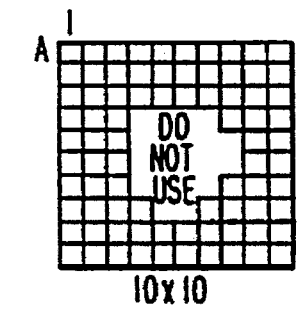
Figure 52E:
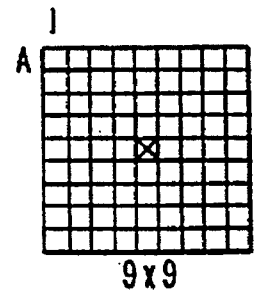
Figure 52F:
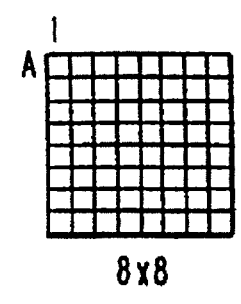

In a preferred embodiment of the invention, DAB 268 includes a configuration area. The configuration areas for the 80-pin DAB in FIG. 51 are shown at 1736, 1738, and 1740. Every trace from the system connector passes through one of the configuration areas. Each trace goes through a via from the system connector to one of the configuration areas, surfaces at the configuration area, and then through another via to a footprint pad. The vias and surface traces are arranged in an orderly pattern, and preferably are numbered.

Figure 54B:
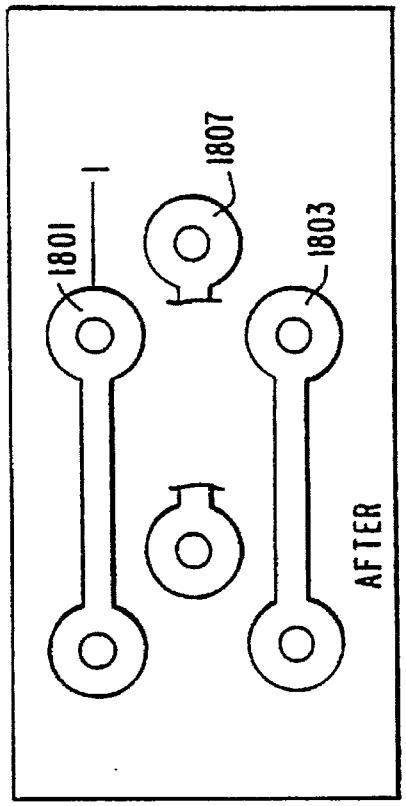
FIG. 54A and 54B shows representative trace cuts in the configuration area of the DAB of FIG. 51.
Figure 54A:
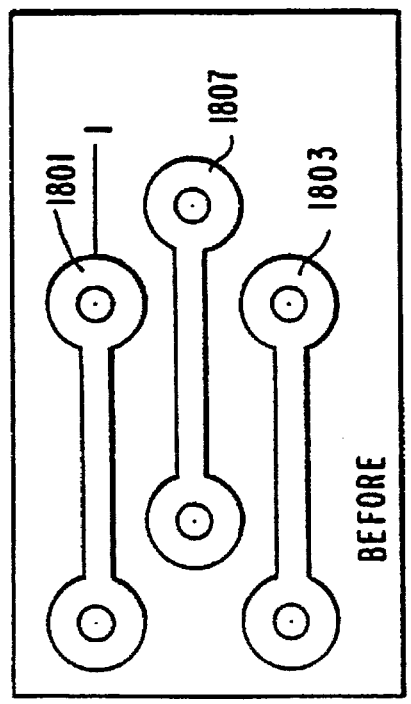

FIG. 54A shows three representation traces 1801, 1803, and 1807 in a configuration area. The traces may be cut in the configuration to increase the versatility of DAB 268 or the HME footprint. For example, the surface trace may be cut to permit the use of a power supply outside the range of the PEL output protection circuitry. That is, if the PEL is only designed to withstand continuous short circuits to HMEVCC or ground, the corresponding trace must be cut when the HME pin is connected to a voltage higher than HMEVCC. Surface traces may also be cut to connect a level translator (e.g., TTL-ECL or ECL-TTL) in series between the system connector and the HME footprint. FIG. 54B shows a representative trace 1807 that may have been cut for one of the above described purposes.

A DAB can only support an HME having a pin count which does not exceed the number of HME signal lines on the system connectors. This limit can be exceeded by cutting the trace to an HMEVCC, ground, or no-connect pin, in the configuration area, and connecting the system connector-side via of the cut trace to a previously unconnected HME signal pin.

DAB 268 preferably includes one or more work areas such as show at 1760. Work area 1760 include arrays of through-hole pads which are not connected to any signals or power supplies. Work area 1760 preferably is surrounded by alternating HMEVCC and ground pads for use in powering the circuitry disposed in the work area. The work area may be used to implement circuitry to support the HME. For example, special feedback logic for decoding a particular HME state into a single rising or falling edge may be mounted on a work area. Other circuits, such as level translators and analog support circuitry for the HME, including special HME clock drivers, indicators, and other HME support logic, may be mounted on the work area.

Many HMEs which specify a minimum operating clock frequency contain a substrate bias generator or other such circuitry in which operation is sustained by the presence of a clock. If the clock stops, or if the clock frequency becomes too low, such devices may require a very long time warm-up before use, or may even sustain permanent damage. To prevent this, keep alive circuitry preferably is provided on DAB 268 to ensure that the HME is clocked at all times. This circuitry preferably includes a register which is output enabled when ever the HME is not in use. This output is the register is connected to the HME clock pins. A range of clock frequencies may be provided to accommodate a predetermined range of HME operating frequencies.

The DAB has two indicators to provide visual indication of the states of the DAB. The first is LED 1770. This LED, when lit, indicates that HMEVCC is available on the DAB. This state is reached once the DAB is connected to the PEL and HMEVCC has ramped up. The second is LED 1772. This is the in-use LED. This LED turns-on when the first instance of the HME is created and goes off when the last instance of the device is released.

The DAB also has two test points that can be used for synchronizing, for example, the operation of external test equipment with that of the HME. The first test point is at 1776. This is used primarily by the software associated with the HME. Two representative events are marked by the changes in the state of the signal output from the first test point, viz., the beginning and end of the evaluation period. The second test point is a pulsed output that may be used to mark specific events during the period the HME is being evaluated. Either of the two test points may be connected, for example, to an external device for synchronizing its operation with the operation of the HME.

Analog sense connector 1780 is jumpered to the analog outputs of the HME. Monitoring of the analog output provides information regarding analog changes occurring in the HME during evaluation that would not be revealed if only the digital signal outputs were monitored.

OPERATION

Hardware modeling system 100 uses a five step method to evaluate a public HME. These five steps are: programming CIC 1300 and other hardware, resetting the HME to a known state, restoring the HME to the last measured state, stimulating the HME with a new stimulus pattern, and measuring the results of the stimulation.

The programming step preferably is accomplished by sending several patterns of programming data to PEL 266 in the initial patterns of the history sequence during the pattern presentation mode. According to the present invention, preferably 22 patterns of programming data are sent.

The resetting step is accomplished by clocking a RESET pattern sequence to the HME, if the HME is the type that will accept and act upon it. If the HME is not resettable in this manner, feedback looping is performed within the VRAM shift registers to bring the HME to a known state. The HME must be returned to a known state before the history sequence is presented, otherwise, there is no way to ensure that the subsequent restoring step will restore the HME to the last measured state.

During the restoring step, patterns are presented to the HME to restore it to its the last measured state. The entire sequence of patterns produced by the HMS from the time simulation began until just prior to the current event is presented to the HME. By completely replaying the pattern sequence before each new stimulation, the simulator may take whatever time is needed to perform analyses of the simulated external system. Without the restoring step, dynamic devices, which have minimum clock frequency specifications, would decay to unknown states between simulator accesses. The restoring step also permits the HME to be shared among more than one simulator and permits a single HME to represent a replicated device within the system being simulated. The restoring step brings the HME to a state from which timing measurements and other measurements may be performed. During the restoring step, patterns are sent to the CIC generally as one bit per pin to reduce the required pattern storage. Output pins of the HME are left floating during the restore step.

The single bit per pin of the pattern specifies a driving direction for the HME pin driver. Strict input pins of the HME are hard driven in the specified direction. I/O pins are driven using the CIC current-limited medium driver as follows: if the HME pin is driving, the CIC medium driver drives in the same direction as the HME pin, otherwise, the CIC medium driver drives in the direction that the simulated external network (connected to the HME pin in the simulated design) is driving. Strict output pins are effectively not driven during the restoring step.

During the stimulating and measuring steps, new stimulus is presented to the HME pins, and the outputs are sampled. In this process, the HMS waits a predetermined interval for the device outputs to settle, and then samples all outputs simultaneously. The changes are returned to the simulator. Scheduling delays are also returned with the changes. The delays can be obtained from the delay table specified in the shell software. This method allows the use of worst-case timing values or ranges from the device data sheet.

Figure 55:
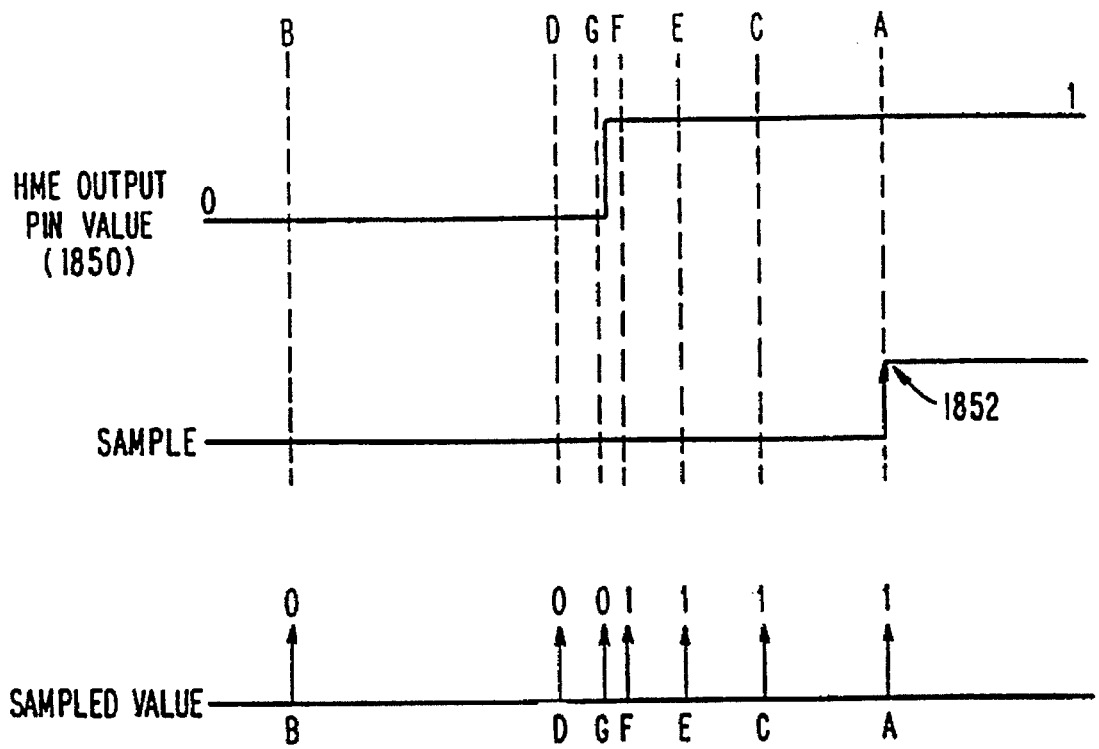
FIG. 55 shows a representation of the timing measurement process performed in accordance with the present invention.

The system of the present invention can perform its own timing delay measurements, such as determining the output delay of each HME output transition. This allows the HMS to create its own Timing file. The SAMPLE timing edge on line 1593 and register 1502 (FIG. 42) are used to perform the binary search shown in FIG. 55, until the output delay is determined. Binary searching consists of continually presenting the same pattern sequence to the HME, and placing the SAMPLE edge at different times during the measurement stage to determine when each HME output pin changes state. As shown, the rising SAMPLE edge at 1852 is placed at time A, and the HME pin value 1850 is sampled as a logic high value. The same pattern sequence is again presented to the HME, and SAMPLE edge 1852 is placed at time B. The output data is sampled as a logic low value. The measurement is continually iterated by repeating the pattern sequence, and continually cutting the interval (A to B) in half. If the sampled value is a logic low value, the next sampling time is increased. If the sampled value is a logic high value, the next sampling time is decreased. The final result of the process when the interval size reaches a small predetermined value is the transition of the signal.

An HME includes several types of pin connections, and each requires a special driving or sampling technique. According to the present invention power, ground, and "no-connect" pins are not driven. Dedicated input pins are driven by the hard drivers, which are turned on and remain on throughout all of the stages of a pattern presentation. Dedicated output pins are never driven with either the hard or medium drivers. During the restoring and stimulating steps of pattern presentation, the output pins are left floating. During the measurement step, the output pins are soft-driven to determine whether the output is driving high or driving low, or non-driving high or non-driving low or unknown. HME I/O pins operate as inputs sometimes and as outputs at other times. HME I/O pins are preferably medium-driven during the restoring and stimulating steps. I/O pins may also be driven by pulsing the hard drivers, preferably, using 15 ns pulses. After these hard driver pulses, the soft drivers may continue to drive in the same direction. Using pulsed hard drivers causes faster input voltage transitions than using medium drivers. This mode of use can be enabled by the HMS user for fastest pattern presentation rates.

HME input and I/O pins may be further classified into several pin types, relating to the pin function. These classifications include data pins, eval pins, store pins, edge_fall pins, edge_rise pins, and I/O store pins. A data pin is a pin which affects neither the output state nor the internal state of an HME. An eval pin is one which may affect the outputs of an HME, but does not affect the HME's internal state. A store pin may affect the output and/or the internal state of the HME. Edge_fall and edge_rise pins are store pins having only one edge which can cause internal state changes. The edge_fall and edge_rise pins affect the output and state of the HME only on the falling and rising edges, respectively. An I/O store pin is an I/O pin which is also a store pin. Patterns preferably are presented to this type of pin during the stimulating step using two bits per pin.

During the stimulating step, patterns are sent to the HME according to the previously described method using one bit per pin, but patterns may be sent as two bits per pin if an I/O store pin is changing from input to output or output to input.

Figure 56:
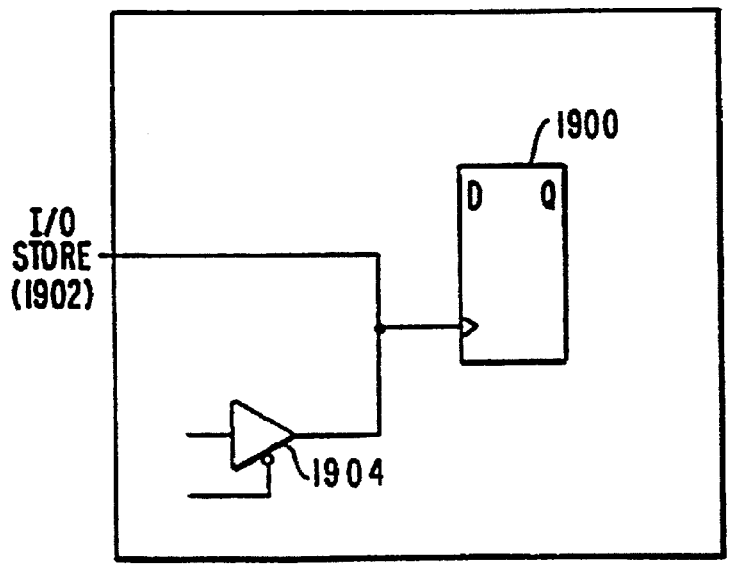
FIG. 56 is a schematic drawing of a representative circuit containing an I/O store pin.

FIG. 56 shows an example of an I/O store pin. The clock of register 1900 within the HME is connected to an I/O store pin 1902 and the output of an internal tri-state buffer 1904. During the stimulating step, it is not known whether pin 1902 or buffer 1904 is driving the clock input at register 1900.

Figure 57:
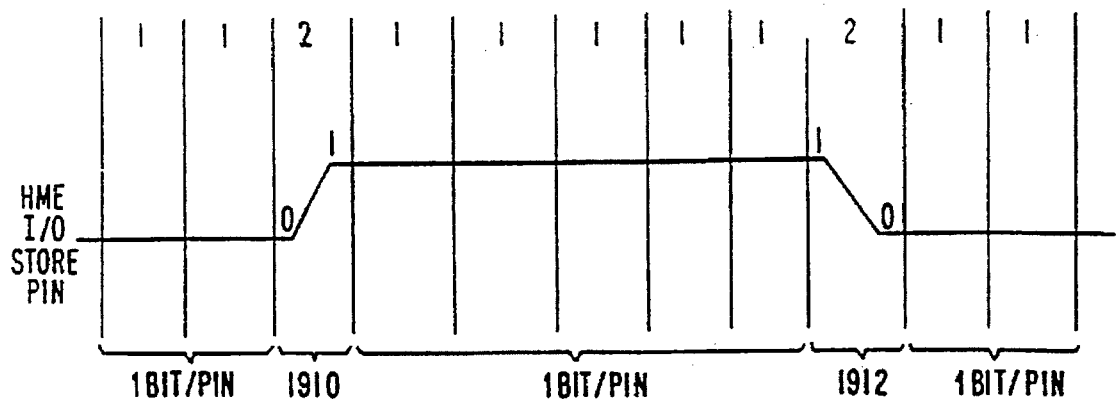
FIG. 57 shows a representative method of system operation using two bits per pin to sample an I/O store pin.

FIG. 57 shows patterns being presented to an I/O store pin. The patterns are sent to the pin as one bit per pin for all pattern cycles except cycles 1910 and 1912. During these two cycles, the HME pin direction was found to change (during a previous measurement step). During 1910, the HME I/O store pin transitions from non-driving low to driving high. During 1912, the HME I/O store pin transitions from driving high back to non-driving low. During each of these cycles, the appropriate pattern is sent using two bits per pin for every pin of the HME. The first bit is latched within the CIC channel and used as a control bit; it specifies whether the appropriate CIC medium driver will be enabled. The second bit is used for the data value. Thus, at 1910, the two bits for this particular HME I/O store pin would disable the CIC medium driver. The data value is irrelevant. At 1912, the two bits for this I/O store pin would re-enable the CIC medium driver and also begin to driving low.

Figure 58:
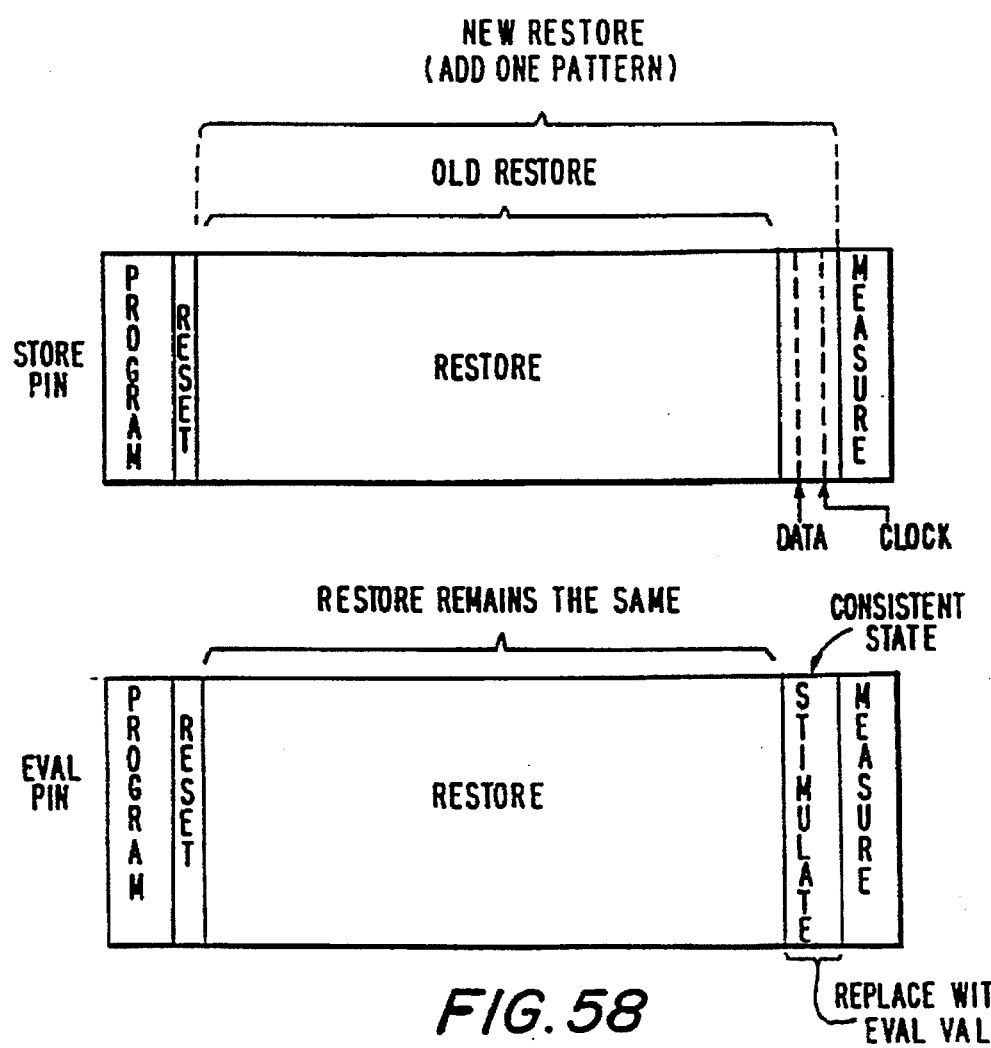
FIG. 58 is a diagram of the method for evaluating the store and eval pins of an HME.

For private HMEs, only a single stimulus pattern is presented to the HME during evaluation. However, as stated, a public HME is restored to its last known state by presenting a history sequence to the HME. To compress the history sequence, only certain measurements cause the sequence to grow. When a store pin, edge_fall pin, or edge_rise pin, transitions, the history sequence must grow to add one additional pattern as shown in FIG. 58. Because such transitions can change the internal state of the HME, the sequence must grow to ensure that the HME is properly restored by the sequence.

Data and eval pin transitions do not cause the sequence to grow. The current values of the data pins are queued on the host computer system until an eval or store pin changes. When measuring the effects of an eval or store pin transition, the pattern at the end of the history sequence is altered, and the HME is measured again, but the history sequence does not grown.

The following procedure is initiated by CPU 240 to begin a pattern presentation. CPU 240 programs the TG pattern clock frequency, and programs the edge and sampling times. The CPU then allocates the pattern memory in PAMs and sets up the pattern sequence to be played, including PEL control patterns and any device initialization sequence. Note that the pattern sequence may already be set up from a previous evaluation. CPU 240 then sends a start signal to TG 248 for the lanes in which the HME resides. Multiple lanes can be started simultaneously.

The above sequence of events results in the following: TG 248 starts PACs 258 in the selected lanes. PACs 258 sequence through the attached PAMs as programmed, delivering the history sequence patterns to the appropriate PELs. PELs 266 deliver the patterns to the pins of the selected HME via DAB 268. CICs on PELs 266 sample and latch the HME pin states. CPU 240 retrieves the sampled data from PELs 266 and returns it to simulator 164.

Having illustrated and described the principles of our invention with reference to one preferred embodiment, it should be apparent to those persons skilled in the art that such invention may be modified in arrangement and detail without departing from such principles.

The terms and expressions used herein are terms of expression and not of limitation, and there is no intention, in the use of such terms and expressions, of excluding any equivalents of the features shown and described, or portions thereof, it being recognized that various modifications are possible within the scope of the invention as claimed.

We claim:

1. A hardware modeling system adapted for coupling to one of a predetermined collection of host computers, the hardware modeling system for evaluating a response of an electronic device or circuitry to stimulation from the hardware modeling system, with pins of the electronic device or circuitry being electrically coupled to pin drivers of the hardware modeling system, comprising:

a. a host connection means configured for coupling a host computer for transmitting bi-directionally thereon communications between the hardware modeling system and a host computer;

b. microprocessor means coupled to the host connection means for controlling programmed operation of the hardware modeling system;

c. central timing control means for generating timing signals for controlling timing of operations of the hardware modeling system, the central timing control means coupled to the microprocessor means and a pattern bus means for generating sample strobes for sampling outputs of the pins of the electronic device or circuitry and edge strobes for formatting stimulation patterns;

d. pattern bus means coupled to the central timing control means and the microprocessor, the pattern bus means having a first mode of operation for the microprocessor means to access certain circuitry for conducting read and write operations and a second mode of operation for presenting the stimulation patterns to the pins of the electronic device or circuitry which is electrically coupled to the hardware modeling system;

e. pattern controller means coupled to the pattern bus means for controlling stimulation pattern sequencing and delivery of stimulation patterns to the pattern bus;

f. pattern memory means coupled to the pattern controller means for storing the stimulation patterns in the pattern memory means in a plurality of memory means bits;

g. pin electronics circuitry coupled to the pattern bus means for driving and sensing the pins of the electronic device or circuitry, and the pin electronics circuitry providing sensing of at least four states of the pins of electronic device or circuitry; and h. adaptor means coupled to the pin electronics circuitry and the pins of the electronic device or circuitry, the adaptor means configured for electrically receiving the electronic device or circuitry wherein the adaptor means includes circuitry for supporting live-insertion into a powered hardware modeling system.

2. A method of communicating between a networked hardware modeling system and one of a plurality of simulators running on one of a plurality of computers coupled to the network, comprising the steps of communicating in a simulator-independent manner and responding concurrently.

3. A method of testing the functionality of an electronic device or circuitry electrically coupled to pin electronics circuitry of a hardware modeling system, comprising the steps of:

a. reading a test vector from a storage device;

b. stimulating the electronic device or circuitry with the pin electronics circuitry according to the test vector;

c. measuring a response by the electronic device or circuitry to the step of stimulating, thereby forming a measured response; and d. comparing the measured response to a stored predetermined response to determine if the electronic device or circuitry is functional.

4. The method as recited in claim 3, wherein the hardware modeling system has a plurality of electronic devices or circuits coupled thereto with each electronic device or circuitry having at least one pin that is electrically coupled to the pin electronics circuitry of the hardware modeling system.

5. A method of executing hardware diagnostics for a networked hardware modeling system, comprising the steps of controlling execution of the diagnostics remotely from one of a plurality of computers coupled to the network and concurrently transmitting the status of the hardware modeling system to one of the plurality of computers.

6. A hardware modeling system for stimulating and sensing a response of electronic devices or circuitry to a stimulus, the hardware modeling system configured for coupling to a plurality of electronic devices or circuitry and comprising a plurality of interfaces each having pin electronics circuitry for driving and sensing low-voltage CMOS electronic devices or circuitry operating at a supply voltage of 3.3 V.

7. A method of configuring a width of memory in a hardware modeling system, wherein the memory is used to store a stimulation pattern sequence for presentation in parallel to pins of an electronic device or circuitry, comprising the steps of coupling a variable number of memory devices in parallel to a pattern bus and storing a stimulation pattern therein.

8. The method as recited in claim 7, wherein the width of the memory is configured up to a size for supporting 320-pin electronic devices or circuitry.

9. A hardware modeling system adapted for coupling to one of a predetermined collection of host computers, the hardware modeling system evaluating a response of an electronic device or circuitry to stimulation from the hardware modeling system, with pins of the electronic device or circuitry being electrically coupled to pin drivers of the hardware modeling system, comprising:

a. a host network configured for coupling to a host computer for transmitting bi-directionally thereon communications between the hardware modeling system and the host computer;

b. microprocessor circuitry coupled to the host network for coupling programmed operation of the hardware modeling system;

c. central timing controller for generating timing signals for controlling timing of operations of the hardware modeling system, the central timing controller coupled to the microprocessor circuitry and a pattern bus for generating sample strobes for sampling outputs of the pins of the electronic device or circuitry and edge strobes for formatting stimulation patterns;

d. pattern bus coupled to the microprocessor and the central timing controller, the pattern bus having a first mode of operation wherein the pattern bus allows the microprocessor circuitry to access certain circuitry for conducting read and write operations and a second mode of operation wherein the pattern bus presents the stimulation patterns to the pins of the electronic device or circuitry which is electrically coupled to the hardware modeling system;

e. pattern controller coupled to the pattern bus for controlling stimulation pattern sequencing and delivery of stimulation patterns to the pattern bus;

f. pattern memory device coupled to the pattern controller for storing the stimulation patterns in the pattern memory device in a plurality of memory bits;

g. pin electronics circuitry coupled to the pattern bus for driving and sensing the pins of the electronic device or circuitry, and the pin electronics circuitry providing sensing of at least four states of the pins of the electronic device or circuitry; and h. an adaptor coupled to the pin electronics circuitry and configured for coupling the electronic device or circuitry to the hardware modeling system, the adaptor having circuitry for supporting live-insertion into a powered hardware modeling system.

10. A hardware modeling system for stimulating and sensing a response of electronic devices or circuitry to a stimulus, the hardware modeling system coupled to a plurality of electronic devices or circuitry, wherein pin electronics circuitry of the hardware modeling system drives and senses low-voltage CMOS electronic devices or circuitry operating at a supply voltage of 3.3 V.

11. A hardware modeling system for evaluating a response of an electronic device or circuitry to a stimulation pattern received from the hardware modeling system, with pins of the electronic device or circuitry being electrically coupled to pin drivers of the hardware modeling system, comprising:

a. a host network configured for coupling to a host computer for transmitting bi-directional communications between the hardware modeling system and the host computer;

b. a microprocessor coupled for controlling the hardware modeling system;

c. a central timing controller coupled to the microprocessor for generating timing signals for controlling timing of operations of the hardware modeling system, the central timing controller for generating sample strobes for sampling the outputs of the pins of the electronic device or circuitry and generating edge strobes for formatting the stimulation patterns;

d. a pattern bus coupled to the central timing controller and the microprocessor, the pattern bus having a first mode of operation wherein the pattern bus allows the microprocessor to access certain circuitry for conducting read and write operations and a second mode of operation wherein the pattern bus is utilized to present the stimulation patterns to the pins of the electronic device or circuitry which is electrically coupled to the hardware modeling system;

e. a pattern controller coupled to the pattern bus for controlling stimulation pattern sequencing and delivery of stimulation patterns to the pattern bus;

f. a pattern memory device coupled to the pattern controller for storing the stimulation patterns in the pattern memory device in a plurality of memory bits;

g. pin electronics circuitry coupled to the pattern bus for driving and sensing the pins of the electronic device or circuitry, and the pin electronics circuitry providing sensing of at least four states of the pins of the electronic device or circuitry; and h. an adaptor coupled to the pin electronics circuitry and configured for coupling the electronic device or circuitry to the hardware modeling system, the adaptor having circuitry for supporting live-insertion into a powered hardware modeling system.

12. A hardware modeling system for evaluating an electronic device or circuitry by generating a stimulation pattern, coupling the stimulation pattern to the electronic device or circuitry and sensing a response therefrom, the electronic device or circuitry having a plurality of electrical contacts, and further wherein the hardware modeling system is adapted to be coupled for bi-directional communications to a host network, the hardware modeling system comprising:

a. a central processing unit (CPU) coupled for controlling the hardware modeling system;

b. a central timing controller coupled to receive control signals from the CPU for generating timing signals for controlling timing of operations of the hardware modeling system, the central timing controller for generating sample strobes for sampling outputs of the electronic device or circuitry and generating edge strobes for exercising the electronic device or circuitry, the central timing controller also coupled to provide the response to the host network;

c. a pattern bus coupled to the central timing controller and the microprocessor, the pattern bus having a first mode of operation wherein the pattern bus allows the microprocessor to access certain circuitry for conducting read and write operations and a second mode of operation wherein the pattern bus is utilized to present the stimulation patterns to the pins of the electronic device or circuitry which is electrically coupled to the hardware modeling system;

d. a pattern generator including:
  (1) a pattern memory device for storing the stimulation pattern; and
  (2) a pattern controller coupled for control by the central timing controller for retrieving the stimulation pattern and providing the stimulation pattern to the bus according to the edge strobes; and e. an interface circuit bi-directionally coupled to receive the stimulation pattern from the bus for providing the stimulation pattern to the electronic device or circuitry and for sensing signals applied by the electronic device or circuitry to the contacts.

13. The hardware modeling system according to claim 12, further comprising an adaptor coupled to the interface circuit for supporting live-insertion of the electronic device or circuitry into a powered hardware modeling system.

14. The hardware modeling system according to claim 12, wherein the bus has a first mode of operation for the CPU to access certain circuitry for conducting read and write operations and a second mode of operation for presenting the stimulation patterns to the contacts of the electronic device or circuitry.

15. The hardware modeling system according to claim 12, further adapted to be one of a plurality of concurrently accessible networked hardware modeling systems coupled to an electronic device or circuity for concurrent access by a networked host computer.

16. The hardware modeling system according to claim 12, wherein the interface circuit has specific circuitry associated with individual pins of the electronic device or circuitry for determining whether a selected pin is in a driving low state, driving high state, or non-driving state.

17. The hardware modeling system according to claim 12, wherein the interface circuitry drives and senses low-voltage CMOS electronic devices or circuitry operating at a supply voltage of 3.3 V.

18. The hardware modeling system according to claim 12, wherein the interface circuit drives and senses the contacts of the electronic device or circuitry and provides sensing of at least four states of the contacts.

19. The hardware modeling system according to claim 17, wherein the interface circuitry has specific circuitry associated with individual pins of the electronic device or circuitry for the voltage of a selected pin to be independently programmed, and at the same time, automatically compare the voltage of the pin with at least two reference voltages.

20. The hardware modeling system according to claim 17, wherein the interface circuitry has specific circuitry associated with individual pins of the electronic device or circuitry for the voltage of a selected pin to be independently programmed, and at the same time, automatically compare the current into the pin with at least two reference currents.

* * * * *

UNITED STATES PATENT AND TRADEMARK OFFICE
CERTIFICATE OF CORRECTION

PATENT NO. : 5,625,580

DATED : April 29, 1997

INVENTOR(S) : Andrew J. Read et al.

It is certified that error appears in the above-indentified patent and that said Letters Patent is hereby corrected as shown below:

On the title page, item [56],

In the References Cited:

Page 2, first column, line 18, delete "4,365,295" and insert --4,365,294--.
Page 2, first column, line 28, delete "7/1985" and insert --6/1985--.
Page 2, first column, line 41, delete "Proyr" and insert --Pryor--.

Column 5, line 51, delete "Ms" and insert --HMEs--.
Column 7, line 33, delete "E1" and insert --H1--.
Column 9, line 26, delete "PINS" and insert --HMS--.
Column 18, line 9, delete "MS" and insert --HMS--.
Column 22, line 26, delete "Bytes" and insert --MBytes--.
Column 33, table 2, line 23, delete "LAKE" and insert --LANE--.
Column 36, line 2, delete "16 XTAL_CLK" and insert --16 MHz XTAL_CLK--.
Column 39, line 8, delete "STOP_REFRESH" and insert --STOP_REFRESH*--.
Column 39, line 10, delete L_MUST_REFRESH" and insert --L_MUST_REFRESH*--.
Column 39, line 25, delete "40" and insert --740--.
Column 39, line 26, delete "44" and insert --744--.

UNITED STATES PATENT AND TRADEMARK OFFICE
CERTIFICATE OF CORRECTION

PATENT NO. : 5,625,580

DATED : April 29, 1997

INVENTOR(S) : Andrew J. Read et al.

It is certified that error appears in the above-indentified patent and that said Letters Patent is hereby corrected as shown below:

Column 39, line 27, delete "50" and insert --750--.

Column 39, line 60, delete "44" and insert --744--.

Column 39, line 66, delete "54" and insert --754--.

Column 43, line 22, delete "EN_BRANCH" and insert --EN_BRANCH*--.

Column 48, table 6, line 8, delete "[(MEM_SIZE)/128 - 1"and insert --[(MEM_SIZE)/128] - 1--.

Column 48, table 6, line 9, delete "soize" and insert --size--.

Column 52, line 61, delete "BTLSPELADDR" and insert --BTL$PELADDR--.

Column 57, table 7, line 43, delete "EDCE<5..0>*" and insert --EDGE<5..0>*--.

Column 57, table 7, line 69, delete "Imoh" and insert --Imol--.

Column 57, table 7, line 73, delete "Imoh" and insert --Imol--.

Column 74, table 17, line 2, delete "voltage<HMEVCC"and insert --voltage ≤ HMEVCC--.

Coulmn 74, table 17, line 19, delete "b4.VLTH<HME"and insert --4. VLTH < HME--.

Signed and Sealed this

Fourteenth Day of October, 1997

BRUCE LEHMAN

Attest:

Attesting Officer

Commissioner of Patents and Trademarks